US007609608B2

(12) United States Patent
Rogerson et al.

(10) Patent No.: US 7,609,608 B2
(45) Date of Patent: *Oct. 27, 2009

(54) METHOD AND APPARATUS FOR DATA TRANSFER USING A TIME DIVISION MULTIPLE FREQUENCY SCHEME WITH ADDITIONAL MODULATION

(75) Inventors: Gerald D. Rogerson, Poway, CA (US); David S. Furuno, San Diego, CA (US); Stephan W. Gehring, Menlo Park, CA (US); Michael L. Walker, San Diego, CA (US); Jason L. Ellis, San Diego, CA (US)

(73) Assignee: General Atomics, San Diego, CA (US)

( * ) Notice: Subject to any disclaimer, the term of this patent is extended or adjusted under 35 U.S.C. 154(b) by 924 days.

This patent is subject to a terminal disclaimer.

(21) Appl. No.: 10/371,065

(22) Filed: Feb. 20, 2003

(65) Prior Publication Data

US 2004/0008729 A1    Jan. 15, 2004

Related U.S. Application Data

(63) Continuation-in-part of application No. 10/255,103, filed on Sep. 26, 2002, and a continuation-in-part of application No. 10/255,111, filed on Sep. 26, 2002.

(60) Provisional application No. 60/359,044, filed on Feb. 20, 2002, provisional application No. 60/359,045, filed on Feb. 20, 2002, provisional application No. 60/359,064, filed on Feb. 20, 2002, provisional application No. 60/359,147, filed on Feb. 20, 2002, provisional application No. 60/359,094, filed on Feb. 20, 2002, provisional application No. 60/359,095, filed on Feb. 20, 2002, provisional application No. 60/359,046, filed on Feb. 20, 2002, provisional application No. 60/326,093, filed on Sep. 26, 2001.

(51) Int. Cl.
*H04J 11/00* (2006.01)
*H04B 7/216* (2006.01)
*H04B 1/00* (2006.01)
*H04L 27/28* (2006.01)

(52) U.S. Cl. ............... 370/203; 370/335; 370/337; 370/342; 375/146; 375/260; 375/295

(58) Field of Classification Search ......... 370/337, 370/203, 335, 342, 347; 375/260, 295, 146
See application file for complete search history.

(56) References Cited

U.S. PATENT DOCUMENTS 3,299,427 A    1/1967   Kondo et al.

(Continued)

FOREIGN PATENT DOCUMENTS

| WO | WO 01/22672 A1 | 3/2001 |
| WO | WO 01/39451 A1 | 5/2001 |
| WO | WO 02/31986 A2 | 4/2002 |

OTHER PUBLICATIONS

Siwiak, "Ultra-Wide Band Radio: Introducing a New Technology," 2001, IEEE, pp. 1088-1093.

(Continued)

*Primary Examiner*—Steven Nguyen
(74) *Attorney, Agent, or Firm*—Fitch Even Tabin & Flannery

(57) ABSTRACT

A method of data transmission according to one embodiment of the invention includes encoding a set of data values to produce a corresponding series of ordered n-tuples. The method also includes transmitting, according to the series of ordered n-tuples, a plurality of bursts over a plurality n of frequency bands. Specifically, for each of the plurality of bursts, a frequency band occupied by the burst is indicated by the order within its n-tuple of an element corresponding to the burst. A bandwidth of at least one of the plurality of bursts is at least two percent of the center frequency of the burst. Information is encoded into an additional modulation, e.g., amplitude, width or polarization modulation, of at least one of the plurality of bursts.

26 Claims, 91 Drawing Sheets

U.S. PATENT DOCUMENTS

| | | |
|---|---|---|
| 3,728,632 A | 4/1973 | Ross |
| 3,806,795 A | 4/1974 | Morey |
| 3,945,012 A | 3/1976 | Cooper |
| 4,105,950 A | 8/1978 | Dingwall |
| 4,309,703 A | 1/1982 | Blahut |
| 4,354,269 A | 10/1982 | Vries et al. |
| 4,486,882 A | 12/1984 | Piret et al. |
| 4,517,532 A | 5/1985 | Neidorff |
| 4,614,945 A | 9/1986 | Brunius et al. ......... 340/870.03 |
| 4,743,906 A | 5/1988 | Fullerton |
| 4,813,057 A | 3/1989 | Fullerton |
| 4,891,609 A | 1/1990 | Eilley |
| 4,978,927 A | 12/1990 | Hausman et al. |
| 4,979,186 A | 12/1990 | Fullerton |
| 4,980,897 A | 12/1990 | Decker et al. |
| 5,013,944 A | 5/1991 | Fischer et al. |
| 5,045,811 A | 9/1991 | Lewis |
| 5,050,188 A | 9/1991 | Dirr |
| 5,208,557 A | 5/1993 | Kersh, III |
| 5,262,735 A | 11/1993 | Hashimoto et al. |
| 5,274,629 A | 12/1993 | Helard et al. |
| 5,331,294 A | 7/1994 | Watanabe et al. |
| 5,345,471 A | 9/1994 | McEwan |
| 5,361,070 A | 11/1994 | McEwan |
| 5,363,108 A | 11/1994 | Fullerton |
| 5,418,499 A | 5/1995 | Nakao |
| 5,420,546 A | 5/1995 | Watanabe et al. |
| 5,455,593 A | 10/1995 | Ross |
| 5,465,076 A | 11/1995 | Yamauchi et al. |
| 5,471,176 A | 11/1995 | Henson et al. |
| 5,471,223 A | 11/1995 | McCorkle |
| 5,475,344 A | 12/1995 | Maneatis et al. |
| 5,475,677 A | 12/1995 | Arnold et al. .................. 370/29 |
| 5,504,783 A | 4/1996 | Tomisato et al. |
| 5,523,758 A | 6/1996 | Harmuth |
| 5,523,760 A | 6/1996 | McEwan |
| 5,526,343 A | 6/1996 | Aizawa et al. ............. 370/13.1 |
| 5,553,064 A | 9/1996 | Paff et al. ...................... 370/50 |
| 5,586,145 A | 12/1996 | Morgan et al. |
| 5,592,170 A | 1/1997 | Price et al. |
| 5,592,177 A | 1/1997 | Barrett |
| 5,648,967 A | 7/1997 | Schulz |
| 5,661,762 A | 8/1997 | Petranovich et al. |
| 5,666,382 A | 9/1997 | Thakore |
| 5,672,007 A | 9/1997 | Brown et al. |
| 5,677,927 A | 10/1997 | Fullerton et al. |
| 5,710,765 A | 1/1998 | Lee et al. |
| 5,739,796 A | 4/1998 | Jasper, Jr. et al. |
| 5,764,690 A | 6/1998 | Blanchard et al. |
| 5,774,450 A | 6/1998 | Harada et al. |
| 5,790,527 A | 8/1998 | Janky et al. |
| 5,815,794 A | 9/1998 | Williams |
| 5,854,603 A | 12/1998 | Heger |
| 5,880,699 A | 3/1999 | McCorkle |
| 5,883,591 A | 3/1999 | McEwan |
| 5,901,172 A | 5/1999 | Fontana et al. |
| 5,952,956 A | 9/1999 | Fullerton |
| 5,963,581 A | 10/1999 | Fullerton et al. |
| 6,002,708 A | 12/1999 | Fleming et al. |
| 6,008,700 A | 12/1999 | Pietrzyk |
| 6,026,125 A | 2/2000 | Larrick, Jr. et al. |
| 6,031,862 A | 2/2000 | Fullerton et al. |
| 6,054,950 A | 4/2000 | Fontana |
| 6,061,406 A | 5/2000 | Carson et al. |
| 6,075,415 A | 6/2000 | Milton et al. |
| 6,151,296 A | 11/2000 | Vijayan et al. |
| 6,154,501 A | 11/2000 | Friedman |
| 6,185,258 B1 | 2/2001 | Alamouti et al. |
| 6,191,724 B1 | 2/2001 | McEwan |
| 6,198,781 B1 | 3/2001 | Ohno et al. |
| 6,204,694 B1 | 3/2001 | Sunter et al. |
| 6,233,205 B1 | 5/2001 | Wells et al. |
| 6,252,909 B1 | 6/2001 | Tzannes et al. |
| 6,275,544 B1 | 8/2001 | Aiello et al. |
| 6,289,038 B1 | 9/2001 | Park |
| 6,353,637 B1 | 3/2002 | Mansour et al. |
| 6,377,566 B1 | 4/2002 | Cupo et al. |
| 6,407,986 B1 | 6/2002 | Dutta |
| 6,438,115 B1 | 8/2002 | Mazur et al. |
| 6,442,211 B1 | 8/2002 | Hampel et al. |
| 6,442,214 B1 | 8/2002 | Boleskei et al. |
| 6,445,425 B1 | 9/2002 | Limberg |
| 6,459,703 B1 | 10/2002 | Grimwood et al. .......... 370/442 |
| 6,487,258 B1 * | 11/2002 | Jedwab et al. ............... 375/295 |
| 6,603,818 B1 * | 8/2003 | Dress et al. ................. 375/295 |
| 6,608,552 B1 | 8/2003 | Fogel et al. ............ 340/310.01 |
| 6,625,222 B1 | 9/2003 | Bertonis et al. |
| 6,791,966 B1 | 9/2004 | Mikkola et al. |
| 6,810,023 B1 | 10/2004 | Dillinger et al. |
| 6,885,694 B1 | 4/2005 | He et al. |
| 6,895,059 B2 * | 5/2005 | Rogerson et al. ............ 375/295 |
| 6,937,674 B2 | 8/2005 | Santhoff et al. |
| 6,987,815 B2 | 1/2006 | Denno |
| 7,187,647 B1 | 3/2007 | Gerakoulis et al. |
| 7,187,715 B2 * | 3/2007 | Balachandran et al. ...... 375/242 |
| 7,321,601 B2 | 1/2008 | Rogerson et al. |
| 2002/0097185 A1 | 7/2002 | Hershey et al. |
| 2002/0154620 A1 | 10/2002 | Azenkot et al. |
| 2002/0155811 A1 | 10/2002 | Prismantas et al. |
| 2002/0168003 A1 * | 11/2002 | Richards ..................... 375/239 |
| 2002/0168991 A1 | 11/2002 | Kochanski et al. |
| 2003/0069025 A1 | 4/2003 | Hoctor et al. |
| 2003/0090407 A1 | 5/2003 | Santhoff |
| 2003/0099299 A1 | 5/2003 | Rogerson et al. |
| 2003/0202537 A1 * | 10/2003 | Rogerson et al. ............ 370/203 |
| 2004/0002347 A1 | 1/2004 | Hoctor et al. |
| 2004/0028011 A1 | 2/2004 | Gehring et al. |
| 2005/0232371 A1 | 10/2005 | Rogerson et al. |
| 2008/0130685 A1 | 6/2008 | Rogerson et al. |

OTHER PUBLICATIONS

Barrett, *History of Ultra WideBand (UWB) Radar & Communications: Pioneers and Innovators*, Progress In Electromagnetics Symposium 2000 (PIERS2000), Jul. 2000, Cambridge, MA, 42 pages.

Foerster, Jeff et al., *Ultra-Wideband Technology for Short- or Medium-Range Wireless Communications*, Intel Technology Journal Q2, 2001, 11 pages.

Hirt, Walter, *Ultra-Wideband (UWB) Radio Technology (UWB-RT) Short-Range Communication and Location Tracking*, Apr. 12, 2001, 4 pages.

Kahney, Leander, *The Third-Generation Gap*, Scientific American. com (http://www.sciam.com/print_version.cfm?articleID=00031A96-ADF7-1C73-9B81809EC588EF21), Oct. 20, 2000, 4 pages.

McCorkle, John, *Project: IEEE P802.15 Working Group For Wireless Personal Area Networks (WPANS)—A Tutorial on Ultrawideband Technology*, XtremeSpectrun, Inc., Mar. 2000, 34 pages.

*PCT International Search Report*, European Patent Office International Search Authority (EP/ISA), from corresponding PCT Application No. PCT/US02/30515, mailed Jun. 3, 2003, five pages.

USPTO; *Notice of Allowability*; from U.S. Appl. No. 10/372,075; mailed Aug. 8, 2007, eight pages.

USPTO; *Office Action*, from U.S. Appl. No. 10/372,075; mailed Feb. 22, 2007, fifteen pages.

USPTO; *Office Action*, from U.S. Appl. No. 11/131,826; mailed Sep. 14, 2007, twelve pages.

PCT; App. No. PCT/US02/30515; International Preliminary Examination Report mailed Mar. 18, 2005.

PCT; App. No. PCT/US03/05160; International Search Report mailed May 21, 2004.

USPTO; U.S. Appl. No. 10/255,111; Notice of Allowance mailed Jan. 3, 2005.
USPTO; U.S. Appl. No. 10/255,111; Office Action mailed Apr. 29, 2004.
10/255,111; Supplemental Notice of Allowance mailed Mar. 29, 2005.

USPTO; U.S. Appl. No. 11/131,826; Notice of Allowance mailed Feb. 11, 2008.
USPTO; U.S. Appl. No. 11/131,826; Notice of Allowance mailed Jun. 2, 2008.

* cited by examiner

|  | band 1 | band 2 | band 3 | band 4 |
|---|---|---|---|---|
| time slot 1 | 1 | 0 | 0 | 1 |
| time slot 2 | 1 | 0 | 1 | 0 |
| time slot 3 | 1 | 0 | 1 | 0 |
| time slot 4 | 1 | 0 | 1 | 0 |

FIGURE 10

METHOD AND APPARATUS FOR DATA TRANSFER USING A TIME DIVISION MULTIPLE FREQUENCY SCHEME WITH ADDITIONAL MODULATION

RELATED APPLICATIONS

This application claims priority to U.S. Provisional Patent Applications Nos. 60/359,044 ("POLARITY SIGNALING METHODS BASED ON TDMF UWB WAVEFORMS," filed Feb. 20, 2002); 60/359,045 ("CHANNELIZATION METHODS FOR TIME-DIVISION MULTIPLE FREQUENCY COMMUNICATION CHANNELS," filed Feb. 20, 2002); 60/359,064 ("HYBRID SIGNALING METHODS BASED ON TDMF UWB WAVEFORMS," filed Feb. 20, 2002); and 60/359,147 ("TRANSMITTER AND RECEIVER FOR A TIME-DIVISION MULTIPLE FREQUENCY COMMUNICATION SYSTEM," filed Feb. 20, 2002); 60/359,094 ("PHY LEVEL ERROR DETECTION/CORRECTION FOR TDMF," filed Feb. 20, 2002); 60/359,095 ("ADAPTING TDMF SIGNALING TO NARROW-BAND INTERFERENCE SOURCES," filed Feb. 20, 2002); and 60/359,046 ("METHOD OF DECODING TO EXPLOIT TDMF (FREQUENCY/TIME) CHARACTERISTICS," filed Feb. 20, 2002); all of which applications are incorporated in their entirety herein by reference.

This application is a continuation-in-part (CIP) of the following U.S. patent applications, all of which are incorporated in their entirety herein by reference: U.S. patent application Ser. No. 10/255,111 ("METHOD AND APPARATUS FOR DATA TRANSFER USING A TIME DIVISION MULTIPLE FREQUENCY SCHEME", filed Sep. 26, 2002); and U.S. patent application Ser. No. 10/255,103 ("TUNABLE OSCILLATOR", filed Sep. 26, 2002).

This application is related to the following U.S. patent application filed concurrently herewith, all of which are incorporated in its entirety herein by reference: U.S. patent application Ser. No. 10/372,075 ("METHOD AND APPARATUS FOR DATA TRANSFER USING A TIME DIVISION MULTIPLE FREQUENCY SCHEME SUPPLEMENTED WITH POLARITY MODULATION"); U.S. patent application Ser. No. 10/371,799 ("FLEXIBLE METHOD AND APPARATUS FOR ENCODING AND DECODING SIGNALS USING A TIME DIVISION MULTIPLE FREQUENCY SCHEME"); U.S. patent application Ser. No. 10/371,064 ("METHOD AND APPARATUS FOR ADAPTING MULTI-BAND ULTRA-WIDEBAND SIGNALING TO INTERFERENCE SOURCES"); and U.S. patent application Ser. No. 10/371,074 ("METHOD AND APPARATUS FOR ADAPTING SIGNALING TO MAXIMIZE THE EFFICIENCY OF SPECTRUM USAGE FOR MULTI-BAND SYSTEMS IN THE PRESENCE OF INTERFERENCE").

BACKGROUND

1. Field of the Invention

This invention relates to data transfer over wired, wireless, and/or optical transmission channels.

2. Background Information

As computing and communications applications become richer and more complex, it becomes desirable to support transfers of data between devices at higher and higher rates. The increasing popularity of consumer electronics, computing, and communicating devices, in various forms (e.g. mobile, hand-held, wearable, and fixed) and possibly with associated peripherals, indicates a clear demand for these types of devices and for connectivity (e.g. peer-to-peer and/or networked) between them. Unfortunately, present-day communications technologies fall short of providing the technical requirements necessary to support such demands.

Wireless connectivity may enable greater user experiences and possibly spur an increased demand for such devices. For example, wireless connectivity can provide enhanced capability; is expected to be easier to use; may encompass cost savings and increases in efficiency and productivity; and may increase possible device applications and/or deployments.

Use of such devices may include large data transfers and/or multimedia applications. For example, a cable replacement scenario for a computer, a consumer electronics device, or a similar device may need to support transfers of large amounts of data. Multimedia applications may handle multiple simultaneous streams of high-definition audio and/or video coming from devices such as business/entertainment systems and gateways.

Most existing wireless schemes transfer data via modulated continuous-wave carriers. In many cases, a portion of the radio-frequency spectrum is reserved for the exclusive use of the scheme. Such reservations allow these transfer schemes (e.g. commercial radio and TV broadcasts) to operate free of interference from other devices and without interfering with other systems.

Data transfers may be conducted over very narrow frequency bands in an attempt to occupy less of the frequency spectrum. However, such schemes may be more susceptible to increases in background noise level and to multipath interference. Some narrowband schemes may also be more likely to interfere with other systems (e.g. due to a higher concentration of energy in the particular frequency band being used).

Although battery technology is steadily improving, operating times between charges or replacement are still important factors in the design of portable devices. Complexity and cost of transmitter and receiver implementations are other important factors for consumer applications. Present-day solutions offer only a few of the necessary technical requirements. For example, some may provide low cost and low power consumption but only at low bit rate, while others may have higher bit rates but be unacceptable in terms of cost and/or rate of power consumption.

It is desirable to support high rates of data transfer. It may also be desirable for a scheme that supports high, medium, and/or low rates of data transfer to obtain one or more advantages such as 1) low power consumption, 2) low cost of implementation, and/or 3) an ability to coexist with interferers and/or with other frequency use. Other desirable advantages may include scalability with potential capability for backwards compatibility and/or an ability to determine position and/or location.

SUMMARY OF THE INVENTION

A method of data transmission according to one embodiment of the invention includes encoding a set of data values to produce a corresponding series of ordered n-tuples. The method also includes transmitting, according to the series of ordered n-tuples, a plurality of bursts over a plurality n of frequency bands. Specifically, for each of the plurality of bursts, a frequency band occupied by the burst is indicated by the order within its n-tuple of an element corresponding to the burst. A bandwidth of at least one of the plurality of bursts is at least two percent of the center frequency of the burst. Information is encoded into an additional modulation of at least one of the plurality of bursts.

A transmitter according to another embodiment of the invention includes: an encoder configured to receive an ordered set of m data values and to produce a corresponding series of ordered n-tuples; and a signal generator configured to transmit, according to the series of ordered n-tuples, a plurality of bursts, each burst occupying at least one of a plurality n of frequency bands. For each of the plurality of bursts, a frequency band occupied by the burst is indicated by the order within its n-tuple of an element corresponding to the burst, and a bandwidth of at least one of the plurality of bursts is at least two percent of the center frequency of the burst. The transmitter is configured to encode information into an additional modulation of at least one of the plurality of bursts.

A method of data reception according to a further embodiment comprising the steps of: receiving a plurality of bursts, each burst occupying at least one of a plurality n of frequency bands, wherein information is encoded into an additional modulation of at least one of the plurality of bursts; obtaining a series of ordered n-tuples based on the plurality of bursts; and decoding the series of ordered n-tuples to produce an ordered set of m data values. For each of the plurality of bursts, the order within its n-tuple of an element corresponding to the burst is indicated by a frequency band occupied by the burst, and a bandwidth of at least one of the plurality of bursts is at least two percent of the center frequency of the burst. Information is decoded from the additional modulation encoded into at least one of the plurality of bursts.

A receiver according to a further embodiment including a signal detector configured to receive a signal including a plurality of bursts, wherein information is encoded into an additional modulation of at least one of the plurality of bursts, each burst occupying at least one of a plurality n of frequency bands, and to output a series of ordered n-tuples based on the plurality of bursts. The receiver further includes a decoder configured to produce an ordered set of m data values from the series of ordered n-tuples. The signal detector is configured to output, for each of the plurality of bursts, an element corresponding to the burst such that an order of the element within its n-tuple corresponds to a frequency band occupied by the burst. A bandwidth of at least one of the plurality of bursts is at least two percent of the center frequency of the burst and the signal detector is configured to output the information based upon the additional modulation of at least one of the plurality of bursts.

A method of data transmission according to a further embodiment, said method comprising: transmitting a plurality of bursts, each burst occupying one of a plurality of frequency bands; wherein at least an order of transmission of the plurality of bursts in time encodes a symbol, the symbol corresponding to a plurality of data values; and wherein a bandwidth of at least one of the plurality of bursts is at least two percent of the center frequency of the burst.

BRIEF DESCRIPTION OF THE DRAWINGS

FIG. 10 shows a representation of one correspondence between an encoded symbol and burst activity over time slots and across different frequency bands for the series of FIG. 9.

DETAILED DESCRIPTION

In the description and claims that follow, certain terms may be defined as follows:

The term 'frequency band' denotes a portion of the frequency spectrum. The term 'center frequency' as applied to a frequency band denotes a frequency at the arithmetic mean of the frequencies of the boundaries of the frequency band. As defined herein, frequency bands may be adjacent to one another but are distinct from one another and do not overlap.

The term 'burst' denotes the emission of an amount of energy within a particular range of frequencies and over a limited period of time. A burst may include one or more cycles of a waveform (e.g. a sine wave). A burst may even be limited to less than one cycle of a waveform. In some applications, two or more bursts may be transmitted simultaneously. Beginning the transmission of a burst is also referred to as 'triggering' the burst. Transferring a burst from the generating circuitry (e.g. as described herein) to the transmission medium or channel is also referred to as 'launching' the burst.

Figure 59:
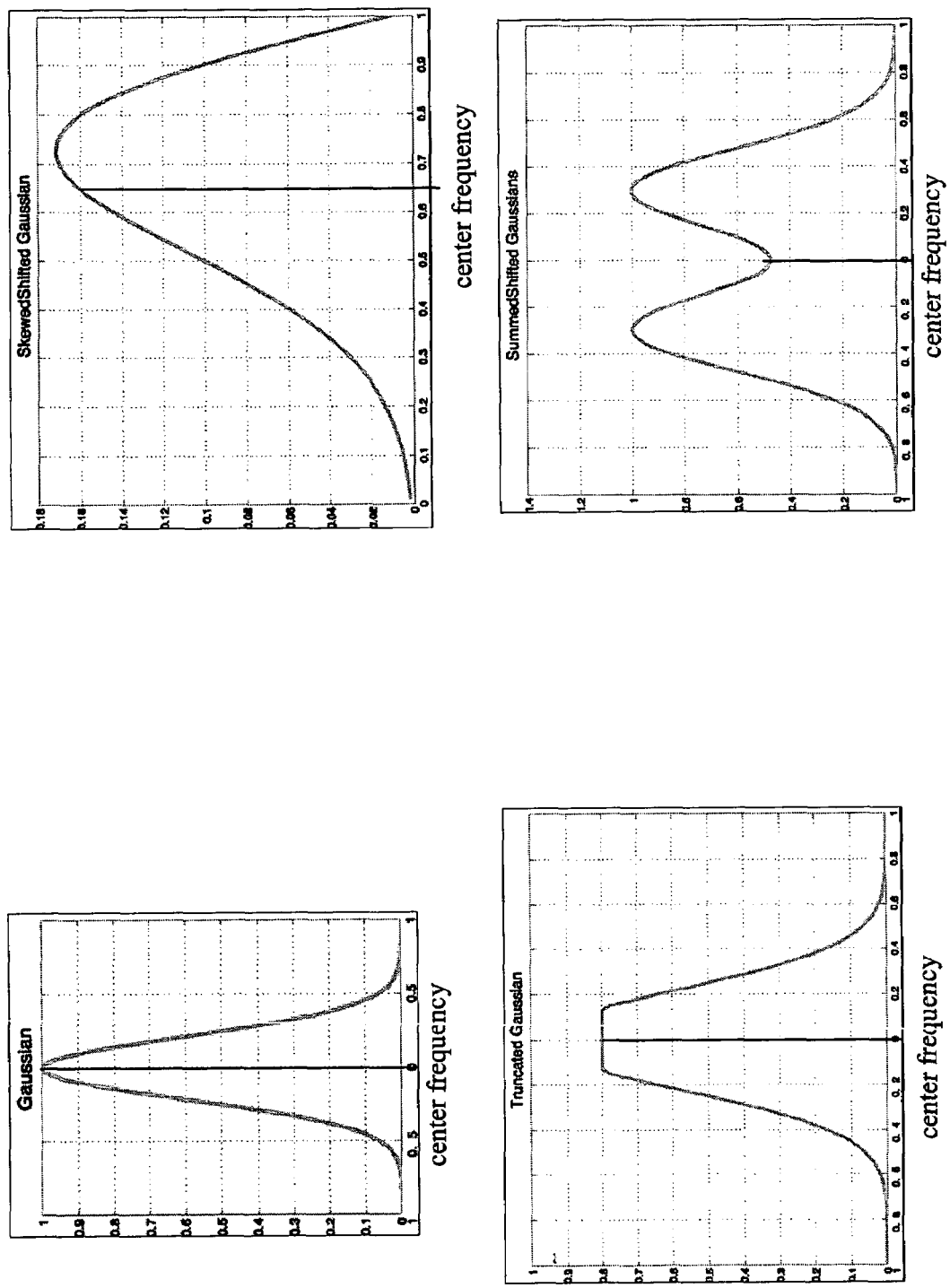
FIG. 59 shows examples of several bursts and their center frequencies.

The term 'bandwidth' denotes a continuous range of frequencies that contains at least 90% and not more than 95% of the total energy of a signal. The bandwidth of a burst may lie within more than one frequency band at a time. The term 'center frequency' as applied to a burst denotes the midpoint (along the frequency axis) of the energy distribution of the burst: i.e. the frequency at which the total energy of the burst on either side is fifty percent of the total energy of the burst (as in the examples illustrated in FIG. 59). A burst 'occupies' a frequency band when the center frequency of the burst is within the frequency band, such that a burst occupies no more than one frequency band at a time.

The term 'wideband' denotes a signal whose bandwidth is not less than 2% of its center frequency, and the term 'ultra-wideband' denotes a signal whose bandwidth is not less than 20% of its center frequency. For example, the bandwidth of an ultra-wideband signal may be up to 50% or more of the signal's center frequency. Ultra-wideband signals may be used at frequencies from less than tens of hertz to terahertz and beyond. Although most ultra-wideband use currently falls between 100 MHz and 10 GHz primarily due to present-day regulatory allocations, it is envisioned that future allocations will extend far beyond this frequency range.

Figure 1:
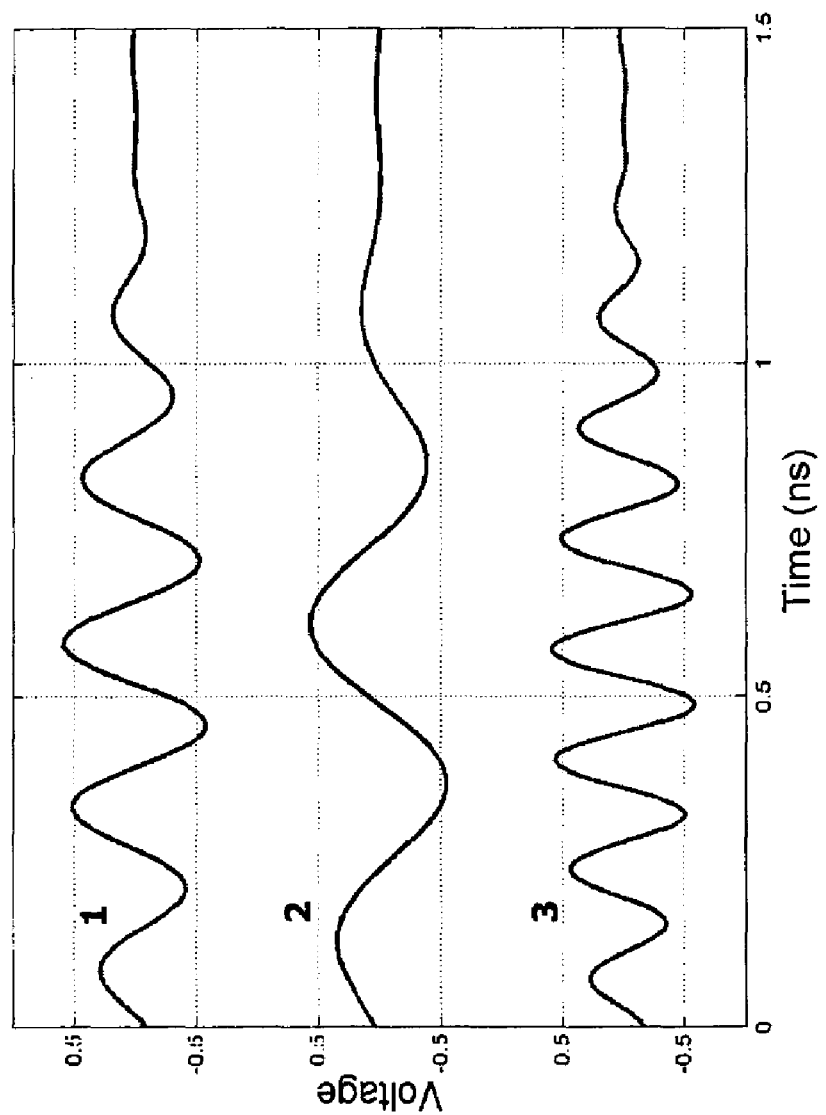
FIG. 1 shows examples of three ultra-wideband bursts at different frequencies.
Figure 2:
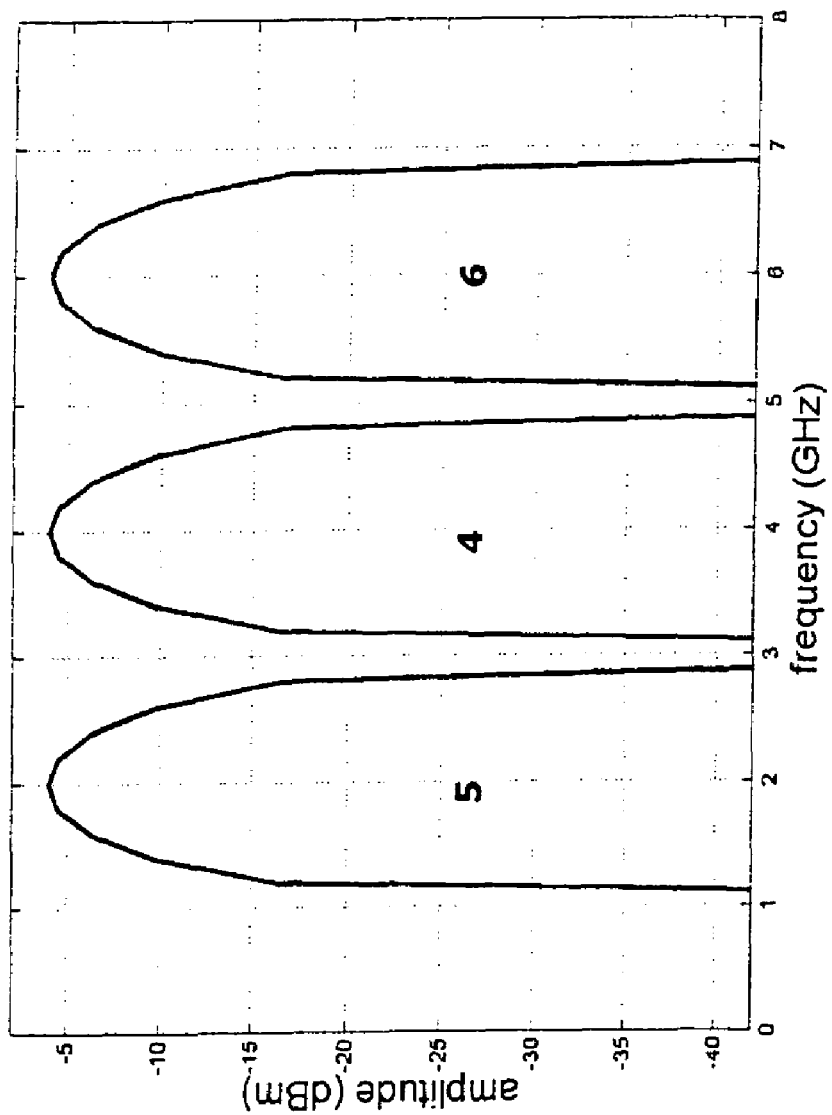
FIG. 2 shows the three bursts of FIG. 1 in the frequency domain.

FIG. 1 shows an example in the time domain of bursts in three different frequency bands (illustrated as waveforms 1, 2 and 3). FIG. 2 shows an alternative representation of these three bursts in the frequency domain, where frequency bands 4, 5, and 6 correspond to waveforms 1, 2, and 3, respectively. In this example, the three frequency bands are easily distinguished from one another in the frequency domain.

The term 'time slot' denotes a defined period of time that separates moments at which bursts may be triggered. It may be desirable to observe a convention of triggering bursts only at the start of a time slot, such that during each time slot, no more than one burst is triggered per frequency band.

A period of time may be divided into a continuous series of consecutive and non-overlapping time slots of equal duration. Alternatively, sets of consecutive and non-overlapping time slots of one duration may be separated in time by one or more time slots of a different (e.g. a longer or even a shorter) duration. In a complex high-speed system, the length of a time slot may be measured in picoseconds. In a lower-speed system of less complexity, the length of a time slot may be in the nanosecond range. In other applications, time slots of shorter or greater length may be used as desired.

In the implementations described herein, the same time slot boundaries are observed across the various frequency bands. However, it is contemplated that two or more different time slot arrangements may be applied among the various frequency bands (e.g. that time slots in one frequency band may be longer than time slots in another frequency band, or that time slots in one frequency band may have constant length while time slots in another frequency band have varying length) in other implementations.

Figure 3:
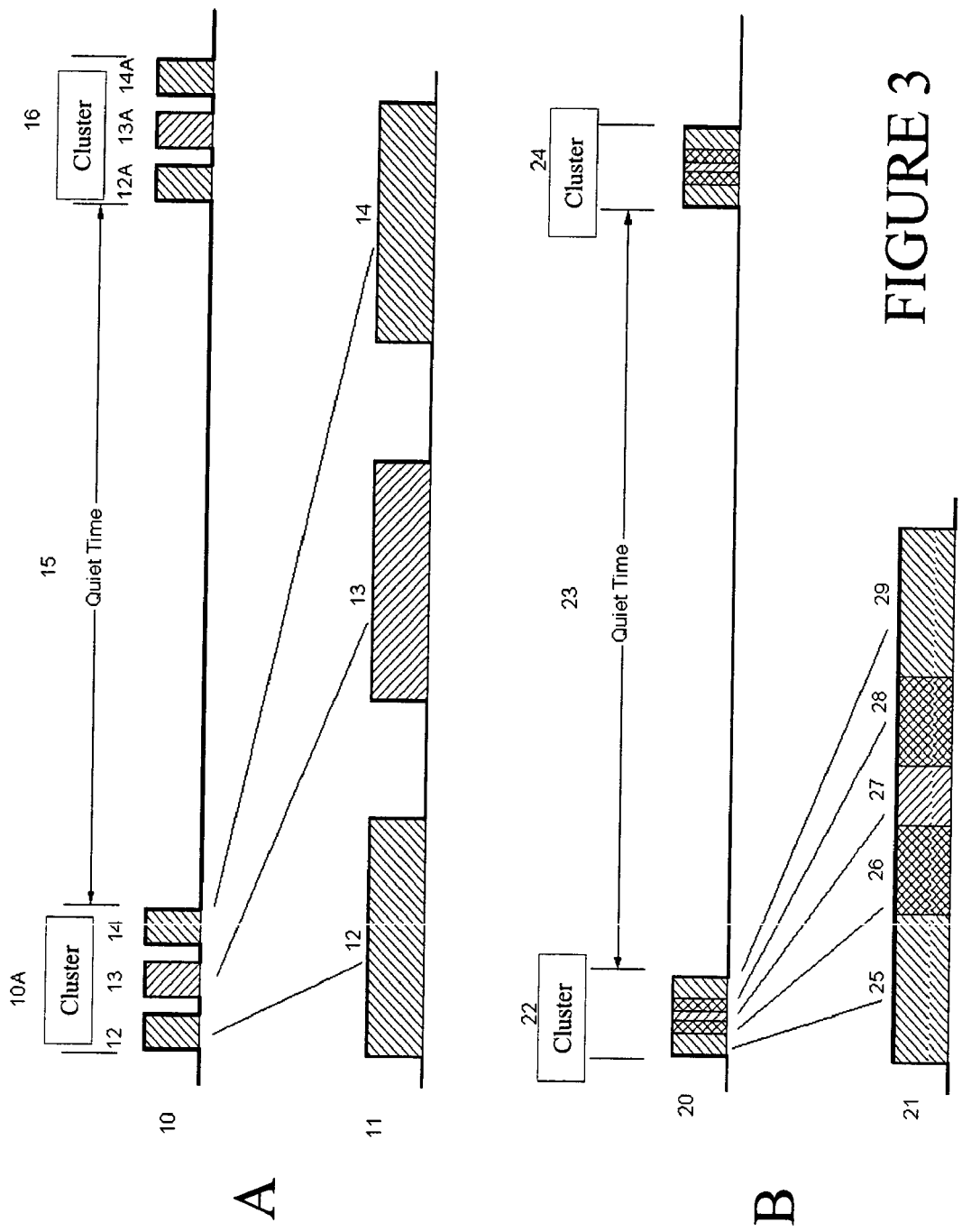
FIG. 3 shows a timing diagram.

FIG. 3 is an illustration of two examples in which sets of time slots are separated by periods during which no bursts are launched ('quiet time'). In example 3A (where different shadings indicate different frequency bands), each burst 12, 13 and 14 has a duration shorter than that of a time slot. However, it is also contemplated that in some applications a burst may have a duration longer than a time slot (e.g. as in example 3B), such that two or more bursts 25, 26, 27, 28, 29 may overlap even if their corresponding time slots do not (e.g., bursts 25 and 26 overlap in time). In such cases, a series of bursts triggered during consecutive time slots in the same frequency band may represent different information than a single burst that extends over the same number of time slots.

Figure 4:
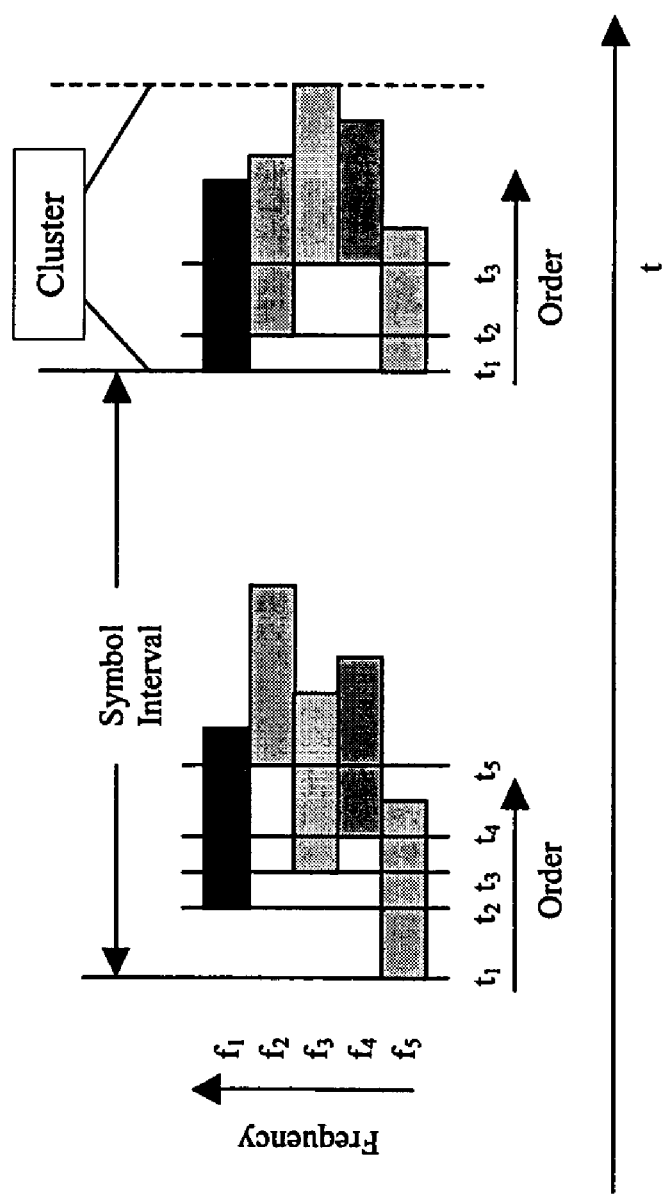
FIG. 4 shows a timing diagram.

The term 'symbol' denotes an ordered series of n-tuples that corresponds to an ordered set of data values. The term 'cluster' (e.g., clusters 10A, 16, 22, 24) denotes a set of bursts corresponding to a symbol. The term 'symbol interval' denotes the period between the start of transmission of a cluster and the start of transmission of the next cluster and includes any 'quiet time' (e.g., quiet time 15, 23) between the clusters. These terms are also illustrated by example in FIG. 3 and in FIG. 4, which shows consecutive clusters that each include overlapping bursts. In some applications as described herein, it is possible for no bursts to be launched during one or more of the time slots in each cluster.

'Quiet time' periods between clusters may be especially useful, for example, in asynchronous applications. In such cases, it may be desirable for the duration of a quiet time period to be greater than the duration of a time slot.

Figure 5:
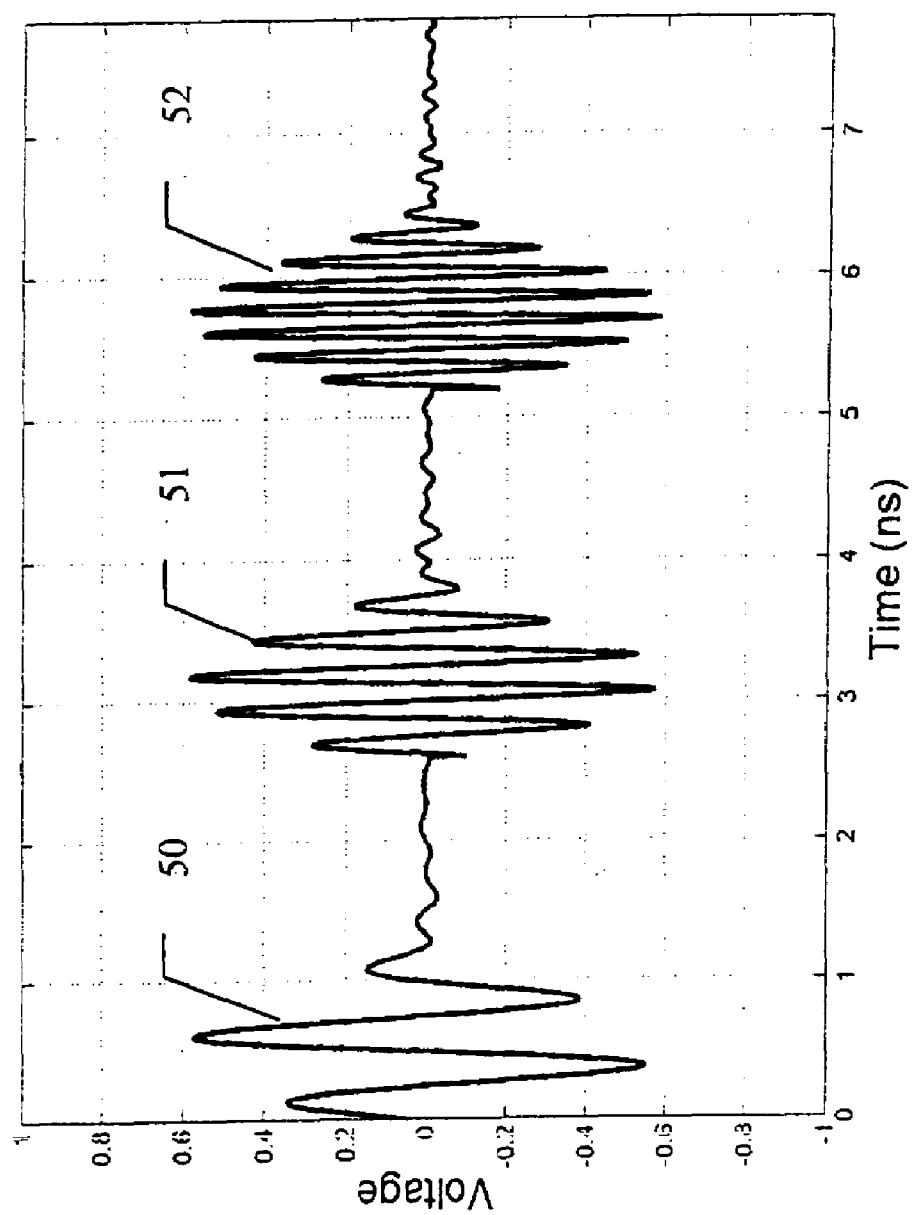
FIG. 5 shows a sequence of three ultra-wideband bursts in time.

In some applications, clusters may not overlap (e.g., to reduce interference). FIG. 5 shows one example of a cluster that includes three bursts 50, 51, 52 triggered at consecutive time slots. In this example, the start of each burst is delayed by about 2.5 nanoseconds from the start of the previous burst.

Figure 6:
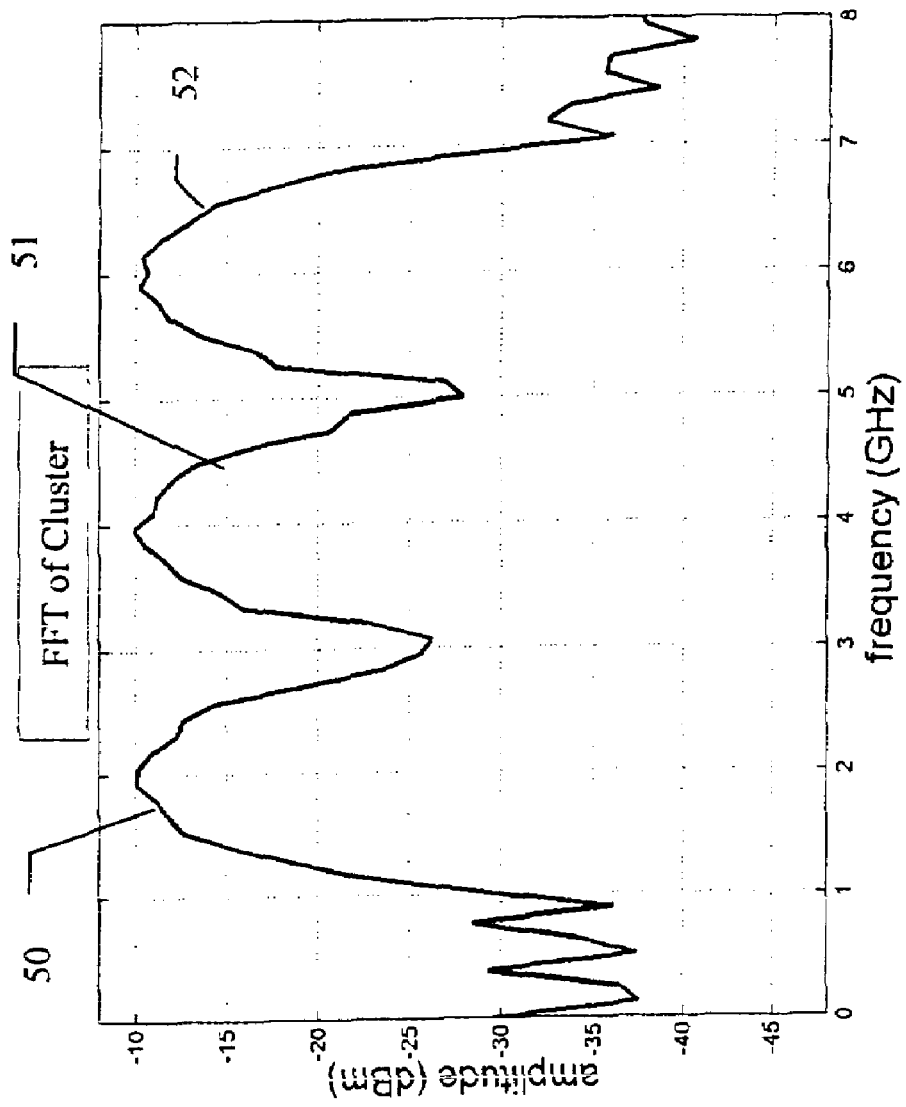
FIG. 6 shows the sequence of FIG. 5 in the frequency domain.
Figure 7:
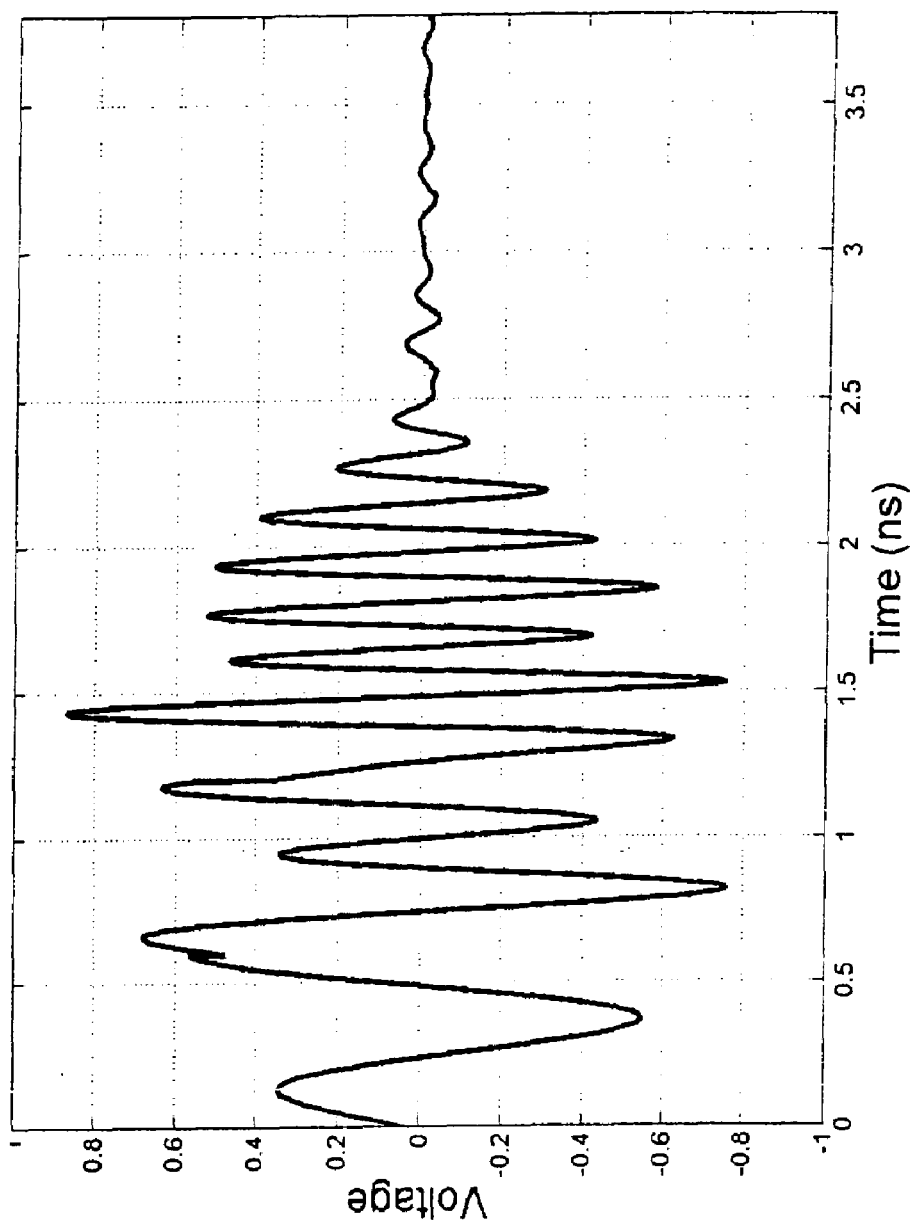
FIG. 7 shows a time-domain plot of overlapping ultra-wideband bursts.

FIG. 6 shows the cluster of FIG. 5 in the frequency domain. Although the three bursts 50, 51, 52 overlap in frequency, they may still be distinguished at, e.g., their center frequencies. FIG. 7 shows a time-domain plot of a cluster that includes bursts which overlap in time. In some applications, bursts that overlap in time may be used (e.g. to support higher rates of data transfer) and/or bursts that overlap in frequency may be used (e.g. to support higher data density).

According to several embodiments of the invention, and as used herein, "time division multiple frequency" or TDMF is generally an encoding scheme that encodes information (bits) in the time order of transmission of at least one burst within each of multiple sub-bands. That is, data is encoded through the time dependence of frequency bursts within a cluster of bursts. The time and the frequency band at which bursts occur within a cluster carry the information. For example, the order of transmission of bursts across the multiple sub-bands defines a symbol, the symbol corresponds or maps to defined bits. For example, as illustrated in FIG. 5, a cluster consisting of a time-sequence of three bursts 50, 51 and 52 transmitted in successive time slots encodes a symbol, which corresponds to a specific set of data. In preferred embodiments, each burst has a bandwidth of at least 2% of its center frequency, and more preferably at least 20% of its center frequency.

Figure 8:
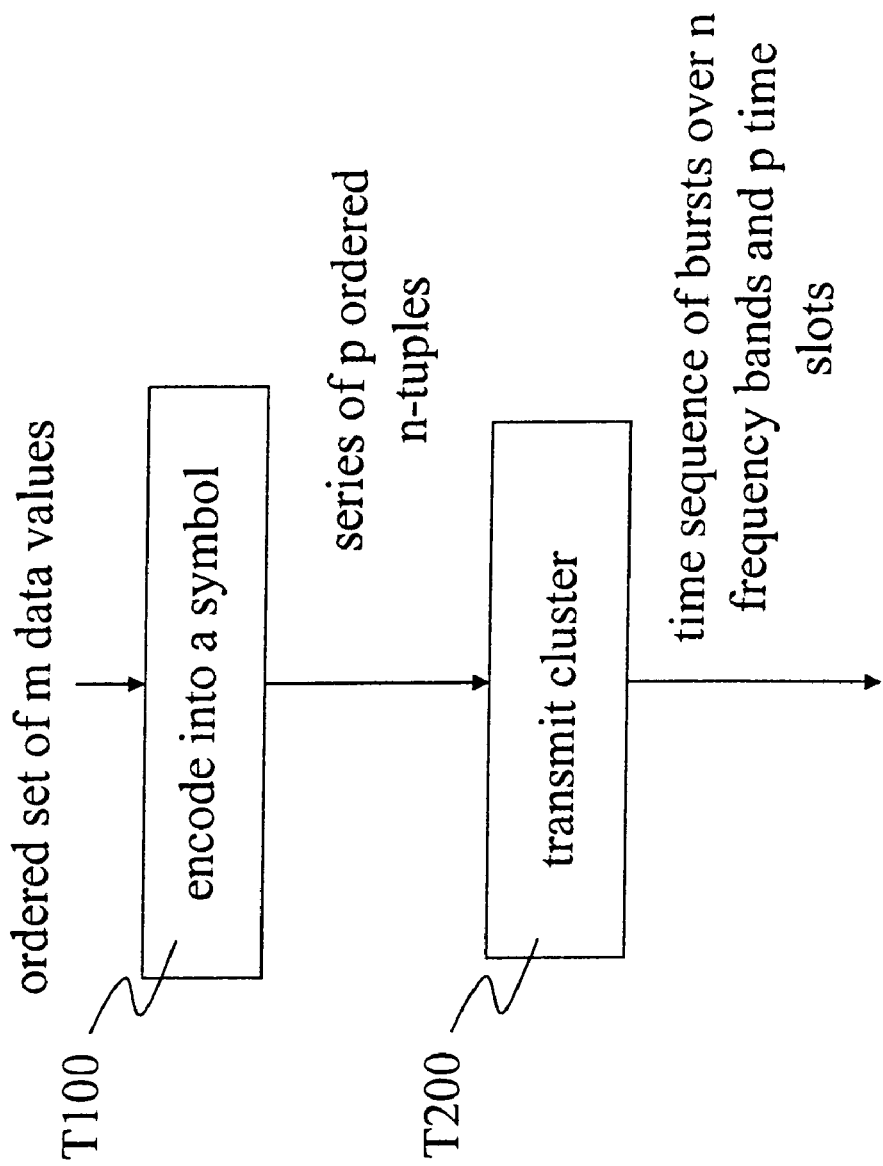
FIG. 8 shows a flowchart of a method according to an embodiment of the invention.

FIG. 8 shows a flowchart of a method according to an embodiment of the invention. Task T100 encodes an ordered set (e.g. ordered in time and/or place) of m data values (e.g. data bits) into a symbol that includes a series of p ordered n-tuples (where m and p are integers greater than zero, and n is an integer greater than one). Task T200 transmits the symbol as a cluster that includes a time sequence of bursts across n frequency bands and over p time slots. For example, task T200 may transmit the symbol such that the i-th element of each n-tuple corresponds to the i-th frequency band, and the j-th n-tuple corresponds to the j-th time slot. According to the particular application, overlap in time of bursts on different frequency bands may or may not be permitted in task T200.

In an operation of data transfer according to an implementation of this method, the (i,j)-th element of the series of n-tuples indicates activity on the i-th frequency band during the j-th time slot. In a base implementation, each element is binary-valued, such that its value indicates either a presence (e.g. '1' or 'high') or an absence (e.g. '0' or 'low') of a burst. In this base implementation, it is also assumed that a length of each burst is arbitrarily less than one time slot, that a polarity of each burst is constant or arbitrary, and that (e.g. for free space and optical applications) a polarization of the transmitted bursts is arbitrary. As discussed below, in other implementations additional information may be supplied (e.g. encoded within the series of n-tuples, or provided in addition to such series) to indicate such qualities of a burst or cluster as amplitude, width, polarity, and/or polarization.

Figure 9:
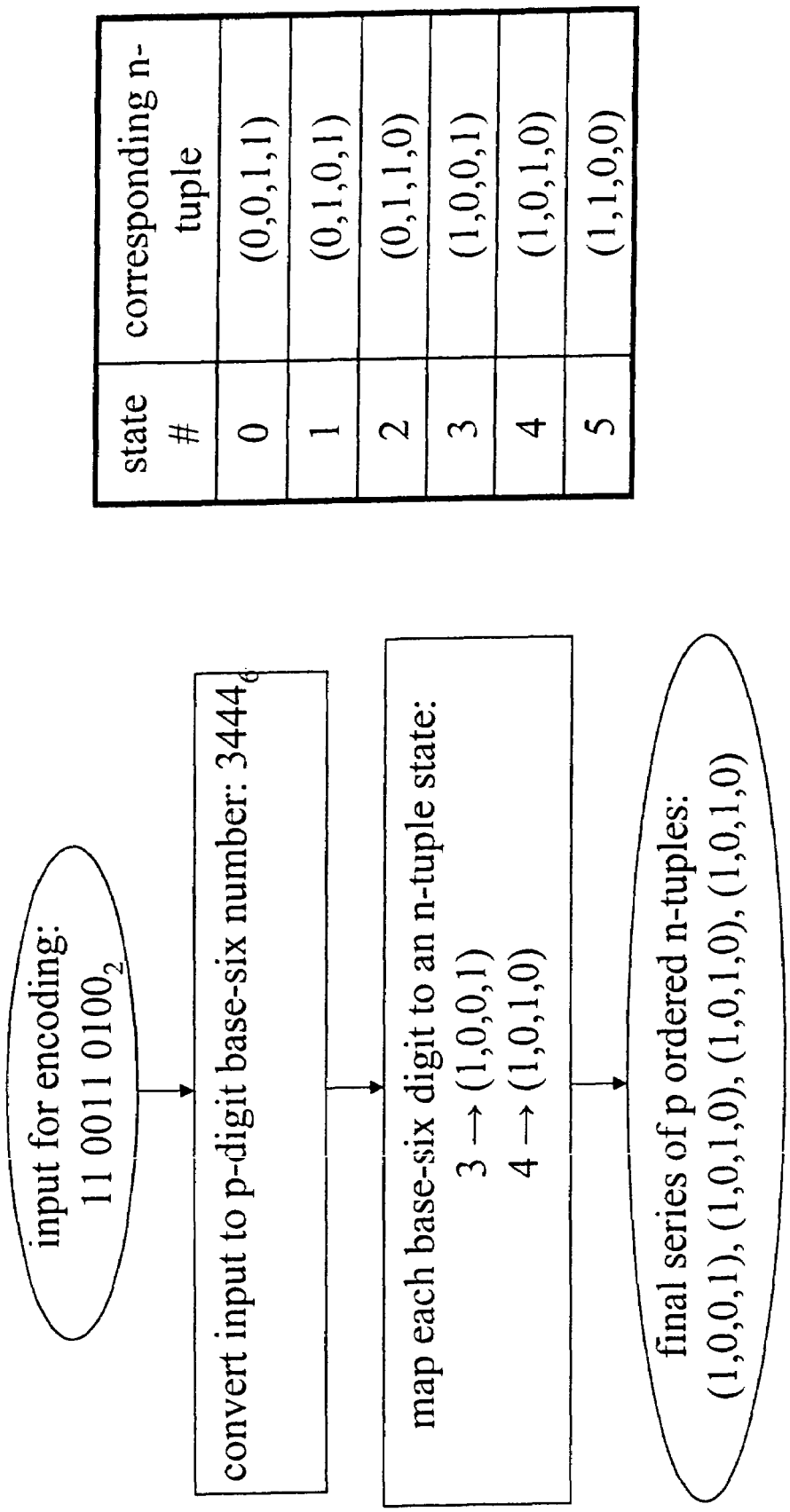
FIG. 9 shows one example of an ordered set of m data values and a corresponding series of ordered n-tuples.

Task T100 may be performed by mapping the ordered set of m data values into one of the possible symbol states for the selected encoding scheme. FIG. 9 illustrates such an encoding for one scheme in which each symbol has four n-tuples. In this particular example, the n-tuples are constrained such that two and only two elements of each n-tuple are high-valued, with the other values of the n-tuple being low-valued. Such a restriction may be observed in practice, for example, to maintain a constant or relatively constant level of energy during transmission of a stream of clusters across the transmission channel.

In such a scheme, each n-tuple has (four choose two) or six possible states, as set forth in the table in FIG. 9. The number of possible states for each symbol in this case is equal to the number of states per n-tuple, raised to the power of the number of time slots (here, $6^4$ or 1296 possible states).

FIG. 9 includes a flowchart that demonstrates an example of encoding a 10-bit binary number into a series of four ordered 4-tuples according to this scheme. By way of explanation, FIG. 9 shows this task as a two-step procedure. First, the input string is converted from a ten-digit number in base two to a four-digit number in base six. Second, each of the four digits of the base-six intermediate result is mapped to a corresponding n-tuple state as shown in the table, yielding the encoded symbol as a series of 4 ordered 4-tuples (the mapping shown in the table is only one of many possible different mappings). While in this example each n-tuple has a one-to-one correspondence with a digit of the base-six intermediate result, at least some of the elements of the n-tuples have a one-to-many correspondence with the values of the binary input string. Therefore, an n-tuple may represent information that relates to more than one of the input data values.

Note that the two-step procedure of FIG. 9 is shown by way of example only. In practice, task T100 may map the input set directly to a corresponding output series using, e.g., a lookup table or equivalent arrangement of combinatorial logic elements.

Figure 11:
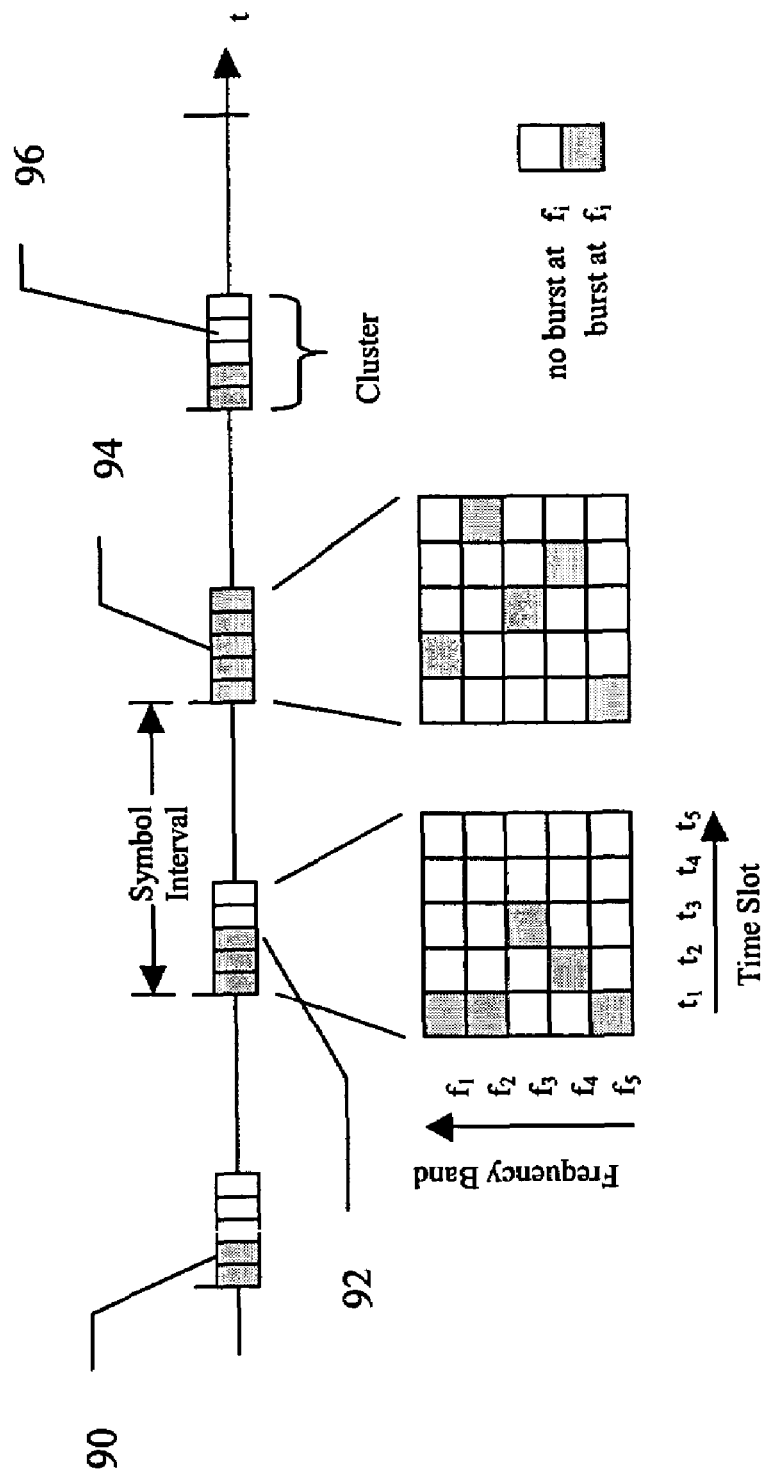
FIG. 11 shows another representation of a correspondence between encoded symbols and burst activity over time slots and across different frequency bands.

FIG. 10 shows a pictorial representation of the distribution of the symbol of FIG. 9 over corresponding frequency bands and time slots according to one possible distribution scheme. Note that this particular symbol indicates activity in frequency band one during all four time slots. Depending upon the application, this indication will correspond unambiguously to one burst that is active in four consecutive time slots, or to two bursts that are each active in two consecutive time slots (or respectively in one and three consecutive time slots), or to four bursts that are each active in one time slot. As noted above, we assume in this example that the indication corresponds to four separate bursts. FIG. 11 shows a similar representation of a sequence of clusters over time.

More specifically, FIG. 11 illustrates a sequence of multiband clusters of bursts, e.g., clusters 90, 92, 94 and 96 each composed of multiple bursts in different frequency bands with a cluster interval between the start of successive clusters. In this example, there are five available frequency bands, $f_1$, $f_2$, $f_3$, $f_4$ and $f_5$. Bursts (indicated in shaded time slots) are transmitted in one of five time slots in one of five frequency bands. In one embodiment, the time dependence of bursts across frequency for each cluster encodes a symbol, the symbol mapping to specific data. In cluster 92, it can be seen that multiple bursts may be transmitted at the same time (i.e., three bursts are transmitted in the first time slot), while in cluster 94, only one burst is sent during each time slot. As described in more detail further below, this scheme may be varied in numerous ways. For example, the polarity, amplitude, width and/or polarization of each burst of a given cluster may be modulated to encode additional bits into the cluster.

In some schemes, the input set may have fewer possible states than the output symbol. In the scheme illustrated in FIG. 9, for example, each input set of 10 bits may have $2^{10}$ or 1024 different states, while each corresponding output symbol may have $6^4$ or 1296 different states. While the additional output states (272 states per symbol in this case) may be ignored in some applications, in other applications they may be used to carry information. For example, these states may be used to transfer information such as one or more additional data streams, possibly at a different data transfer rate.

In one example as applied to the scheme of FIG. 9, 256 of the 272 additional states are used to carry a different input stream of 8-bit words (each word having $2^8$ or 256 possible states), while the remaining 16 additional states could even be used to carry a third input stream of 4-bit words (each word having $2^4$ or 16 possible states). Alternatively, symbols not used for data can be used to convey control information from transmitter to receiver. For example, one or more otherwise unused symbol states can be used for synchronization or other timing purposes, to control a decoder initial state, to indicate a change in modulation scheme, etc. In some cases, one or more unmapped symbol states may be used to maintain signal activity or homogeneity (i.e. for transmission during a period when no input data is available for transfer).

In some applications, symbol states that are not mapped to input sets may be used for signal source identification. For example, one or more unused symbol states may be assigned to a transmitter for use as an identifier. A signal that includes this symbol or symbols may then be distinguished from the signals of other transmitters in the vicinity (e.g. minimizing false alarms due to interference from other transmitters or emitters). Transmitter identification may be used to support networking and transmitter location and position determination applications as disclosed herein.

In other applications, a label that distinguishes one transmitter from another may itself serve as the ordered set of m data values that is encoded to produce the symbol. In one such application, a transmitter is configured to transmit (e.g. at some predetermined interval) one or more clusters corresponding to its label. The location of the transmitter is then determined by comparing the arrival times of the cluster(s) at several (preferably three or more) receivers. An example system uses one or more low-cost, low-power versions of such a transmitter as 'smart tags', e.g. for tracking the locations of boxes in a warehouse. Additional location and position determination techniques and applications are discussed below.

In a basic modulation scheme according to an embodiment of the invention (hereinafter 'scheme A'), each time slot may have any number of bursts from zero to n. Therefore, each symbol may have $2^{np}$ different states. Such a scheme may be applied to synchronous or asynchronous operations, and the transmission channel may be wired, wireless, or optical (whether through free space or through fiber or another medium).

By varying such system parameters as the number of bursts permitted/required per time slot, the number of time slots per cluster, the number of frequency bands, whether the first time slot of a cluster is required to be occupied by at least one burst, and whether a cluster must include at least one burst in each frequency band, many different schemes may be designed to suit many different situations. For example, a scheme that maximizes data transfer rate may be adopted for a noise-free application, while a scheme that maximizes symbol tracking performance may be adopted for an asynchronous application, while a scheme that balances data transfer rate and error detection capability may be adopted for another application. Various example schemes as applied to the base implementation are described below.

In one such scheme, at least one burst occurs during each time slot, such that no time slot within a symbol is empty. Such a scheme may provide a benefit in asynchronous operations (e.g. easier tracking). In this example, each symbol may have $(2^n-1)^p$ different states.

In another scheme, one and only one burst occurs during each time slot. Such a scheme may support asynchronous operations and/or offer reduced power output, for example, at the cost of reduced rate of data transfer. Each symbol according to this example may have $n^p$ different states.

In another scheme, up to n bursts occur during each time slot, and exactly one burst occurs per frequency band per cluster (in this scheme, the number of time slots p is not less than the number of frequency bands n). The constraint of one burst per frequency band per cluster may provide better performance in environments prone to reflection or multipath interference. Such a scheme may also be expected to provide better error detection capability at the expense of a reduced data transfer rate. Each symbol according to this example may have $p^n$ different states (e.g. 100,000 different states for n=5 and p=10, or 3125 different states for n=p=5).

In another scheme, one and only one burst occurs during each time slot, and no more than one burst occurs per frequency band per cluster (in this scheme, the number of time slots p is not less than the number of frequency bands n). Each symbol in this example may have $n!/(n-p)!$ different states.

In one variation of the scheme above (one and only one burst per time slot, and no more than one burst per frequency band per symbol), the first time slot of a cluster is unavailable for data transfer. For example, such a variation may be used to implement a logical channelization scheme in which the active frequency in the first time slot identifies the particular logical channel over which the cluster is being transmitted. (Division of a physical channel into more than one logical channel, and other techniques for such division, are discussed in more detail below.) Each symbol in this example may have up to $(n-1)!/(n-p)!$ different data states.

In another scheme, no more than one burst occurs during each time slot, and exactly one burst occurs per frequency band per cluster (in this scheme, the number of time slots p is not less than the number of frequency bands n). This example scheme also includes the feature that the first time slot of each cluster is not empty; this feature (which may be especially useful in asynchronous applications) could be applied to provide a relative time reference at the receiver. In this case, each symbol may have up to $n(p-1)!/(p-n)!$ different states (e.g. 15,120 different states for n=5 and p=10, or 120 different states for n=p=5).

In another scheme, no more than one burst occurs during each time slot, no more than one burst occurs per frequency band per cluster, and the first time slot of each cluster is not empty (in this scheme, the number of time slots p is not less than the number of frequency bands n). In this case, the number of different states available for each symbol may be expressed as the sum over k ($1 \leq k \leq n$) of the number of clusters having bursts on exactly k frequency bands, or $$\sum_{k=1}^{n} \binom{n}{k} k \frac{(p-1)!}{(p-k)!}$$

(e.g. 27,545 different states for n=5 and p=10, or 1045 different states for n=p=5).

In another scheme, up to n bursts may occur during each time slot, exactly one burst occurs per frequency band per cluster, and the first time slot of each cluster is not empty (in this scheme, the number of time slots p is not less than the number of frequency bands n). In this case, the number of different states available for each symbol may be expressed as $$\sum_{k=1}^{n} \binom{n}{k} (p-1)^{n-k}$$

(e.g. 40,951 different states for n=5 and p=10, or 2101 different states for n=p=5).

In another scheme, up to n bursts may occur during each time slot, no more than one burst occurs per frequency band per cluster, and the first time slot of each cluster is not empty (in this scheme, the number of time slots p is not less than the number of frequency bands n). In this case, the number of different states available for each symbol may be expressed as $$\sum_{k=1}^{n} \binom{n}{k} \sum_{m=1}^{k} \binom{k}{m} (p-1)^{k-m}$$

(e.g. 61,051 different states for n=5 and p=10, or 4651 different states for n=p=5).

In another scheme, up to n bursts may occur during each time slot, no more than one burst occurs per frequency band per cluster, and each cluster includes at least one burst (i.e. no cluster is empty) (in this scheme, the number of time slots p is not less than the number of frequency bands n). In this case, the number of different states available for each symbol may be expressed as $$\sum_{k=1}^{n} \binom{n}{k} p^k$$

(e.g. 161,050 different states for n=5 and p=10, or 7775 different states for n=p=5).

In another scheme, up to r ($r \leq n$) bursts occur during each time slot, exactly one burst occurs per frequency band per cluster, and the first time slot of each cluster is not empty (in this scheme, the number of time slots p is not less than the number of frequency bands n). In this case, the number of different states available for each symbol may be expressed as nc(r,n,p) using the following recursive formula:

$$nc(r, nf, 1) = 1$$

$$nc(r, nf, ns) = \sum_{M(ns-1) \geq nf-s}^{\min(r,nf)} \binom{nf}{s} nc(M, nf - s, ns - 1),$$

where the parameter nf denotes the number of frequency bands still unassigned in the cluster; the parameter ns denotes the number of time slots remaining in the cluster; the constraint $M(ns-1) \geq (nf-s)$ requires that the product of the number of time slots that will remain and the maximum number of bursts per time slot is sufficiently large to permit assignment of the frequency bands that will remain; nc(A,B,C) denotes the number of combinations for up to A bursts per time slot, B frequency bands still unassigned in the cluster, and C time slots remaining in the cluster; and the parameter s1 has the value $$s1 = \begin{cases} 0, & ns < p \\ 1, & ns = p \end{cases}.$$

For such a scheme in which each symbol has five n-tuples, the number of different states available for each symbol is indicated in the following table as a function of n and r:

|       | r = 1 | r = 2 | r = 3 | r = 4 | r = 5 |
|-------|-------|-------|-------|-------|-------|
| n = 1 | 1     | —     | —     | —     | —     |
| n = 2 | 8     | 9     | —     | —     | —     |
| n = 3 | 36    | 60    | 61    | —     | —     |
| n = 4 | 96    | 336   | 368   | 369   | —     |
| n = 5 | 120   | 1620  | 2060  | 2100  | 2101  |

In another scheme, exactly one burst occurs per frequency band per cluster, the first time slot of each cluster is not empty, and from one to r bursts occur during each time slot until no unassigned frequency bands remain (in this scheme, the number of time slots p is not less than the number of frequency bands n). In this case, the number of different states available for each symbol may be expressed as nc(r,n,p) using the recursive formula above, except that s1=1 for any value of ns.

Again, it is noted that the number of states per symbol indicated for the above examples assumes without limitation that each element of each n-tuple is binary-valued. Variations of such schemes in which one or more elements of an n-tuple may have additional values are specifically contemplated and enabled herein.

Many other schemes may be implemented according to such principles. For example, in addition to variations to the base implementation as mentioned above, characteristics of such schemes may include a minimum number of time slots between bursts on the same frequency band (which minimum number may be different for different frequency bands), a maximum and/or minimum number of bursts during one time slot, a minimum number of time slots per burst, a maximum and/or minimum number of consecutive empty time slots, etc. Depending on its nature, a particular variation or characteristic may be applied during encoding of the data set and/or during transmission of the symbol.

As noted above, the duration of an individual burst may be longer or shorter than the corresponding time slot. For timing purposes, it may be desirable to synchronize the start of a burst with the start of the corresponding time slot. However, other timing schemes are possible.

Figure 12:
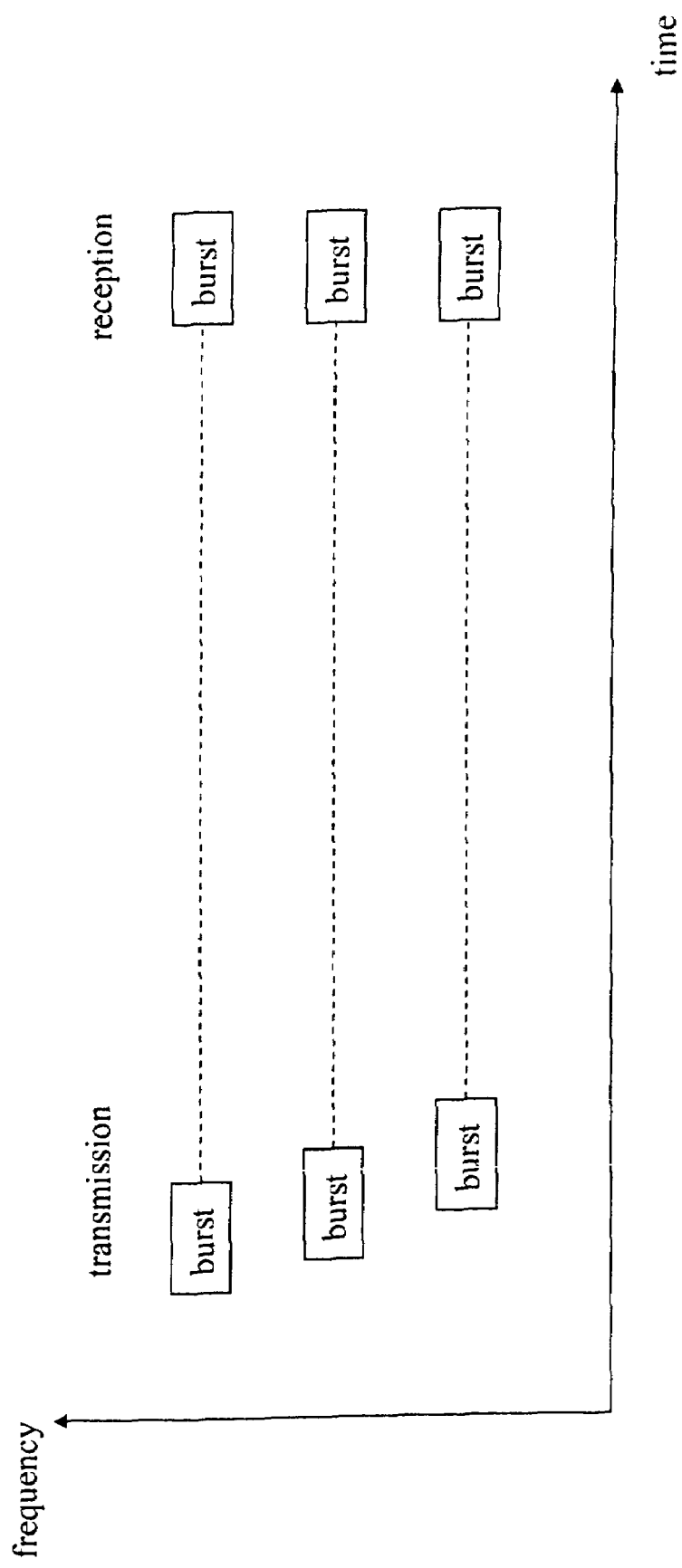
FIG. 12 shows a diagram of an application in which bursts in different frequency bands are transmitted at different times.

Bursts having one time relation that are transmitted over different frequency bands may propagate through a dispersive communications channel such that the bursts have a different time relation upon reception. For example, bursts at different frequency bands may be reflected differently in the environment, within the transmitter, within the receiver, etc. In some applications, the timing of burst transmissions among the various n frequency bands may be modified to adjust for expected propagation delays. For example, burst transmissions may be timed such that bursts within the same time slot may be expected to arrive at the receiver at substantially the same time. Such modification may be based on a prior determination (e.g. calculation and/or measurement) and/or may be performed adaptively during operation through a mechanism such as dynamic calibration. FIG. 12 shows a diagram of one such application in which bursts in higher frequency bands are transmitted earlier than bursts in lower frequency bands, according to an expected (e.g. calculated, calibrated, and/or observed) difference in propagation delay.

Figure 13:
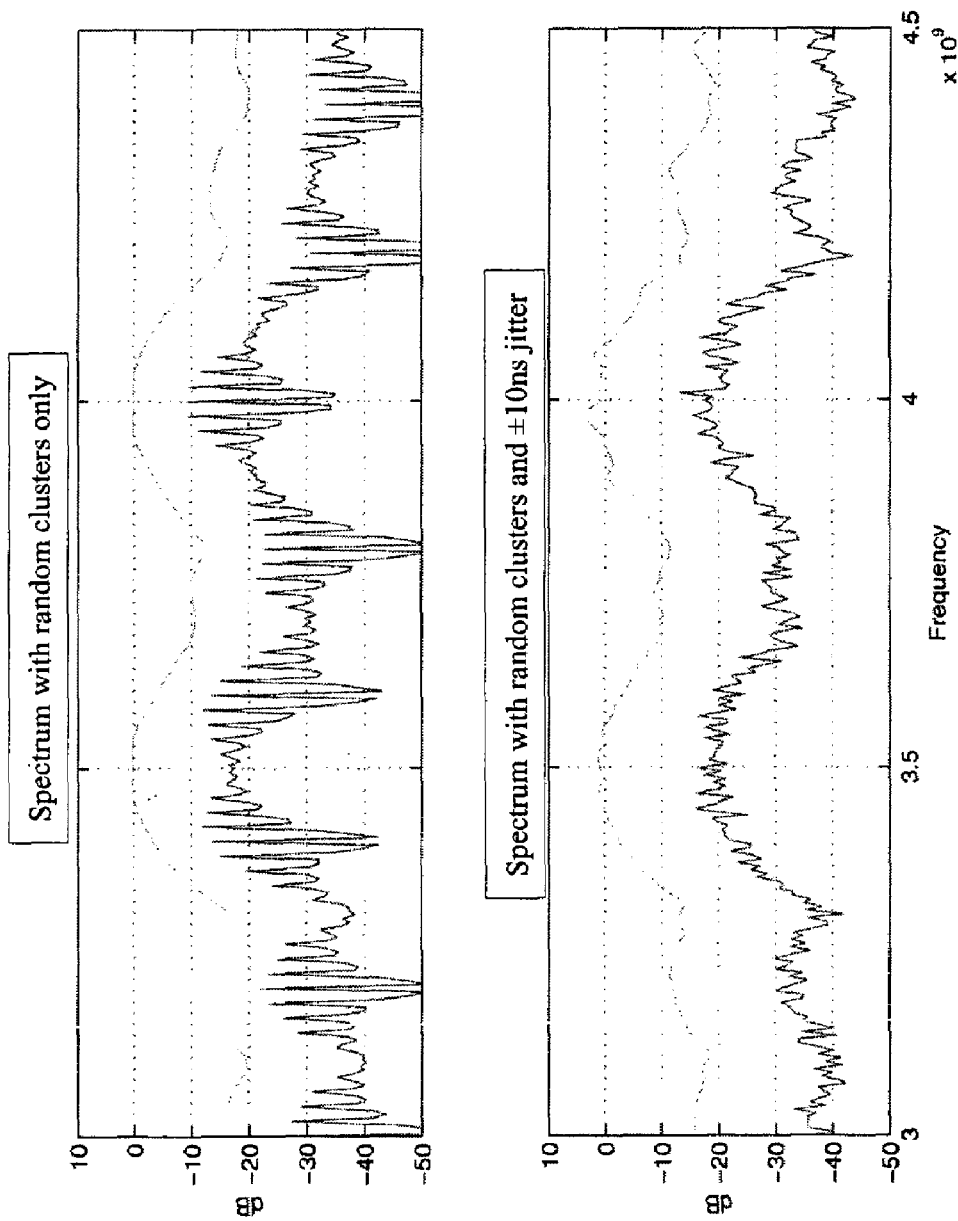
FIG. 13 shows an effect of random time perturbation in cluster transmission start time.

In another example, the addition of a random (or pseudo-random) time perturbation may reduce peak power levels on a nominally periodic train of symbols. FIG. 13 shows an effect of application of random delay perturbations (or 'jitter') to a simulated transmission of 100 clusters using frequency bands centered at 3.5 and 4 GHz, repeated 20 times, with two bursts per cluster, burst duration 5 ns, quiet time period 40 ns, and symbol interval 50 ns. The bottom plot shows the spectrum that occurs when the same train of clusters is sent using a random delay of ±10 ns.

In other implementations of a method according to several embodiments of the invention, one or more additional modulations may be added to the techniques described thus far to encode additional information (e.g., bits) into the transmitted bursts and/or clusters. For example, while one or more elements of a given n-tuple indicates which frequency band and timeslot to transmit a given burst within a cluster, one or more elements of the n-tuple indicate a modulation variation to be applied to a particular burst(s) and/or cluster. The number of possible symbol states in a particular modulation scheme (e.g. as configured at a particular time) may be a function of several parameters such as the number of frequency bands n and the number of time slots p. For example, the data transfer rate of a system may be effectively limited by the number of frequency bands n (with other parameters being fixed). In some cases, it may be desirable to add an additional or supplemental modulation to a modulation scheme as described or suggested herein to increase the number of data values that may be transferred during a designated time period. Examples of such additional or supplemental modulations include polarity, amplitude, width and polarization modulations.

According to one example, an element of the n-tuple (e.g., out of a series of n-tuples defining a symbol) indicates that a burst is to be transmitted during a given timeslot and in a given frequency band, while another element of the n-tuple indicates the polarity of the burst to be transmitted. The additional modulation (i.e., polarity modulation in this case) adds additional information to the transmitted cluster without transmitting additional bursts. Thus, advantageously, the additional modulation makes possible to encode additional bits of information into the transmitted signal (cluster), which can increase the data transfer rate of information within the same time period. Following are more detailed descriptions of additional modulations that may be applied or encoded into the transmitted signaling. It is understood that other additional modulations not specifically described may be added without departure from these embodiments of the invention.

Figure 13A:
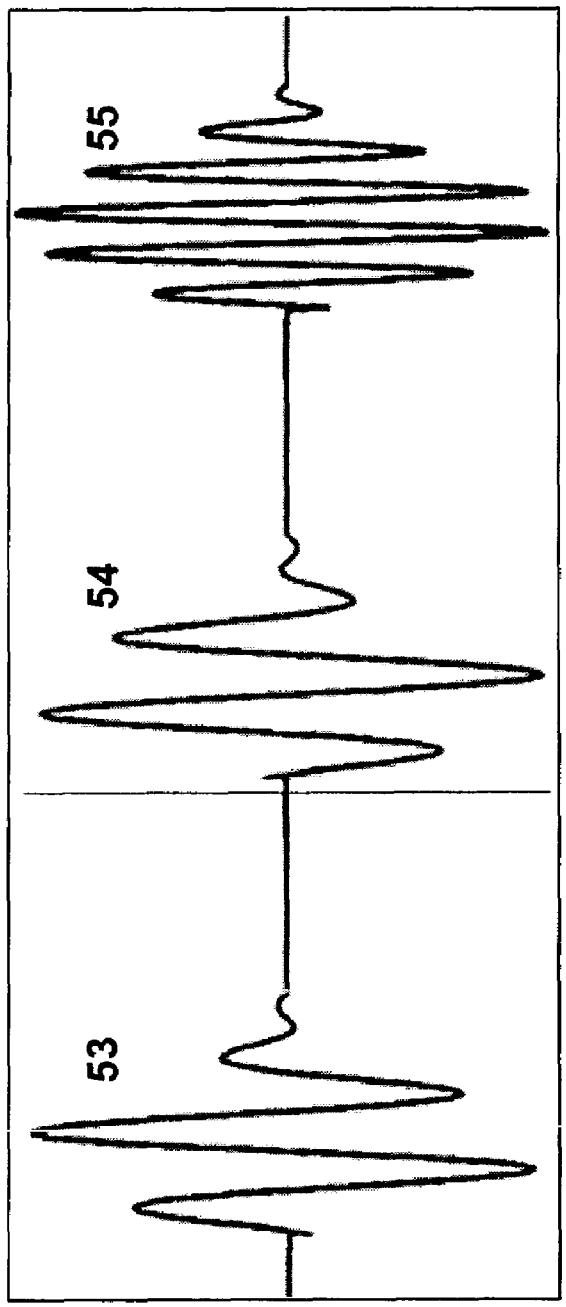
FIG. 13A shows a cluster including a sequence of bursts in time with polarity modulation to encode additional information into the cluster.

In other implementations of a method according to an embodiment of the invention, polarity modulation is used to additionally modulate the signal, e.g., a value of at least one element of a series of n-tuples indicates a polarity of the corresponding burst. FIG. 13A shows one example of a cluster that includes bursts that are polarity modulated. In this example, the first burst 53 of the cluster is centered at a first frequency, the second burst 54 is also centered at the first frequency but has a polarity opposite to that of the first burst, and the third burst 55 is centered at a second (higher) frequency. The third burst may have information encoded in its polarity or may have a preset or arbitrary polarity.

Polarity modulation may be applied in many different ways. For example, polarity modulation may be applied burst-wise. In an entirely burst-wise scheme, the polarity of each burst of a cluster is independently modulated, although some bursts may remain unmodulated. FIG. 13A shows an example of a cluster that is burst-wise polarity modulated.

Alternatively, polarity modulation may be applied other than burst-wise such that the polarity of one burst depends upon (or has a predetermined relation to) the polarity of at least one other burst. In one such scheme, all of the bursts of a cluster have the same polarity. It is also possible to implement a polarity modulation scheme that is both burst-wise with respect to some bursts and dependent with respect to other bursts. Two or more bursts having a dependent polarity relation need not be in adjacent frequency bands or time slots. Also, two or more bursts having a dependent polarity relation need not have the same polarity (e.g. a pair of bursts may be modulated to have opposite polarities).

Figure 13B:
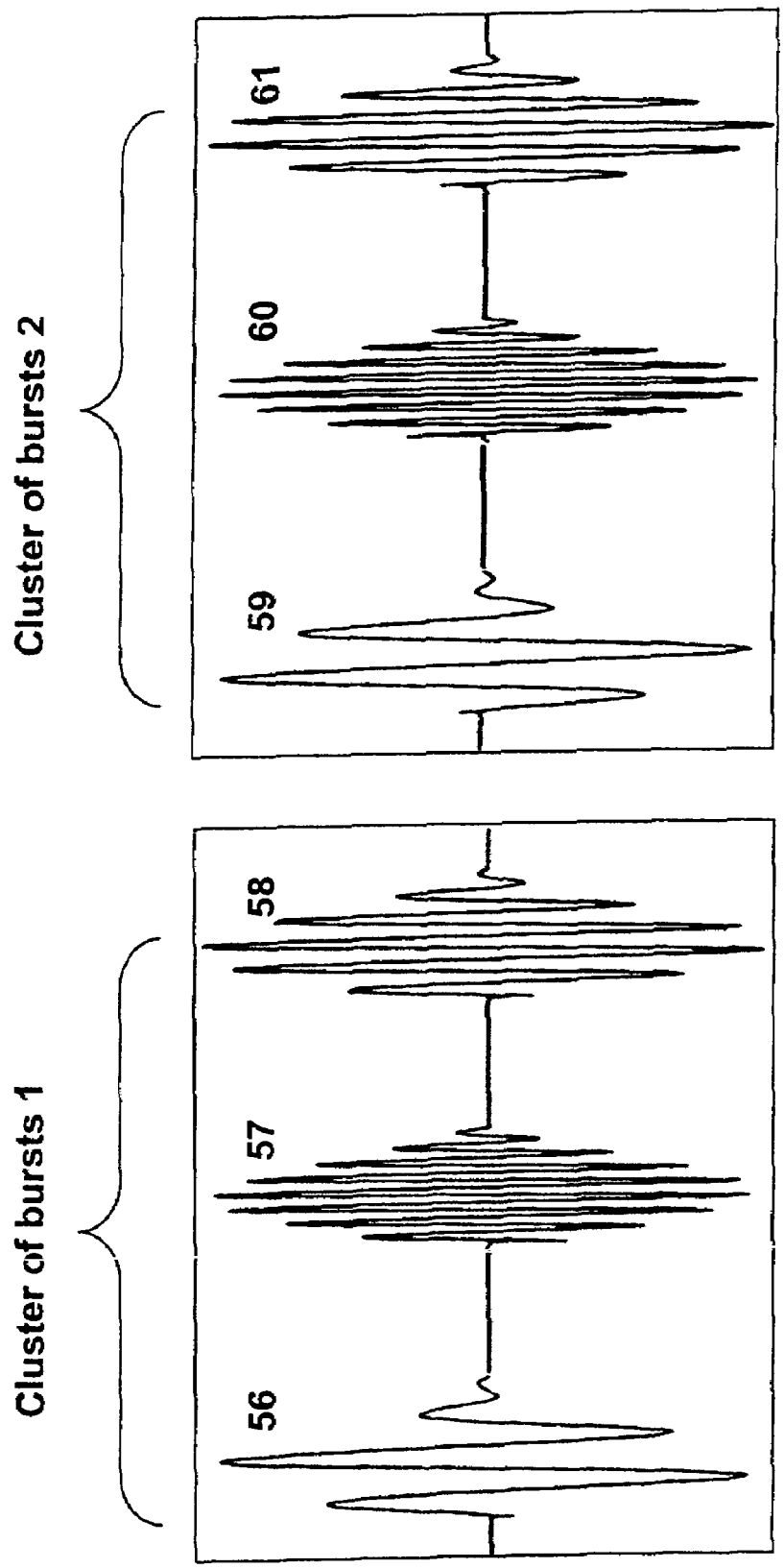
FIG. 13B shows two clusters of bursts, the bursts of the second cluster having a different polarity relative to the bursts of the first cluster.

FIG. 13B shows an example of two clusters having identical frequency content that are polarity modulated using a cluster-wise scheme. The first cluster includes three bursts (bursts 56, 57, 58) of different frequencies, each having a defined first polarity. The second cluster includes three bursts (bursts 59, 60, 61), each having the same frequency as the corresponding one of the first cluster but the opposite polarity. In a cluster-wise scheme, the polarity of each cluster may be independently modulated, or some clusters may remain unmodulated. Polarity modulation may also be applied other than cluster-wise such that the polarity of one cluster depends upon (or has a predetermined relation to) the polarity of at least one other cluster.

The number of possible symbol states in a particular modulation scheme (e.g. as configured at a particular time) may be a function of several parameters such as the number of frequency bands n and the number of time slots p. For example, the data transfer rate of a system may be effectively limited by the number of frequency bands n (with other parameters being fixed). In some cases, it may be desirable to add polarity modulation to a modulation scheme as described or suggested herein to increase the number of data values that may be transferred during a designated time period.

In scheme A as described above, each time slot may have any number of bursts from zero to n, and accordingly each symbol may have $2^{np}$, different possible states. Burst-wise polarity modulation may be added to this basic scheme to obtain a variation in which each symbol may have $3^{np}$ different possible states.

For a different modulation scheme in which a cluster includes exactly n frequency bursts over p time slots (hereinafter 'scheme B'), each symbol may have $n^p$ possible states. By adding burst-wise polarity modulation to such a scheme, the capability of the system may be increased to $(2n)^p$ possible states per symbol. If scheme B is applied to a particular example in which n=p=3, each symbol has $3^3$=27 possible states before polarity modulation and can encode four full bits of digital data, and after burst-wise polarity modulation each symbol has $(2\times3)^3=6^3=216$ possible states and can encode seven full bits of digital data.

Applying cluster-wise polarity modulation to scheme B increases the capability of each symbol to $2(n^p)$ possible states. If scheme B is applied to a particular example in which n=p=3, each symbol has $3^3$=27 possible states before polarity modulation and can encode four full bits of digital data, and after cluster-wise polarity modulation each symbol has $2\times(3)^3$=54 possible states and can encode five full bits of digital data.

As mentioned above, a scheme having a constraint of one burst per frequency band per cluster may provide better performance in an environment prone to reflection or multipath interference (such as terrestrial free space) than a scheme that does not observe such a constraint. A scheme having this constraint may also be expected to provide better error detection capability at the expense of a reduced data transfer rate.

In one variation of such a scheme, a further constraint of one and only one burst per time slot is also applied, with the number of time slots p being not less than the number of frequency bands n (hereinafter 'scheme C'). Each symbol in this scheme may have p!/(p−n)! different states.

For the particular case of scheme C in which n=p, each symbol may have n! possible states. By applying burst-wise polarity modulation to this instance of scheme C, an implementation having $n!2^n$ possible states per symbol may be obtained. For n=p=3, each symbol under scheme C may have six possible states and can encode two full bits of digital data. By applying burst-wise polarity modulation, the capacity of each symbol increases to 48 states, such that each symbol can encode five full bits of digital data.

By applying cluster-wise polarity modulation to the (n=p) instance of scheme C, an implementation having n!2 possible states per symbol may be obtained. For n=3, each symbol under this instance of scheme C may have six possible states and can encode two full bits of digital data. By applying cluster-wise polarity modulation, the capacity of each symbol increases to 12 states, such that each symbol can encode three full bits of digital data.

The examples of polarity modulation described above assume that a burst may have three states with respect to a particular time slot: absent, present with a first polarity, or present with a second polarity opposite to the first polarity. In some implementations, it may be desirable to restrict the allowed states of some or all bursts. For example, it may be desirable for a burst to be always present with respect to a particular time slot, such that the burst is allowed to have only the two polarity states. In another example, it may be desirable to restrict some bursts to have only the absent and first polarity states, while other bursts are restricted to have only the absent and second polarity states. Such implementations may be desirable for purposes such as synchronization, channel power uniformity, and/or coding design.

In a system employing polarity modulation, it may be desirable for a transmitter to transmit one or more bursts of predetermined polarity to provide a polarity reference. For example, the polarity of a burst within a cluster may be assigned with respect to the first burst of the cluster. Dynamic comparison of a received burst or cluster to one or more previously received bursts or clusters may also be used to determine a polarity state that has been distorted during propagation through the transmission channel. Alternatively, polarity modulation may be applied using a channel coding scheme (such as Walsh coding) to resolve ambiguity in the polarity of the received bursts without the need for a polarity reference.

In other implementations of a method according to an embodiment of the invention, amplitude modulation is used to additionally modulate the signal, e.g., at least one element of the series of n-tuples has one of q distinct values, such that its value indicates an amplitude of the corresponding burst. Such amplitude modulation may be added to a scheme as described or suggested above to increase the number of data values that may be transferred during a designated time period. Adding burst-wise amplitude modulation to scheme A, for example, may result in a system in which each symbol has $q^{np}$ different possible states.

Figure 13C:
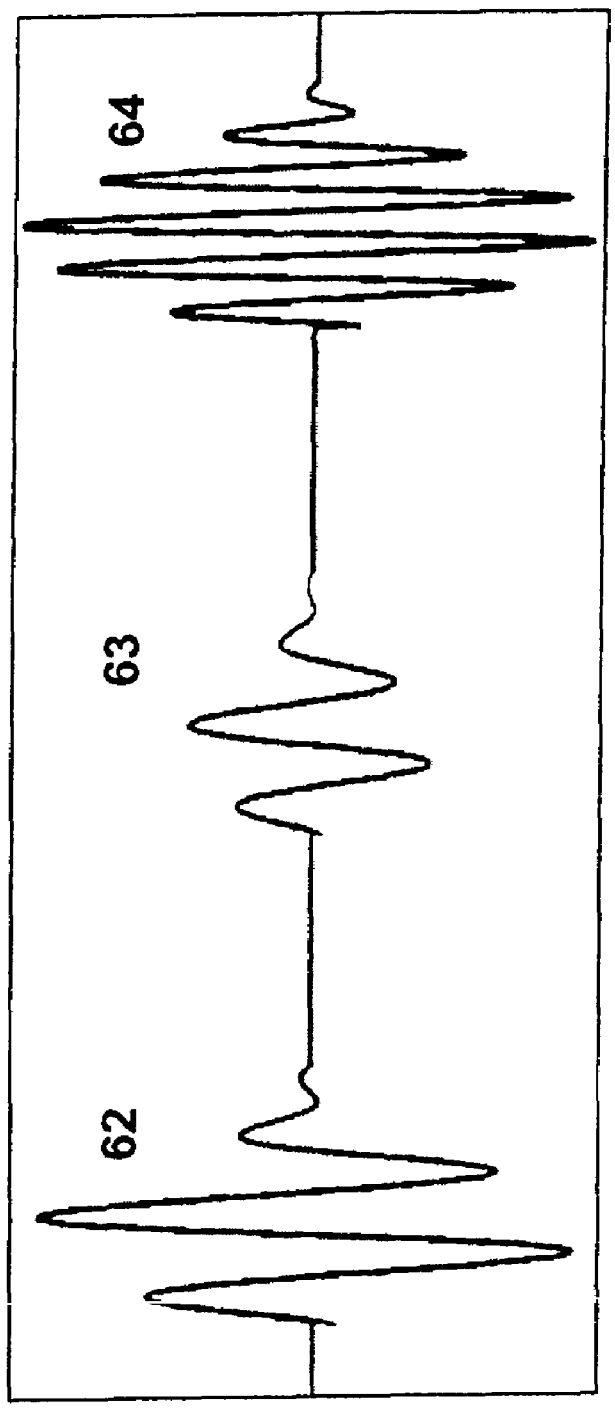
FIG. 13C shows a cluster including a sequence of bursts in time with amplitude modulation to encode additional information into the cluster.

FIG. 13C shows one example of a cluster that includes bursts that are amplitude modulated. In this example, the first burst 62 of the cluster is centered at a first frequency, the second burst 63 is also centered at the first frequency but has an amplitude that is one-half the amplitude of the first burst, and the third burst 64 is centered at a second (higher) frequency and has the same amplitude as the first burst. The third burst may have information encoded in its amplitude or may have a preset or arbitrary amplitude.

Amplitude modulation may be applied in many different ways. For example, amplitude modulation may be applied burst-wise. In an entirely burst-wise scheme, the amplitude of each burst of a cluster is independently modulated, although some bursts may remain unmodulated. FIG. 13C shows an example of a cluster that is burst-wise amplitude modulated.

Alternatively, amplitude modulation may be applied other than burst-wise such that the amplitude of one burst depends upon (or has a predetermined relation to) the amplitude of at least one other burst. In one such scheme, all of the bursts of a cluster have the same amplitude. It is also possible to implement an amplitude modulation scheme that is both burst-wise with respect to some bursts and dependent with respect to other bursts. Two or more bursts having a dependent amplitude relation need not be in adjacent frequency bands or time slots. Also, two or more bursts having a dependent amplitude relation need not have the same amplitude (e.g. a pair of bursts may be modulated to have related but different amplitudes).

Figure 13D:
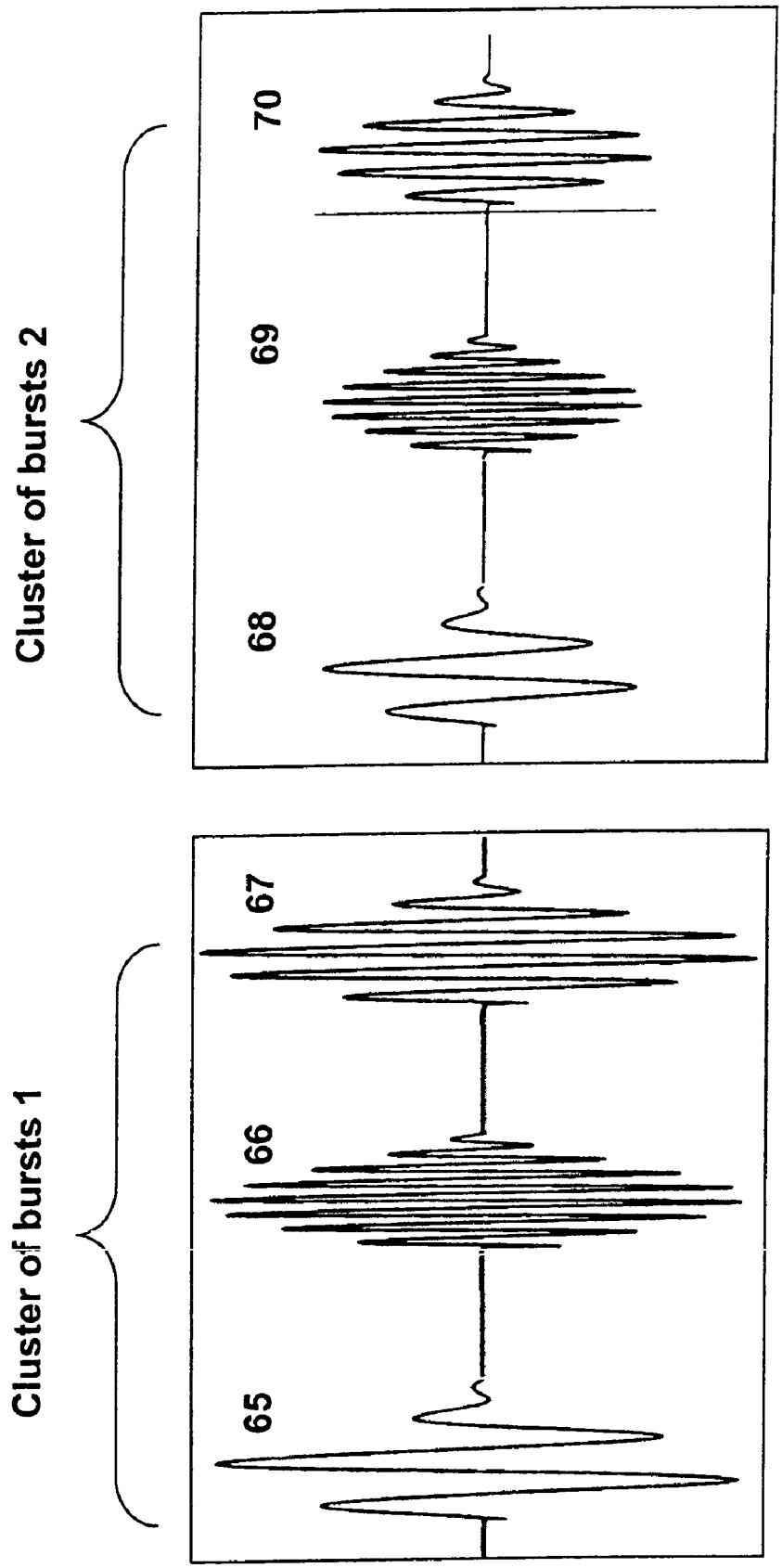
FIG. 13D shows two clusters of bursts, the bursts of the second cluster having a different amplitude relative to the bursts of the first cluster.

FIG. 13D shows an example of two clusters having identical frequency content that are amplitude modulated using a cluster-wise scheme. The first cluster includes three bursts (bursts 65, 66, 67) of different frequencies, each having a defined first amplitude. The second cluster includes three bursts (bursts 68, 69, 70), each having the same frequency as the corresponding one of the first cluster but a second amplitude lower than the first amplitude. In a cluster-wise scheme, the amplitude of each cluster may be independently modulated, or some clusters may remain unmodulated. Amplitude modulation may also be applied other than cluster-wise such that the amplitude of one cluster depends upon (or has a predetermined relation to) the amplitude of at least one other cluster.

In scheme B as described herein, each symbol may have $n^p$ possible states. By adding burst-wise amplitude modulation to such a scheme, the capability of the system may be dramatically increased to $(nq)^p$ possible states, where q is the number of distinct amplitude levels employed. If scheme B is applied to a particular example in which n=p=3, each symbol has $3^3$=27 possible states before amplitude modulation and can encode four full bits of digital data, and after two-level burst-wise amplitude modulation each symbol has $(2\times3)^3=6^3=216$ possible states and can encode seven full bits of digital data. A higher number of distinct amplitude levels may be used to further increase the number of possible states per symbol.

Applying cluster-wise amplitude modulation to scheme B increases the capability of each symbol to $q(n^p)$ possible states. If scheme B is applied to a particular example in which n=p=3, each symbol has $3^3$=27 possible states before amplitude modulation and can encode four full bits of digital data, and after two-level cluster-wise amplitude modulation each symbol has $2\times(3)^3$=54 possible states and can encode five full bits of digital data. A higher number of distinct amplitude levels may be used to further increase the number of possible states per symbol.

In scheme C as described above, each symbol may have p!/(p−n)! different states, and if n equals p, then the possible states per symbol is n!. By applying burst-wise amplitude modulation to this particular instance of scheme C, an implementation having $n!q^n$ possible states per symbol may be obtained. For n=p=3, each symbol under this scheme may have six possible states and can encode two full bits of digital data. By applying two-level burst-wise amplitude modulation, the capacity of each symbol increases to 48 states, such that each symbol can encode five full bits of digital data.

By applying cluster-wise amplitude modulation to the (n=p) instance of scheme C, an implementation having n!q possible states per symbol may be obtained. For n=3, each symbol under this instance of scheme C may have six possible states and can encode two full bits of digital data. By applying two-level cluster-wise amplitude modulation, the capacity of each symbol increases to 12 states, such that each symbol can encode three full bits of digital data.

In a system employing amplitude modulation, it may be desirable for a transmitter to transmit one or more bursts of predetermined amplitude to provide an amplitude reference. For example, the amplitude of a burst within a cluster may be assigned with respect to the amplitude of the first burst of the cluster. Alternatively, one burst within a sequence of clusters may serve as a reference for the other bursts in the sequence.

Figure 13E:
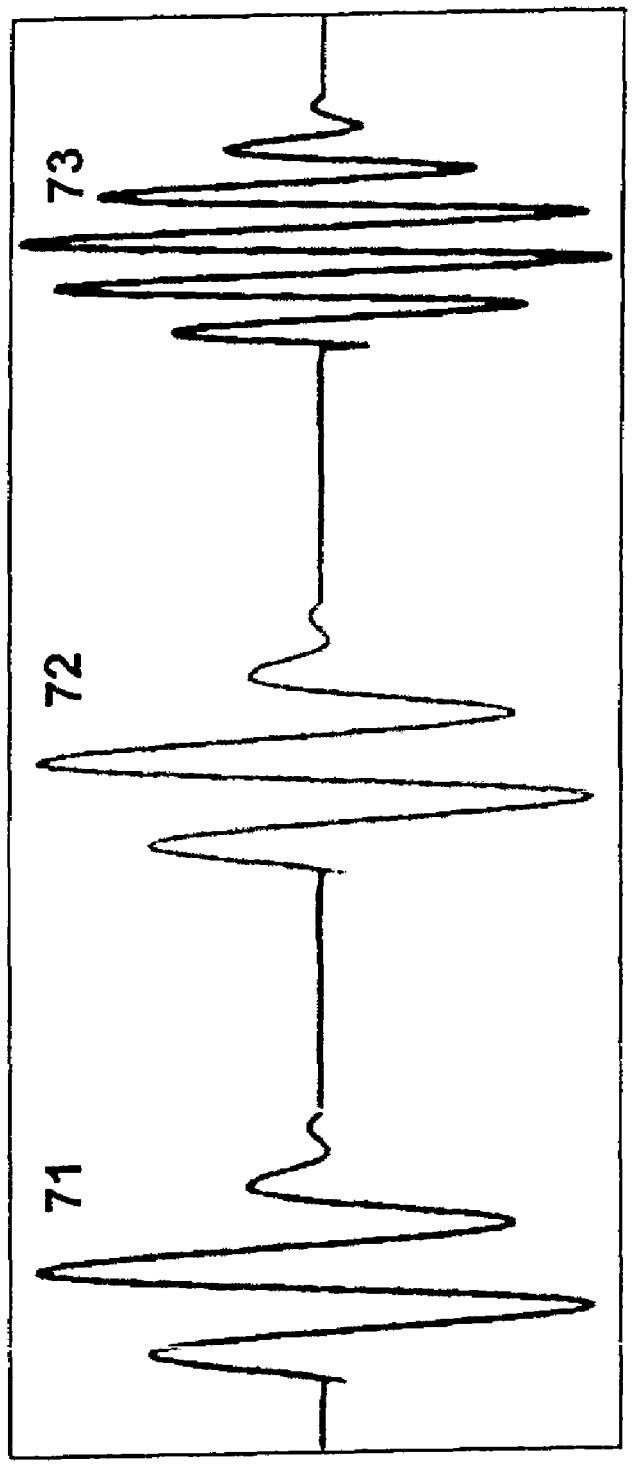
FIG. 13E shows a cluster including a sequence of bursts in time with polarization modulation to encode additional information into the cluster.

In other implementations of a method according to an embodiment of the invention, polarization modulation is used to additionally modulate the signal, e.g., a value of at least one element of a series of n-tuples indicates a polarization of the corresponding burst (e.g. vertical, horizontal, left-hand circular, right-hand circular, etc.). FIG. 13E shows one example of a cluster that includes bursts that are polarization modulated. In this example, the first burst 71 of the cluster is centered at a first frequency, the second burst 72 is also centered at the first frequency but has a polarization different from that of the first burst, and the third burst 73 is centered at a second (higher) frequency. The third burst may have information encoded in its polarization or may have a preset or arbitrary polarization.

Polarization modulation may be applied in many different ways. For example, polarization modulation may be applied burst-wise. In an entirely burst-wise scheme, the polarization of each burst of a cluster is independently modulated, although some bursts may remain unmodulated. FIG. 13E shows an example of a cluster that is burst-wise polarization modulated.

Alternatively, polarization modulation may be applied other than burst-wise such that the polarization of one burst depends upon (or has a predetermined relation to) the polarization of at least one other burst. In one such scheme, all of the bursts of a cluster have the same polarization. It is also possible to implement a polarization modulation scheme that is both burst-wise with respect to some bursts and dependent with respect to other bursts. Two or more bursts having a dependent polarization relation need not be in adjacent frequency bands or time slots. Also, two or more bursts having a dependent polarization relation need not have the same polarization (e.g. a pair of bursts may be modulated to have orthogonal polarizations).

Figure 13F:
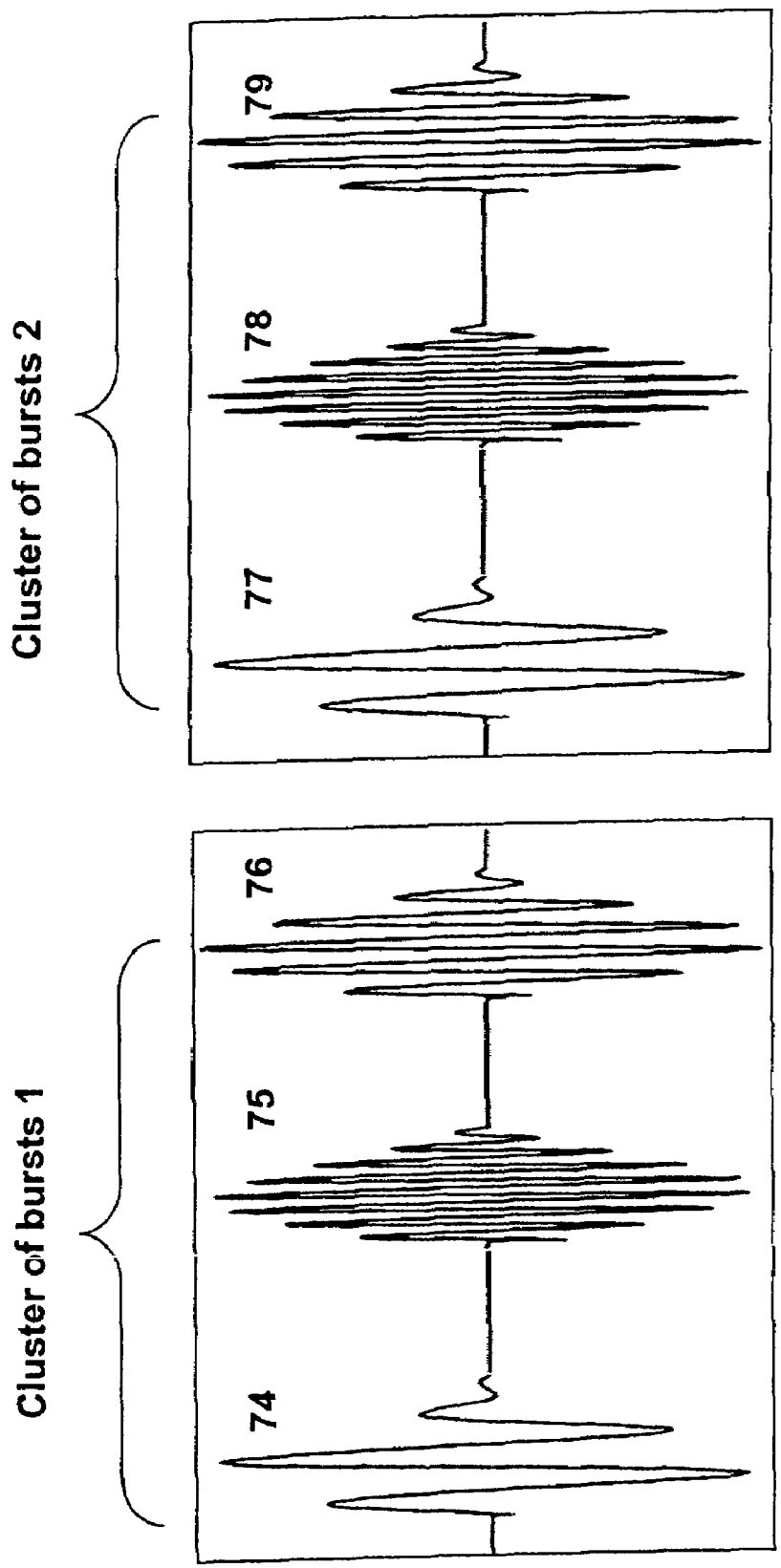
FIG. 13F shows two clusters of bursts, the bursts of the second cluster having a different polarization relative to the bursts of the first cluster.

FIG. 13F shows an example of two clusters having identical frequency content that are polarization modulated using a cluster-wise scheme. The first cluster includes three bursts (bursts 74, 75, 76) of different frequencies, each having a defined first polarization. The second cluster includes three bursts (bursts 77, 78, 79), each having the same frequency as the corresponding one of the first cluster but a different polarization. In a cluster-wise scheme, the polarization of each cluster may be independently modulated, or some clusters may remain unmodulated. Polarization modulation may also be applied other than cluster-wise such that the polarization of one cluster depends upon (or has a predetermined relation to) the polarization of at least one other cluster.

In some cases, it may be desirable to add polarization modulation to a modulation scheme as described or suggested herein to increase the number of data values that may be transferred during a designated time period. In scheme A as described above, each time slot may have any number of bursts from zero to n, and accordingly each symbol may have $2^{np}$ different possible states. Burst-wise polarization modulation may be added to this basic scheme to obtain a variation in which each symbol may have $v^{np}$ different possible states, where v denotes the number of different polarization states being implemented.

In scheme B as described above, each symbol may have $n^p$ possible states. By adding burst-wise polarization modulation to such a scheme, the capability of the system may be increased to $(vn)^p$ possible states per symbol. If scheme B is applied to a particular example in which n=p=3, each symbol has $3^3$=27 possible states before polarization modulation and can encode four full bits of digital data, and after two-state burst-wise polarization modulation (e.g. vertical/horizontal, or left-hand/right-hand circular) each symbol has $(2\times3)^3=6^3=216$ possible states and can encode seven full bits of digital data.

Applying cluster-wise polarization modulation to scheme B increases the capability of each symbol to $v(n^p)$ possible states. If scheme B is applied to a particular example in which n=p=3, each symbol has $3^3$=27 possible states before polarization modulation and can encode four full bits of digital data, and after two-state cluster-wise polarization modulation each symbol has $2\times(3)^3=54$ possible states and can encode five full bits of digital data.

In scheme C as described herein, each symbol may have p!/(p−n)! different states. For the particular case of scheme C in which n=p, each symbol may have n! possible states. By applying burst-wise polarization modulation to this instance of scheme C, an implementation having $n!v^n$ possible states per symbol may be obtained. For n=p=3, each symbol under scheme C may have six possible states and can encode two full bits of digital data. By applying two-state burst-wise polarization modulation, the capacity of each symbol increases to 48 states, such that each symbol can encode five full bits of digital data.

By applying cluster-wise polarization modulation to the (n=p) instance of scheme C, an implementation having n!v possible states per symbol may be obtained. For n=3, each symbol under this instance of scheme C may have six possible states and can encode two full bits of digital data. By applying two-state cluster-wise polarization modulation, the capacity of each symbol increases to 12 states, such that each symbol can encode three full bits of digital data.

The examples of two-state polarization modulation described above assume that a burst may have three states with respect to a particular time slot: absent, present with a first polarization, or present with a second polarization different from the first polarization. In some implementations, it may be desirable to restrict the allowed states of some or all bursts. For example, it may be desirable for a burst to be always present with respect to a particular time slot, such that the burst is allowed to have only the two polarization states. In another example, it may be desirable to restrict some bursts to have only the absent and first polarization states, while other bursts are restricted to have only the absent and second polarization states. Such implementations may be desirable for purposes such as synchronization, channel power uniformity, and/or coding design. Polarization modulation schemes that use more than two polarization states are also possible.

In a system employing polarization modulation, it may be desirable for a transmitter to transmit one or more bursts of predetermined polarization to provide a polarization reference. For example, the polarization of a burst within a cluster may be assigned with respect to the first burst of the cluster. Dynamic comparison of a received burst or cluster to one or more previously received bursts or clusters may also be used to determine a polarization state that has been distorted during propagation through the transmission channel. Alternatively, polarization modulation may be applied using a channel coding scheme (such as Walsh coding) to resolve ambiguity in the polarization of the received bursts without the need for a polarization reference.

In other implementations of a method according to an embodiment of the invention, width modulation is used to additionally modulate the signal, e.g., at least one element of the series of n-tuples has one of w distinct values, such that its value indicates a width of the corresponding burst. Such width modulation may be added to a scheme as described or suggested above to increase the number of data values that may be transferred during a designated time period. Adding burst-wise width modulation to scheme A, for example, may result in a system in which each symbol has $w^{np}$ different possible states.

Figure 13G:
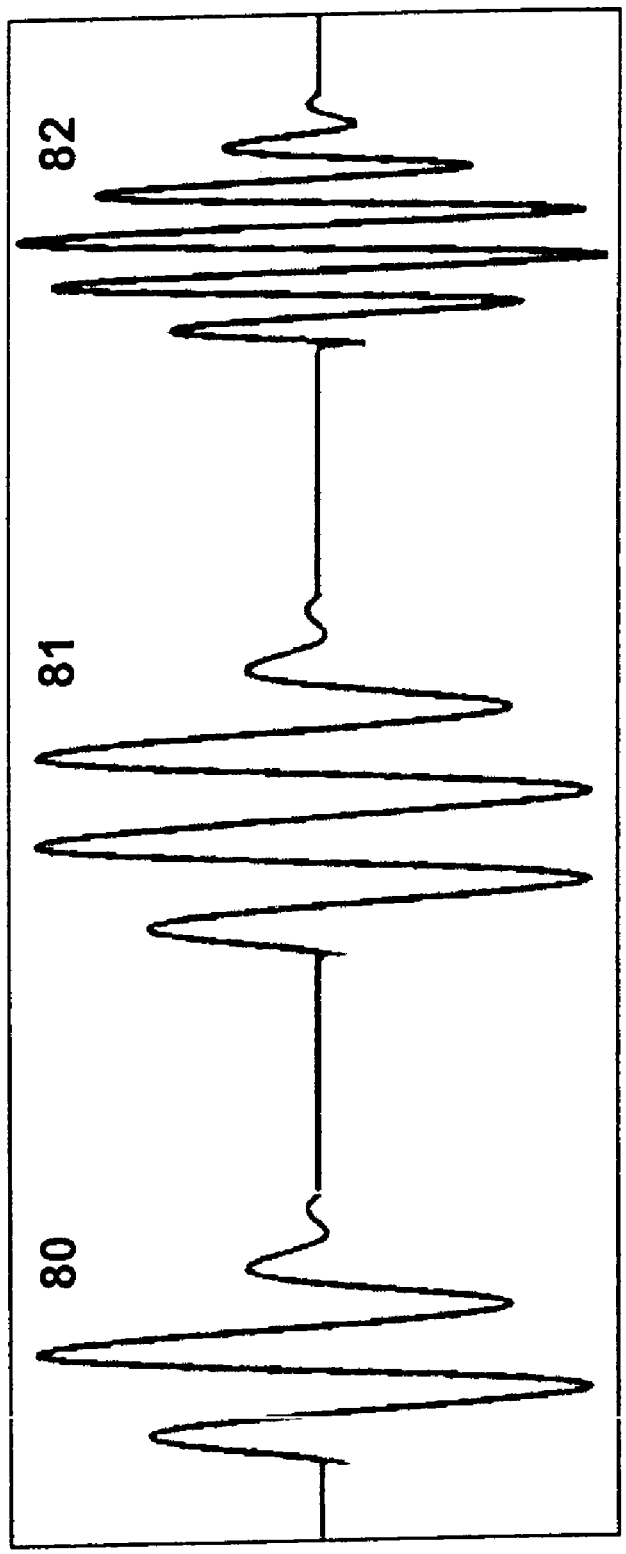
FIG. 13G shows a cluster including a sequence of bursts in time with width modulation to encode additional information into the cluster.

FIG. 13G shows one example of a cluster that includes bursts that are width modulated. In this example, the first burst 80 of the cluster is centered at a first frequency, the second burst 81 is also centered at the first frequency but has a width that is twice the width of the first burst, and the third burst 82 is centered at a second (higher) frequency and has the same width as the first burst. The third burst may have information encoded in its width or may have a preset or arbitrary width.

Width modulation may be applied in many different ways. For example, width modulation may be applied burst-wise. In an entirely burst-wise scheme, the width of each burst of a cluster is independently modulated, although some bursts may remain unmodulated. FIG. 13G shows an example of a cluster that is burst-wise width modulated.

Alternatively, width modulation may be applied other than burst-wise such that the width of one burst depends upon (or has a predetermined relation to) the width of at least one other burst. In one such scheme, all of the bursts of a cluster have the same width. It is also possible to implement an width modulation scheme that is both burst-wise with respect to some bursts and dependent with respect to other bursts. Two or more bursts having a dependent width relation need not be in adjacent frequency bands or time slots. Also, two or more bursts having a dependent width relation need not have the same width (e.g. a pair of bursts may be modulated to have related but different widths).

In scheme B as described herein, each symbol may have $n^p$ possible states. By adding burst-wise width modulation to such a scheme, the capability of the system may be dramatically increased to $(nw)^p$ possible states, where w is the number of distinct width levels employed. If scheme B is applied to a particular example in which n=p=3, each symbol has $3^3$=27 possible states before width modulation and can encode four full bits of digital data, and after two-level burst-wise width modulation each symbol has $(2\times3)^3=6^3=216$ possible states and can encode seven full bits of digital data. A higher number of distinct width values may be used to further increase the number of possible states per symbol.

In scheme C as described above, each symbol may have p!/(p−n)! different states, and if n equals p, then the possible states per symbol is n!. By applying burst-wise width modulation to this particular instance of scheme C, an implementation having $n!w^n$ possible states per symbol may be obtained. For n=p=3, each symbol under this scheme may have six possible states and can encode two full bits of digital data. By applying two-level burst-wise width modulation, the capacity of each symbol increases to 48 states, such that each symbol can encode five full bits of digital data.

In a system employing width modulation, it may be desirable for a transmitter to transmit one or more bursts of predetermined width to provide a width reference. For example, the width of a burst within a cluster may be assigned with respect to the width of the first burst of the cluster. Alternatively, one burst within a sequence of clusters may serve as a reference for the other bursts in the sequence.

It should be understood that width modulation may also be applied in a cluster-wise fashion as described above and illustrated in FIGS. 13B, 13D and 13F. In this embodiment, the bursts of the second cluster each have the same frequency as the corresponding one of the first cluster but a different width. In a cluster-wise scheme, the width of each cluster may be independently modulated, or some clusters may remain unmodulated. Width modulation may also be applied other than cluster-wise such that the width of one cluster depends upon (or has a predetermined relation to) the width of at least one other cluster.

From the above description, it is useful to note that any of these supplemental modulations may be combined to yield even more advanced modulation schemes. For example, one implementation may use burst-wise amplitude modulation combined with cluster-wise polarity modulation; another may use burst-wise polarity modulation combined with burst-wise width modulation; yet another may use burst-wise amplitude modulation combined with burst-wise width modulation and cluster-wise polarity modulation. In general, increasing the complexity of the waveform increases the number of possible states, thus improving system performance while increasing system complexity.

Figure 14:
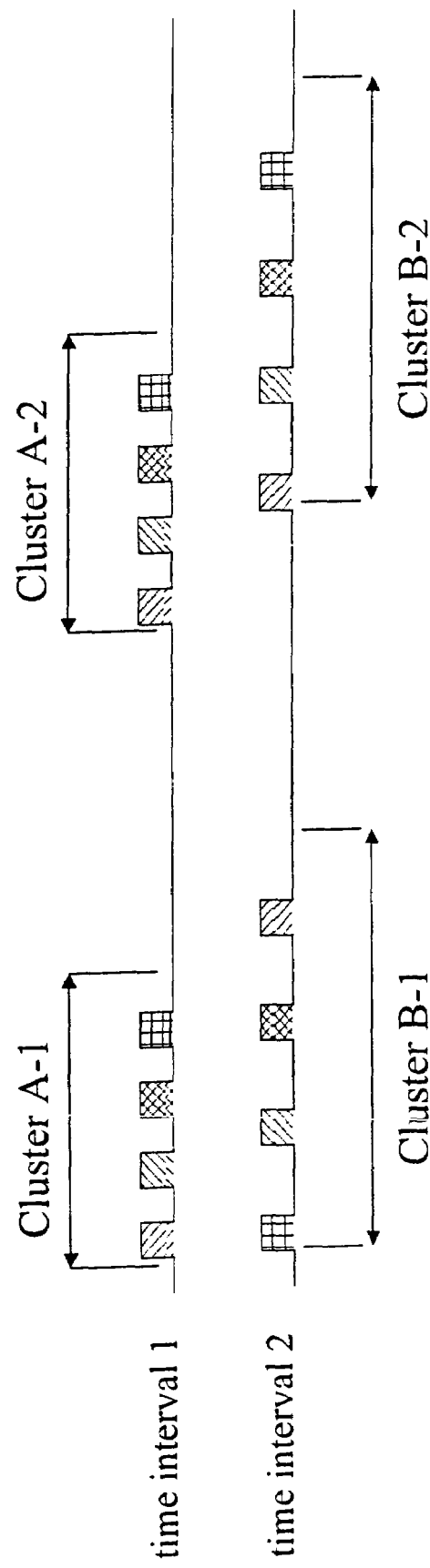
FIG. 14 shows an example of a scheme in which symbols for two different logical channels are transmitted over the same physical channel at different times.

In further implementations of a method according to an embodiment of the invention, channel information may be encoded into intervals between bursts and/or between clusters of bursts. FIG. 14 shows one example of such a scheme in which symbols for two different logical channels are transferred over the same physical channel at different times. The upper diagram illustrates a sequence of clusters [A-1 and A-2] transmitted over a first time interval on the first logical channel, which is characterized by an interval of one time slot between consecutive bursts. The lower diagram illustrates a sequence of clusters [B-1 and B-2] transmitted over a second time interval on the second logical channel, which is characterized by an interval of two time slots between consecutive bursts. A receiver may be configured to identify the particular logical channel associated with a received sequence of clusters. Alternatively, a receiver may be configured to ignore all but a limited set (e.g. of one or more) of logical channels.

Figure 15:
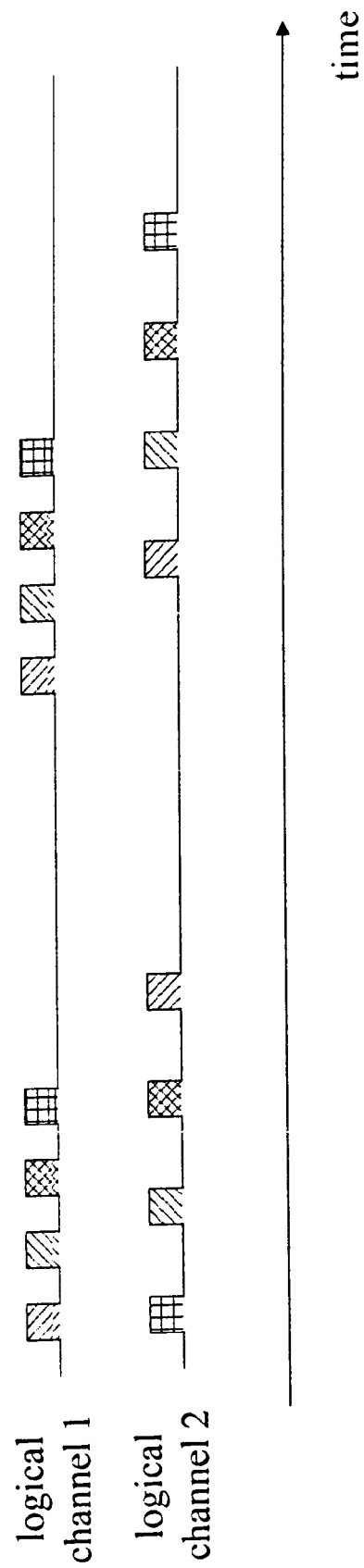
FIG. 15 shows an example of a scheme in which symbols for two different logical channels are transmitted over the same physical channel at the same time.

In some systems, the same physical channel may carry more than one logical channel at the same time. For example, different logical channels that carry bursts during the same time interval may be distinguished by the use of different frequencies and/or different combinations of frequencies. In a system in which transmission of bursts over different logical channels may be synchronized, each logical channel may also be distinguished by the number of time slots between consecutive bursts of a cluster. FIG. 15 shows one such example in which two logical channels are configured differently in terms of frequency and timing. In another scheme, the number of time slots between consecutive bursts of a cluster is a different prime number for each logical channel.

In the particular examples of FIGS. 14 and 15, the quiet time between clusters is the same on each logical channel, although in other schemes this period may vary from one logical channel to another. In a further example of a scheme including channelization, fewer than all of the pairs of consecutive bursts of a cluster (e.g. only the first and second bursts) are separated in time. In a yet further example of such a scheme, a width of one or more of the bursts of a cluster may identify the corresponding logical channel.

Figure 16:
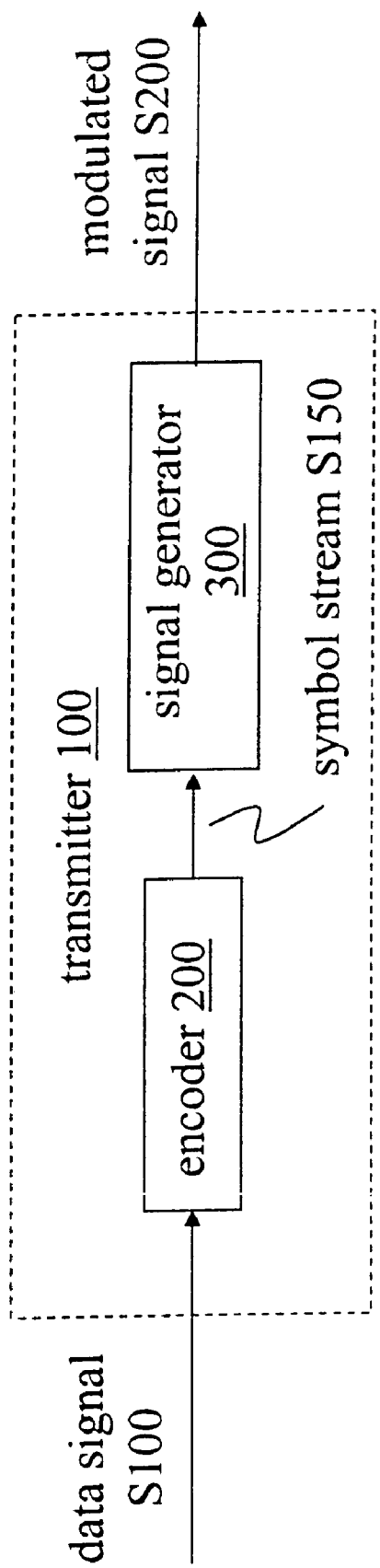
FIG. 16 shows a block diagram of a transmitter 100 according to an embodiment of the invention.

FIG. 16 shows a block diagram of a transmitter 100 according to an embodiment of the invention. Encoder 200 receives a data signal S100 that includes ordered data values (i.e. ordered in time and/or space) and outputs a symbol stream S150 based on signal S100 to signal generator 300. Specifically, encoder 200 maps ordered sets of m data values to corresponding symbols, each symbol including a series of p ordered n-tuples. Based on symbol stream S150, signal generator 300 outputs a modulated signal S200 that includes clusters of bursts (e.g. ultra-wideband bursts). In embodiments applying additional modulations (e.g., one or more of polarity, amplitude, width and polarization), the encoder preferably encodes the additional modulation into the symbol stream S150.

Figure 17:
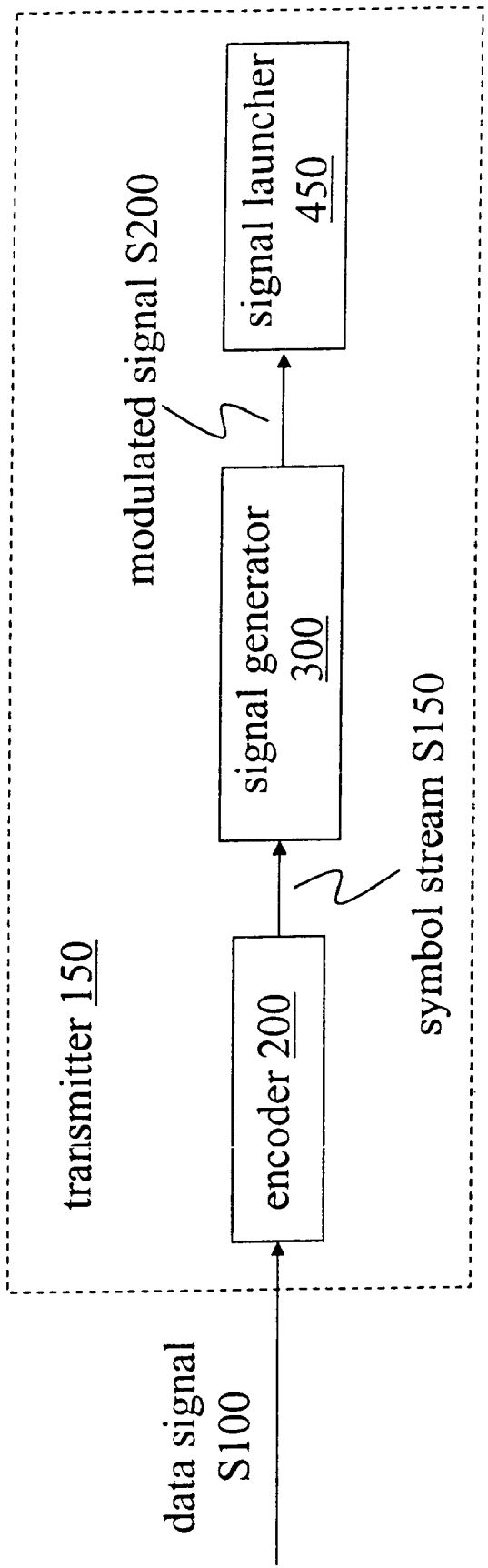
FIG. 17 shows a block diagram of an implementation 150 of transmitter 100.

FIG. 17 shows a block diagram of an implementation 150 of transmitter 100 that includes a signal launcher 450 having sufficient instantaneous bandwidth to transfer the desired waveform. Signal launcher 450, which transfers modulated signal S200 to the transmission medium, may include one or more elements such as filters and impedance-matching components (e.g. coils or transformers) or structures. Implementations of signal launcher 450 may also include one or more amplifiers (e.g. power amplifiers) for such purposes as increasing signal level.

For wireless transmission of clusters, signal launcher 450 may also include an antenna. In certain cases, the antenna may be embedded into a device that includes transmitter 100 or even integrated into a package (e.g. a low-temperature co-fired ceramic package) that includes components of transmitter 100 and/or signal launcher 450.

For transmission of clusters through a conductive medium (e.g. a wire, cable, or bus having one or more conductors, a conductive structure, another conductive medium such as sea or ground water, or a series of such conductors), signal launcher 450 may include one or more elements such as components for electrostatic protection (e.g. diodes), current limiting (e.g. resistors), and/or direct-current blocking (e.g. capacitors).

For transmission of clusters through an optical medium (e.g. one or more optical fibers or other transmissive structures, an atmosphere, a vacuum, or a series of such media), signal launcher 450 may include one or more radiation sources controllable in accordance with the clusters to be transmitted such as a laser or laser diode or other light-emitting diode or semiconductor device.

Figure 18:
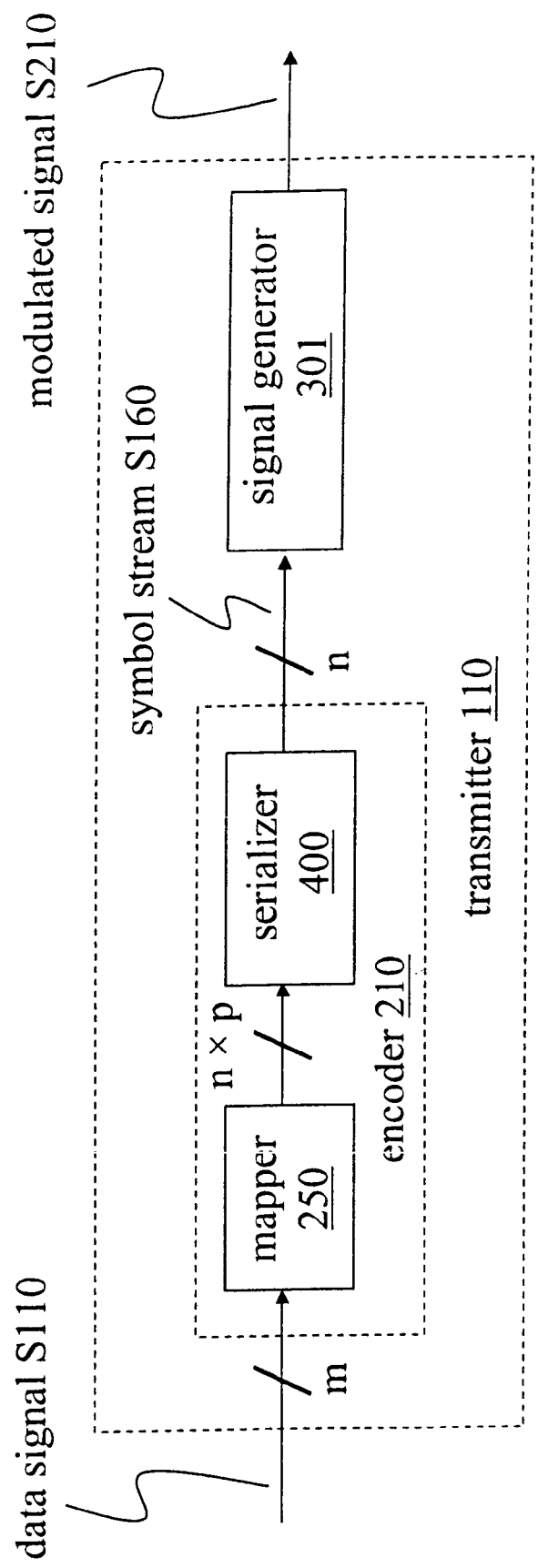
FIG. 18 shows a block diagram of an implementation 110 of transmitter 100.

FIG. 18 shows a block diagram of an implementation 110 of transmitter 100 that includes an implementation 210 of encoder 200 (having a mapper 250 and a serializer 400) and an implementation 301 of signal generator 300. Mapper 250 receives an m-unit parallel data signal S110 and produces a corresponding (n×p)-unit parallel encoded signal according to a predetermined mapping. For example, mapper 250 may be constructed to receive an m-bit parallel data signal and produce a corresponding (n×p)-bit parallel encoded signal.

In one implementation, mapper 250 may include a lookup table that maps an m-unit input value to an n×p-unit output value. Alternatively, mapper 250 may include an array of combinational logic that executes a similar predetermined mapping function. In another application, the predetermined mapping function applied by mapper 250 may be changed from time to time (e.g. by downloading a new table or selecting between more than one stored tables or arrays). For example, different channel configurations (e.g. different sets of frequency bands) may be allocated in a dynamic fashion among implementations of transmitter 100 that share the same transmission medium.

Serializer 400 receives the (n×p)-unit parallel encoded signal and serializes the signal to output a corresponding n-unit (e.g. n-bit) implementation S160 of symbol stream S150 to signal generator 301 (e.g. at a data rate that is p or more times higher than the data rate of the parallel encoded signal). Signal generator 300 outputs a modulated signal S210 based on symbol stream S160.

Figure 19:
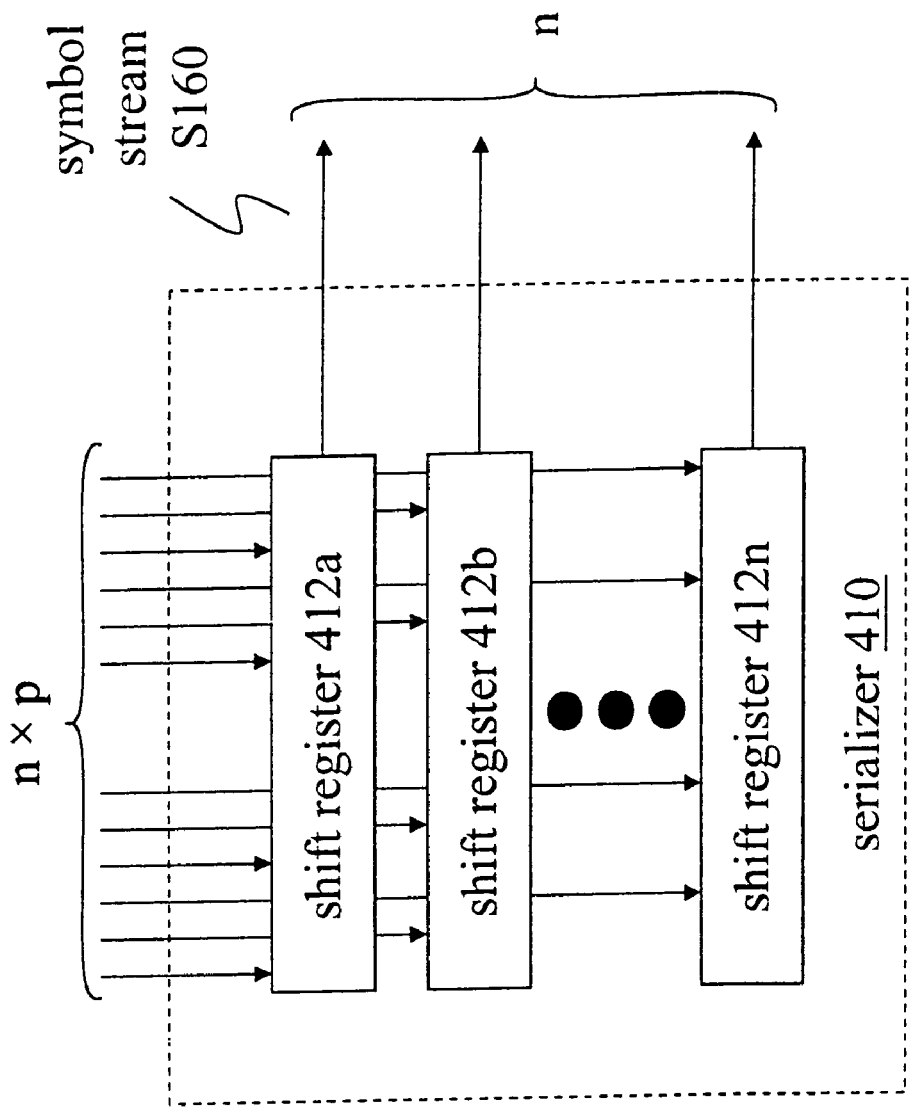
FIG. 19 shows a block diagram of an implementation 410 of serializer 400.

FIG. 19 shows an implementation 410 of serializer 400 that includes n shift registers 412. Upon assertion of a common load signal (not shown), each shift register 412 stores a different p-unit coset of the n×p-unit encoded signal. In one example, the p units stored in each shift register 412 are then shifted out (e.g. according to a common clock signal) as a series of p n-tuples to signal generator 301.

Figure 20:
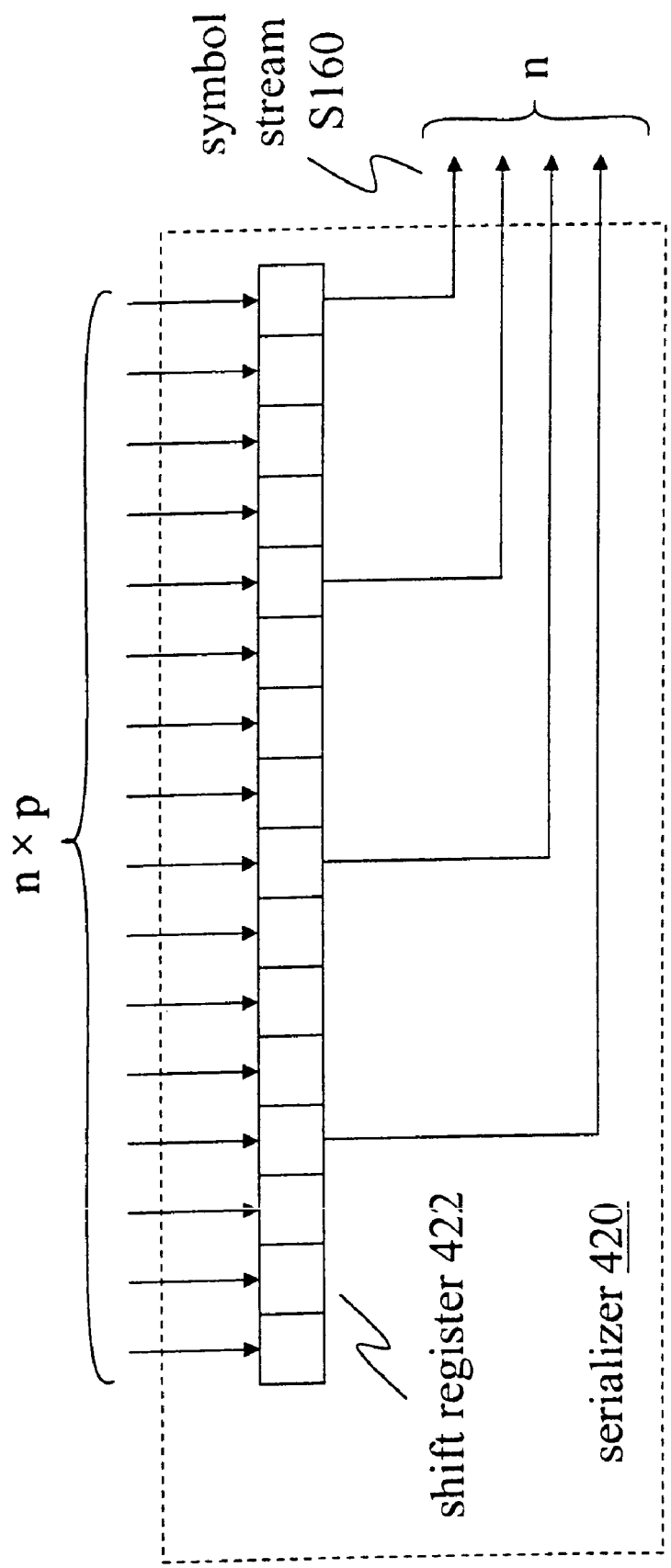
FIG. 20 shows a block diagram of an implementation 420 of serializer 400.

FIG. 20 shows another implementation 420 of serializer 400 that includes an n×p-unit shift register 422. Upon assertion of a load signal (not shown), shift register 422 stores an n×p-unit string of values (e.g. as outputted by encoder 210). Each of the n-unit cosets of this string is then outputted as an n-unit value to signal generator 301 according to a clock signal (not shown).

Figure 21:
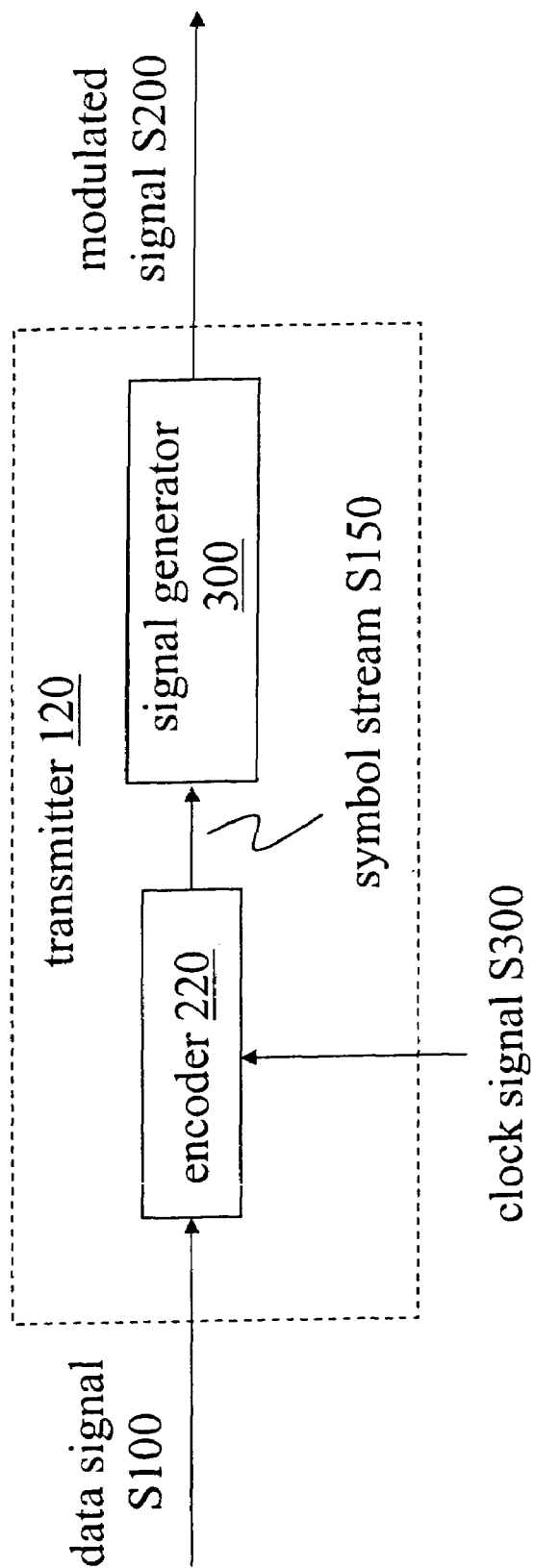
FIG. 21 shows a block diagram of an implementation 120 of transmitter 100.

FIG. 21 shows a block diagram of an alternative implementation 120 of transmitter 100. Encoder 220 outputs symbol stream S150 according to data signal S100 and a clock signal S300. Signal generator 300 receives symbol stream S150 and outputs a corresponding modulated signal S200 (e.g. as a series of clusters of ultra-wideband bursts).

Figure 22:
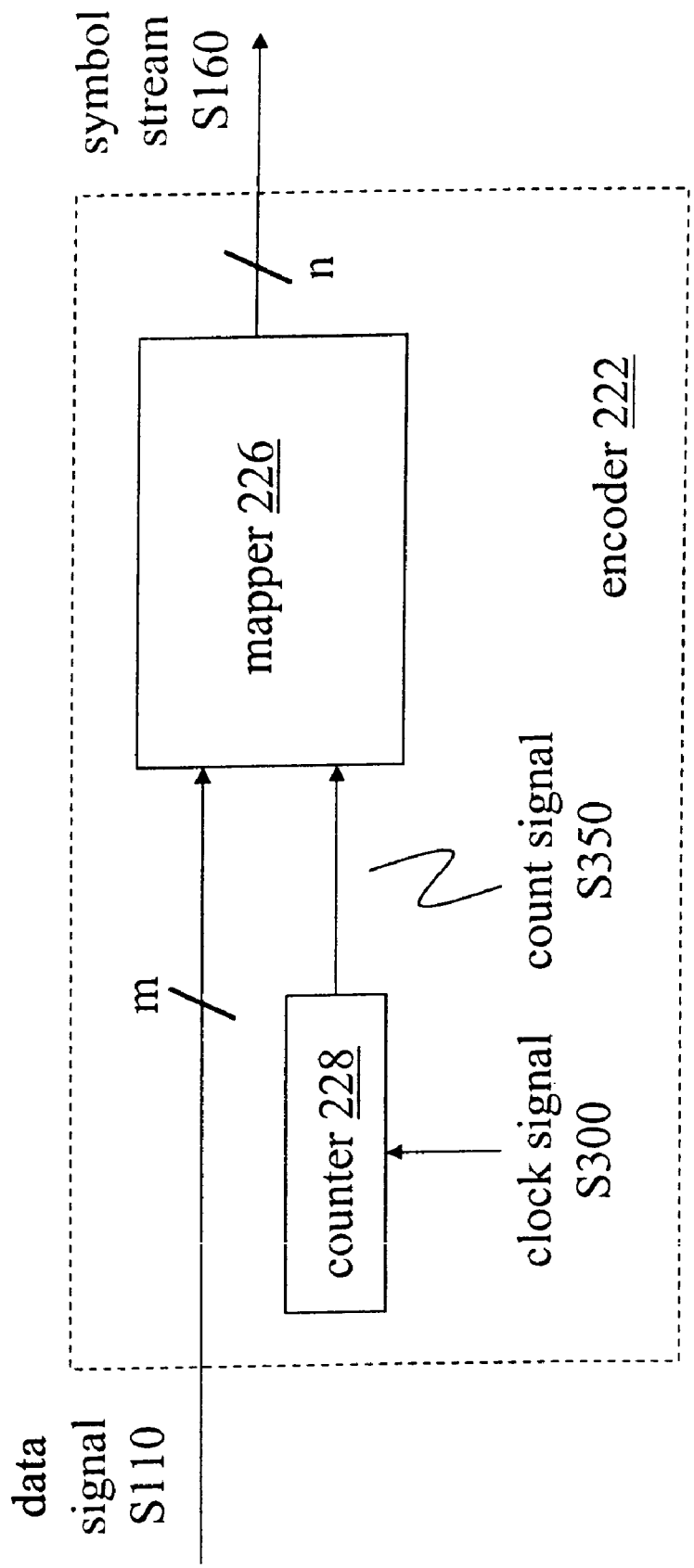
FIG. 22 shows a block diagram of an implementation 222 of encoder 220.

FIG. 22 shows one implementation 222 of encoder 220. A counter 228 receives clock signal S300 and outputs a count signal S350 having one of p values. For example, count signal S350 may count up from 0 to (p−1), or down from (p−1) to 0, or may pass through p different states in some other fashion. Mapper 226 (e.g. a lookup table or combinatorial logic array) receives m-unit data signal S110 and count signal S350 and outputs a corresponding n-unit symbol stream S160 (e.g. to signal generator 301).

Signal generator 301 receives n-unit (e.g. n-bit) symbol stream S160 and outputs a series of clusters of bursts (e.g. ultra-wideband bursts) over n corresponding frequency bands. Each of the n frequency bands has a different center frequency. In one application, the n frequency bands are separated from each other (e.g. by guard bands), although in other applications two or more of the bands may overlap each other.

In one implementation, each unit of symbol stream S160 is a bit that indicates whether or not a burst should be emitted (e.g. at a predetermined amplitude) over a corresponding frequency band during a corresponding time slot. In another implementation, a unit may have more than two values, indicating one among a range of amplitudes at which the corresponding burst should be emitted.

Signal generator 300 includes one or more burst generators, each configured to generate a burst that may vary in duration from a portion (e.g. ±½) of a cycle to several cycles. The time-domain profile of each cycle of the burst may be a sine wave or some other waveform. In one example, a burst generator generates a burst as an impulse that is filtered and/or amplified. Alternatively, a burst may be generated by gating a continuous-wave signal. For example, a burst generator may include a broadband oscillator with controllable bandwidth. Signal generator 300 may include burst generators of the same configuration or burst generators according to two or more different configurations. Example configurations for a burst generator include the following:

1) A circuit or device that produces a fast edge or pulse and is followed by a bandpass filter. The circuit or device that produces the fast edge or pulse generates a waveform with broadband spectral content, and the filter selects the frequency band over which transmission of the burst is desired. Examples of circuits or devices that produce a fast edge or pulse include high-speed logic gates such as ECL (emitter-coupled logic) and PECL (positive ECL). One suitable configuration may include a ring oscillator (e.g. as a free-running oscillator with a gate on its output). Such circuits or devices may also include avalanche transistors, avalanche diodes, and/or step recovery diodes. Examples of suitable filters may include cavity filters, surface acoustic wave (SAW) filters, discrete filters, transmission line filters, and/or any other RF filter technique. In this case, the filter controls the relationship between energy and frequency within the band, and also establishes the roll-off profile of energy outside the band.

2) A tunable oscillator followed by a switching device. The tunable oscillator establishes the center frequency of the burst. The tunable oscillator can be any tunable source of continuous-wave RF energy, such as a voltage-controlled oscillator, a YIG (yttrium-indium garnet)-tuned oscillator, a dielectric resonator oscillator, a backward wave oscillator, and/or a oscillator circuit including a reflex klystron, magnetron, or Carcinotron. The switching device sets the width of the burst, which defines the bandwidth of the spectral content. Suitable switching devices may include mixers, solid-state RF switches, laser-controlled RF switches, plasma-based RF switches, and/or switches that utilize an electron beam.

3) A semiconductor solid-state oscillator that produces a frequency burst in response to a pulsed control voltage. The pulsed control voltage may be provided by any circuit or device capable of delivering a pulse with the desired burst width and amplitude. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable solid-state oscillators may include Gunn devices, IMPATT (impact ionization avalanche transit time) diodes, TRAPATT (trapped plasma avalanche-triggered transit) diodes, and/or BARITT (barrier injection transit-time) diodes.

4) A thermionic oscillator that produces a frequency burst in response to a pulsed control voltage. The pulsed control voltage may be provided by any circuit or device capable of delivering a pulse with the desired burst width and amplitude. Examples of control voltages include a grid voltage, a body voltage, or a reflector voltage. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable thermionic oscillators may include backward wave oscillators, Carcinotrons, magnetrons, and/or reflex klystrons.

Figure 23:
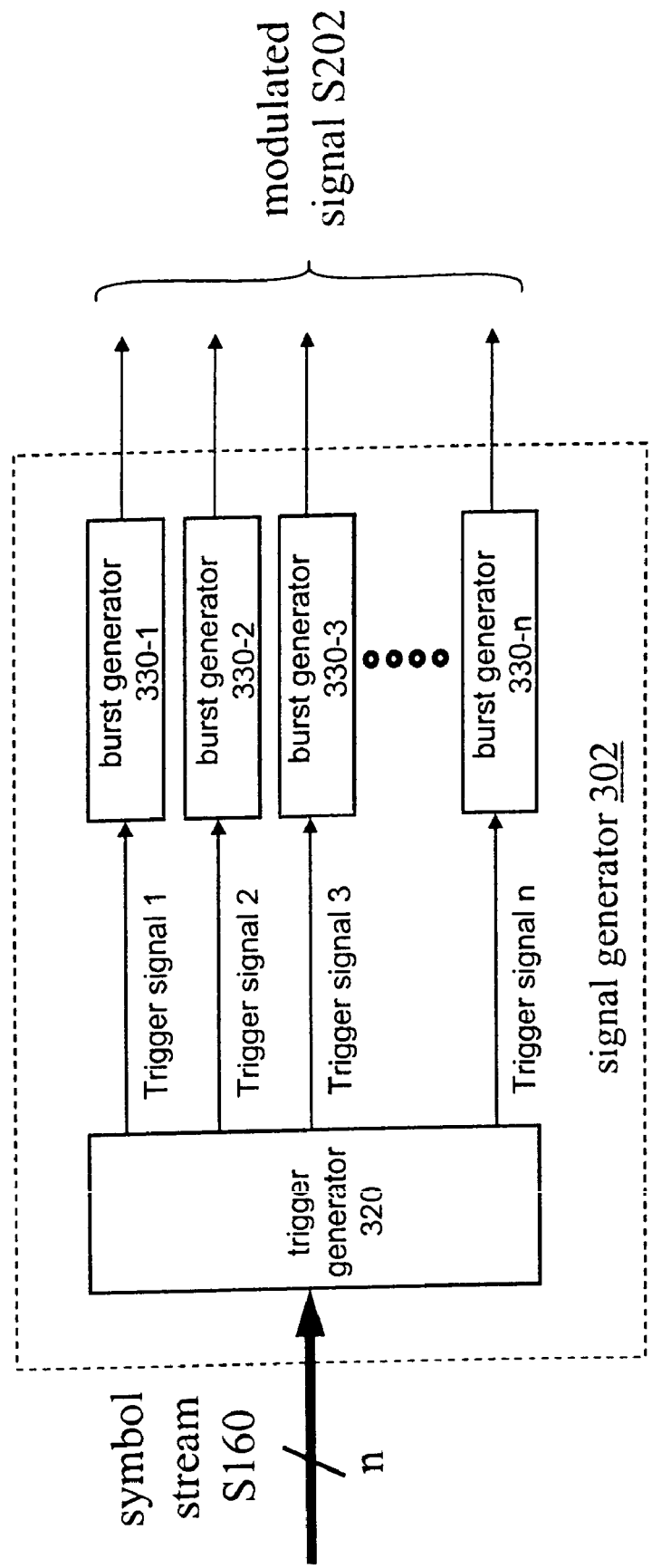
FIG. 23 shows an implementation 302 of signal generator 300.
Figure 24:
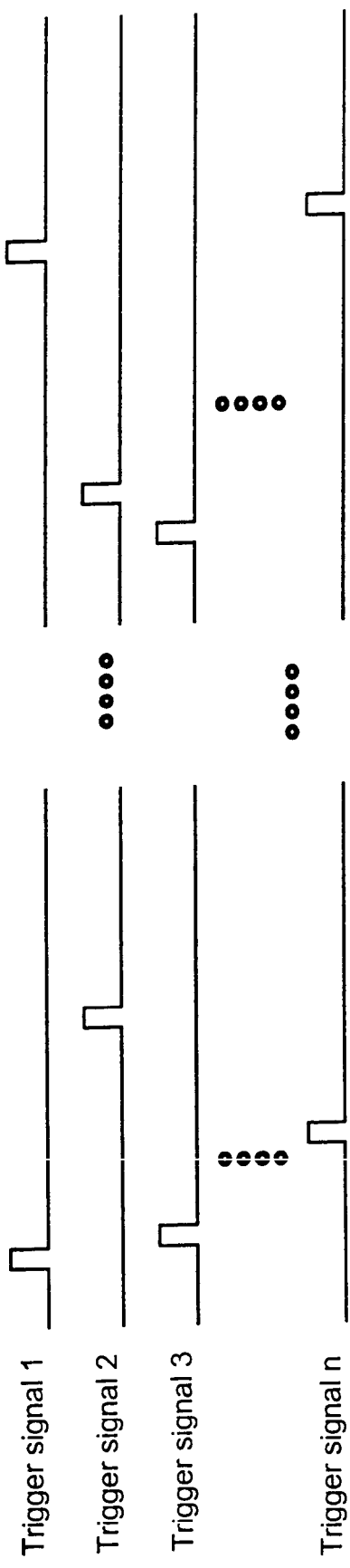
FIG. 24 shows trigger pulses on N independent trigger signals as generated by trigger generator 320.

FIG. 23 shows an implementation 302 of signal generator 301 that includes a trigger generator 320 and a set of n burst generators 330. As shown in FIG. 24, trigger generator 320 generates trigger pulses on n independent trigger signals according to the elements of the n-tuples of the symbol to be transmitted. In this example, each of the n burst generators 330 is configured to emit a burst upon receiving a trigger pulse. In other implementations, a burst generator may be configured to emit a burst upon receiving a rising edge or a falling edge or upon some other event (which trigger pulse, edge, or other event may be electrical and/or optical). Also in this particular example, each burst generator 330 is configured to emit bursts that occupy a different frequency band than bursts emitted by other burst generators 330. Each burst generator 330 may be configured to emit bursts of constant time duration, or one or more of generators 330 may be configured to emit bursts of varying time durations.

Figure 25:
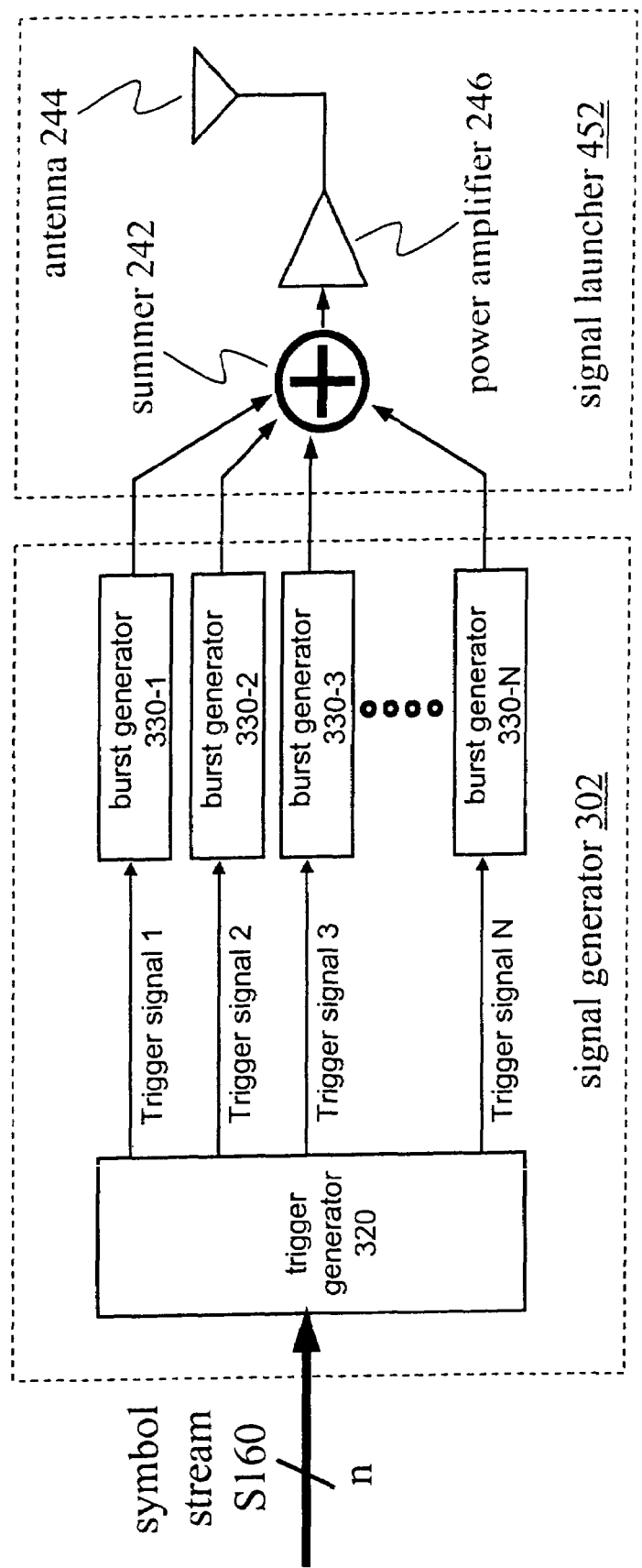
FIG. 25 shows a block diagram of signal generator 302 and an implementation 452 of signal launcher 450.
Figure 26:
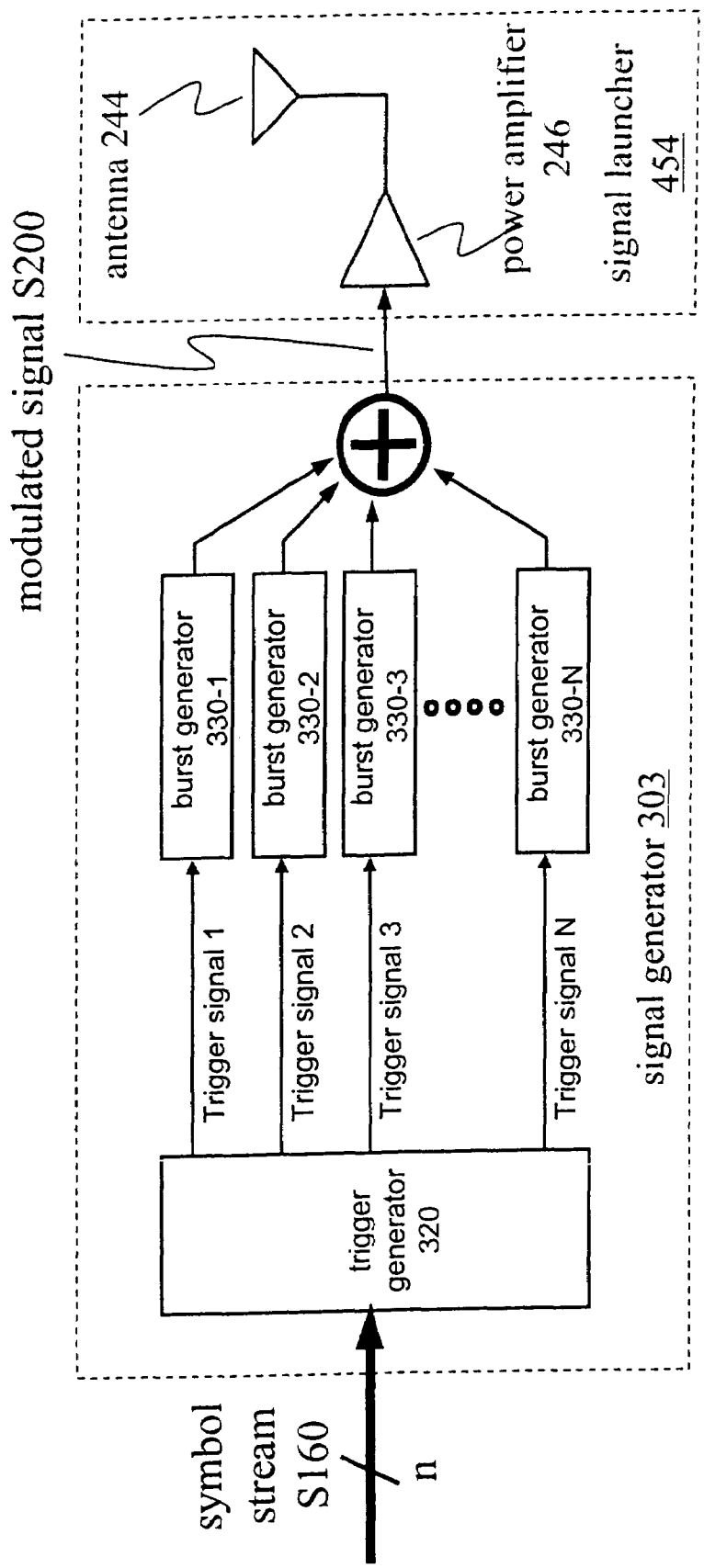
FIG. 26 shows a block diagram of an implementation 303 of signal generator 302.

FIG. 25 illustrates that the outputs of burst generators 330 may be summed (e.g. by summer 242 of implementation 452 of signal launcher 450) before radiation (e.g. by an antenna 244) and may also be amplified (e.g., by power amplifier 246) if desired. As shown in FIG. 26, in another implementation 303 of signal generator 302, the outputs of burst generators 330 are summed (e.g. by a summer) within the signal generator 303. Also in another implementation, the outputs of burst generators 330 are at baseband and may be upconverted (e.g. using a mixer and local oscillator) individually and/or collectively (e.g. after summing).

Figure 26A:
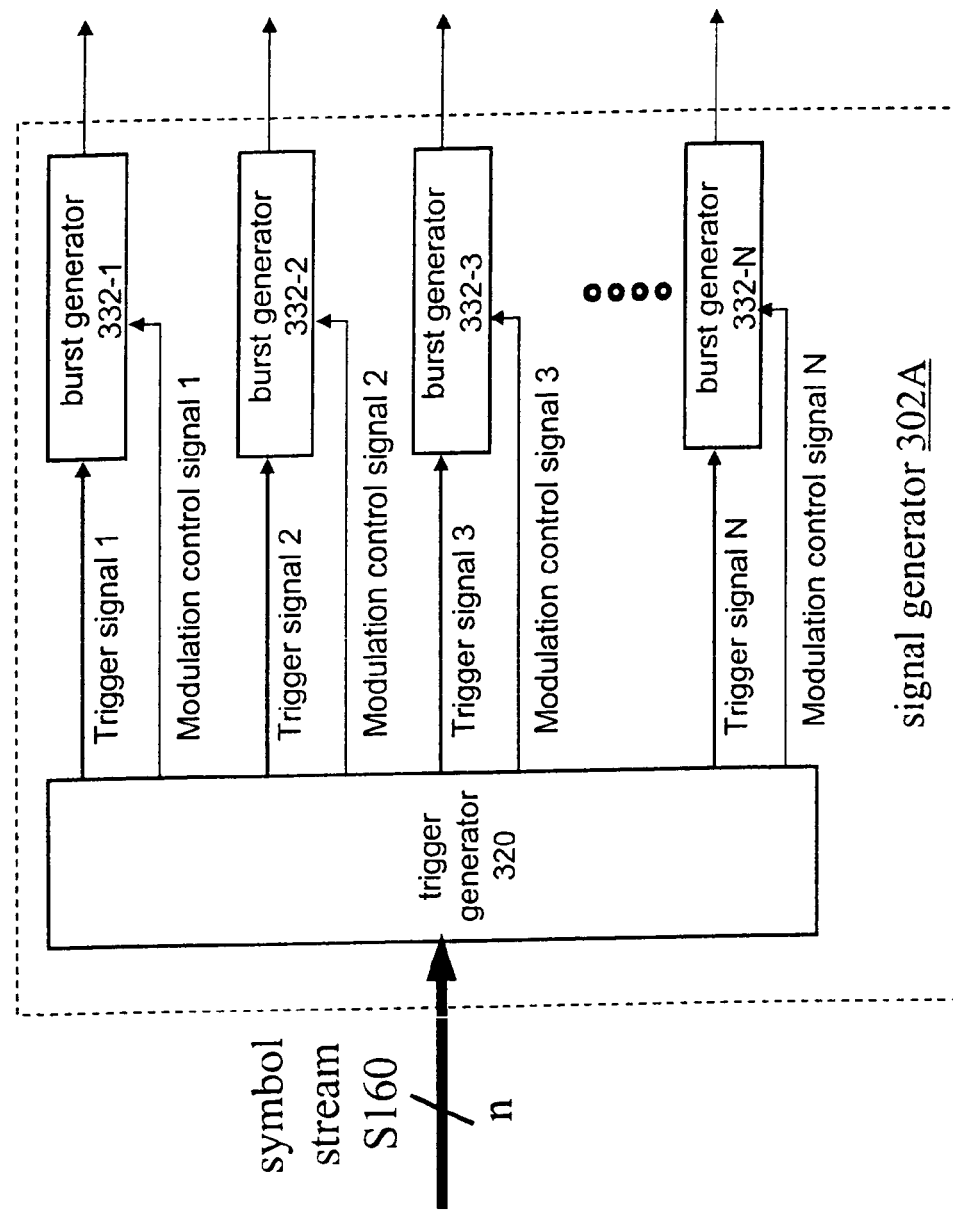
FIG. 26A shows a block diagram of one implementation of a signal generator for generating signaling having an additional modulation, such as polarity, amplitude and/or width modulation, on a burst-wise or cluster-wise basis.

FIG. 26A shows an implementation 302A of signal generator 302 that includes implementations 332 of burst generator 330 that are constructed to produce bursts that are modulated in amplitude, polarity, and/or width. In this embodiment, the trigger generator 320 receives the symbol stream S160 and includes control circuitry for trigger generation. The trigger generator 320 maps the input symbol stream S160 (multiple series of n-tuples) to a combination of burst frequencies and the additional modulation (e.g., polarity, amplitude, width). In turn, the trigger generator 320 outputs a respective trigger signal and a respective modulation control signal to each of the burst generators 332. The modulation control signal instructs the burst generator 332 to modulate the burst generated with the additional modulation. For example, in one embodiment, the modulation control signal indicates the appropriate polarity (e.g., positive or negative) of the triggered burst in order to provide a burst-wise polarity modulation such as illustrated in FIG. 13A. In another embodiment, the modulation control signal indicates the appropriate amplitude (one of two or more preselected amplitude levels) of the triggered burst in order to provide a burst-wise amplitude modulation such as illustrated in FIG. 13C. In another embodiment, the modulation control signal indicates the appropriate width of the triggered burst in order to provide a burst-wise width modulation (one or two or more preselected burst widths or durations) such as illustrated in FIG. 13G. In further embodiments, the modulation control signal indicates one or more of the appropriate polarity, amplitude, width or other additional modulation on a burst-wise basis. For these implementations, the control circuitry signals can be thought as different polarity/different amplitude levels/different widths and the burst generator in turn outputs the signal of set polarity/amplitude/width.

Figure 26B:
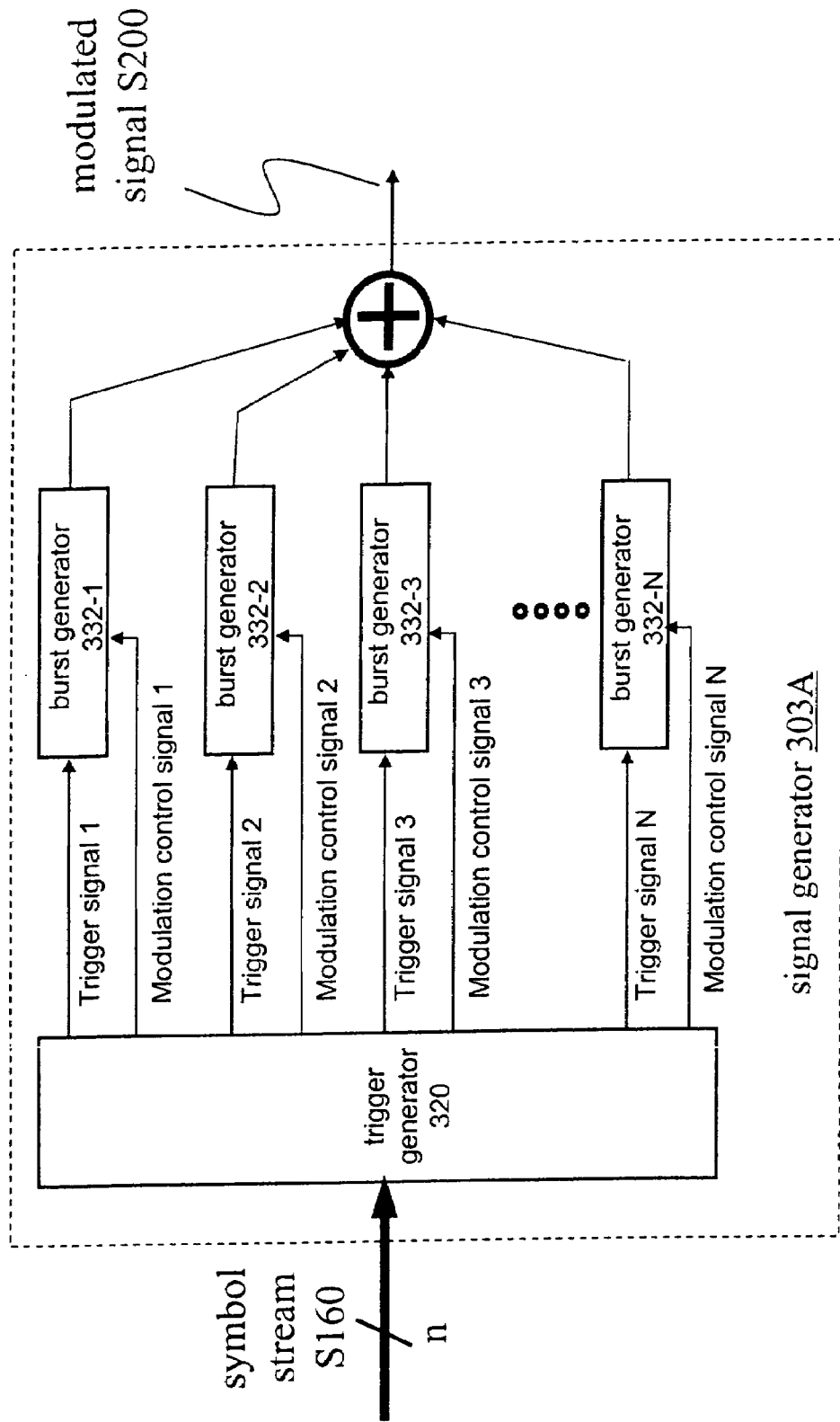
FIG. 26B shows a block diagram of a variation of the signal generator of FIG. 26A.

FIG. 26B shows an implementation 303A of signal generator 303 in which the output of the burst generators 332 are summed (e.g., by a summer) within the signal generator 303A similar to the embodiment of the FIG. 26. It is also understood that the outputs of the burst generators may be summed (e.g. by summer 242 of implementation 452 of signal launcher 450) before radiation (e.g. by an antenna) and may also be amplified (e.g., by a power amplifier) if desired similar to the embodiment of FIG. 25.

Depending on the type of additional or supplemental modulation to be added to the signal generated by the signal generators 302A and 303A, the burst generators 332 may include different components. For polarity modulation, such a burst generator 332 may include a controllable device such as a double-balanced diode mixer. For amplitude modulation, such a burst generator 332 may include a controllable device such as a double-balanced mixer, a controllable or programmable attenuator, or a variable-gain amplifier. For width modulation, such a burst generator 332 may include a controllable switch (e.g., a Hittite GaAs switch commercially available from Hittite Microwave Corporation of Chelmsford, Mass. or M/A-Com switches commercially available from M/A Com of Lowell, Mass.) to gate the burst at the appropriate duration. A burst generator may be used to apply one or more modulations burst-wise and/or to apply the same-modulation or modulations to a string of two or more adjacent bursts.

Figure 27:
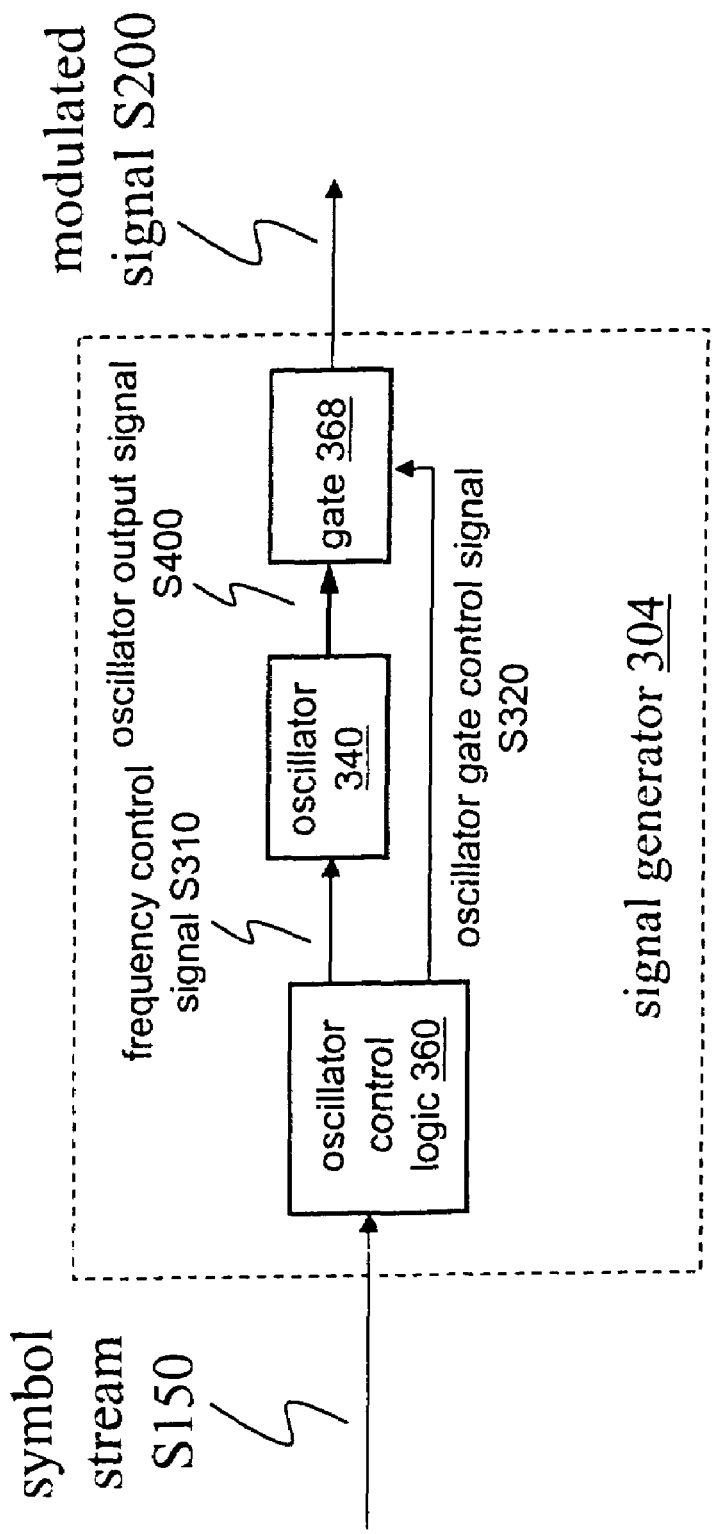
FIG. 27 shows an implementation 304 of signal generator 300.
Figure 28:
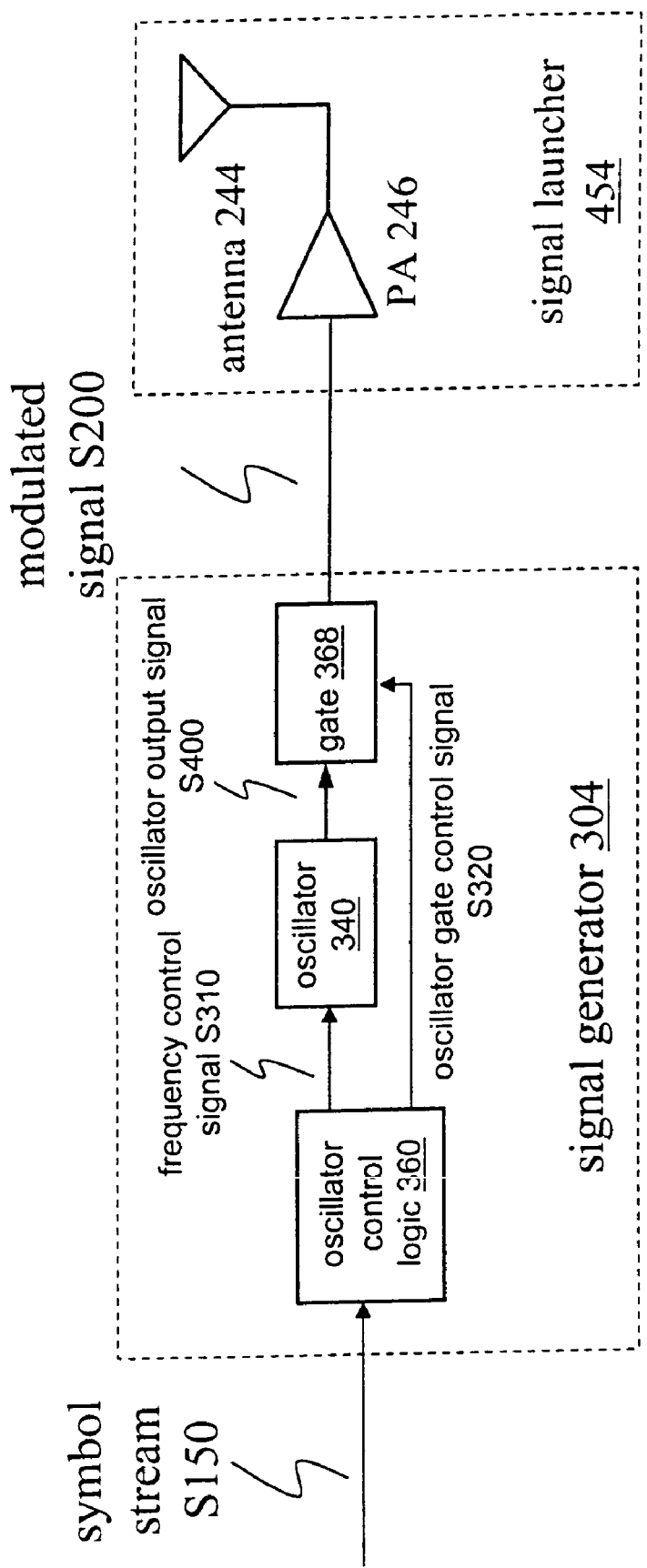
FIG. 28 shows a block diagram of signal generator 304 and an implementation 454 of signal launcher 450.
Figure 29:
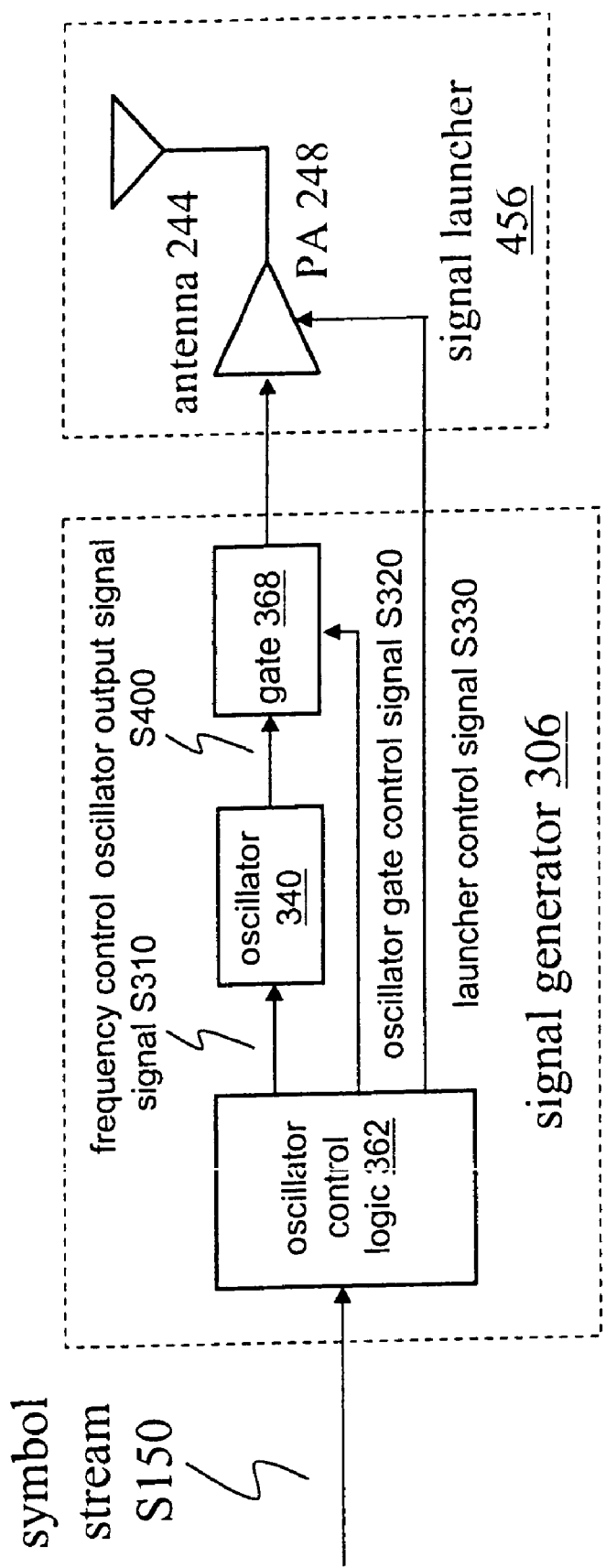
FIG. 29 shows a block diagram of signal generator 306 and an implementation 456 of signal launcher 450.

FIG. 27 shows an implementation 304 of signal generator 300 that includes an oscillator 340 and a gate 368. Oscillator control logic 360, which may include a trigger generator such as trigger generator 320, outputs a frequency control signal S310 and an oscillator gate control signal S320 that are based on symbol stream S150. Frequency control signal S310 may include a set of trigger signals, e.g. as shown in FIG. 25. Oscillator 340, which may be a tunable oscillator as described herein, is tunable to emit waveforms over different frequency bands at different times according to frequency control signal S310. For example, oscillator 340 may be a frequency agile source whose output may be changed from one frequency band to another between bursts. Gate 368 may include a switching device as described above, a mixer, a diode, or another suitable gate. As shown in FIG. 28, the output of gate 368 may be amplified (e.g. by a power amplifier 246 or by a controllable power amplifier 248 as shown in FIG. 29) before radiation.

Oscillator gate control signal S320 may control such features as burst start time, burst duration (i.e. width), and burst polarity. In some implementations, the output of oscillator 340 may be at baseband and may be upconverted (e.g. using a mixer and local oscillator).

In embodiments providing an additional burst-wise or cluster-wise modulation, such as illustrated in FIGS. 13A, 13B and 13G, the oscillator gate control signal S320 may be used to signal to the gate 368 to select one of two or more different widths (durations) and/or polarities. Thus, in a general sense, the oscillator gate control signal S320 may function similarly to the modulation control signals of FIGS. 26A and 26B.

In some applications, an element of a symbol may indicate a rising or falling frequency. In one such case, oscillator 340 is controlled (e.g. via frequency control signal S310) to emit a waveform whose frequency changes accordingly. Such an implementation may also include a gate (e.g. gate 368) that is controlled (e.g. via oscillator gate control signal S320) to output a burst having a corresponding rising or falling frequency. Such 'chirping' techniques may be used in combination with one or more modulation schemes as described above.

In some applications, a polarization of the transmitted signal may be controlled according to symbol stream S150, e.g. within signal launcher 450. As shown in FIG. 29, an implementation 362 of oscillator control logic 360 may output a launcher control signal S330 to control such parameters as burst amplitude, duration (i.e. width), and polarization. Thus, similar to the modulation control signals of FIGS. 26A and 26B, the launcher control signal S330 may be used to implement additional burst-wise or cluster-wise modulation.

Figure 29A:
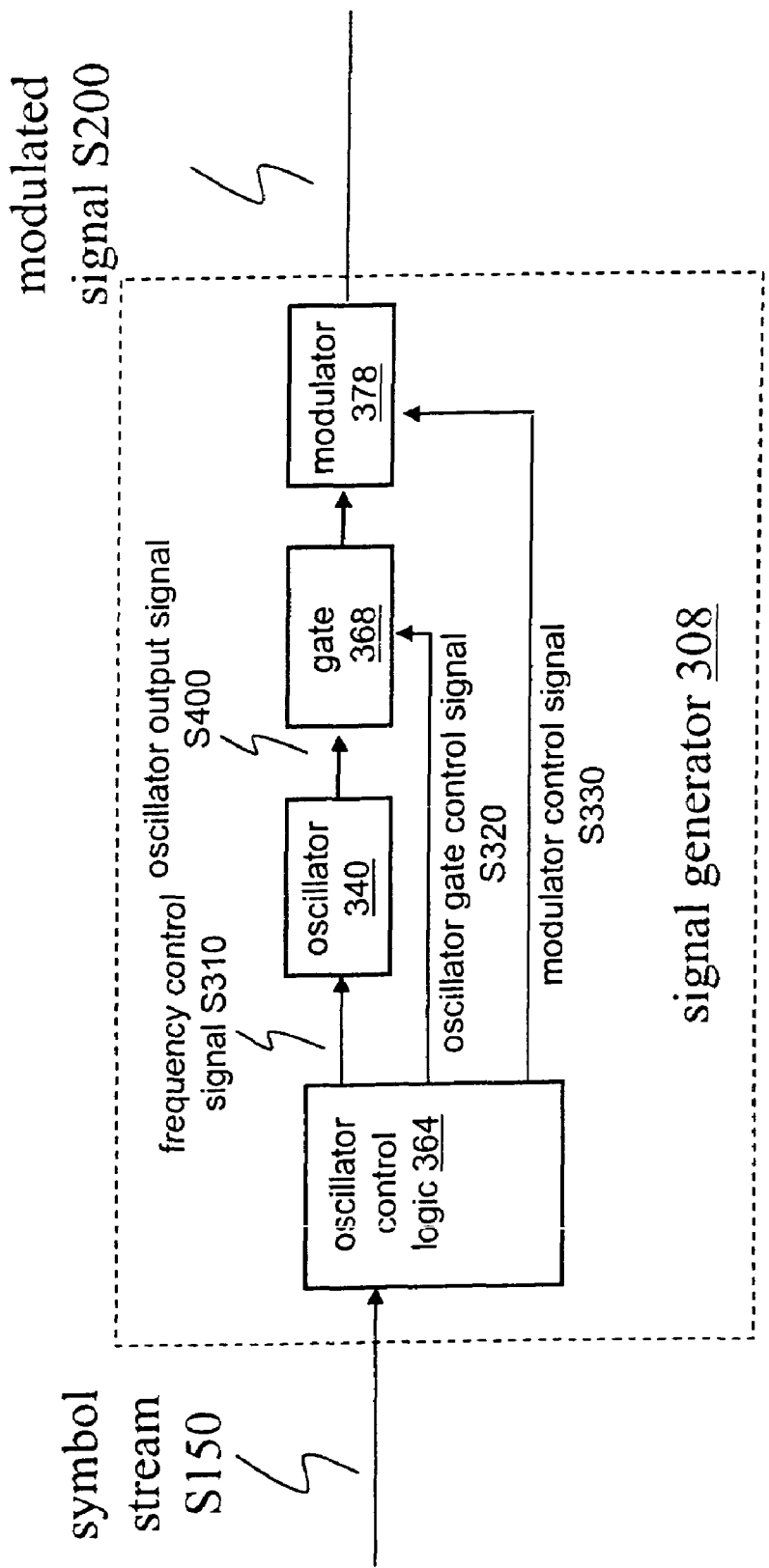
FIG. 29A shows a block diagram another implementation of the signal generator for generating signaling having an additional modulation, such as polarity, amplitude and width modulation, on a burst-wise or cluster-wise basis.

FIG. 29A illustrates another implementation of a signal generator 308 further including a modulator 378 coupled to the output of the gate 368, which produces the modulated signal S200. In this embodiment, additional modulation is added on a burst-wise or cluster-wise basis to the output signal. The components of the modulator 378 depend on the type of additional modulation (e.g., one or more of polarity, amplitude, and width) to be added to the signal, such as those described with reference to FIGS. 26A and 26B. In one example, the oscillator gate control signal S320 controls the gate 368 which defines the burst duration (width) while the modulator control signal S330 controls the modulator 378 which defines the polarity of the burst to add polarity modulation to the transmitted bursts. In this example, a double balanced diode mixer can provide the necessary polarity control.

Figure 29B:
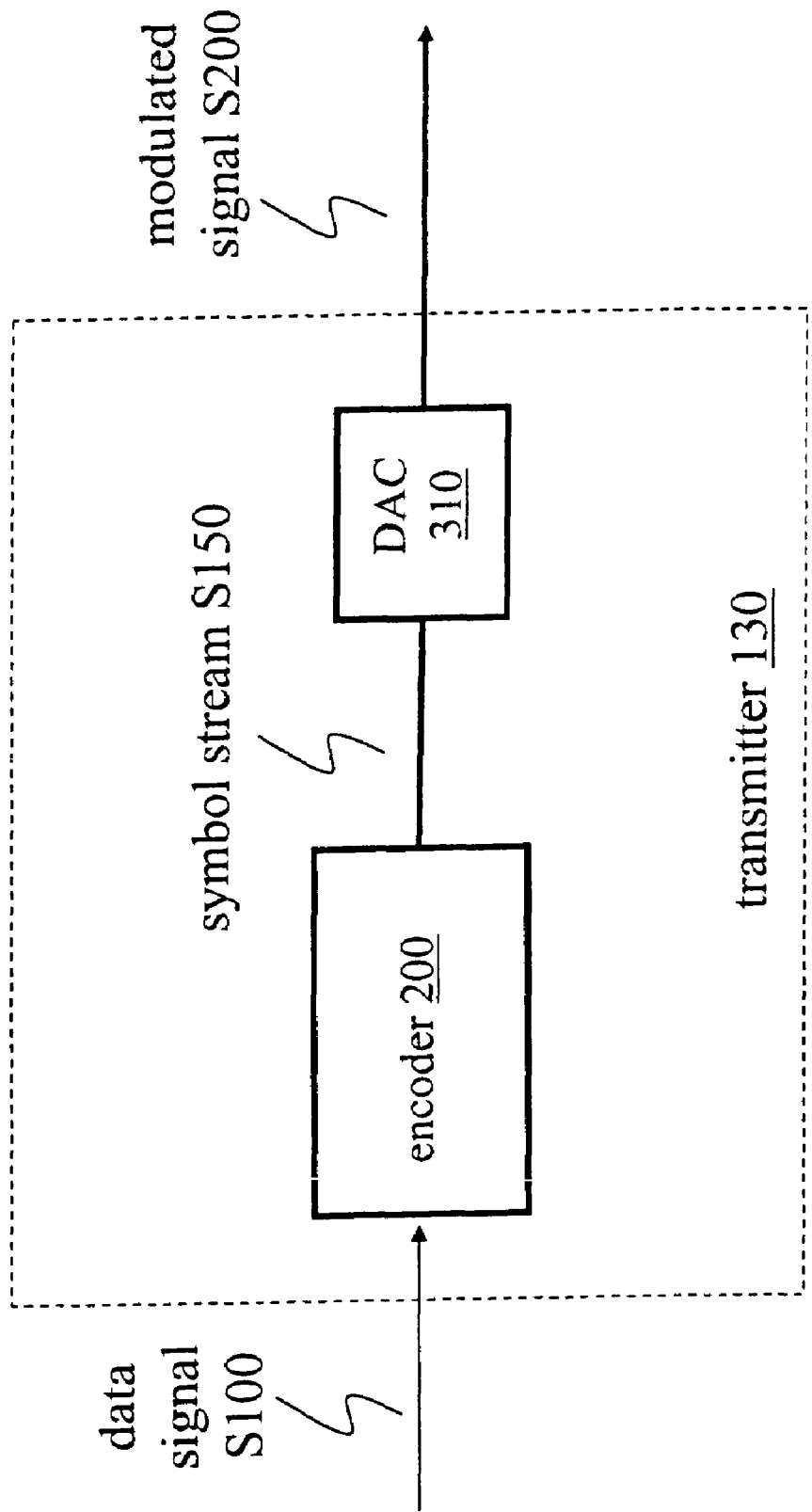
FIG. 29B shows a block diagram of yet another implementation of a signal generator for generating signaling having an additional modulation on a burst-wise or cluster-wise basis.

FIG. 29B shows another implementation 130 of transmitter 100. In this implementation, a digital-to-analog converter (DAC) 310 is used to generate bursts from symbol stream S150 as desired waveforms occupying particular frequency bands at particular times. Thus, the waveform is generated in the digital domain and realized in the analog domain using the DAC 310. As described above, the encoder maps the bit stream (data signal S100) to several series of ordered n-tuples (symbol stream S150). In other implementations, DAC 310 may also receive modulation control information (e.g. from encoder 200) to control encoding of information into the polarity, amplitude, and/or width of bursts (whether burst-wise or otherwise).

Figure 30:
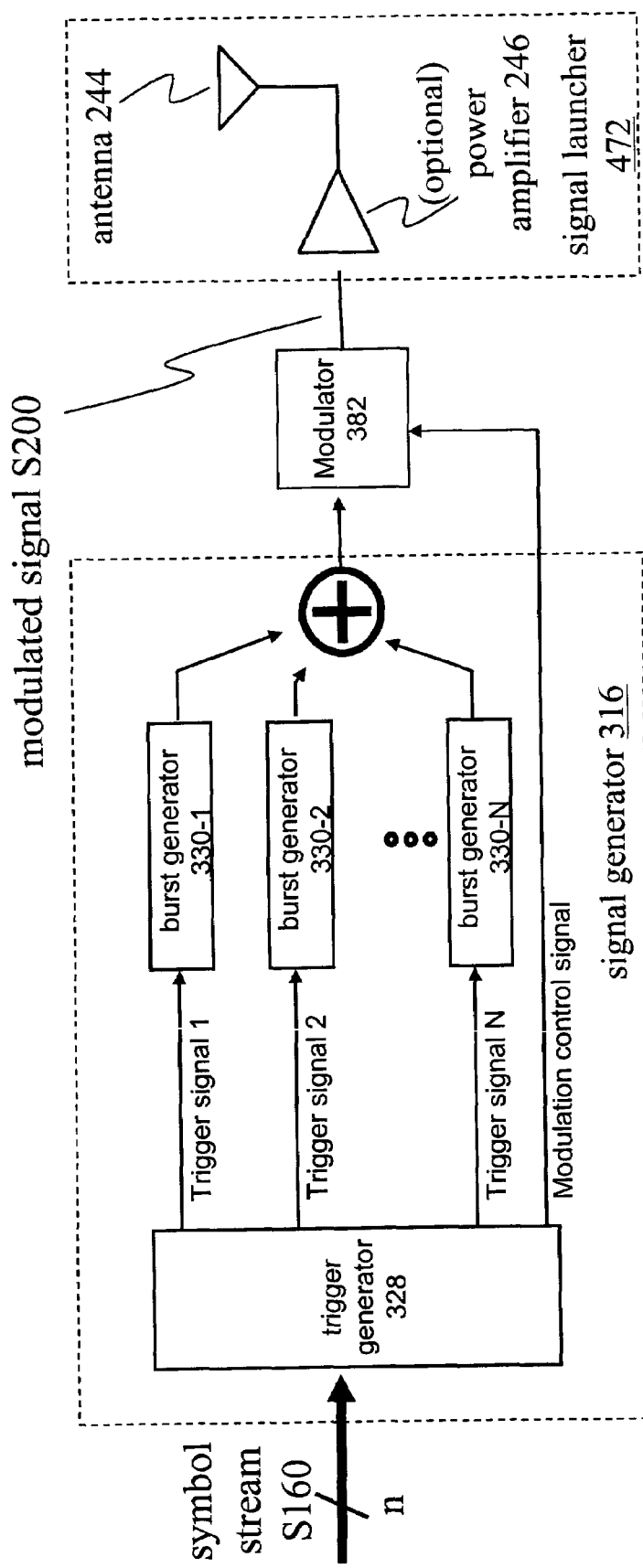
FIG. 30 shows a block diagram of an implementation of a signal generator for generating signaling having an additional modulation on a cluster-wise basis.

In another implementation, FIG. 30 illustrates another variation of a transmitter including a signal generator 316 receiving the symbol stream S160 and outputting the modulated signal S200 to a signal launcher 472. In this implementation, an additional or supplemental modulation is added on a cluster-wise basis, e.g., polarity, width or amplitude modulation (see FIGS. 13B and 13D). Rather than the trigger generator 328 sending a modulation control signal to each burst generator 330 such as illustrated in FIGS. 26A and 26B, the modulation control signal is sent to the modulator 382 after the bursts have been generated (e.g., at burst generators 330) and summed, but prior to being launched. FIG. 30 is similar to that of FIG. 26A except the appropriate modulation (e.g., polarity, width, amplitude) of the individual burst generators in not controllable. Thus, the entire cluster is modulated (cluster-wise modulation), rather than individual bursts within a cluster. In an implementation using amplitude modulation, the modulator 382 comprises a device that selects the amplitude of the bursts of the cluster. In an implementation using width modulation, the modulator 382 comprises a device that gates the bursts of the cluster to modulate burst width.

Figure 30A:
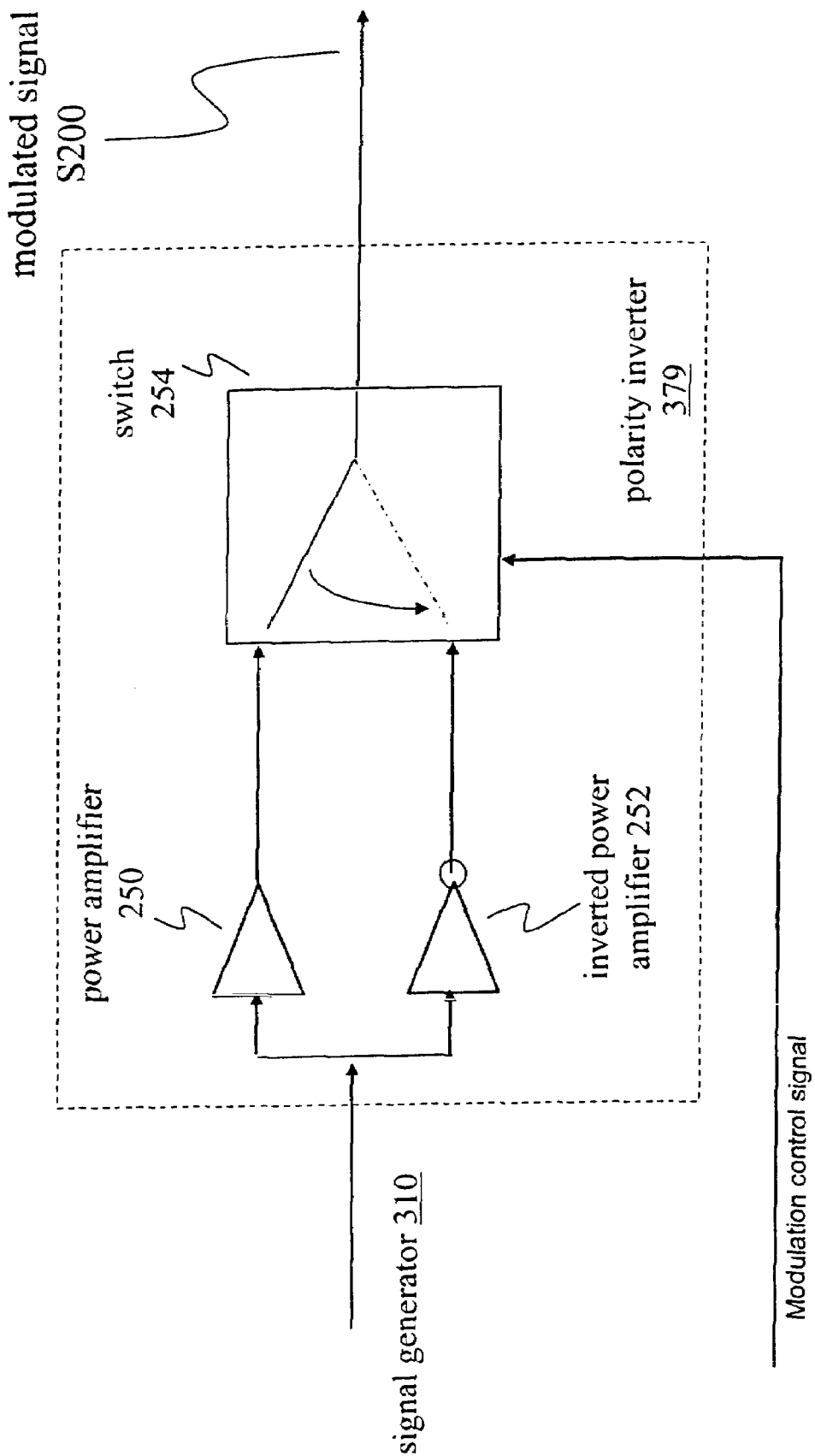
FIG. 30A shows an implementation of the modulator of FIG. 30 as a polarity converter for providing polarity modulation.

In an implementation using polarity modulation, the modulator 382 comprises a polarity converter, such as illustrated in FIG. 30A. FIG. 30A identifies one implementation of the polarity converter 379 for the modulator 382, which uses a parallel set of amplifiers 252 and 250, one of which is inverted 252. Following the 2 amplifiers, switch 254 is used to select the desired polarity signal to continue to the signal launcher. The switch 254 may be implemented in a variety of ways as known in the art such as a Hittite GaAs switch or M/A-Com Switches.

Figure 31:
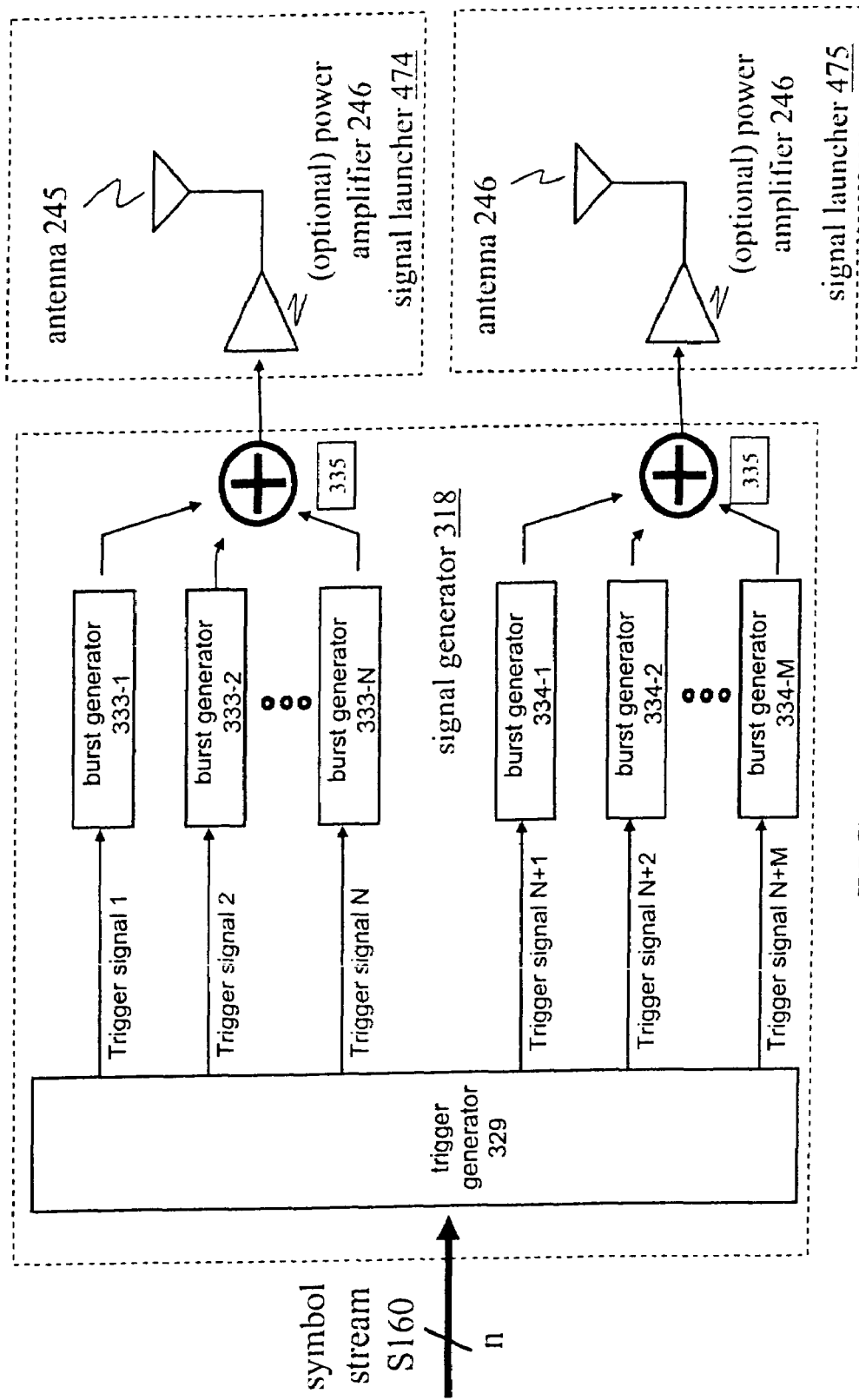
FIG. 31 shows an implementation of a transmitter for generating signaling having polarization modulation on a burst-wise or cluster-wise basis.

In FIG. 31, an implementation of a transmitter for generating a signaling having an additional polarization modulation on a burst-by-burst or burst-wise basis is illustrated according to one embodiment of the invention. An example of a cluster including burst-wise polarization modulation is illustrated in FIG. 13F. In this embodiment, the signal generator 318 includes control circuitry for trigger generation 329, two different sets of burst generators 333 and 334, and combiners 335. The trigger generator 329 maps input symbol stream S1160 to a combination of burst frequencies and polarization (e.g., vertical, horizontal, left-hand circular, right-hand circular, etc.). In turn, the circuitry sends trigger signals to each of the burst generators 333 and 334 with associated polarization. The output of the N and M burst generators is summed and presented to one or more signal launchers 474, 475 of orthogonal polarization with sufficient instantaneous bandwidth to transmit the desired waveform. Amplifiers 246 may be used to increase the signal level, if required. One variation on this is to synthesize the desired waveform at a lower frequency and then upconvert the waveform to a higher frequency. Thus, the output of each of a separate series of burst generators 333 and 334 is summed and output to a respective signal launcher, the signal launcher for launching the signal having an associated polarization that is different from the polarization of the other signal launcher. By controlling which bursts are routed to which signal launcher 474 and 475, the polarization of individual bursts and/or entire clusters is controllable. In this embodiment, it is unnecessary to transmit a polarization control signal from the trigger generator 329, since the trigger generator 329 simply directs the appropriate trigger signal to the appropriate burst generator 333 or 334 to select the polarization. It is noted that although only two groups of burst generators and signal launchers are illustrated, it is understood that additional signal launchers and groups of burst generators may be added for additional polarization modulation options.

Figure 31A:
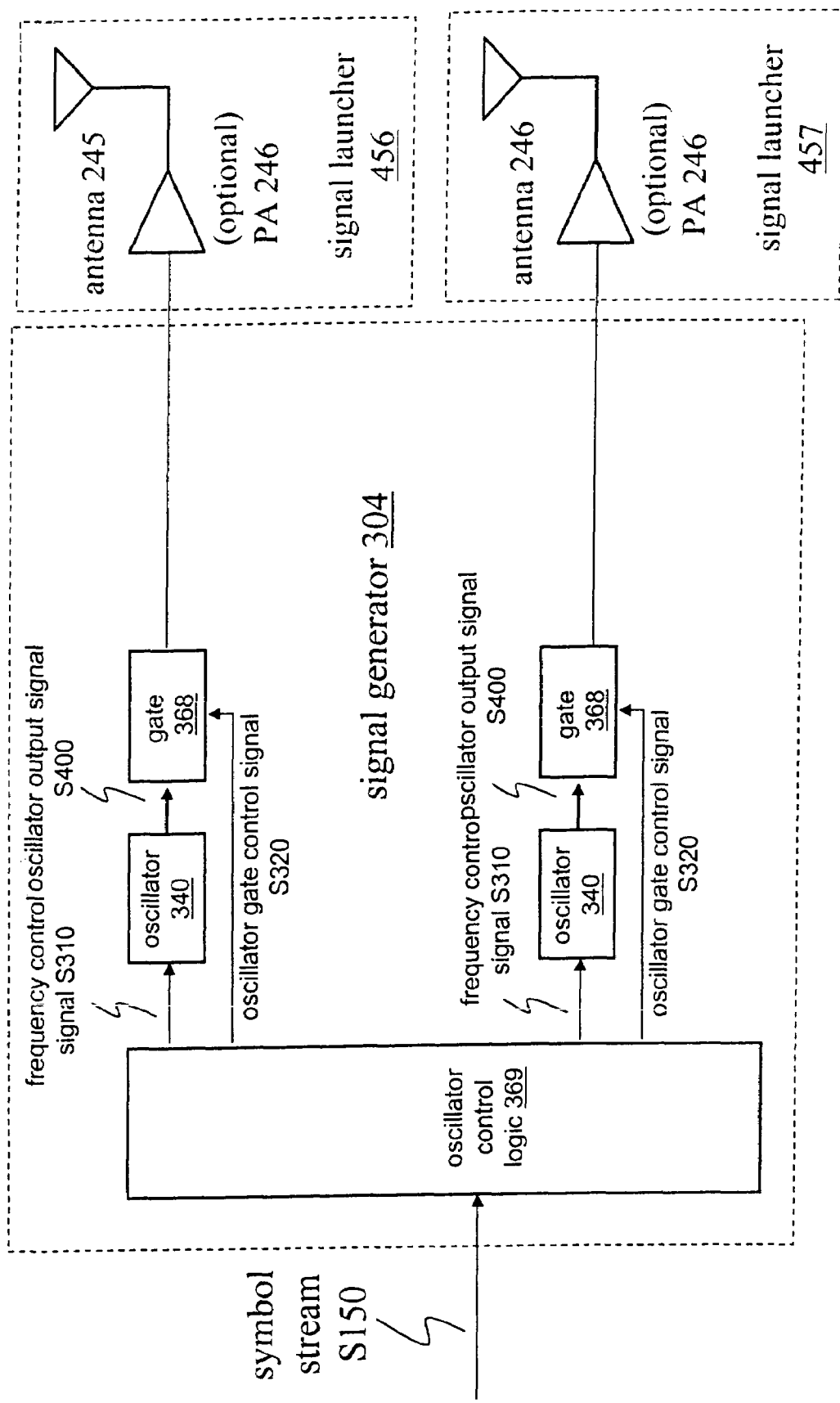
FIG. 31A shows another implementation of a transmitter for generating signaling having polarization modulation on a burst-wise or cluster-wise basis.

An alternative implementation of the transmitter of FIG. 31 is illustrated in FIG. 31A. In this transmitter, oscillator control logic 369 maps input symbol stream S150 to a combination of bursts and polarization. Unlike the embodiment of FIG. 31, the desired waveform is generated by rapidly tuning frequency agile sources. The frequency agile sources, labeled 'oscillator' 340 in the diagram, can change from one frequency to another between bursts within the cluster of bursts. Gates 368 are controlled by the oscillator control logic 369 are used to define the duration (width) of the bursts within the cluster of bursts. The output of the gates 368 is presented to one or more signal launchers 456 and 457 of orthogonal polarization with sufficient instantaneous bandwidth to transmit the desired waveform, where it may be amplified, if required. Thus, the transmitted includes separate paths to separate signal launchers, each signal launcher for launching signaling at polarizations that are different from each other.

One variation on this is to synthesize the desired waveform at a lower frequency and then upconvert the waveform to a higher frequency.

Figure 31B:
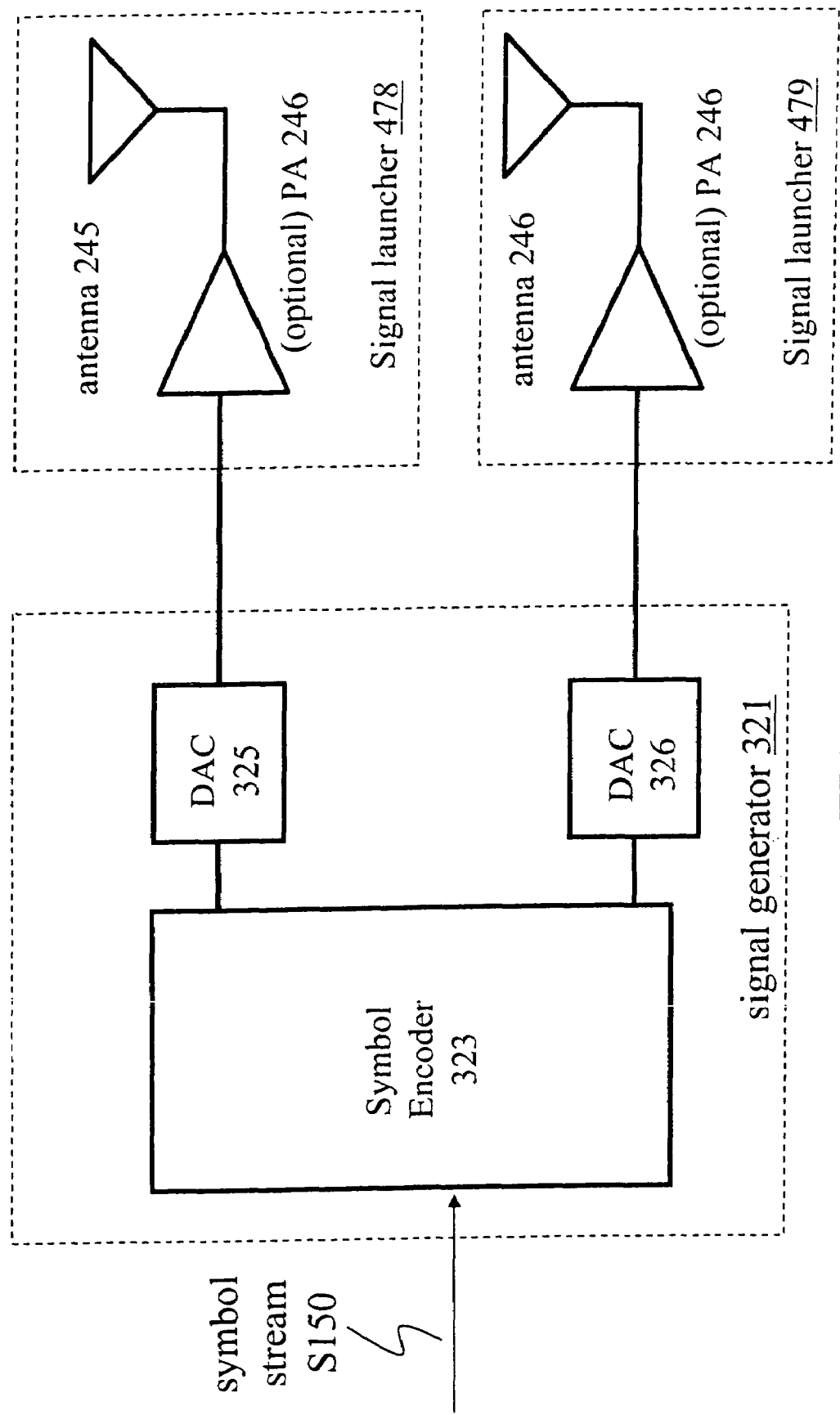
FIG. 31B shows yet another implementation of a transmitter for generating signaling having polarization modulation on a burst-wise or cluster-wise basis.

Another approach to construct the desired burst-wise polarization modulation waveform is to generate it in the digital domain and realize it in the analog domain using a Digital-to-Analog-Converter (DAC) as shown in FIG. 31B. Symbol stream S150 enters signal generator 321, where the symbol encoder 323 maps the bit stream to a series of ordered n-tuples. Entering the DACs 325 and 326 are controls from the symbol encoder 323 for timing, polarization and frequency. The DACs 325 and 326 in turn generate the required series of frequency bursts with timing information. The output of the DACs may be amplified if required and then presented to one or more signal launchers 478 and 479 of orthogonal polarization with sufficient instantaneous bandwidth to transmit the desired waveform. A variation on this is to synthesize the desired waveform at a lower frequency and then upconvert the waveform to a higher frequency. Similar to FIGS. 31 and 31A, multiple paths direct bursts to one of multiple signal launchers 478 and 479 which each transmit signaling at a different polarization. Thus, individual bursts and/or entire clusters may be modulated in polarization based upon which path (which DAC 325 and 326) the symbol encoder 323 selects to generate the burst.

Figure 31C:
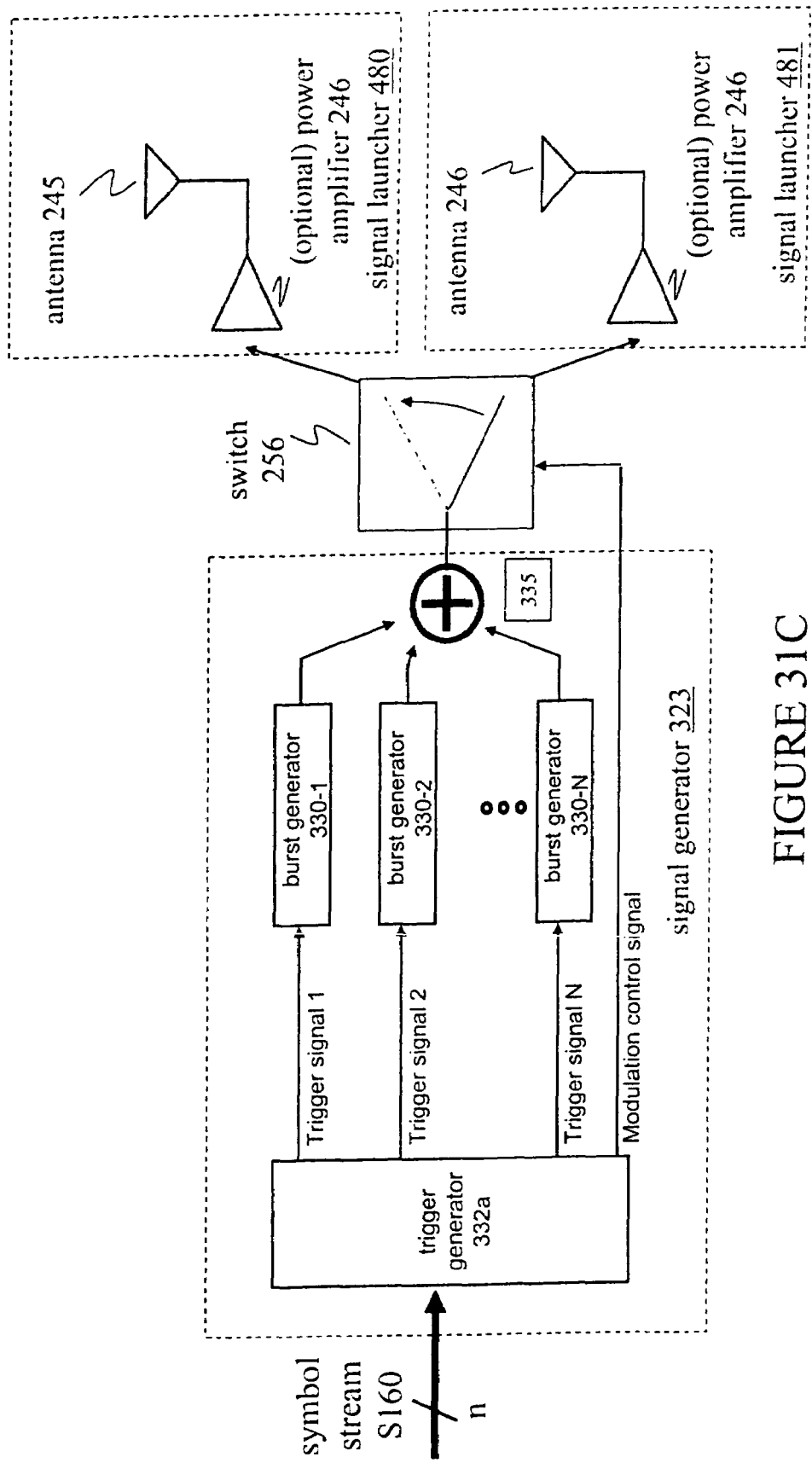
FIG. 31C shows an implementation of a transmitter for generating signaling having polarization modulation on a cluster-wise basis.

Another implementation of a transmitter which includes polarization modulation on a cluster-wise basis as an additional modulation is illustrated in FIG. 31C. An example of clusters of bursts including cluster-wise polarization modulation is illustrated in FIG. 13G. The transmitter of FIG. 31C is similar to the transmitter of FIG. 31 except there are fewer burst generators, e.g., there is only one set of burst generators 330 whose outputs are summed together (e.g., at summer 335). Thus, this embodiment offers some added simplicity relative to the transmitter of FIG. 31. To accommodate this, switch 256 is located between the summer 335 and the signal launchers 480 and 481. The switch 256 is controlled by the modulation control signal (e.g., a polarization control signal) coming from the trigger generator 332a and informs the switch 256 which polarization the cluster of bursts should be, thus connecting the switch 256 to the appropriate signal launcher 480, 481. Again, each of the signal launchers 480 and 481 launches signaling at different polarizations. The switch 256 may be implemented in a variety of ways as known in the art such as using a Hittite GaAs switch or using M/A-Com switches.

Figure 31D:
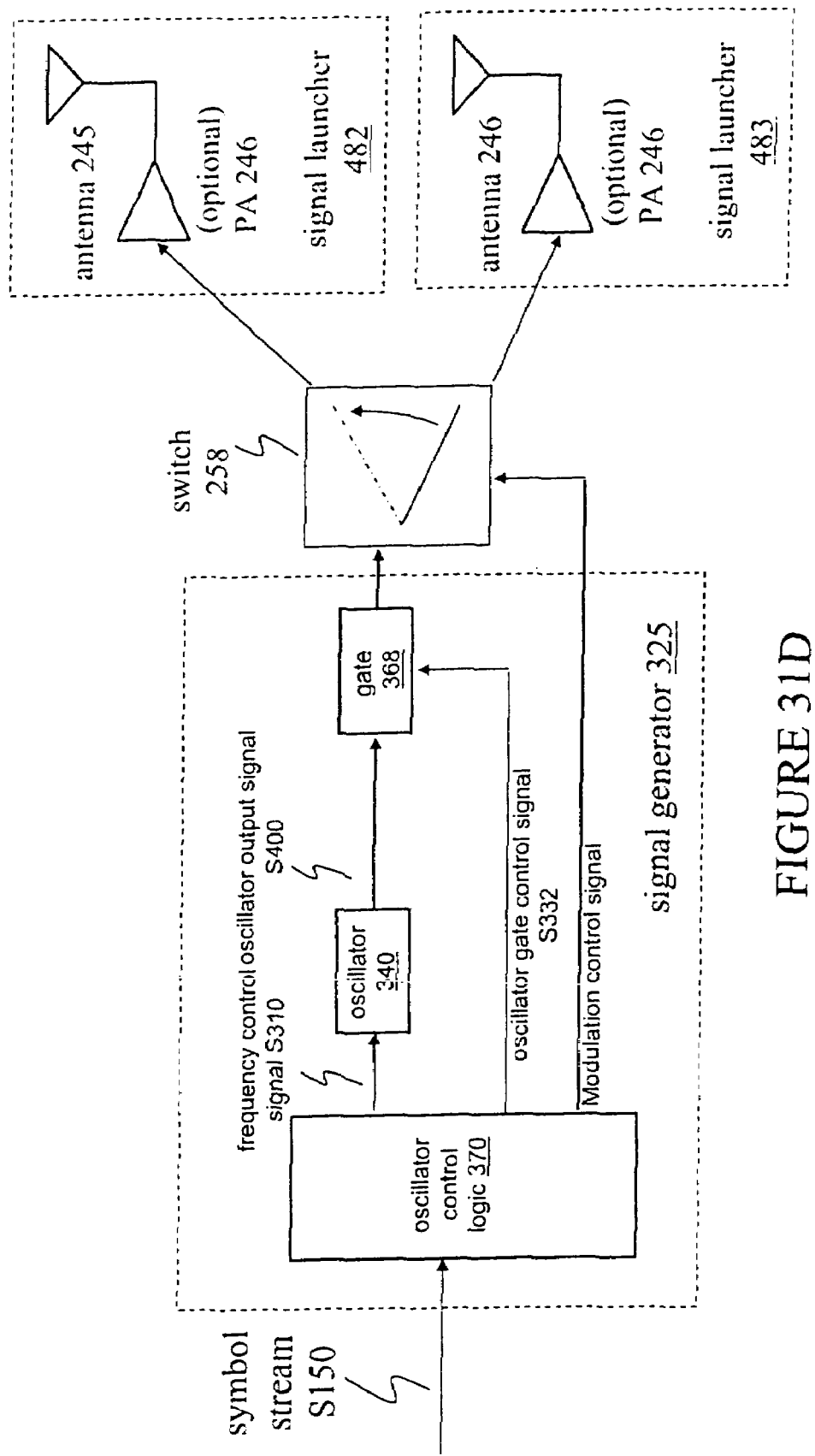
FIG. 31D shows an implementation of a transmitter for generating signaling having polarization modulation on a cluster-wise basis.

Another variation of a transmitter for transmitting signaling with polarization modulation on a cluster-wise basis is illustrated in FIG. 31D. The transmitter of FIG. 31D is similar to that of FIG. 31A except there are fewer oscillators and gates. That is, rather than using redundant sets of oscillators 340 and gates 368, the output of a single oscillator 340 and gate 368 is switched between one of multiple signal launchers (e.g., signal launchers 482 and 483), each signal launcher for launching signaling at a different polarization. To accommodate this, switch 258 is located between gate 368 and the signal launchers 482 and 483. The switch 258 is controlled by a modulation control signal (e.g., a polarization control signal) coming from the oscillator control logic 370 and informs the switch 258 which polarization the cluster of bursts should be (e.g., based upon an element of a given n-tuple), thus connecting the switch 258 to the appropriate signal launcher 482, 483. The switch 258 may be implemented in a variety of ways as known in the art such as using a Hittite GaAs switch or using M/A-Com switches.

According to embodiments utilizing additional or supplemental modulations to encode additional information into the transmitted clusters (such as described with reference to FIGS. 13A-13G), modulation control information may be encoded in several different ways. In some arrangements, information for modulation control may be included in the value of the element that corresponds to a burst to be modulated. For example, one or more bits of the value of an element of an n-tuple may be used to control one or more modulation modes of a burst that corresponds to the element. In such embodiments, the modulation may be encoded into a given symbol (e.g., an ordered series of n-tuples) during T100 of FIG. 8.

In one such scheme for burst-wise width modulation, one bit of the element value provides the trigger signal and the other bits of the element value indicate the burst width. In another such scheme, different bits of the modulation control portion of the element value may control different modulation modes. For example, one bit may indicate polarity of the burst, while other bits indicate the amplitude of the burst.

Alternatively, information for modulation control may be included in the value of an element that is different from the element that corresponds to a burst to be modulated. For example, one of the elements of an n-tuple may be used to control the modulation of one or more bursts that correspond to other elements of the n-tuple. In one such scheme, one element of each n-tuple controls the modulation of all of the bursts in the corresponding time slot (e.g. either individually or collectively), while the other elements of the n-tuple indicate the frequencies of the modulated bursts.

As a further alternative, information for modulation control may be provided in addition to the ordered series of n-tuples. For example, one or more bits of the data stream to be transmitted may be used to control the modulation of all of the bursts in a cluster (or a predetermined subset of the bursts). In another example, each of p bits of the data stream to be transmitted (or each of p groups of bits of the data stream) may be used to control the modulation of all bursts occurring in a corresponding time slot. In a further example, bits of the data stream to be transmitted may be used to control the modulation of individual bursts of a cluster. For a scheme in which each time slot has exactly one burst, for example, each of p bits of the data stream may be used to control the modulation of a corresponding burst of the cluster. Again, in one embodiment, the additional modulation control information to affect the additional modulation is encoded into the symbol or ordered series of n-tuples during the encoding process (e.g., T100 of FIG. 8 and the process of FIG. 9) performed by a transmitter.

It may be desirable to limit the spectral content of a burst. For example, reducing out-of-band emissions may support a more efficient use of bandwidth. Reducing out-of-band emissions may also be desired to avoid interference with other devices and/or may be required for regulatory compliance. While a filter may be used to modify the spectral content of a burst (as described above), in some applications it may be desirable to modify the spectral content of a burst by controlling the shape of the burst in the time domain instead.

In one ideal system, the frequency spectrum of each burst is rectangular, and the bandwidth of the burst lies within the occupied frequency band. Within the frequency band, the power level is the maximum allowed by regulatory agencies; outside of the frequency band, the power level due to the burst is zero.

The frequency profile of a transmitted waveform may be controlled by controlling the time-dependent amplitude profile of the transmitted burst. If the time-dependent amplitude profile of the burst is rectangular, for example, the frequency content of the burst will have a sine(f)/(f) profile (where f denotes frequency). In such cases, the bandwidth of the burst may extend into one or more adjacent frequency bands and may degrade performance. It may be desirable for the time-dependent amplitude profile to have a sine(t)/(t) shape (where t denotes time), so that a rectangular frequency profile may be created.

In a practical system, the time-dependent amplitude profile of the transmitted burst may have a shape that is an approximation to a sine(t)/(t) function. The resulting frequency spectrum may have a reduction in unintentional leakage of signal energy into an adjacent frequency band (or out of the region of spectrum allocated by a regulatory agency) as compared to a case where a rectangular amplitude profile is utilized. Examples of time-dependent amplitude profiles that may be suitable for particular applications include raised cosine, Gaussian, and low-pass-filtered rectangular pulses.

The actual technique used to generate the desired time-dependant amplitude profile of the burst may depend on the technique used to generate the burst. In many cases, for example, a control voltage within the waveform generator may be tailored to provide the desired tailored burst. One such example is the use of a mixer to switch a CW waveform to generate the desired burst. By low-pass filtering the control signal applied to the mixer, one can obtain a tailored time-dependent amplitude profile and reduced leakage of energy into adjacent frequency bands.

Figure 32:
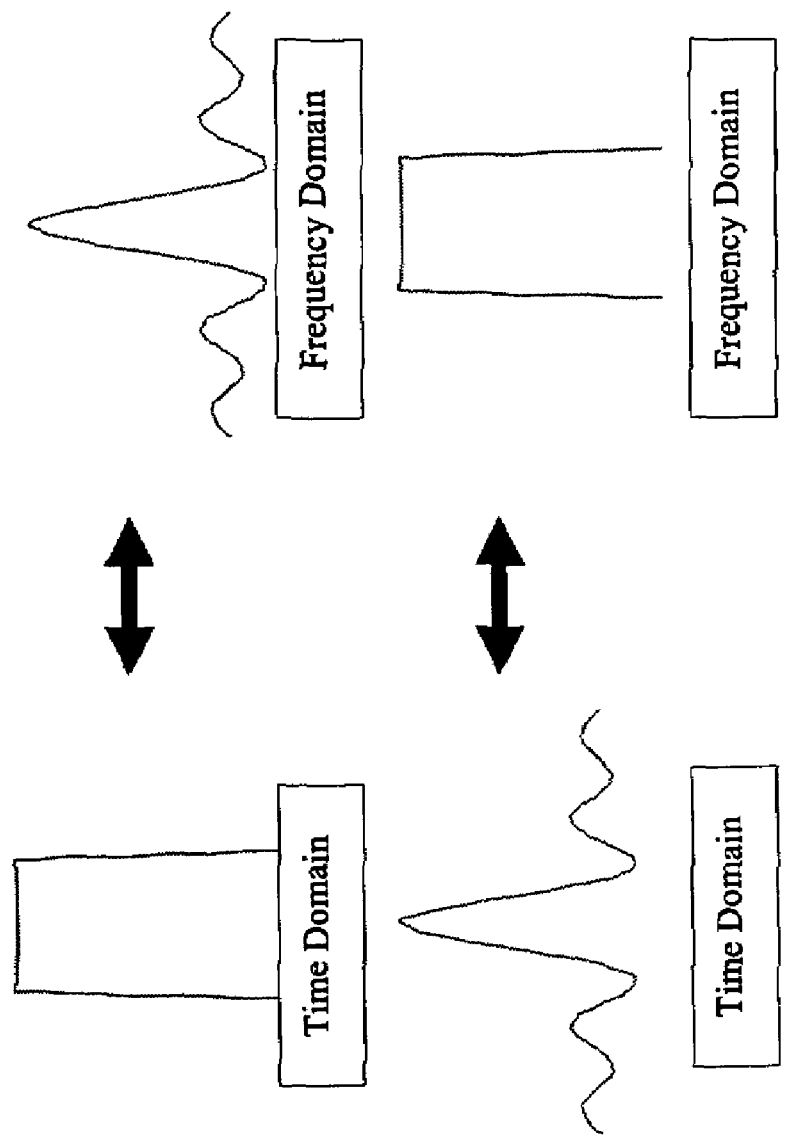
FIG. 32 shows a correspondence between waveform profiles in the time and frequency domains.
Figure 32A:
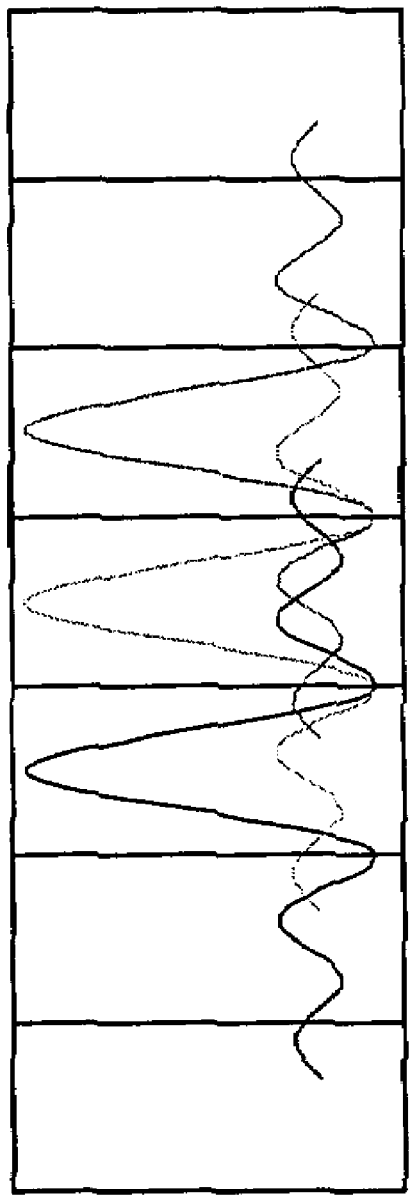
FIG. 32A shows a spectral plot of a sequence of bursts.
Figure 32B:
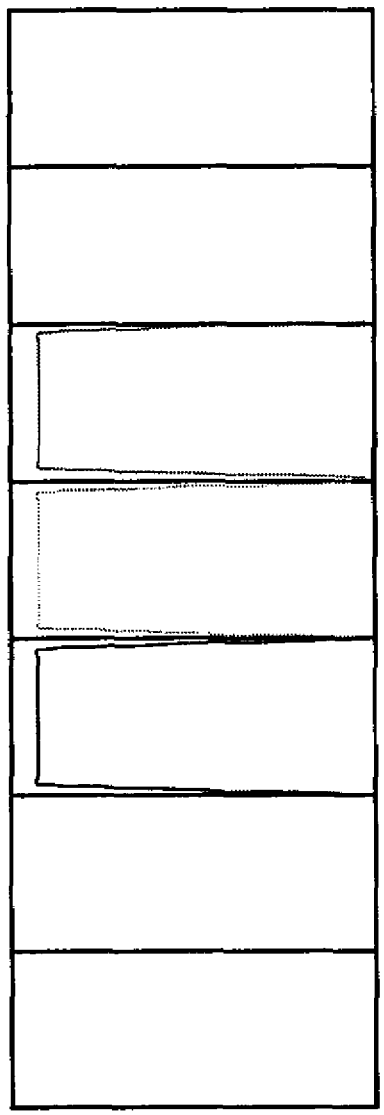
FIG. 32B shows a spectral plot of a sequence of bursts.

FIG. 32 demonstrates that a square impulse in one of the time and frequency domains corresponds to a waveform in the other domain that has the shape of a sinc function. (For example, the Fourier transform may be applied to transform a waveform in one domain to the other domain.) FIG. 32A illustrates an example of a spectrum resulting from the transmission (at three different frequencies) of bursts having square profiles in the time domain. This figure demonstrates that transmitting a burst over one frequency band may cause emissions in neighboring frequency bands. FIG. 32B illustrates an example of a spectrum resulting from the transmission (at the same three frequencies) of bursts having sinc-shaped profiles in the time domain. This figure demonstrates that shaping the time-domain profile of a burst may reduce emissions in neighboring frequency bands.

These figures demonstrate that spectral shaping may be based on time-domain control of a burst profile rather than (or in addition to) the use of burst-shaping filters. In certain burst generator examples described herein, the switch or applied voltage pulse may be used to control the burst shape in the time domain, thereby controlling the relationship between energy and frequency within the band and also establishing the roll-off profile of energy outside the band.

Figure 33:
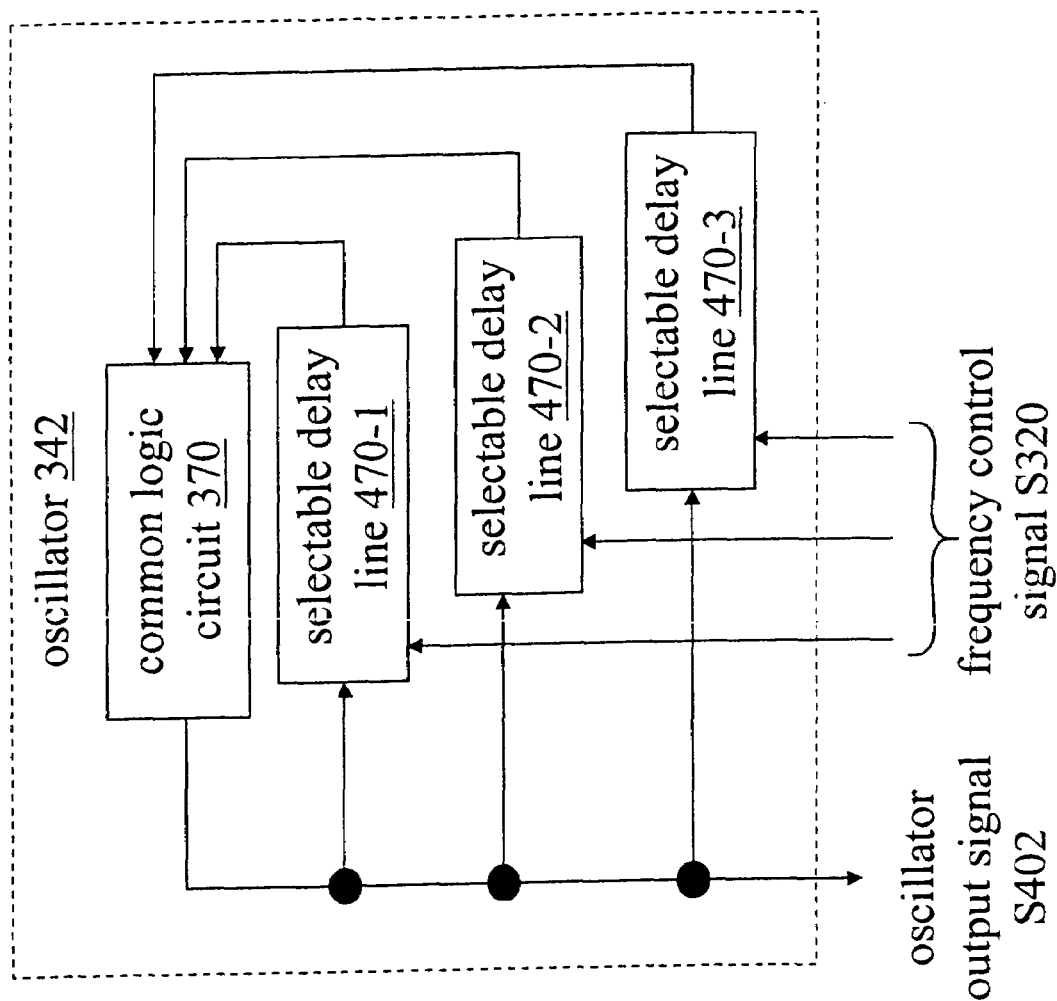
FIG. 33 shows a block diagram of an oscillator 342 according to an embodiment of the invention.

FIG. 33 shows a block diagram of a tunable oscillator 342 according to an embodiment of the invention. Oscillator 342 may be used as oscillator 340 in an implementation of signal generator 300 as shown, e.g., in FIGS. 27-29, 29A, 31A and 31D. In combination with a suitable switching device (e.g. a gate), oscillator 342 may also be used as burst generator 330 in other implementations of signal generator 300.

Oscillator 342 includes selectable delay lines 470, which introduce delays of different periods. Such delay lines may include analog delay elements (e.g. inductors, RC networks, long transmission lines) and/or digital delay elements (e.g. inverters and/or other logic elements or gates). A common logic circuit 370 is coupled to the output terminal of each selectable delay line 470. Common logic circuit 370, which includes one or more logic gates, changes the state of its output signal according to a state transition at one of its inputs and may or may not invert the received state transition depending on the particular circuit configuration. Each of selectable delay lines 470 is selectable via frequency control signal S320 such that only one receives an output signal from common logic circuit 370 during any time period. It may be desirable in some implementations to buffer the output of oscillator 342 before connection of oscillator output signal S402 to a load.

In some implementations, a selectable delay line 470 may include a portion of the path that couples the selectable delay line to common logic circuit 370, with the length and/or character of such portion being designed to introduce a desired propagation delay or other effect. In other implementations, the delay (and/or the delay difference between delay lines) introduced by such paths may be considered negligible.

A control circuit or device (such as oscillator control logic 360) provides frequency control signal S320 to control the frequency of the oscillator's output. For example, frequency control signal S320 may be a function of an n-tuple that indicates a burst occupying a particular frequency band. For at least some implementations of oscillator 342, the frequency of oscillator output signal S402 may be changed at every cycle of the oscillation.

Figure 34:
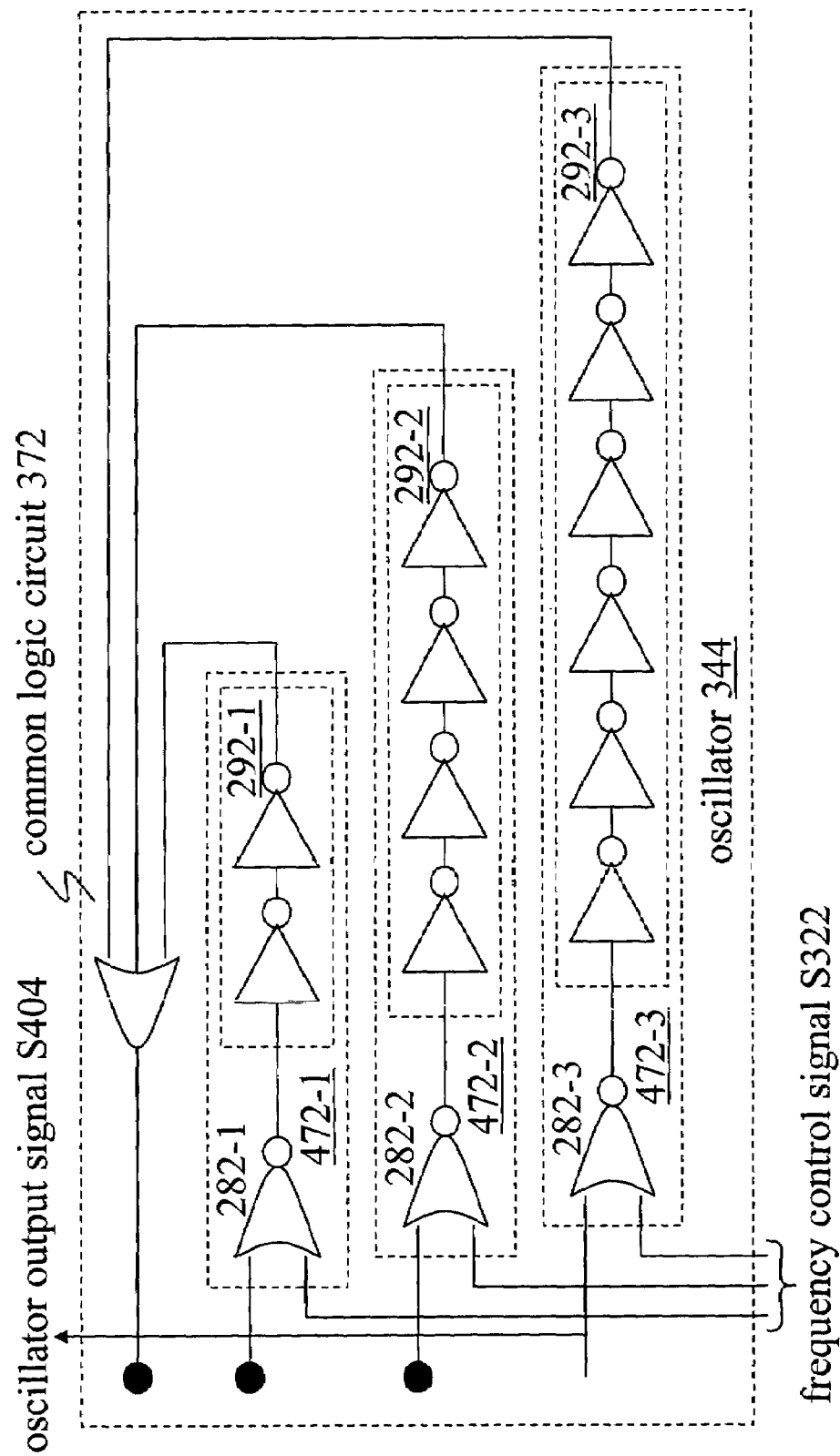
FIG. 34 shows a block diagram of an implementation 344 of oscillator 342.

FIG. 34 shows a block diagram of an implementation 344 of oscillator 342. Each selectable delay line 472 includes an inverting selector portion 282 (e.g. a NOR gate) and a delay portion 292 having an even number of inverters in series. Common logic circuit 372 is a noninverting selector (e.g. an OR gate). In this case, the lines of frequency control signal S322 are active low.

Figure 35:
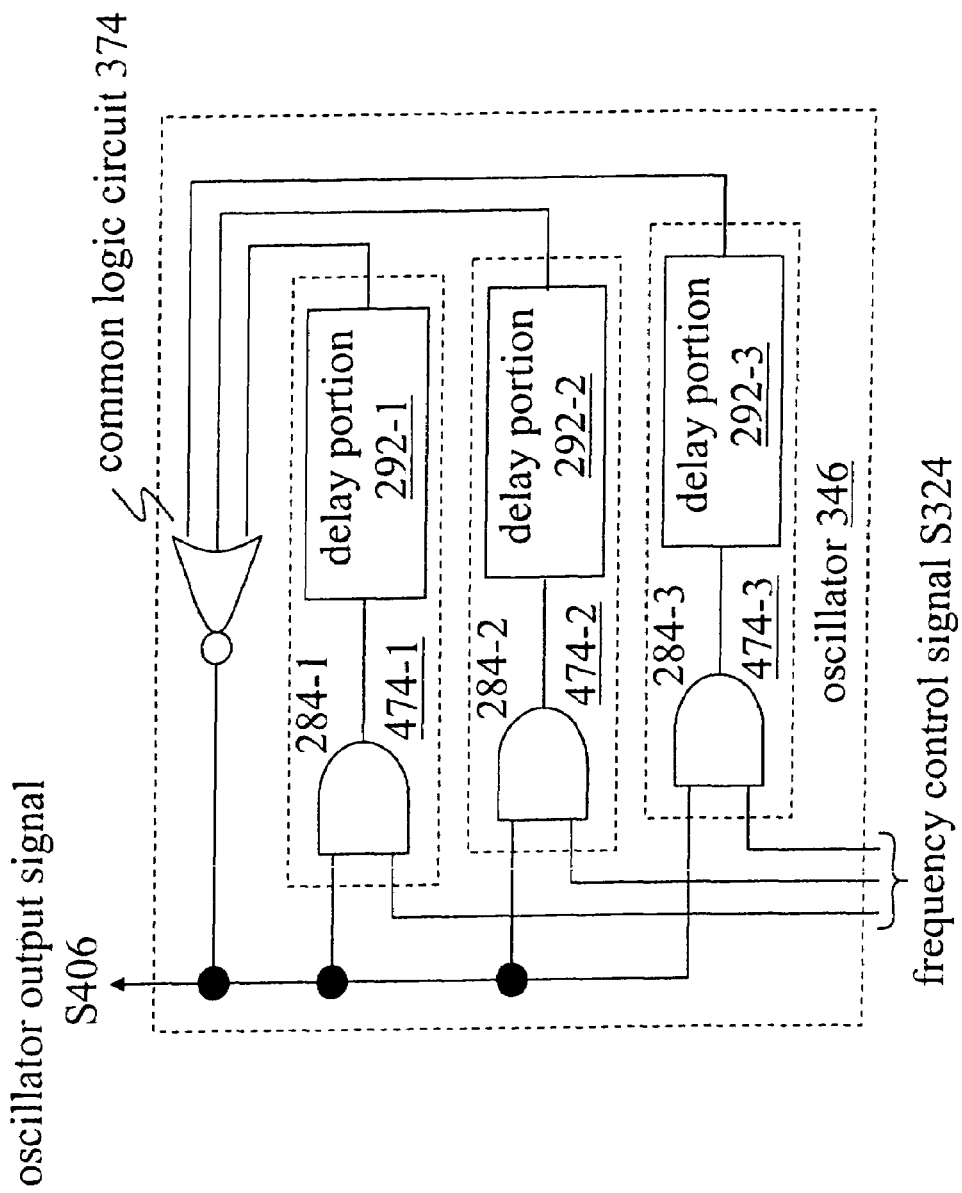
FIG. 35 shows a block diagram of an implementation 346 of oscillator 342.

FIG. 35 shows a block diagram of an implementation 346 of oscillator 342. Each selectable delay line 474 includes a noninverting selector portion 284 (e.g. an AND gate) and a delay portion 292 having an even number of inverters in series. Common logic circuit 374 is an inverting selector (e.g. a NOR gate). In this case, the lines of frequency control signal S324 are active high.

Figure 36:
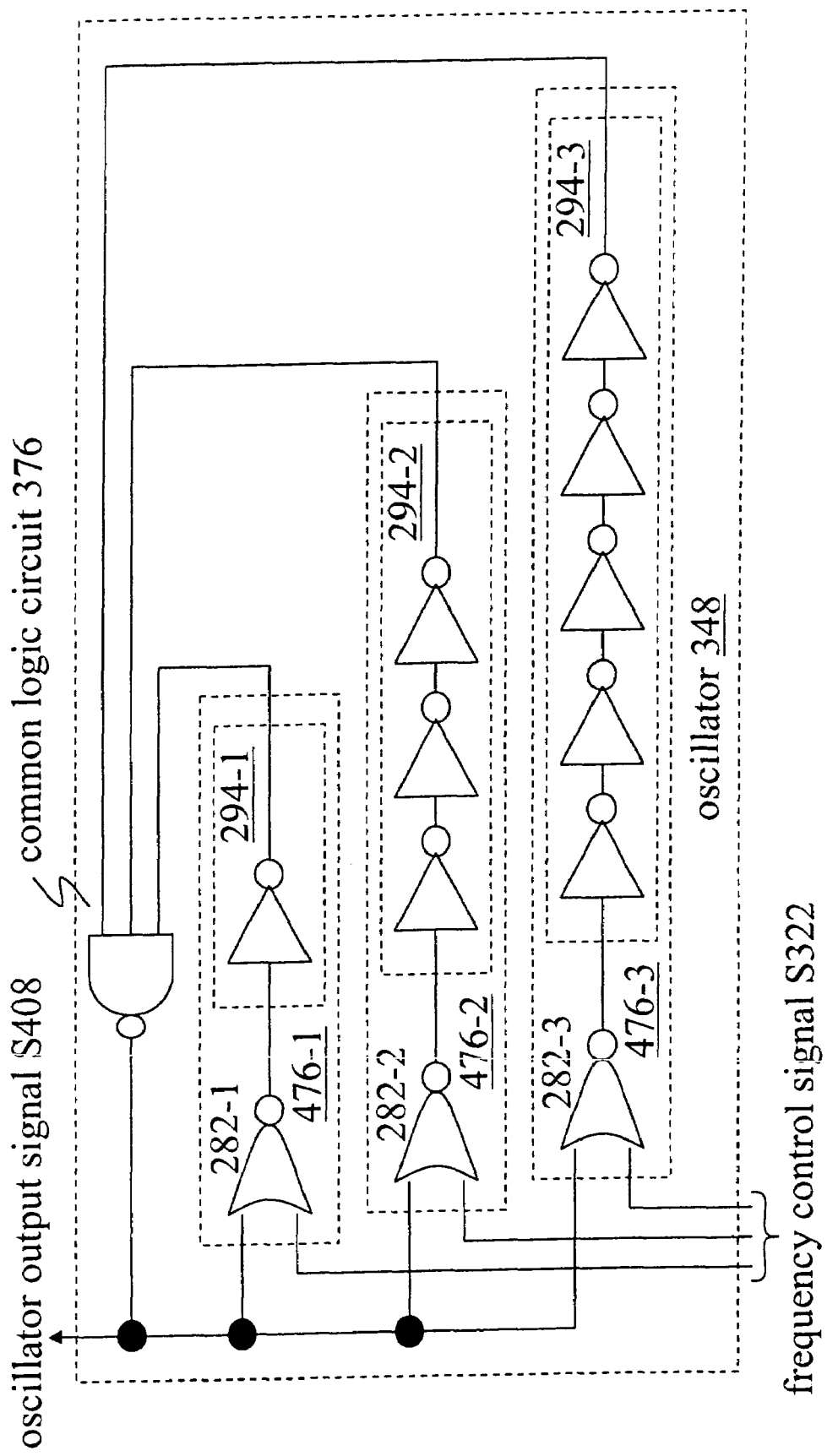
FIG. 36 shows a block diagram of an implementation 348 of oscillator 342.

Many other configurations are possible for oscillator 342, including configurations in which each selectable delay line includes a chain having an odd number of inverters in series. For example, FIG. 36 shows such a configuration 348 that includes selectable delay lines 476 having delay portions 294 (in this case, the lines of frequency control signal S322 are active low). The shortest path in an implementation of oscillator 342 may include only three inversions, while the longest path may include an arbitrarily large odd number of inversions. Additionally, the number of different selectable delays in an implementation of oscillator 342 may be arbitrarily large.

Figure 37:
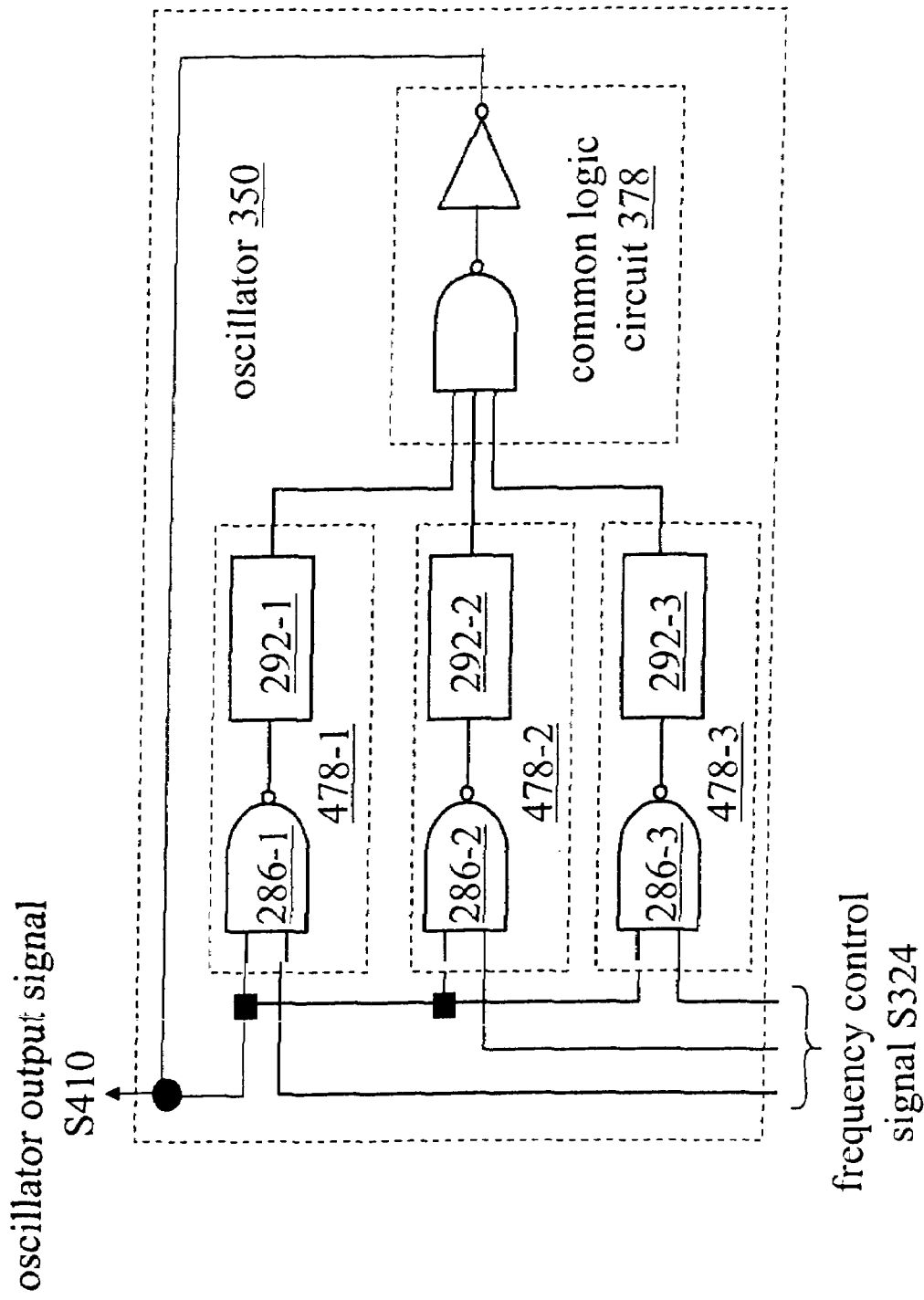
FIG. 37 shows a block diagram of an implementation 350 of oscillator 342.

FIG. 37 shows a block diagram of an implementation 350 of oscillator 342 in which an implementation 378 of common logic circuit 370 includes a NAND gate and an inverter. In this example, each selectable delay line 478 includes a selector portion 286 (e.g. a NAND gate) and a delay portion 292 that includes a generic (e.g. analog and/or digital) delay line.

Figure 38:
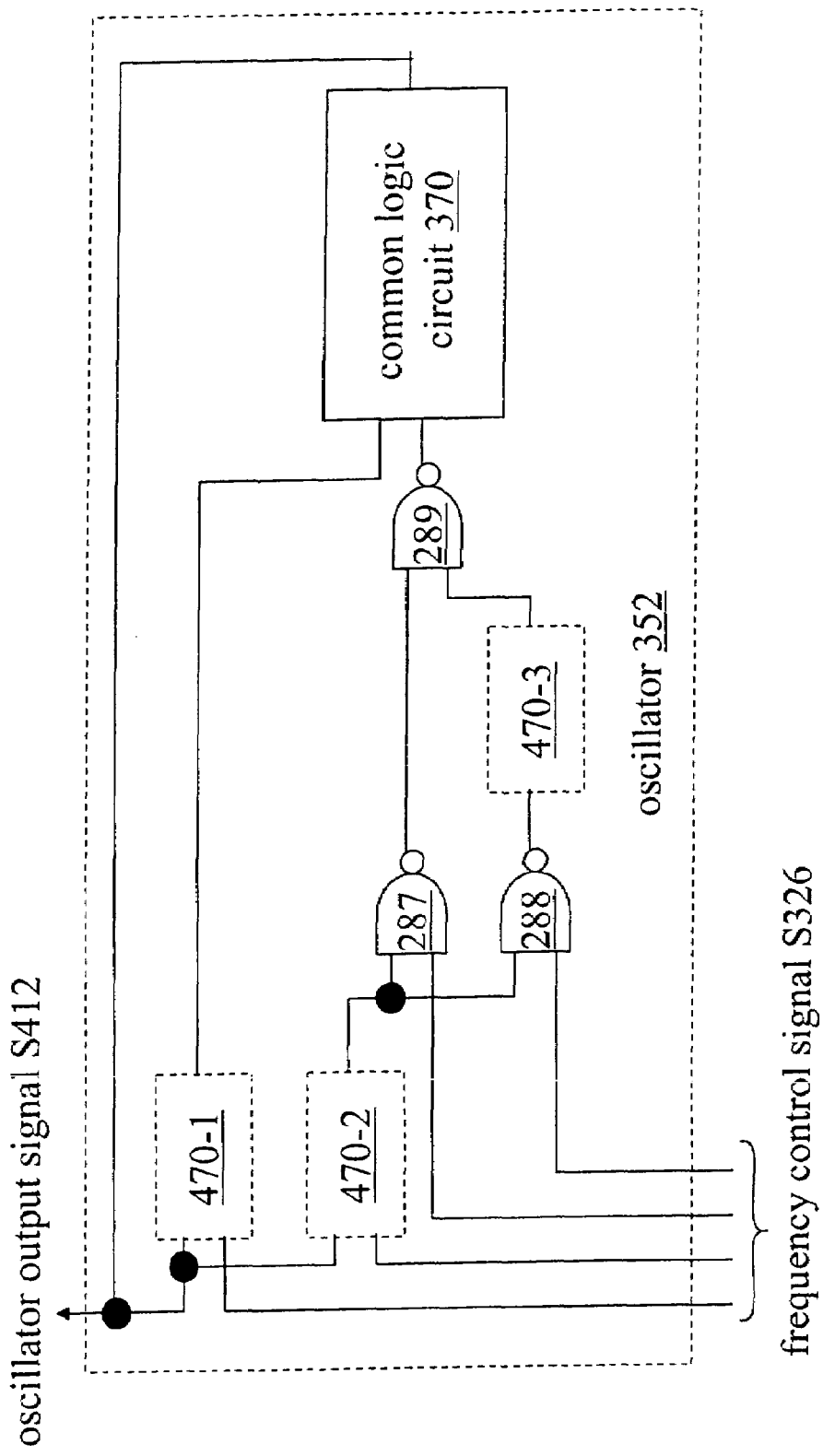
FIG. 38 shows a block diagram of an implementation 352 of oscillator 342.

In some implementations of oscillator 342, one or more delay paths may be further selectable. For example, FIG. 38 shows an implementation 352 of oscillator 342 in which one of the delay paths includes two individual selectable delay lines 470.

Oscillators based on implementations of oscillator 342 as described herein may also include oscillators that produce more than one burst simultaneously, each such burst occupying a different frequency band.

A frequency of an oscillator may change over time. For example, the delays introduced by the delay lines of oscillator 342 may change in some cases due to environmental factors, such as temperature or voltage, or to other factors such as aging or device-to-device variances. It may be desirable to compensate for these variations, e.g. in order to maintain a desired oscillation frequency.

Figure 39:
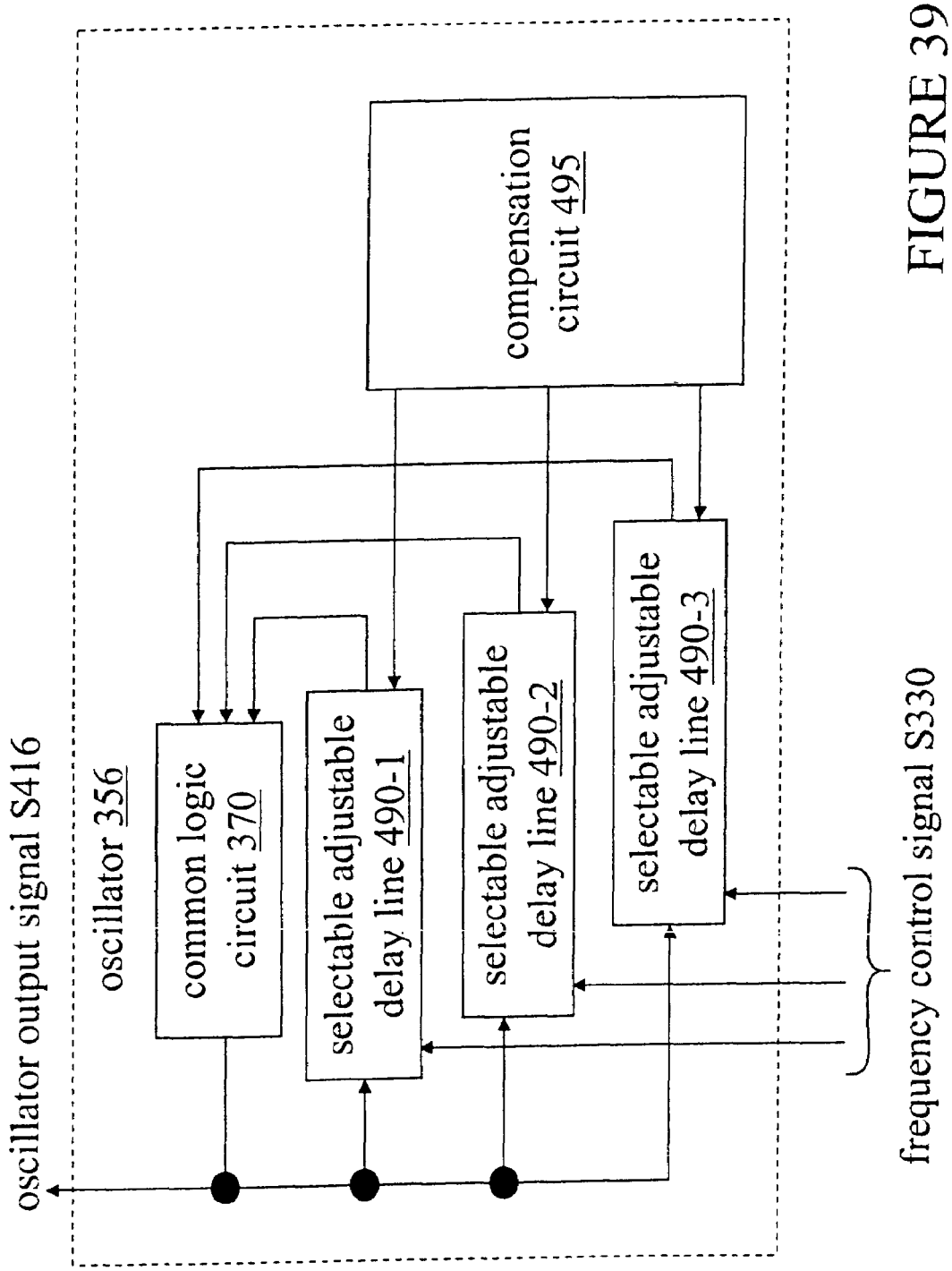
FIG. 39 shows a block diagram of an implementation 356 of oscillator 342 and a compensation mechanism 495.

FIG. 39 shows an implementation 356 of oscillator 342 that includes selectable adjustable delay lines 490. Each of selectable adjustable delay lines 490 may include a controllable delay element as described in, e.g., any one of U.S. Pat. No. 5,646,519; 5,731,726; or 6,054,884. Compensation circuit 495 controls a delay period of at least one of selectable adjustable delay lines 490.

Figure 40:
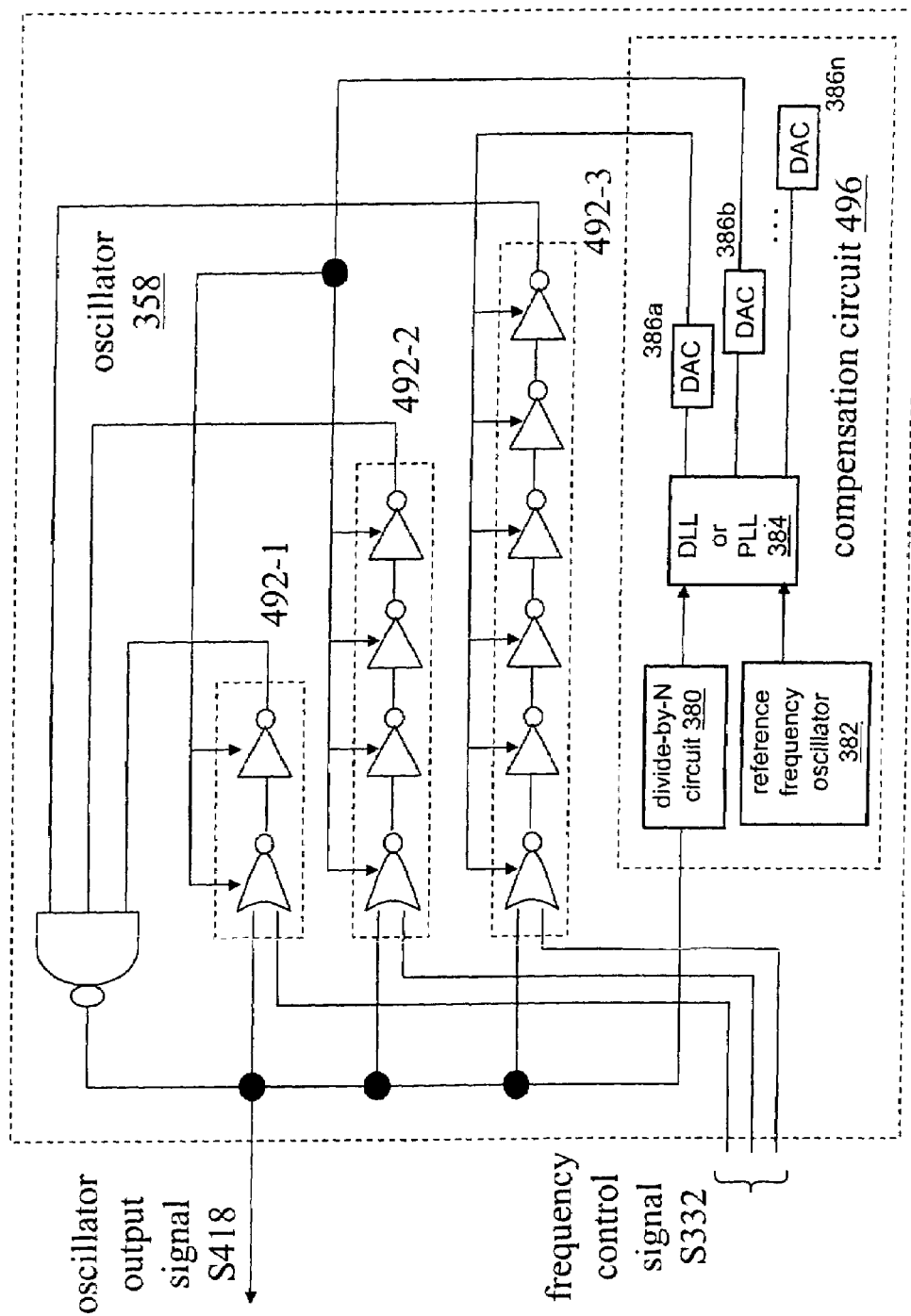
FIG. 40 shows a block diagram of an implementation 358 of oscillator 342 and an implementation 496 of compensation mechanism 495.

FIG. 40 shows a block diagram of an implementation 358 of oscillator 342 that includes an implementation 496 of compensation circuit 495. Divide-by-N circuit 380 scales the frequency of the oscillator output to match that of a reference frequency oscillator 382. A phase-locked loop (or digital locked loop) 384 compares the two frequencies and outputs a signal (e.g. a voltage) according to a difference in frequency or phase between them. One or more digital-to-analog converters (DACs) and/or controllable voltage references 386 may be included to convert a digital difference signal into an analog signal to control a characteristic of one or more of the adjustable delay lines 492. A DAC or controllable reference may be dedicated to one delay line or may control more than one delay line. The DACs or controllable references may also serve to sample and hold the difference signal until a subsequent compensation operation. In another implementation, one or more of the adjustable delay lines are controlled digitally.

Figure 41:
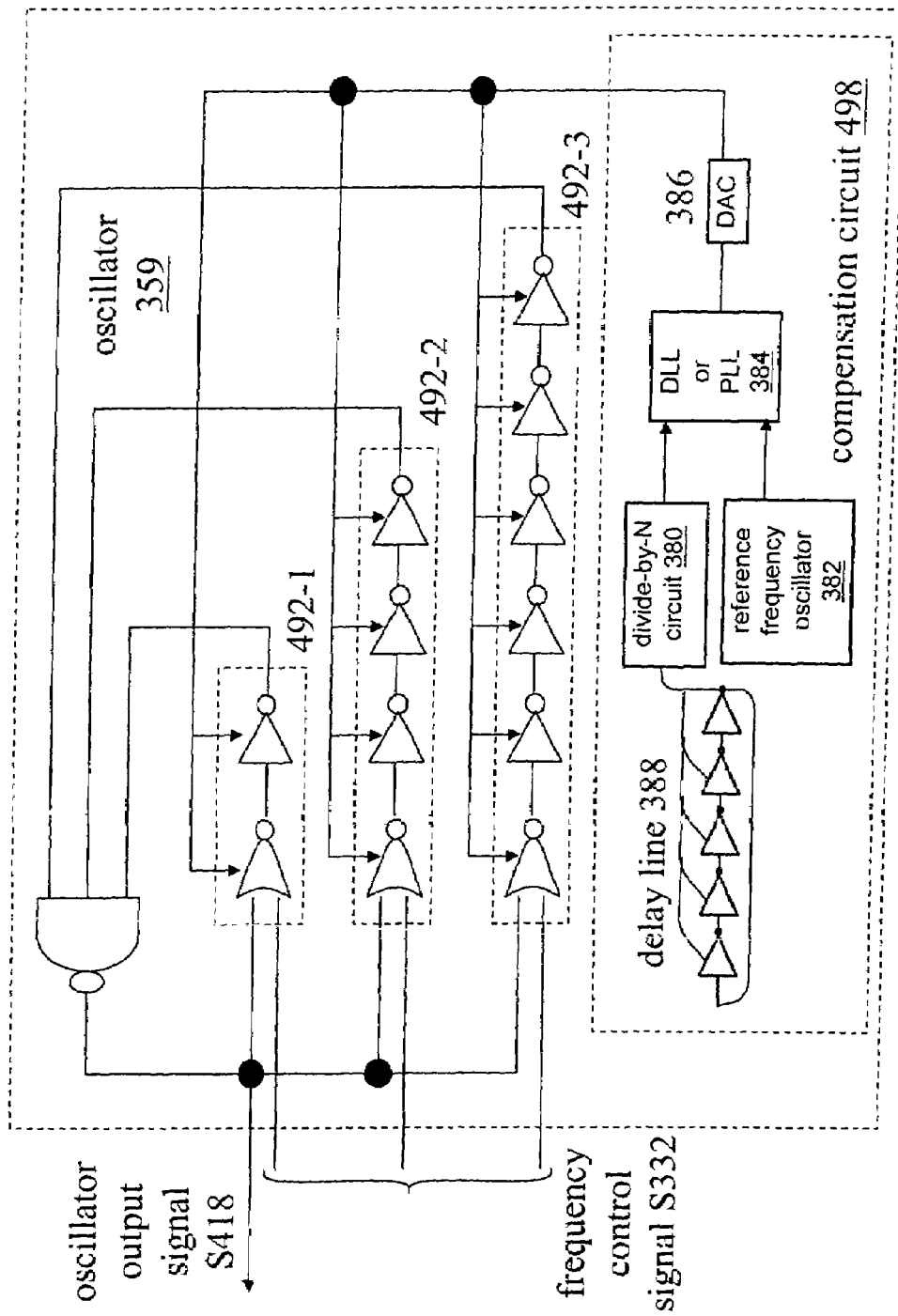
FIG. 41 shows a block diagram of oscillator 358 and an implementation 498 of compensation mechanism 495.

FIG. 41 shows a block diagram of an implementation 359 of oscillator 342 that includes an alternate implementation 498 of compensation circuit 495. This circuit includes an additional delay line 388 that is fabricated to react to environmental changes in the same way as the adjustable delay lines 492. The adjustable delay lines are then controlled according to a frequency or phase error in the additional delay line 388.

Figure 42:
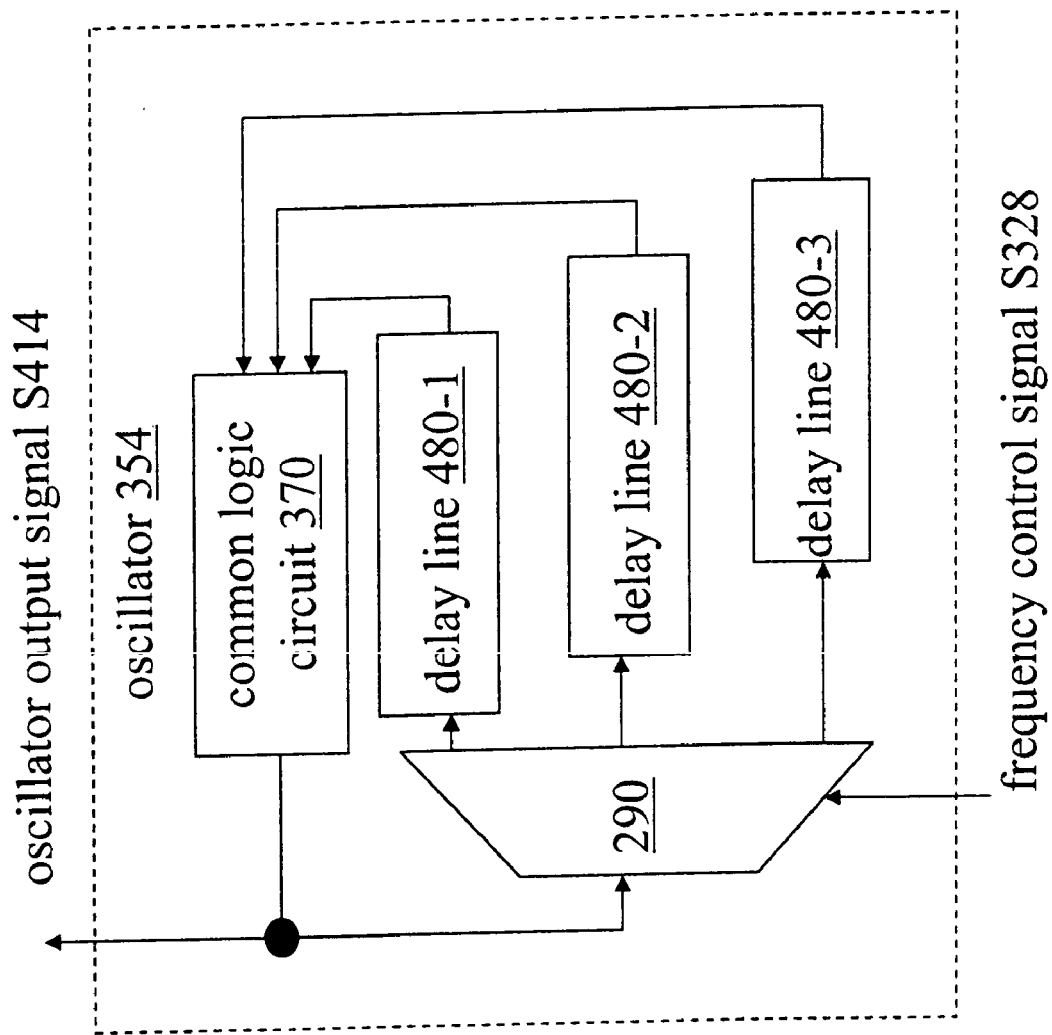
FIG. 42 shows a block diagram of an implementation 354 of oscillator 342.

FIG. 42 shows a block diagram of an implementation 354 of oscillator 340 that may be used in place of oscillator 342, e.g. in many of the applications described herein. In this implementation, multiplexer 290 applied an implementation S328 of frequency control signal S320 to provide selection between the various delay lines 480, which may be adjustable (e.g. by a compensation circuit as described herein) but need not include selector portions.

In some applications, it may be acceptable to run oscillator 340 continuously. In other applications, it may be desirable to reduce power consumption by, e.g., turning on oscillator 340 (or a portion thereof, such as a compensation circuit) only a short period before transmitting.

In some implementations of oscillator 342, an oscillator output signal may be tapped off for signal launch at more than one location. For example, tap off can occur at a junction where all signals are combined, or could occur outside of junctions for each signal in which the signals may or may not be later combined.

Figure 43:
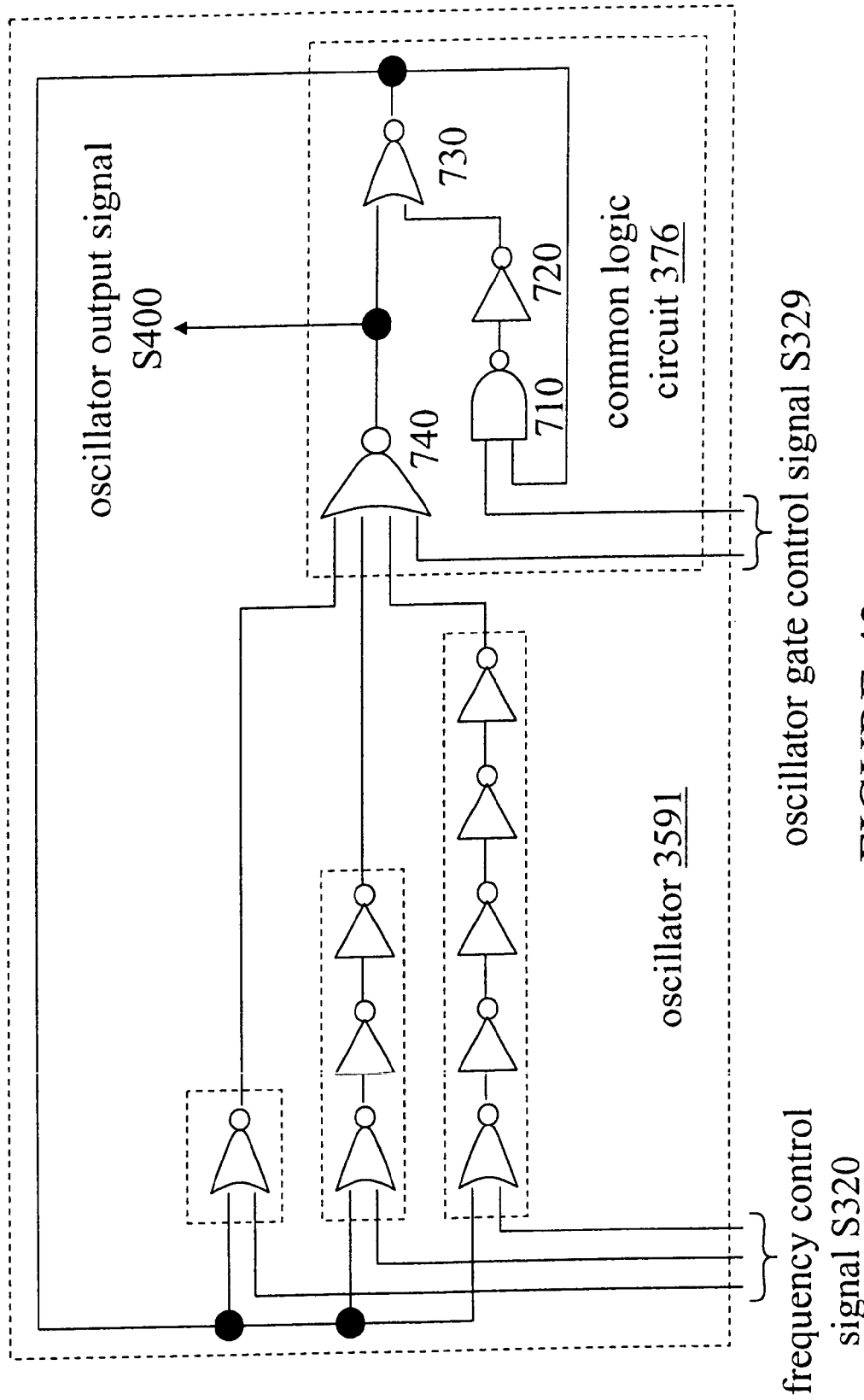
FIG. 43 shows a block diagram of an implementation 360 of oscillator 342 according to an embodiment of the invention.

FIG. 43 shows a block diagram of an implementation 3591 of oscillator 342. When all of the delay lines are disabled (in this example, by holding all lines of frequency control signal S320 high), the oscillator section (here, gates 710, 720, and 730) within common logic circuit 376 maybe set to run freely (in this example, with both lines of oscillator gate control signal S329 being high). When a signal launch is desired, frequency control signal S320 selects the desired delay line and both lines of oscillator gate control signal S329 are set low, forming a circuit including the selected delay line and output gate 740 to oscillate at the desired frequency. The lines of oscillator gate control signal S329 may be individually timed, or one line may be used. Similarly, the line or lines of oscillator gate control signal S329 may be linked to (e.g. may provide timing for or may be derived from) frequency control signal S320 or may be individually timed (e.g. depending upon factors such as gate setup and hold times and concerns such as avoiding spurious outputs). A configuration as in oscillator 3591 may reduce transients due to oscillator start-up time by separating a free-running oscillator section from the output (e.g. from the signal launcher), so that this oscillator section may be continuously running between bursts or may be started-up at some time prior to the signal being launched.

In some applications, it may be desirable to filter the output of oscillator 360 (e.g. to remove unwanted harmonics). Examples of suitable filters may include cavity filters, surface acoustic wave (SAW) filters, discrete filters, transmission line filters, and/or any other RF filter technique.

Implementations of oscillator 360 as described above may be fabricated (e.g. in whole or in part) in application-specific integrated circuits (ASICs) using one or more known techniques such as ECL, PECL, CMOS, or BiCMOS and materials such as SiGe, GaAs, SiC, GaN, 'strained silicon', etc.

Figure 44:
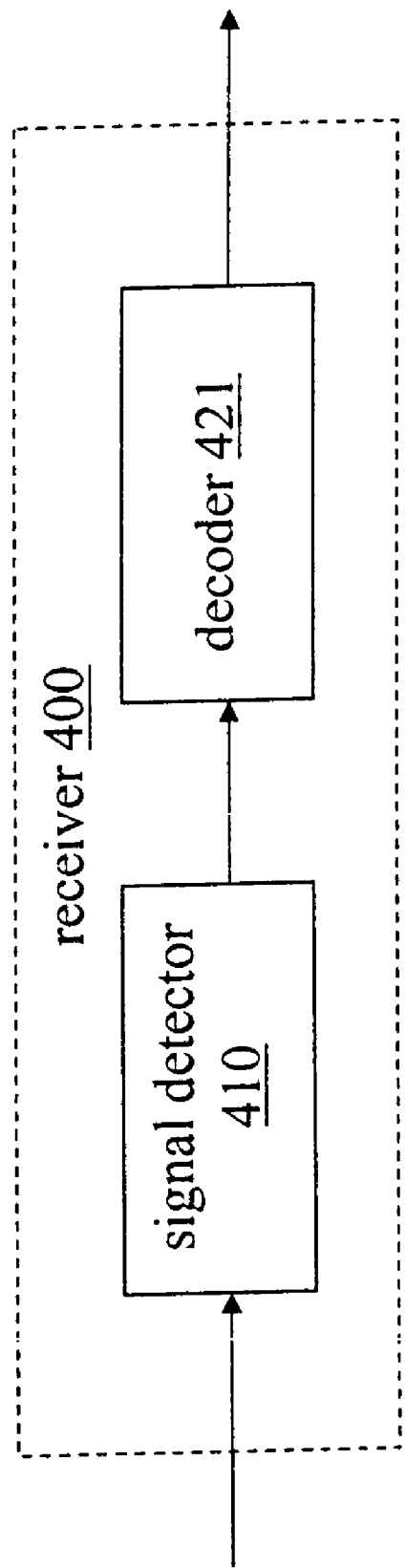
FIG. 44 shows a block diagram of a receiver 400 according to an embodiment of the invention.

FIG. 44 shows a receiver 400 according to an embodiment of the invention. Signal detector 410 receives a received signal (e.g. after amplification and/or filtering) and outputs an ordered series of n-tuples. Decoder 421 receives the ordered series of n-tuples and outputs a corresponding ordered set of data values. Decoder 421 may also perform digital signal processing operations on the series of n-tuples (e.g. filtering operations).

Figure 45:
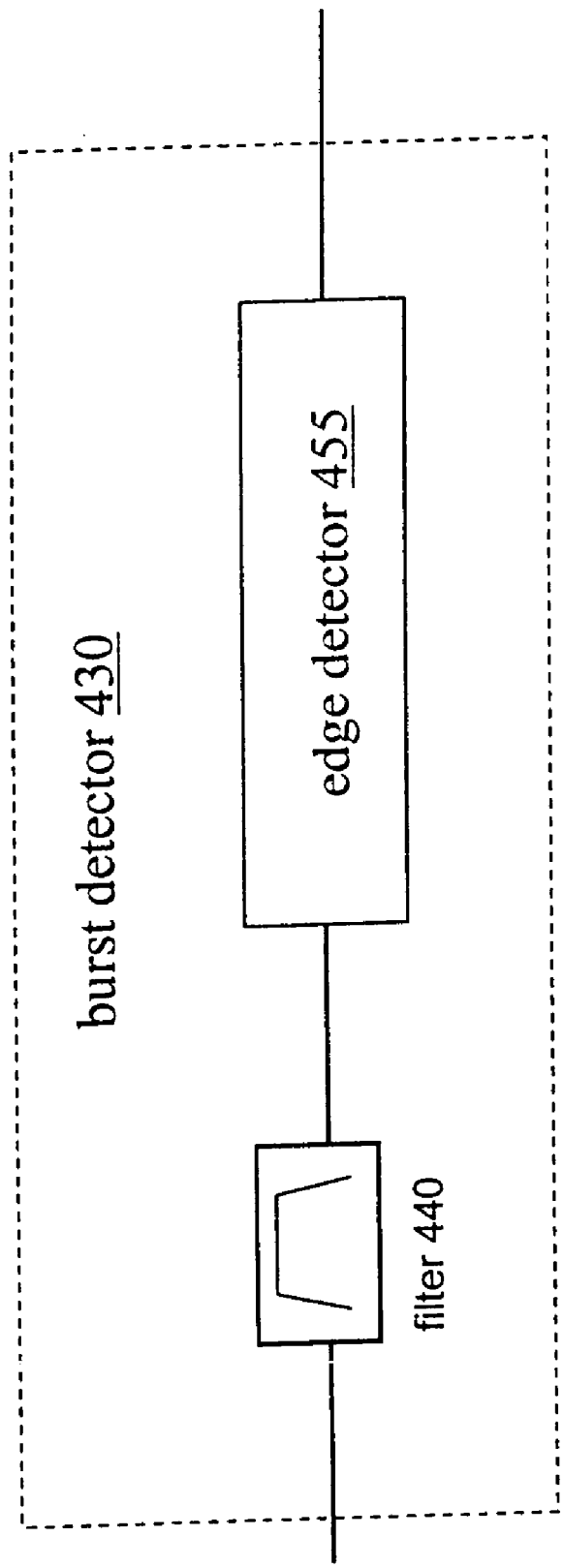
FIG. 45 shows a block diagram of a burst detector.

FIG. 45 shows a block diagram of a burst detector 430 suitable for use in signal detector 410. Filter 440 (e.g. a bandpass filter) passes energy within a particular frequency band. Edge detector 455 detects a rising edge of a signal received within the corresponding frequency band. Signal detector 410 may include a parallel arrangement of several burst detectors, each configured to detect bursts on a different frequency band.

Figure 46:
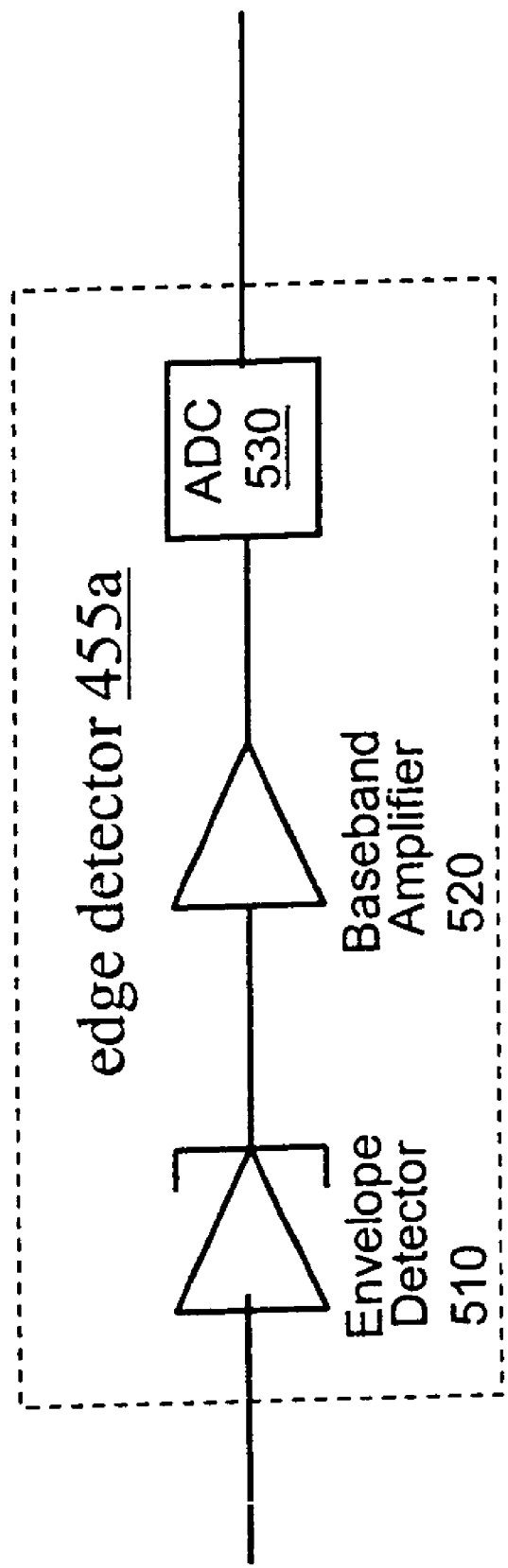
FIG. 46 shows a block diagram of an implementation 455a of edge detector 455.

FIG. 46 shows a block diagram of an implementation 455a of edge detector 455. In this example, the envelope detector 510 is a square-law device. For high-frequency applications, for example, the envelope detector 510 may be a tunneling diode or similar device. The baseband output of the envelope detector 510 is amplified (e.g. by baseband amplifier 520) and digitized (e.g. by analog-to-digital converter (ADC) 530).

Figure 47:
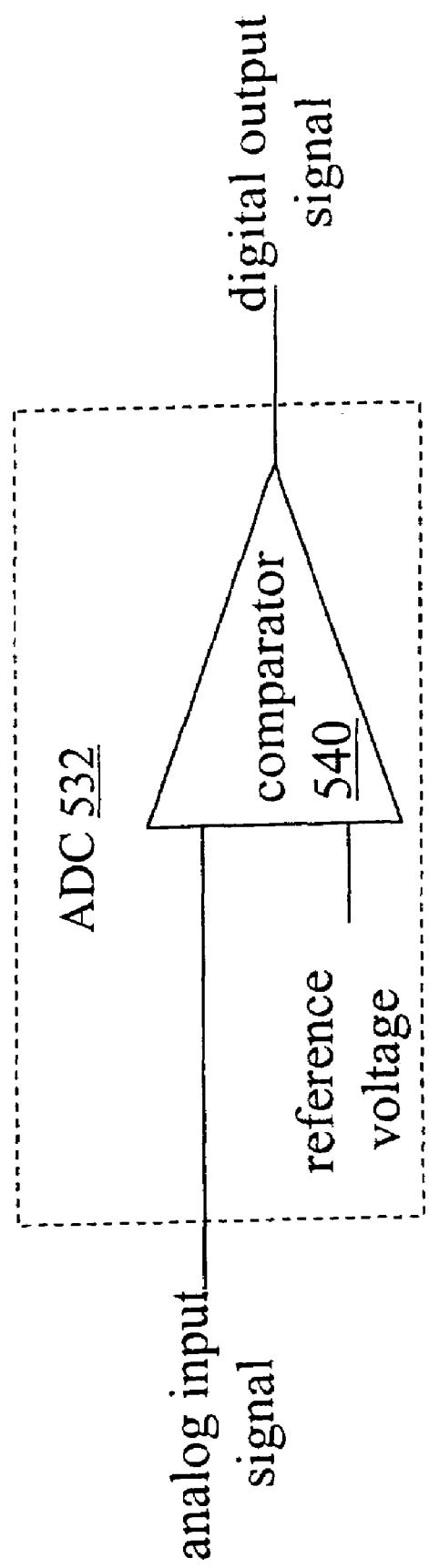
FIG. 47 shows a block diagram of an implementation 532 of ADC 530 that includes a comparator.

In its simplest form, digitization of the baseband signal may be performed by comparison of the signal with a reference voltage (e.g. thresholding). For example, FIG. 47 shows a block diagram of such an ADC 532 including a comparator 540. Depending on the particular application, other suitable ADCs may include multi-bit parallel-encoding (flash), successive-approximation, dual-slope, digital-ramp, delta-sigma-modulation, or other configurations.

Figure 48:
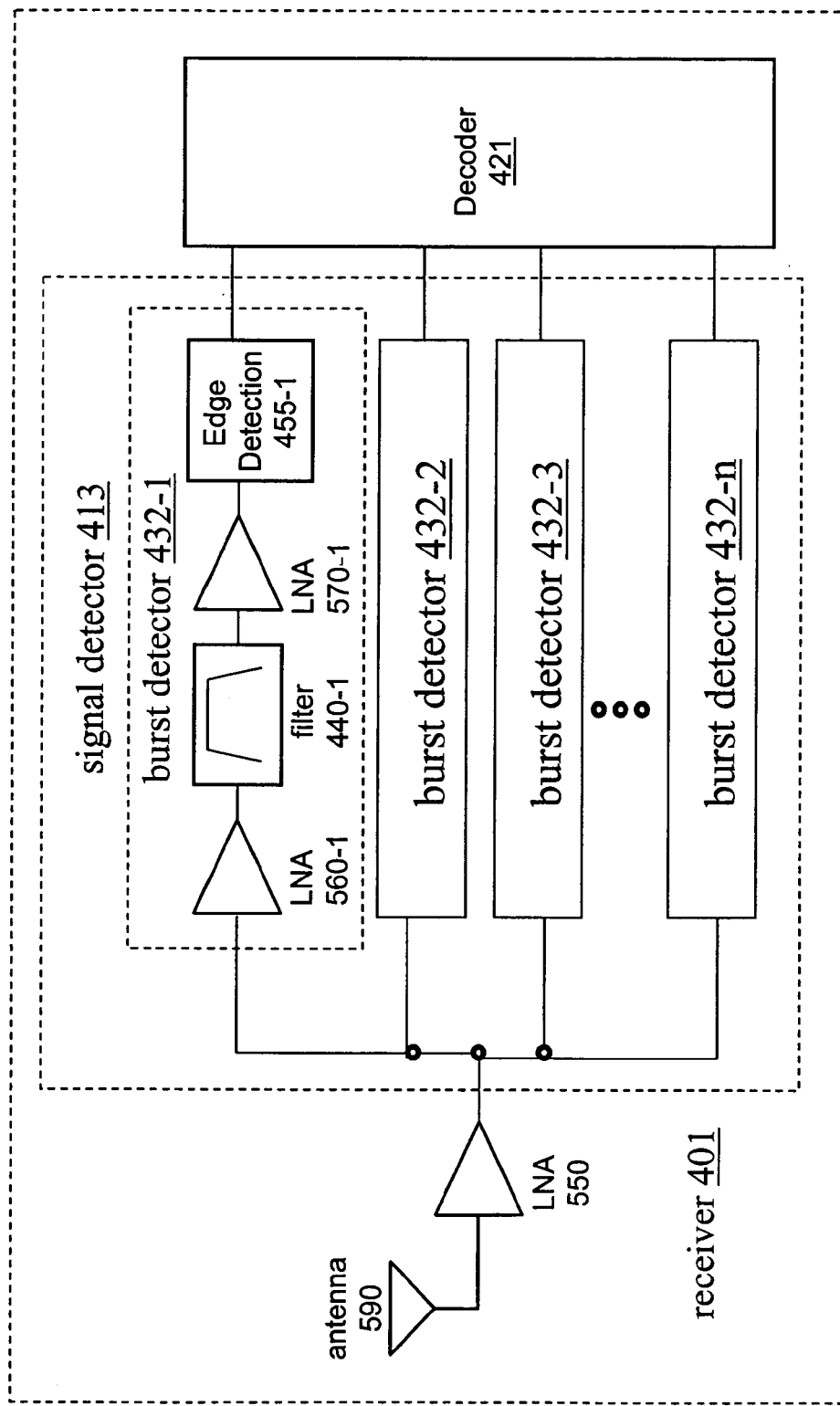
FIG. 48 shows a block diagram of a receiver 401 according to an embodiment of the invention including an implementation 413 of signal detector 410.

FIG. 48 shows an implementation 401 of receiver 400 that includes an implementation 413 of signal detector 410. Signaling is received at antenna 590 and coupled to the signal detector 413. Optionally, the received signaling may be amplified (e.g., by LNA 550) before forwarded to the processing circuitry. This signal detector 413 includes a parallel arrangement of implementations 432 of burst detectors 432, the outputs of which are coupled to the decoder 421. Each burst detector 432 includes a filter 440 and edge detector 455. As shown in this example, a burst detector 432 may include other processing blocks such as low-noise amplifiers (LNAs). It is noted that depending on the specific implementation, the one or more of the amplifiers (e.g., LNAs 550, 560 and 570) are optional.

Figure 49:
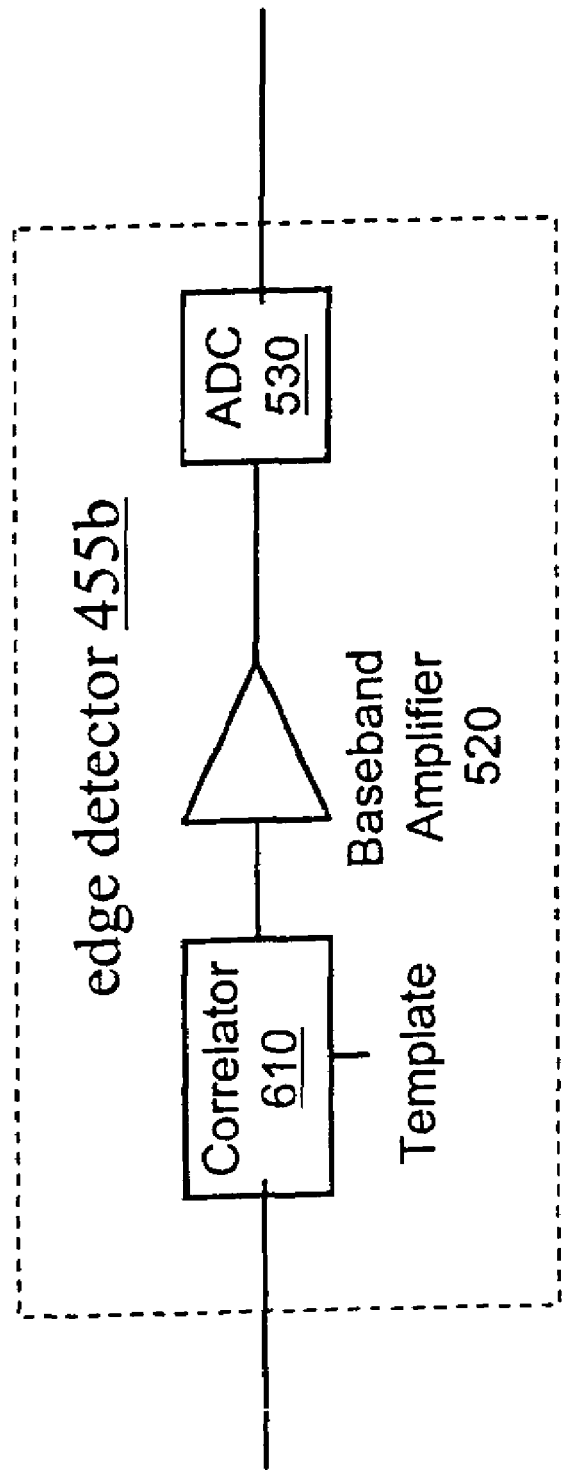
FIG. 49 shows a block diagram of an implementation 455b of edge detector 455.

FIG. 49 shows a block diagram of another implementation 455b of edge detector 455. In this example, a correlator 610 receives the filtered signal and correlates it with a template to produce a corresponding baseband signal, which is amplified (e.g. by baseband amplifier 520) and digitized (e.g. by ADC 530).

Figure 50:
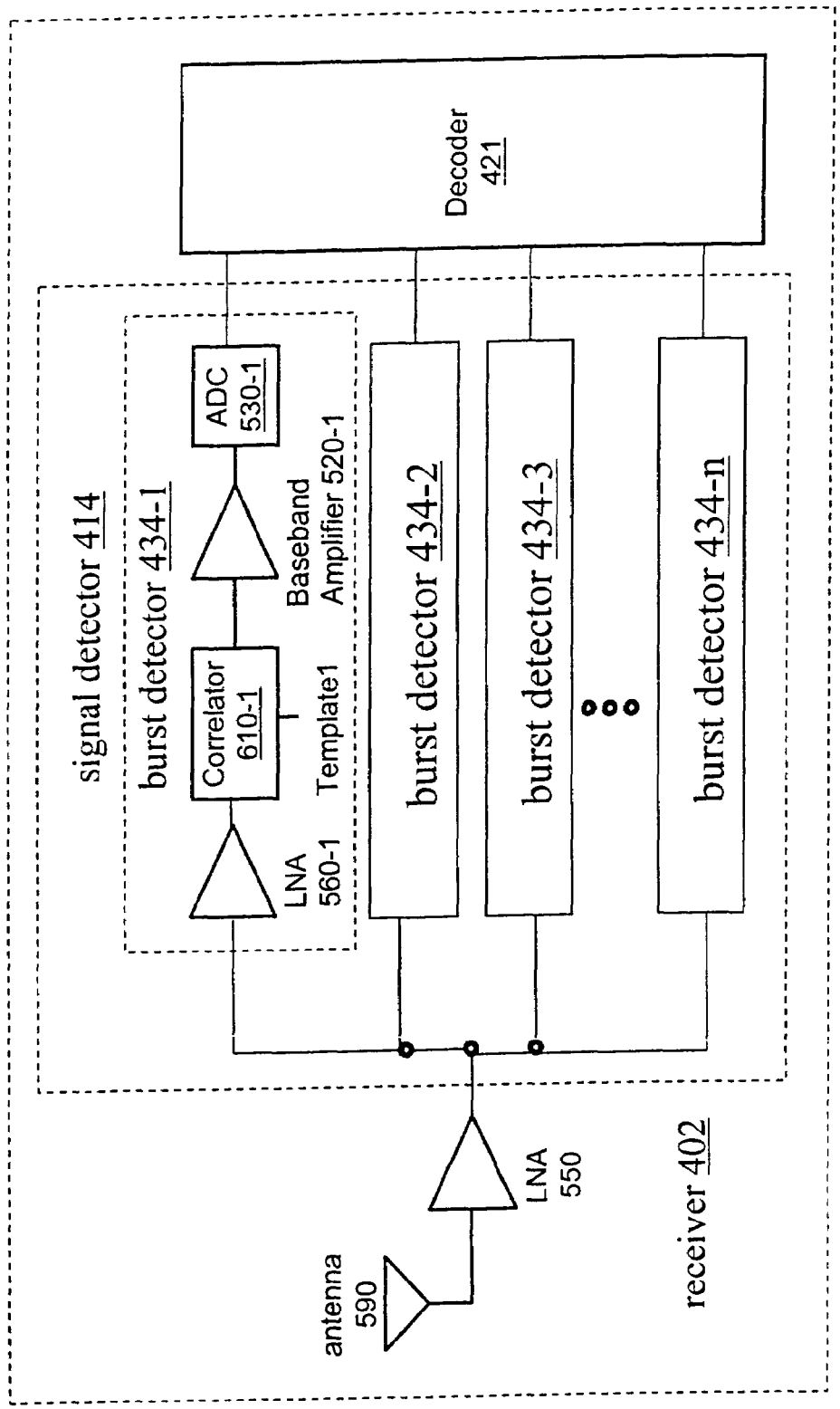
FIG. 50 shows a block diagram of a receiver 402 according to an embodiment of the invention including an implementation 414 of signal detector 410.

FIG. 50 shows an implementation 402 of receiver 400 that includes an implementation 414 of signal detector 410. This signal detector includes a parallel arrangement of implementations 434 of burst detector 430 that include correlators 610, each of which may apply a different template to their input signals. In this case, each burst detector 434 also includes a LNA 560 upstream of the correlator 610 that serves as a filter. Also, in this case, a baseband amplifier 520 is located between the correlator 610 and the ADC 530. Again, it is noted that depending on the specific implementation, one or more of the amplifiers (e.g., LNAs 550, 560 and amplifier 520) are optional.

Figure 51:
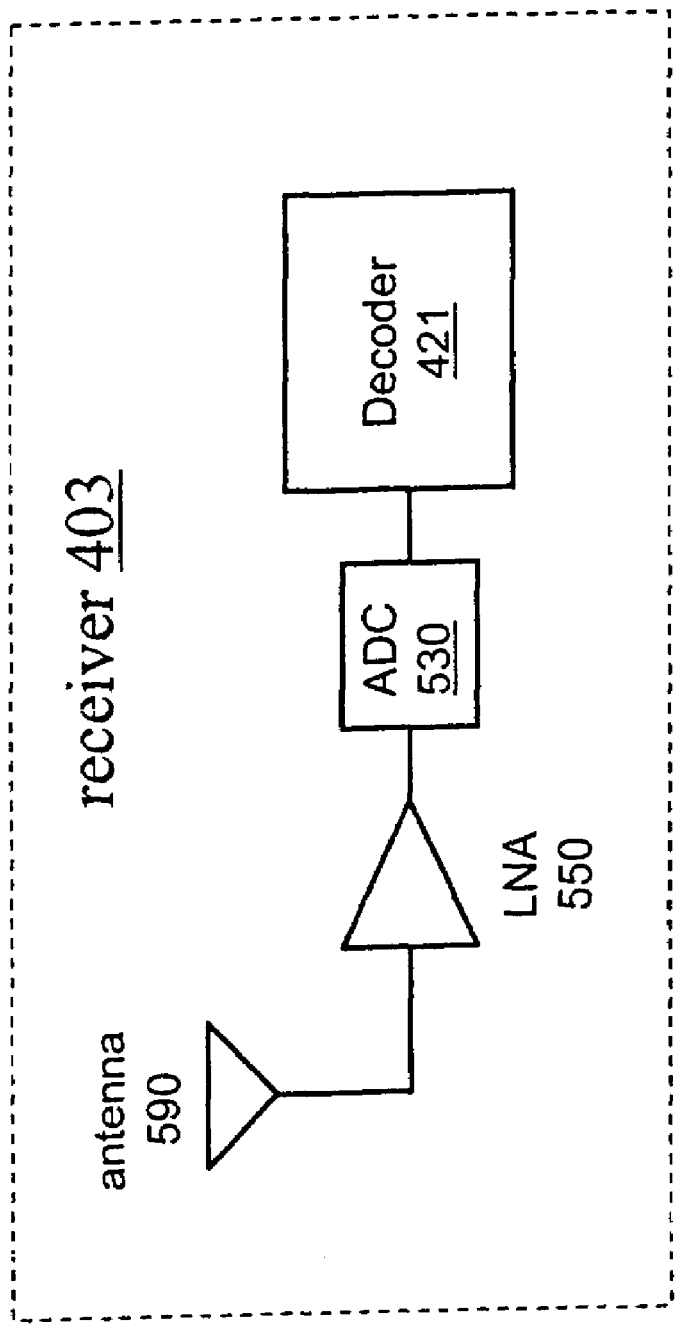
FIG. 51 shows a block diagram of a receiver 403 according to an embodiment of the invention.

As the operating speed of ADCs increases, it is also contemplated to sample the incoming signal directly and filter it after digitization. One such receiver is shown in FIG. 51. The signaling is received at antenna 590, optionally amplified (e.g., at LNA 550), converted to digital at ADC 530 and forwarded to the decoder 421. In one such implementation, the digitized output is filtered (e.g. by decoder 421) to determine the activity over time on each frequency band. In another implementation, successive fast Fourier transforms are performed in time on the digitized output, and the activity on each individual frequency band is determined from the resulting spectral information.

Figure 52:
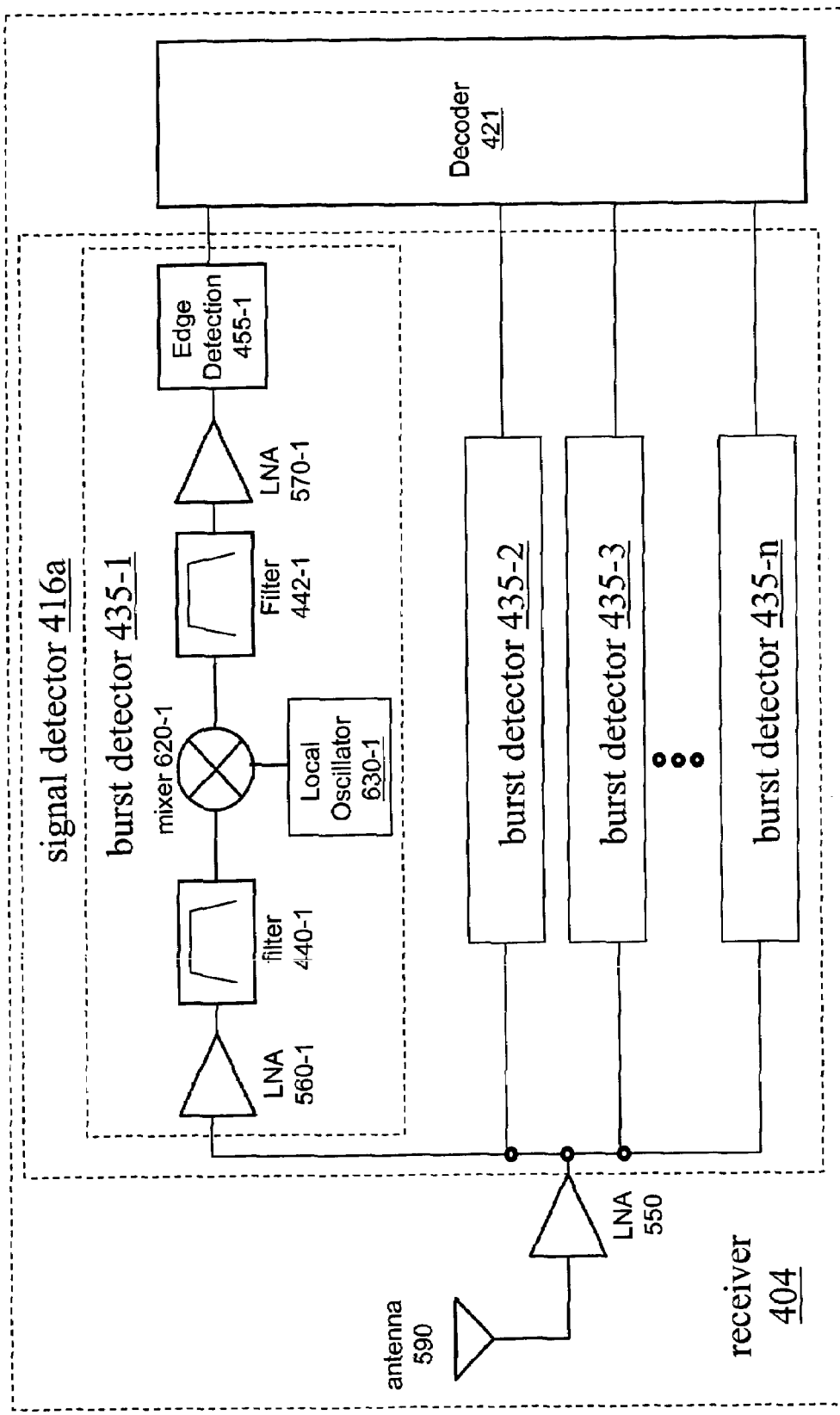
FIG. 52 shows a block diagram of a receiver 404 according to an embodiment of the invention.
Figure 53:
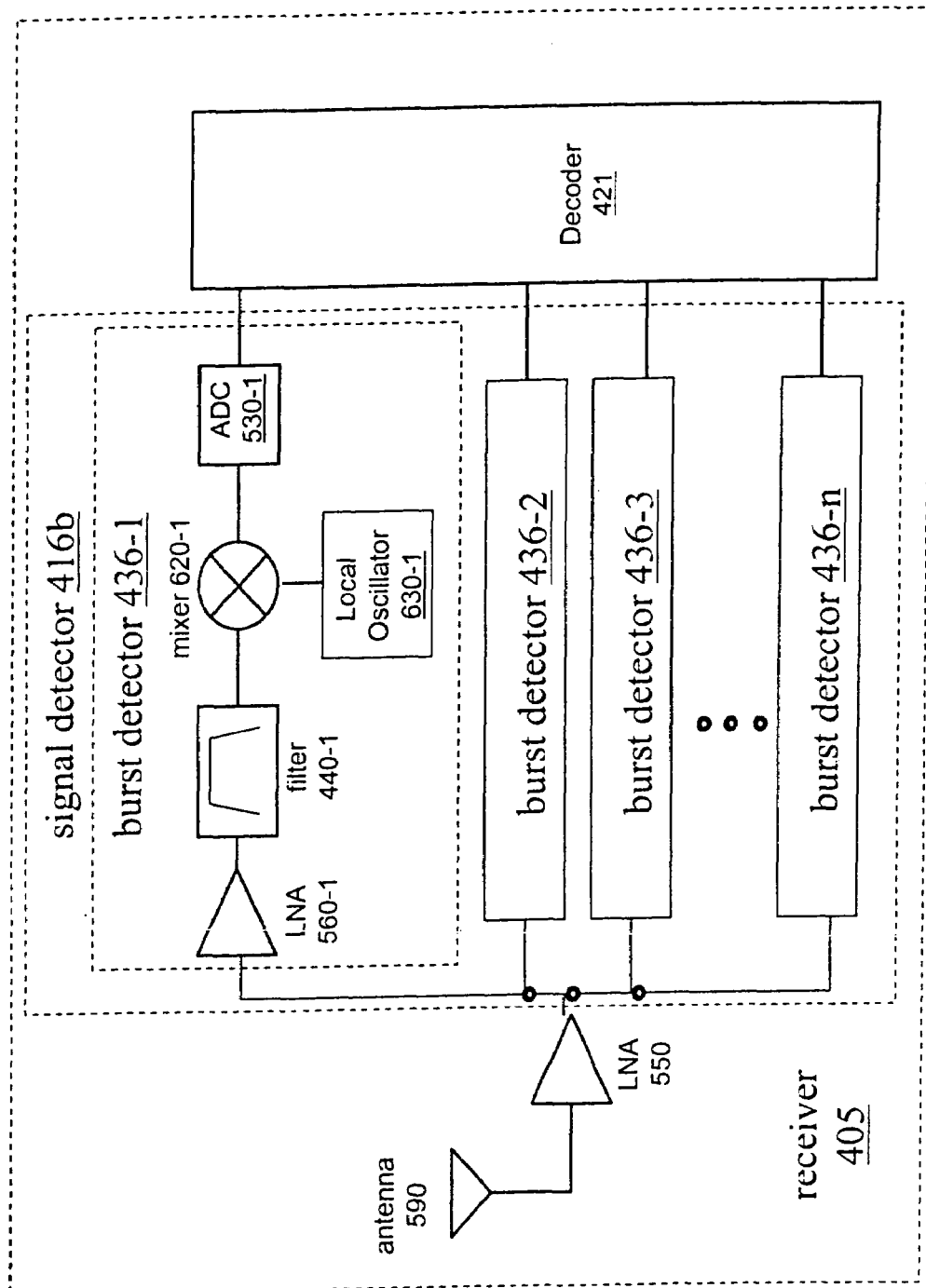
FIG. 53 shows a block diagram of a receiver 405 according to an embodiment of the invention.

It is also possible to divide the signal into different sections of the spectrum and then to downconvert each section separately. After downconversion (e.g. using a mixer 620 and local oscillator 630 at the desired intermediate frequency, which may differ from one frequency band to another), the bursts may be detected using edge detection or the signal may be sampled directly with an ADC. FIG. 52 shows a block diagram of an implementation 404 of receiver 400 that includes edge detectors 455. In this implementation 416a of the signal detector, the burst detector 435 amplifies (e.g., optional LNA 560) and filters (e.g., filter 440) the signal prior to downconverting (e.g., using the mixer 620 and local oscillator 630). The signal is then filtered (e.g., filter 442), optionally amplified (e.g., LNA 570) and then forwarded to the edge detection 455. FIG. 53 shows a block diagram of an implementation 405 of receiver 400 including implementation 416b of the signal detector including burst detectors 436 that sample each signal directly using an ADC. In this embodiment, each burst detector 436 optionally amplifies (e.g., LNA 560), filters (e.g., filter 440), and downconverts the signal (e.g., using the mixer 620 and the local oscillator 630), then converts the signal to digital (e.g., at ADC 530).

Figure 54:
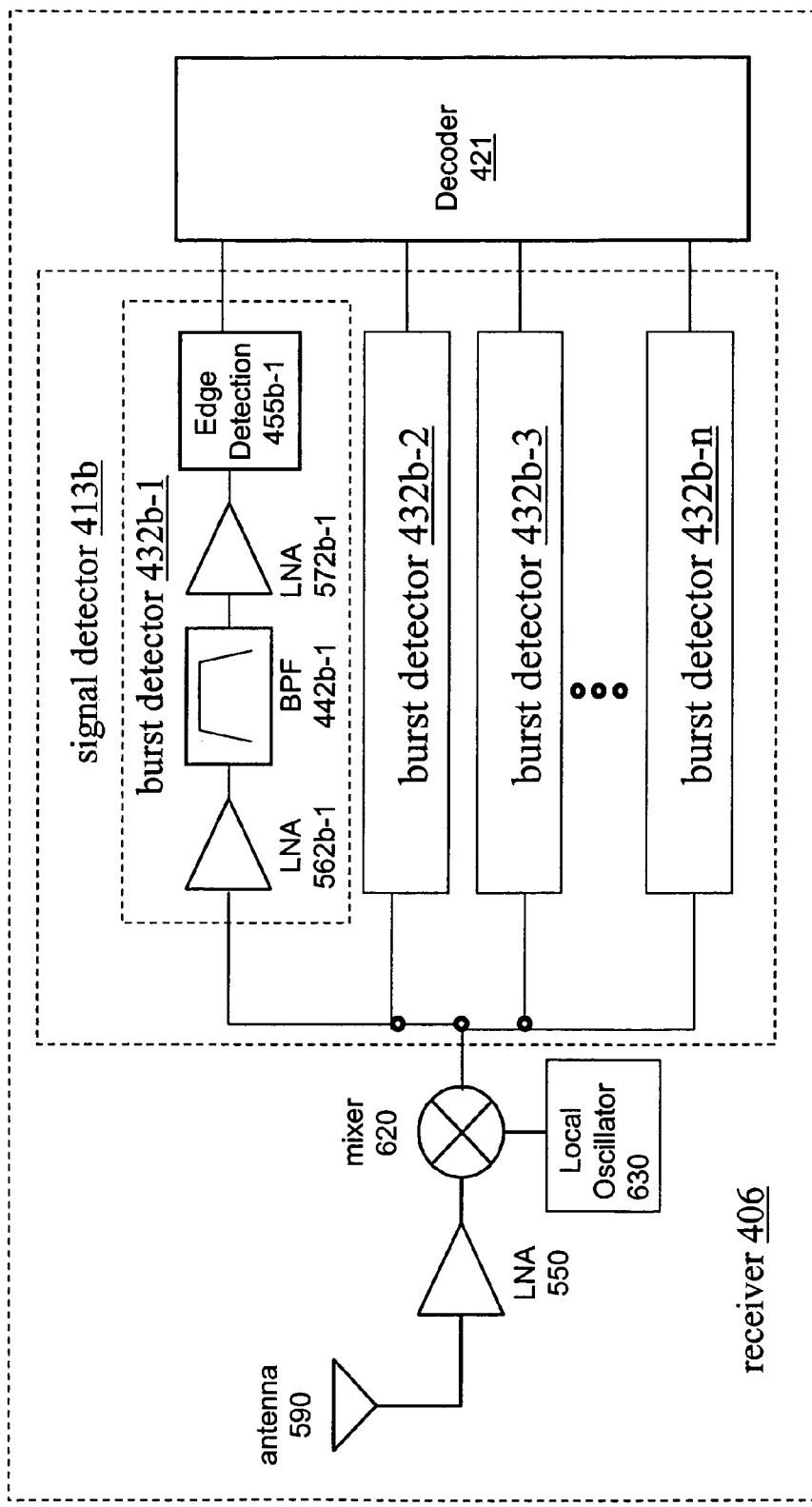
FIG. 54 shows a block diagram of a receiver 406 according to an embodiment of the invention.
Figure 55:
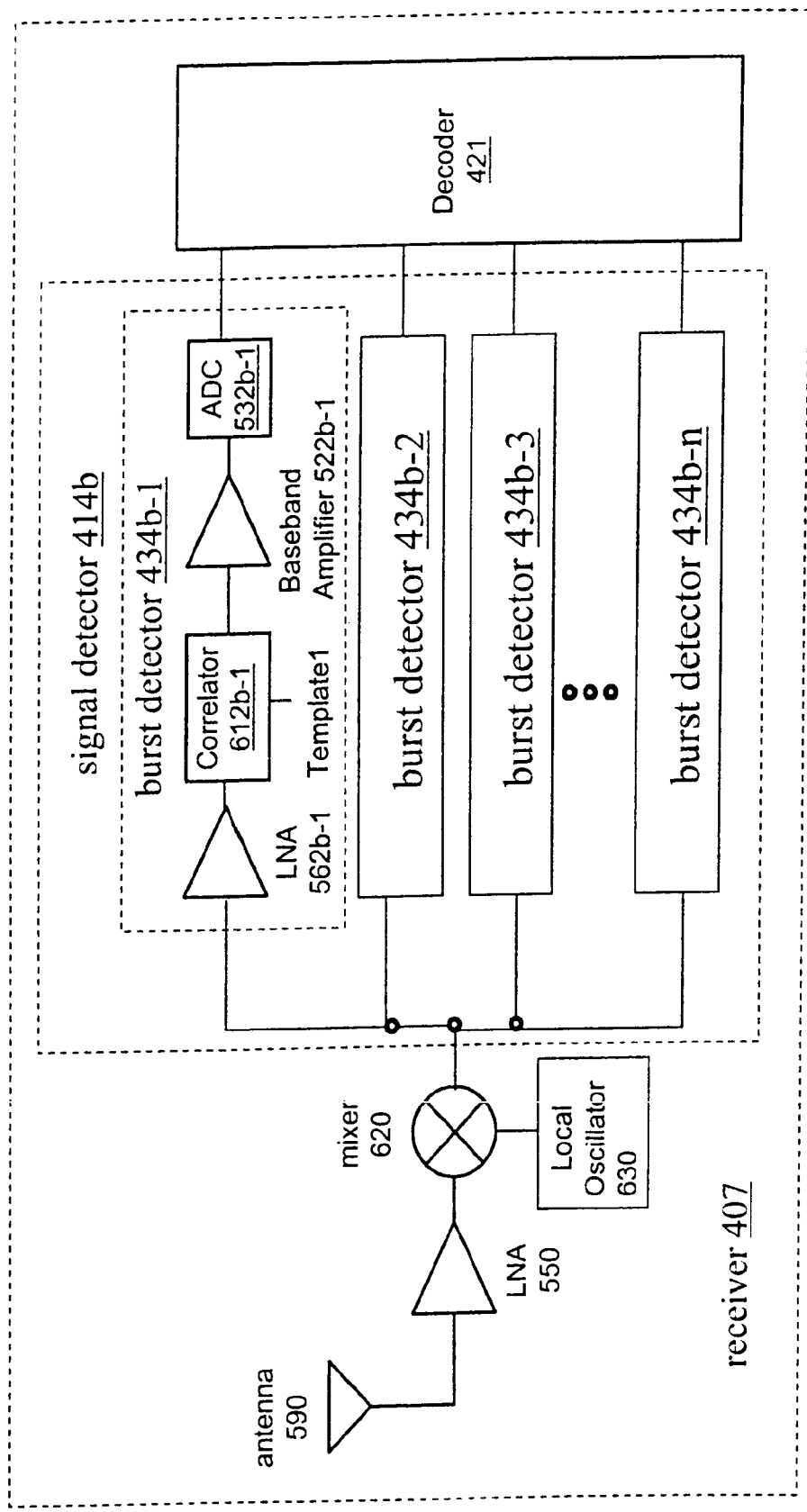
FIG. 55 shows a block diagram of a receiver 407 according to an embodiment of the invention.
Figure 56:
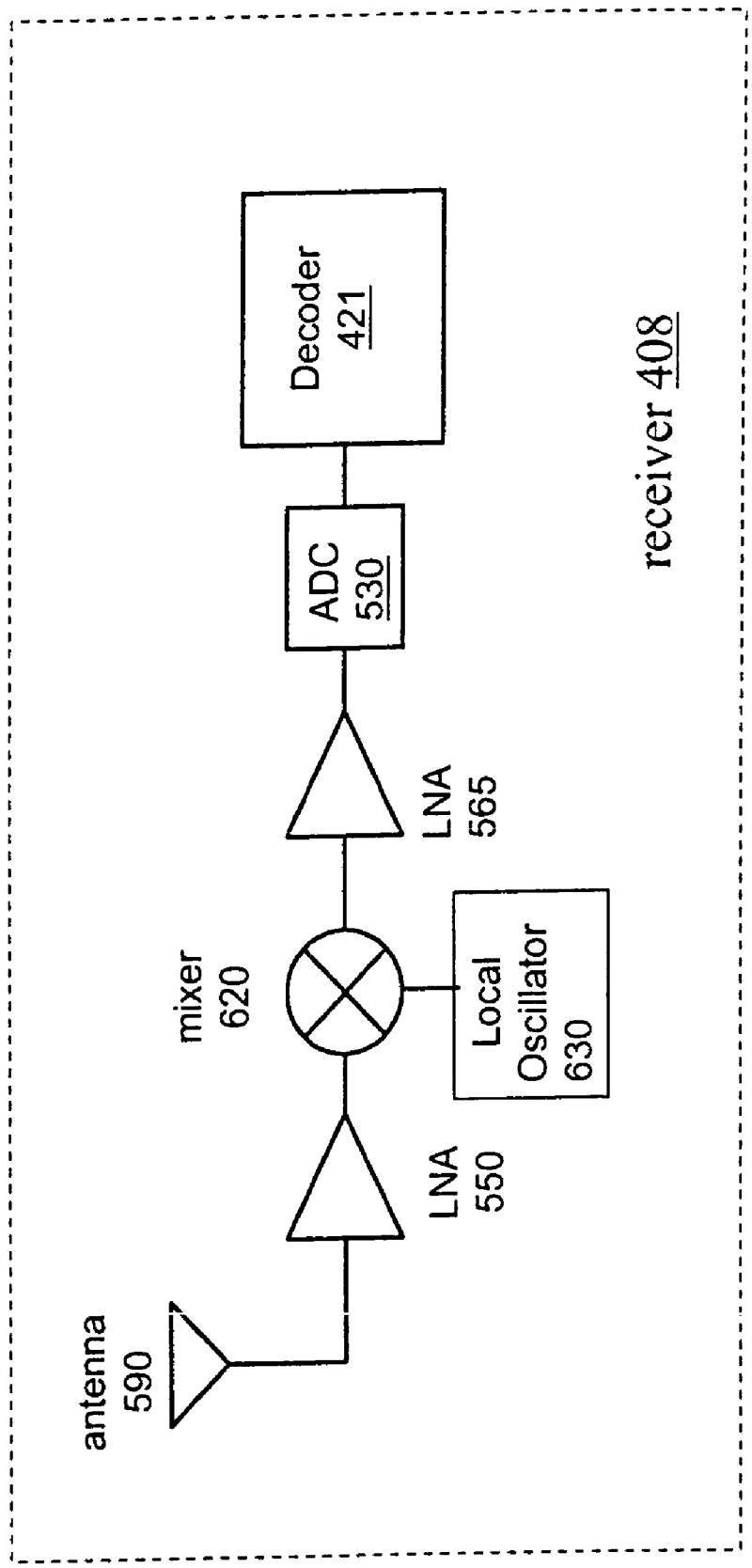
FIG. 56 shows a block diagram of a receiver 408 according to an embodiment of the invention.

In some applications, it may be desirable to downconvert the received signal to an intermediate frequency (e.g. by mixing with a local oscillator signal) before performing further processing as described above, i.e., convert to an intermediate frequency prior to processing entering the signal detector. For example, the signaling is received at antenna 590, optionally amplified (e.g., by LNA 550) as needed, then downconverted to an intermediate frequency (e.g., using the mixer 620 and the local oscillator 630), before entering the signal detector. Since the received signal contains bursts having different frequencies, the output of the downconverter is at a different intermediate frequency for bursts of different frequencies. FIG. 54 shows one such implementation 406 of receiver 400 in which the downconverted signal is divided into separate intermediate frequencies before edge detection 455. FIG. 55 shows another implementation in which the downconverted signal is divided into separate intermediate frequencies (by mixer 620 and local oscillator 630) before correlation (e.g., at correlator 612b). FIG. 56 shows a further implementation in which the downconverted and filtered signal is digitized directly similar to the embodiment of FIG. 51 (i.e., mixer 620 and local oscillator 630 before ADC 530).

Figure 57:
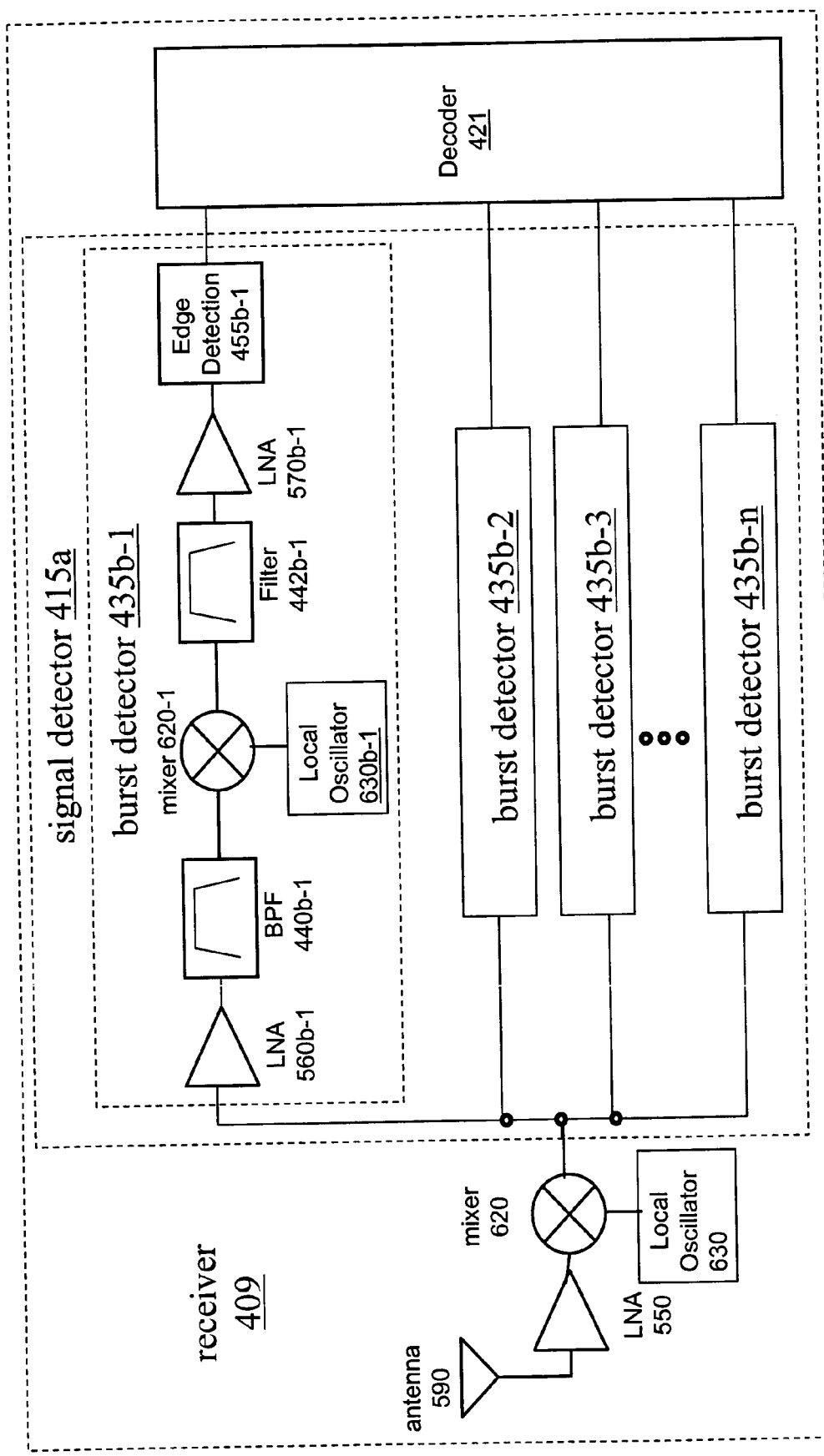
FIG. 57 shows a block diagram of a receiver 409 according to an embodiment of the invention.
Figure 58:
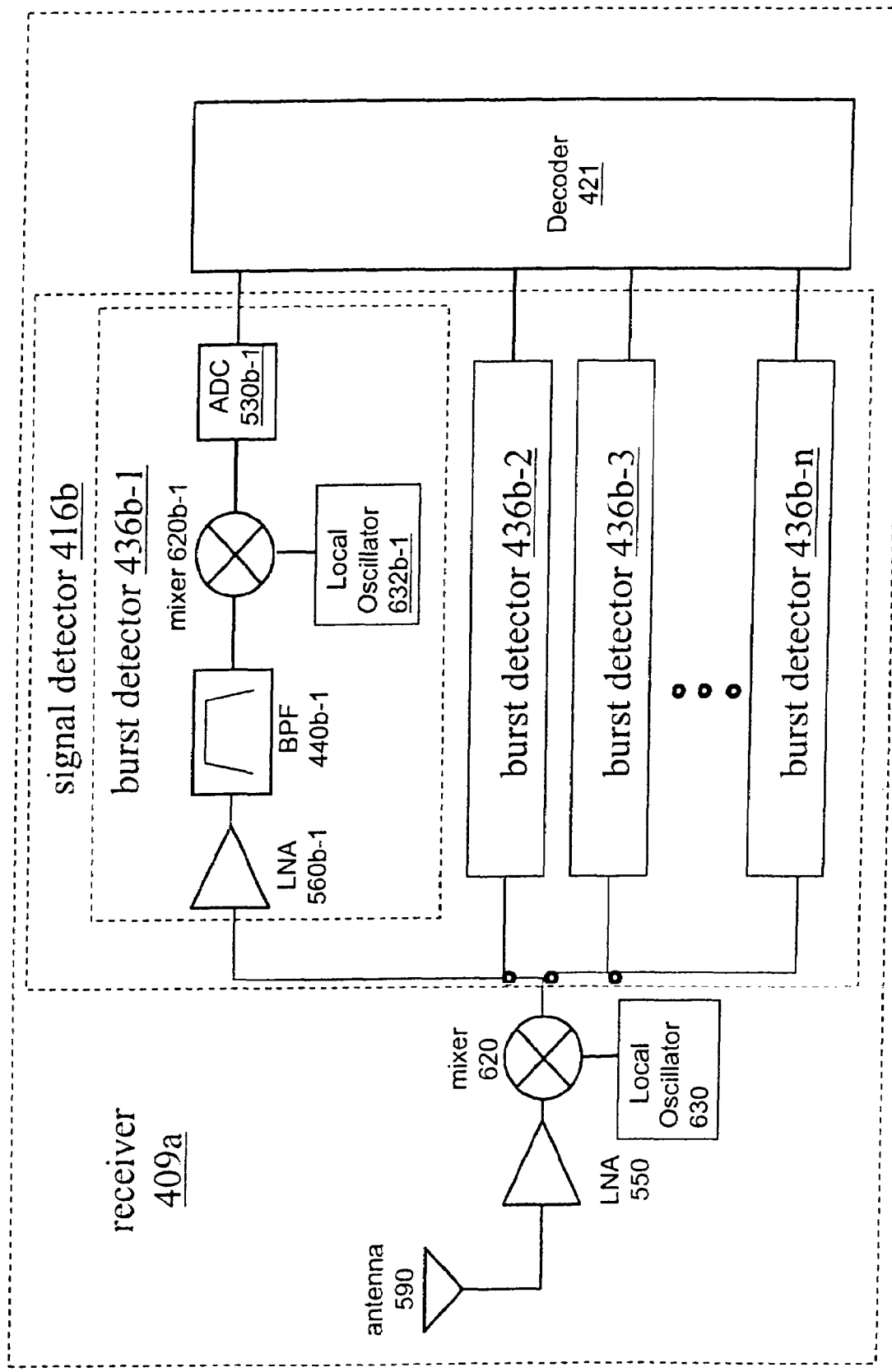
FIG. 58 shows a block diagram of a receiver 409a according to an embodiment of the invention.

In other embodiments, the signaling is downconverted to intermediate frequencies prior to entering the signal detector (e.g., by the mixer 620 and the local oscillator 630) and then downconverted again (e.g., by mixer 620 and local oscillator 630b) within the individual burst detectors of the signal detector prior to further processing. FIG. 57 shows a block diagram of an implementation 409 of receiver 400 in which an intermediate frequency signal is separated into different frequency bands before a second downconversion and edge detection 455b within the burst detectors 435 within of signal detector 415a. FIG. 58 shows a block diagram of another implementation 409a in which the twice-downconverted signals (converted prior to entering the signal detector 416b and downconverted within the burst detectors 436b) are digitized and filtered (at ADC 530). In some applications, an increase in signal-to-noise ratio may be achieved by performing gating of the received signal (e.g. in combination with a receiver configuration as described herein).

It is understood that in the receiver embodiments described herein, although several embodiments illustrate an antenna 590 for receiving the launched signaling, depending on the transmission scheme and medium, an antenna is not required. In such embodiments, a suitable receiving device understood for use by the transmission scheme and medium may used in place of the antenna 590.

Many of the receivers described above may be used to properly receive and decode signaling launched according to several embodiments of the invention, and including signaling launched with additional or supplemental modulations on a burst-wise and/or cluster-wise basis encoding additional information into the launched signaling, e.g., signaling such as illustrated in FIGS. 13A-13G.

For example, according to several embodiments, the receiver 402 of FIG. 50 may be used to receive signaling launched including one or more burst-wise and cluster-wise additional modulations, e.g., polarity modulation, amplitude modulation, and width modulation. In receiver 402, the received signal is correlated with a template waveform. The correlated signal contains the additional modulation information (e.g., polarity, amplitude and/or width) and time information and the decoder 421 uses this information to reconstruct the data from the received waveform. The template can be a stored waveform, or can be from a referenced burst or cluster of bursts from within the transmitted stream or transmitted at some period prior to reception. The use of a transmitted reference is advantageous because the reference travels with the data and experiences the same distortion as the data, thus making it easier to decipher timing, frequency, and the additional information (e.g., polarity, amplitude and width). It is noted that the template for each correlator 610 of each burst detector 434 is different in order to correlate the different bursts that the transmitter may launch. Furthermore, the receiver can incorporate frequency downconversion (e.g., before entering the signal detector 414 and/or within the burst detectors 434) as described above to permit the use of less costly, lower frequency components.

In another example, according to several embodiments, the receiver 401 of FIG. 48 may be used to receive signaling launched including one or more burst-wise and cluster-wise additional modulations, e.g., amplitude modulation, polarity modulation and width modulation. The received signal is optionally amplified via LNA 560, if necessary, and applied to a bank of filters 440. The filters 440 discriminate signal energy in the bands of interest. The filtered signal may be amplified if necessary (e.g., by LNA 570) prior to edge detection 455. The edge detection 455 detects a rising edge of a signal received within the corresponding frequency band. The edge detection 455 may also be configured to detect a polarity of the received signal. The signal contains the additional information (e.g., amplitude, polarity and/or width) and time information and the decoder 421 uses this information to reconstruct the data from the received waveform (e.g., the decoder determines which symbol (an ordered series of n-tuples) was received for converts it to the corresponding data). The use of absolute amplitude and/or width at the detector to reconstruct the data contained in the burst may be difficult as the characteristics of the propagation channel may vary with time, introducing errors. An alternative to having predetermined amplitude/width thresholds is having the burst amplitude/width compared with a reference burst or cluster of bursts. This reference can be a separate burst or cluster of bursts, or simply another burst or cluster of bursts in the transmitted stream. Alternatively, the information can be encoded in the relative amplitudes/widths of the separate frequency bursts. Furthermore, the receiver can incorporate frequency downconversion to permit the use of less costly, lower frequency components.

In another example, according to several embodiments, the receiver 401 of FIG. 51 may be used to receive signaling launched including one or more burst-wise and cluster-wise additional modulations, e.g., polarity modulation, amplitude modulation, and width modulation. In these variations, the received signal is optionally amplified by LNA 550, if required, and digitized via ADC 530 and decoded in the digital domain by decoder 421. In this embodiment, the decoder is configured to recognize and decode the various digital representations of the launched bursts having the additional information modulation, such as polarity, amplitude and width. Again, a reference burst or cluster of bursts may be employed in the transmitted stream or transmitted prior to reception to aid in the determination of received burst characteristics. Additionally, the receiver can incorporate frequency downconversion to permit the use of less costly, lower frequency components.

It is noted that the receivers described above may be used to receive and detect signaling including the additional modulation on a burst-wise basis and/or on a cluster-wise basis.

For these receiver implementations, methods of encoding can be used to eliminate the need for a predefined reference cluster of bursts. Encoding can be done using either relative polarity, amplitude, or width of frequency bursts within the cluster of bursts or using differential polarity, amplitude or width between successive clusters of bursts.

Figure 60:
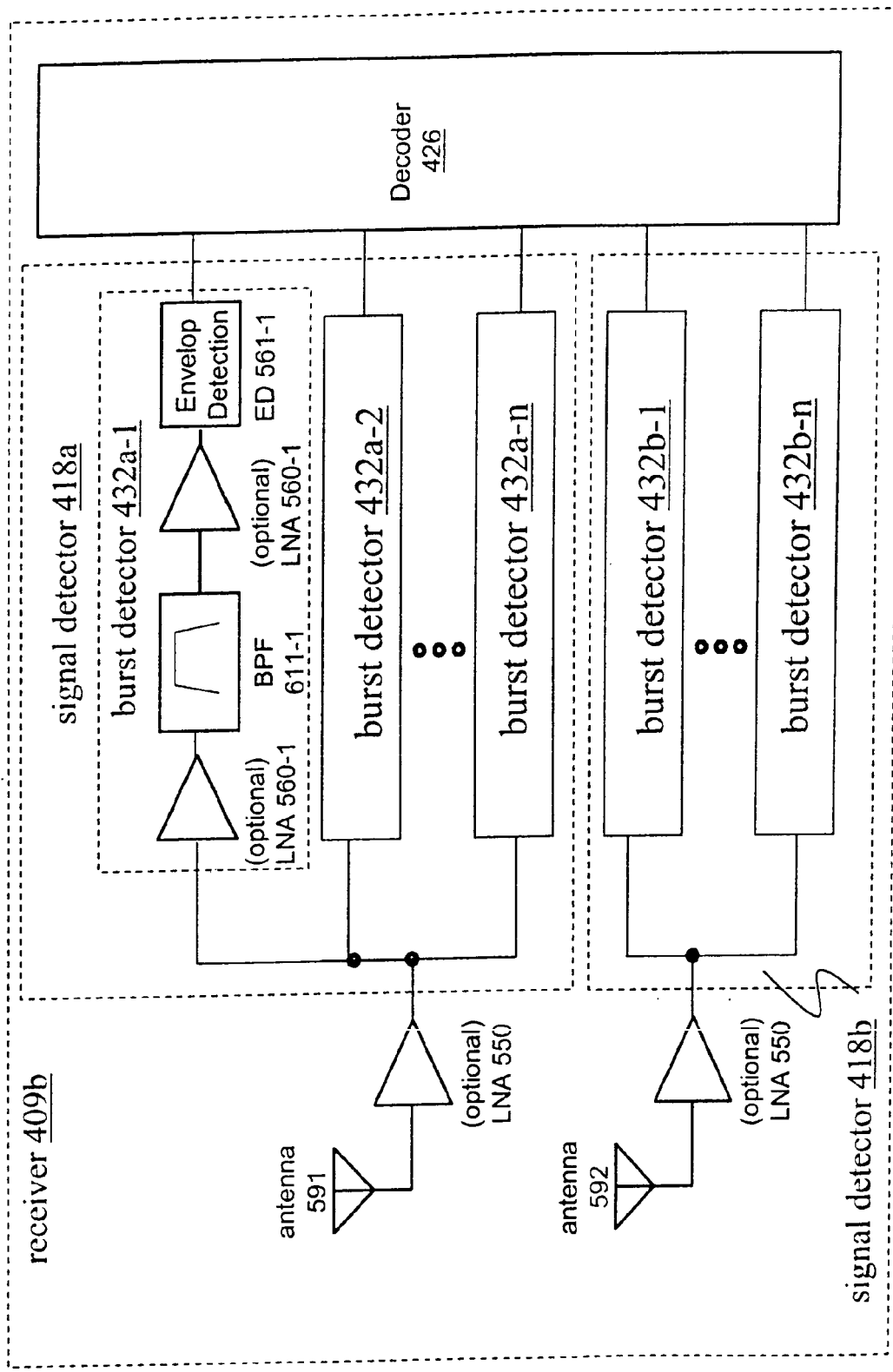
FIG. 60 shows an implementation of a receiver for receiving signaling including polarization modulation.

In other implementations employing additional modulation information, such as polarization information, into the launched cluster to further encode information, variations of the receivers presented above are described. Examples of such signaling are illustrated in FIGS. 13E and 13F. FIG. 60 shows an example of a receiver 409*b* for receiving signaling including burst-wise and/or cluster-wise polarization modulation. The receiver 409*b* is comprised of multiple antennas 591 and 592, optional low noise amplifiers (LNAs 550), multiple signal detectors 418*a* and 418*b* (each signal detector including a number of burst detectors 432*a* and 432*b*), and decoder 426. The burst detectors 434 of each signal detectors 418*a* and 418*b* are comprised of LNA 560 (as needed), bandpass-filter 611, LNA 560 (as needed), and envelop detector (ED) 561. Each of the antennas 591 and 592 receives signaling having a specified and different polarization, e.g., antennas 591 and 592 are orthogonal to each other. The received signal is amplified via the first LNA 560, if necessary, and applied to a bank of filters. The filters 611 discriminate signal energy in the bands of interest. The filtered signal may be amplified (e.g., at LNA 560) if necessary. The signal contains time information, and together with the other polarization signal detectors, and decoder 426 uses this information to reconstruct the data from the received waveform. The use of absolute polarization at the detector to reconstruct the data contained in the burst may be difficult as the characteristics of the propagation channel may vary with time, introducing errors. An alternative to having predetermined polarizations is having the burst polarization compared with a reference burst or cluster of bursts. This reference can be a separate burst or cluster of bursts, or simply another burst or cluster of bursts in the transmitted stream. Alternatively, the information can be encoded in the relative polarization of the separate frequency bursts. Furthermore, the receiver can incorporate frequency downconversion (e.g., before entering the signal detectors 418*a* and 418*b* and/or within the burst detectors 432*a* and 432*b*) similar to that described above to permit the use of less costly, lower frequency components. It is noted that although two paths are illustrated, i.e., two separately polarized antennas 591 and 592 each coupled to a separate set of burst detectors 432*a* and 432*b*, additional antennas and sets of signal detectors may be implemented in order to add further polarization variations.

Figure 61:
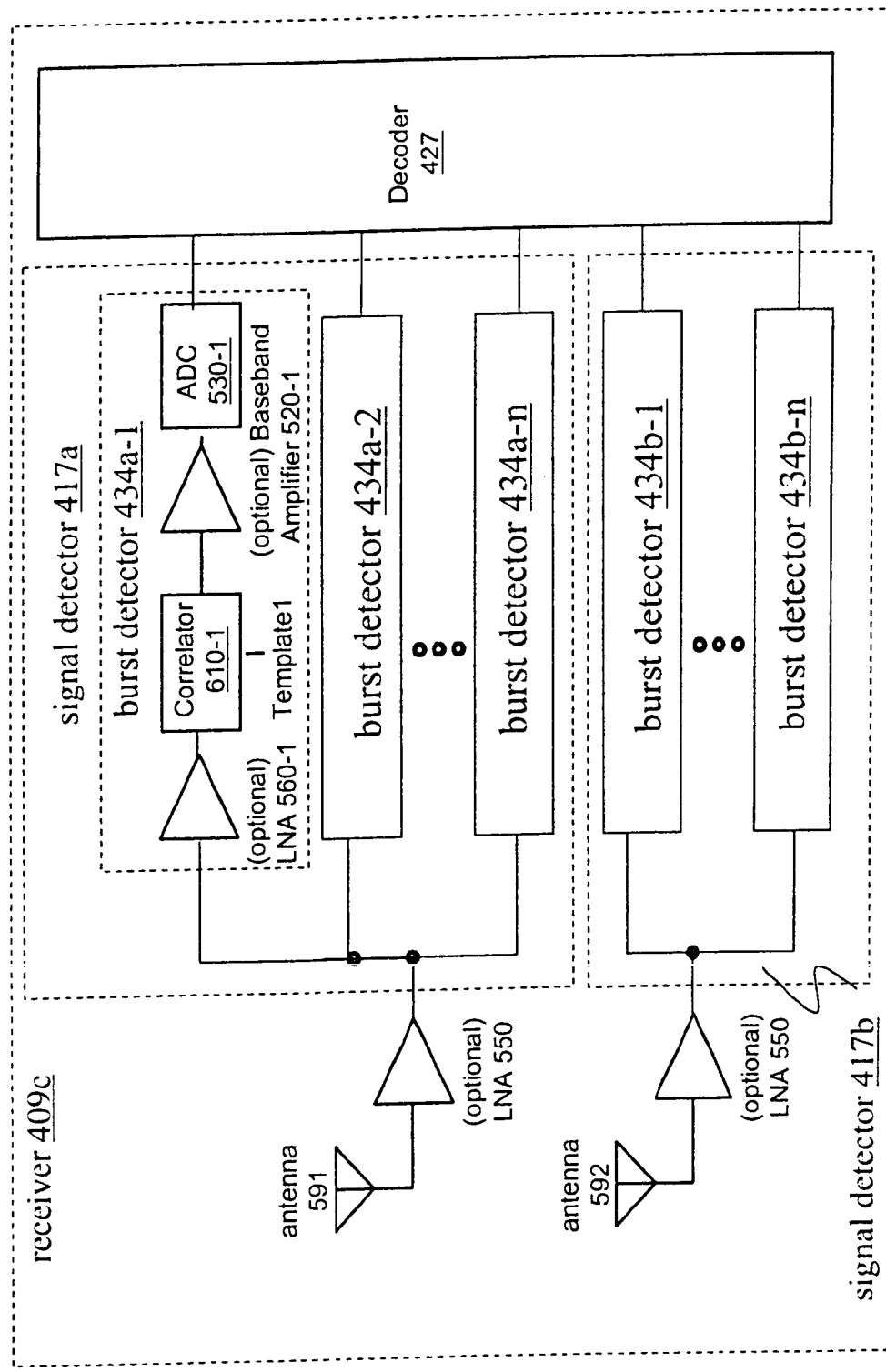
FIG. 61 shows another implementation of a receiver for receiving signaling including polarization modulation.

FIG. 61 shows a variation of the receiver of FIG. 60 in which the receiver 409*c* includes the signal detectors 417*a* and 417*b* including burst detectors 434*a* and 434*b* that are implemented using correlators 610, rather than filters 611 and envelope detectors 561. Each correlator 610 stores a given template to be correlated with the received waveform. The correlated signal contains time information and together with the other polarization signal detectors, the decoder 427 uses this information to reconstruct the data from the received waveform. The template can be a stored waveform, or can be from a referenced burst or cluster of bursts from within the transmitted stream or transmitted at some period prior to reception. The use of a transmitted reference is advantageous because the reference travels with the data and experiences the same distortion as the data, thus making it easier to decipher timing, frequency, and polarization information. Furthermore, the receiver can incorporate frequency downconversion (e.g., before entering the signal detectors 417*a* and 417*b* and/or within the burst detectors 434) to permit the use of less costly, lower frequency components.

Figure 62:
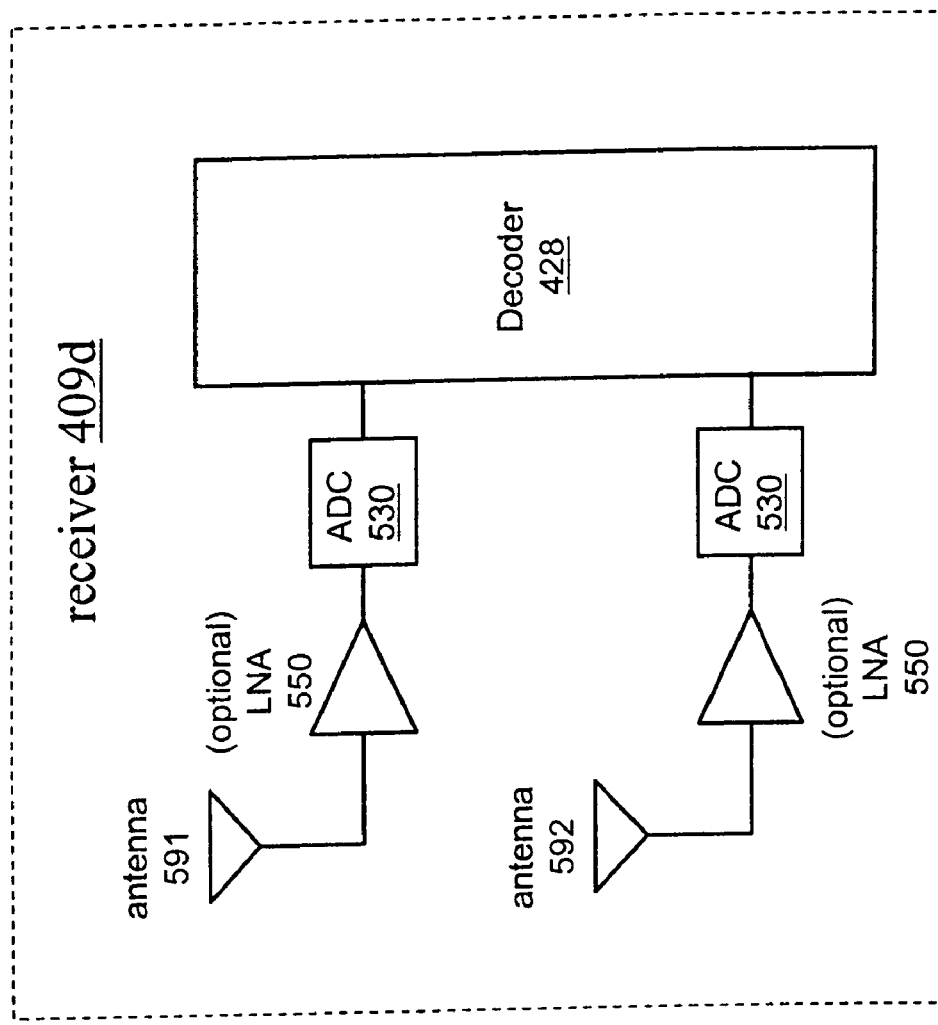
FIG. 62 shows yet another implementation of a receiver for receiving signaling including polarization modulation.

In another embodiment, the receiver 409*d* of FIG. 62 may be used to receive and decode signaling including burst-wise or cluster-wise polarity modulation. In this embodiment, the signal is received by orthogonal antennas 591 and 592, such as horizontal and vertical linear polarizations, or right and left hand circular polarizations. Each antenna provides a separate signal path to the decoder 428, a single path similar to the receiver of FIG. 51. In each path, the received signal is amplified by LNA 550, if required, and digitized via ADC 530 and decoded in the digital domain by decoder 428. In this embodiment, the decoder 428 is configured to recognize and decode the various digital representations of the launched bursts having the additional polarization modulation. Again, a reference burst or cluster of bursts may be employed in the transmitted stream or transmitted prior to reception to aid the in the determination of received burst characteristics. Additionally, the receiver can incorporate frequency downconversion to permit the use of less costly, lower frequency components.

It is noted that the receivers described in FIGS. 60-62 may be used to receive and detect signaling including the additional polarization modulation on a burst-wise basis and/or on a cluster-wise basis.

The use of amplifiers throughout this entire disclosure, on the receive side, are shown in the figures primarily using low noise amplifiers (LNAs); and it is equally valid to use other types of amplifiers besides low noise amplifiers; such as variable gain amplifiers (VGAs), rf amplifiers amplifiers, and limiting amplifiers.

In some applications, it may be desirable for a receiver as described herein to apply a timestamp to one or more received clusters or to otherwise note the order and/or time of arrival of clusters. For example, such information may be applied during decoding of the received symbols and/or may be applied to overcome multipath interference. Information regarding the relative time between clusters may also be used to detect empty clusters (such a technique may also be applied at the time-slot scale to detect empty time slots). For noting order of arrival only, the timestamp may be generated using a counter whose state is updated (e.g. incremented) at each noted event (e.g. cluster arrival). For noting time of arrival, the timestamp may be generated using a clock (e.g. a counter whose state is updated according to an oscillator). For relative measurements between events, it may not be necessary to synchronize such a clock to a reference or to otherwise take account of the clock's initial state.

At least some of the techniques for data transfer as disclosed herein may be embedded into highly scaleable implementations. For example, such a technique may be applied to wireless replacement of cables for transmission of content and/or control data. In a low-end application, this technique may be implemented to replace a cable (e.g. a Universal Serial Bus or USB cable) linking a computer to a low-cost, low-data-rate peripheral such as a computer mouse, keyboard, or handheld gaming controller. In a mid-range application, the technique may be used to replace a cable carrying video information from a computer to a monitor. In a high-end application, the technique may be scaled to replace one or more of the cables that carry high-fidelity video and audio information (e.g. from a receiver, a set-top box, or DVD (Digital Versatile Disc) player) to a high-definition television display and audio system.

Other applications that may vary in cost and performance requirements to those noted above include wireless computer networking, wireless transfer of audio data (e.g. as one or more datastreams and/or files, and in formats such as sampled (e.g. WAV) and/or compressed (e.g. MP3)), wireless transfer of image data (e.g. from a digital still camera or other device including one or more CCD or CMOS sensors, and in uncompressed or compressed (e.g. JPEG, JPEG2000, PNG) format), and wireless replacement of cables transmitting such formats or protocols as Ethernet, USB, IEEE 1394, S-video, NTSC, PAL, SECAM, and VoIP (Voice over IP).

In addition to many office and consumer entertainment applications, such cable replacement may be applied to control systems in industry and at home (e.g. thermostatic control); in automobiles and other vehicles; and in aircraft applications (e.g. for control systems and also to support networking applications such as passenger e-mail). Therefore, systems, methods, and apparatus for data transfer as disclosed herein may be implemented to suit a wide range of different latency, performance, and cost requirements.

One problem that may be encountered when using existing methods of wireless data transfer is an inability (e.g. insufficient data throughput rate) to support the data rate or latency requirements for a demanding application such as real-time video display. As noted above, systems, methods, and apparatus for data transfer as disclosed herein may be implemented to transfer data at very high rates. In one such application, a set-top box includes an apparatus for data transfer as disclosed herein which may be used to transmit a video signal wirelessly to a television display (e.g. a flat-panel display). One benefit that may be realized from a very high data rate in such an application is an ability to update the displayed picture (e.g. in response to the user changing the channel) in real time, rather than after a lag as might be suffered in a low-data-rate system that requires buffering to maintain the displayed picture.

Signal source identification mechanisms may be applied within systems, methods, and apparatus for data transfer as disclosed herein to support networking applications. An identifier such as a serial number may be hard-coded into a transmitter or transceiver (e.g. during manufacture or installation), or the identifier may be assigned or updated by the application during use. The identifier may be transmitted in the same manner as other data to be transferred (e.g. within a protocol or other higher-layer abstraction), or the identifier may be distinguished from other data within the physical layer by using features discussed herein such as logical channelization and/or unused symbol states. Communications applications in which source identification may be useful include directing communications within piconets, mesh networks, and multi-hop networks (e.g. including repeaters); distributed sensor networks for industry and military; encrypted and other secure communications; and selective or exclusive communication between data sources (e.g. a computer or PDA) and peripherals (e.g. a printer).

Applications for systems, methods, and apparatus for data transfer as disclosed herein may include location and position determination tasks. These tasks may include ranging and triangulation operations. A ranging signal may include a burst, a stream of bursts at different frequencies and/or different times, or a cluster or group of clusters. Ultra-wideband signals having extremely short bursts (e.g. durations of one nanosecond or less) are especially well-suited to such applications because the shortness of the bursts corresponds (under ideal conditions) to high spatial resolutions (e.g. down to the order of one centimeter). Better spatial resolution may also be achieved by transmitting the ranging signal over a wide frequency range (e.g. including bursts over more rather than fewer frequency bands). It may be desirable for a ranging signal to include signal source identification information (e.g., as described above), especially in an environment that includes potential interferers such as other transmitters.

In one example of a ranging operation, a first transceiver transmits a ranging signal. A second transceiver detects the signal and transmits a response (e.g. a ranging signal that may include information such as the second transceiver's location). The first transceiver detects the response, notes the round-trip time of flight, removes a known latency value (e.g. the propagation time within the circuits), divides by two to remove the bidirectional component, and divides by the speed of light to determine the distance between the two transceivers. A triangulation (or trilateration) operation may then be performed by combining the distances obtained from at least three such ranging operations (i.e. between the first transceiver and at least three other transceivers having known locations) to determine the first transceiver's location.

In another example of a ranging operation, a first transmitter transmits a ranging signal that is received by three or more receivers. The times of arrival of the signal at each receiver are transmitted to a processing unit (e.g. via a network), which combines the various times of arrival and corresponding receiver locations in a triangulation (or trilateration) operation to determine the transmitter's location. It may be desirable in this case for the receivers to be synchronized to a common clock.

In a variation of the ranging operation above, the ranging signal includes a signal source identifier. Each receiver timestamps the received ranging signal according to the time of arrival and transmits the timestamped signal (including the source identifier) to the processing unit. Such a technique may be used to support location and position determination for multiple transmitters. Transmitter location and position determination may also be performed within a multihop network such that the processing unit is several hops removed from the transmitter.

At least some of the systems, apparatus, and methods of data transfer as disclosed herein may be applied to sensor networks. In such a network, a possibly large number of sensors is deployed across an area, with sensed data being returned (possibly relayed via multihop) to a processing unit. Each sensor is configured to sense an environmental condition such as gas concentration, radiation level at one or more frequencies or ranges (e.g. charged particle, X-ray, visible light, infrared), temperature, pressure, sound, vibration, etc. A sensor may include an analog-to-digital converter for converting data relating to the sensed condition from analog to digital form.

A sensor network as described herein may be used for temperature monitoring within a facility, for an intruder alert system, or for remote monitoring of activity in an area (e.g. for military purposes). The processing unit, which calculates the state of the network from the collective sensed data, may act accordingly or may convey the state information to another unit.

Additionally, use of methods and apparatus for data transfer as described herein may include applications requiring very low cost, robustness to interference and/or multipath, low probability for intercept and/or detection, and/or sensor applications (e.g. networked or peer-to-peer). For example, low-cost sensors may permit vast deployments for either tagging or distributed feedback systems for commercial, industrial, and military applications. Interference and multipath robustness may be especially useful for deployments in industrial settings and military scenarios where jamming (intentional or unintentional) and/or reflections are likely. Low probability for intercept (both in terms of implementing special symbol codes and in terms of possible operations at low emission levels) and low probability for detection are critical components of covert military or sensitive usages.

Figure 63:
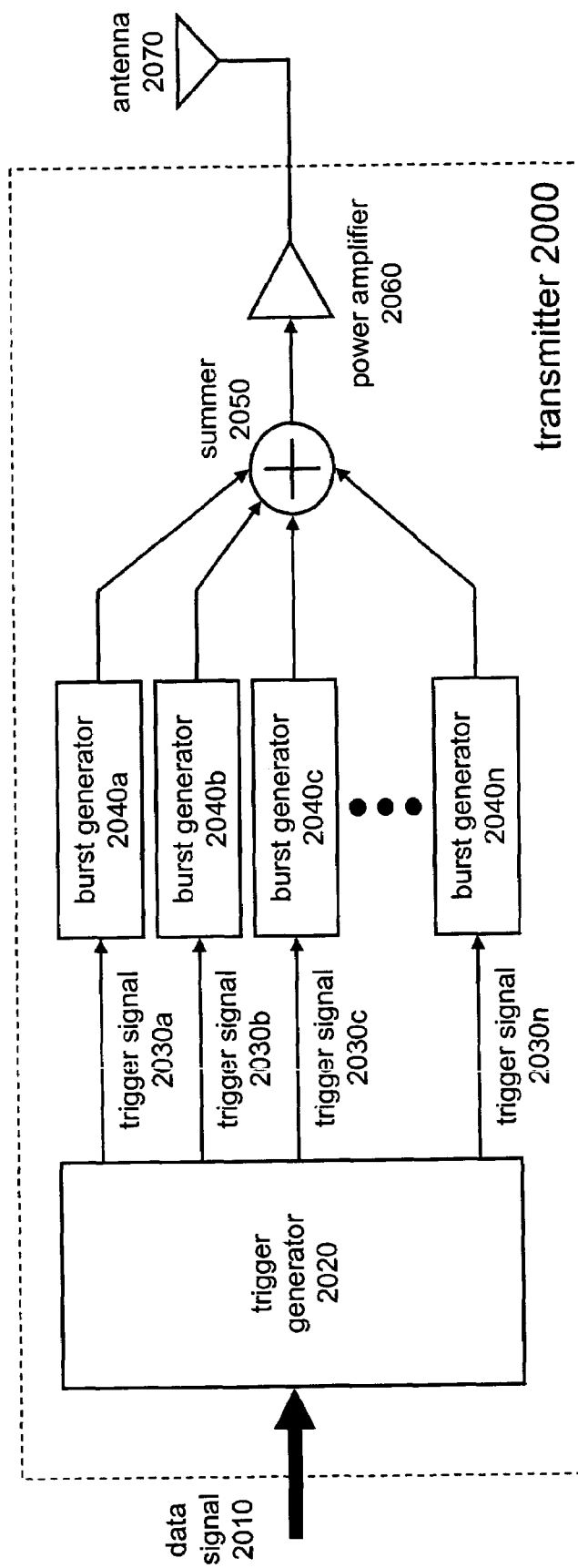
FIG. 63 shows a block diagram of a multi-band transmitter.
Figure 64:
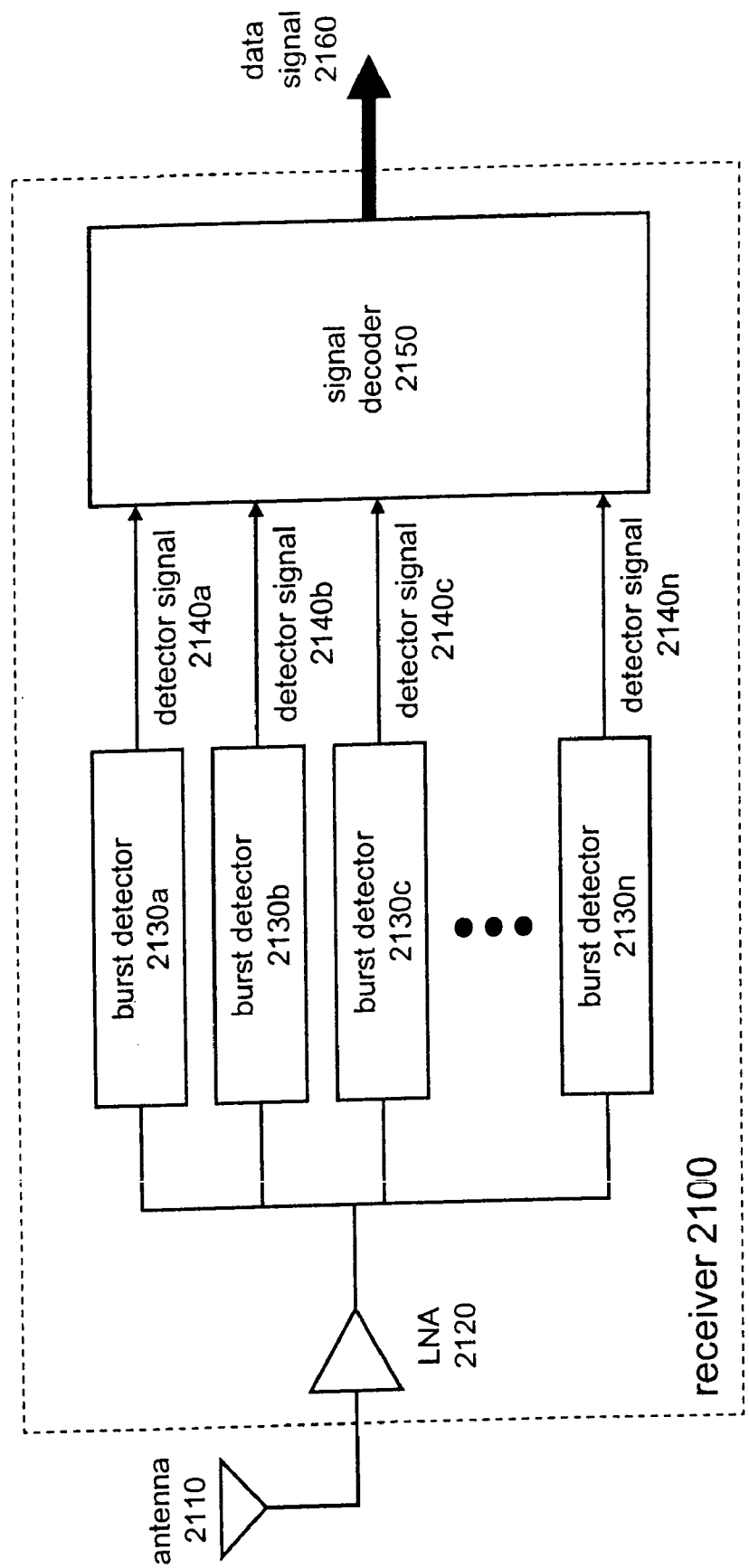
FIG. 64 shows a block diagram of a multi-band receiver.

FIGS. 63 through 73 illustrate further embodiments of encoders and decoders. FIG. 63 shows a block diagram of a multi-band transmitter 2000 according to one embodiment of the invention. It comprises a trigger generator 2020, which is coupled to a data source through data signal 2010 and to one or more burst generators 2040a through 2040n. The burst generators are configured to emit bursts in specific frequency bands (e.g., ultra-wideband bursts) and are connected to a summer 2050. The summer's output is coupled to the input of an optional power amplifier 2060. Power amplifier 2060 is further connected to antenna 2070.

In this embodiment, trigger generator 2020 receives a data signal 2010 and encodes the received data into a sequence of trigger signals 2030a through 2030n, which activate the burst generators 2040a through 2040n at times according to the encoded data signal. Thus, in contrast to earlier embodiments, the encoder is implemented within the trigger generator. When activated, a burst generator 2040 emits a burst in its specific frequency band. Summer 2050 combines the burst generator outputs into a signal amplified by power amplifier 2060 and radiated through antenna 470. In some embodiments, burst generators are activated by a single-bit trigger signal. In other embodiments, burst generators may be activated using multi-bit trigger signals.

FIG. 5 shows a block diagram of a multi-band receiver 2100 according to one embodiment of the invention. It comprises a low-noise amplifier (LNA) 2120 whose input is coupled to an antenna 2110 and whose outputs are connected to one or more burst detectors 2130a through 2130n. The outputs of burst detectors 2130a through 2130n are connected to the inputs of signal decoder 2150 through detector signals 2140a through 2140n.

Upon detecting a burst, a burst detector 2130a through 2130n signals detection of a burst in its frequency band to attached signal decoder 2150. Signal decoder 2150 decodes a sequence of detected bursts, constituting a cluster, into a data signal that is communicated to a data sink through data signal 2160.

In one embodiment, a burst detector 2130a through 2130n is configured to communicate the presence or absence of a burst through detector signal 2140a through 2140n, which may be represented with a single bit of information in detector signal 2140a through 2140n. In other embodiments, a burst detector 2130a through 2130n is configured to communicate other and/or additional characteristics of a detected burst, such as its amplitude, its polarity, or other characteristics know in the art, which may be represented by one or more bits of information communicated to signal decoder 2150 through detector signal 2140a through 2140n. The burst detectors may be as described throughout this specification.

Several embodiments of the invention described herein will generally be described assuming a single bit of information be exchanged between the trigger generator 2020 and the burst generator 2040 and between the burst detector 2130 and the signal decoder 2150. Those skilled in the art will readily understand that the generic principles described herein apply in the same way when the information exchanged consists of multiple bits of information. Without loss of generality, the following descriptions use the designator n to refer to the number of burst generators, as well as the number of burst detectors. Designator p is used to denote the maximum number of time slots per cluster, while designator m denotes the number of bits of the data signal entering the transmitter and the number of bits of the data signal exiting the receiver.

Figure 65:
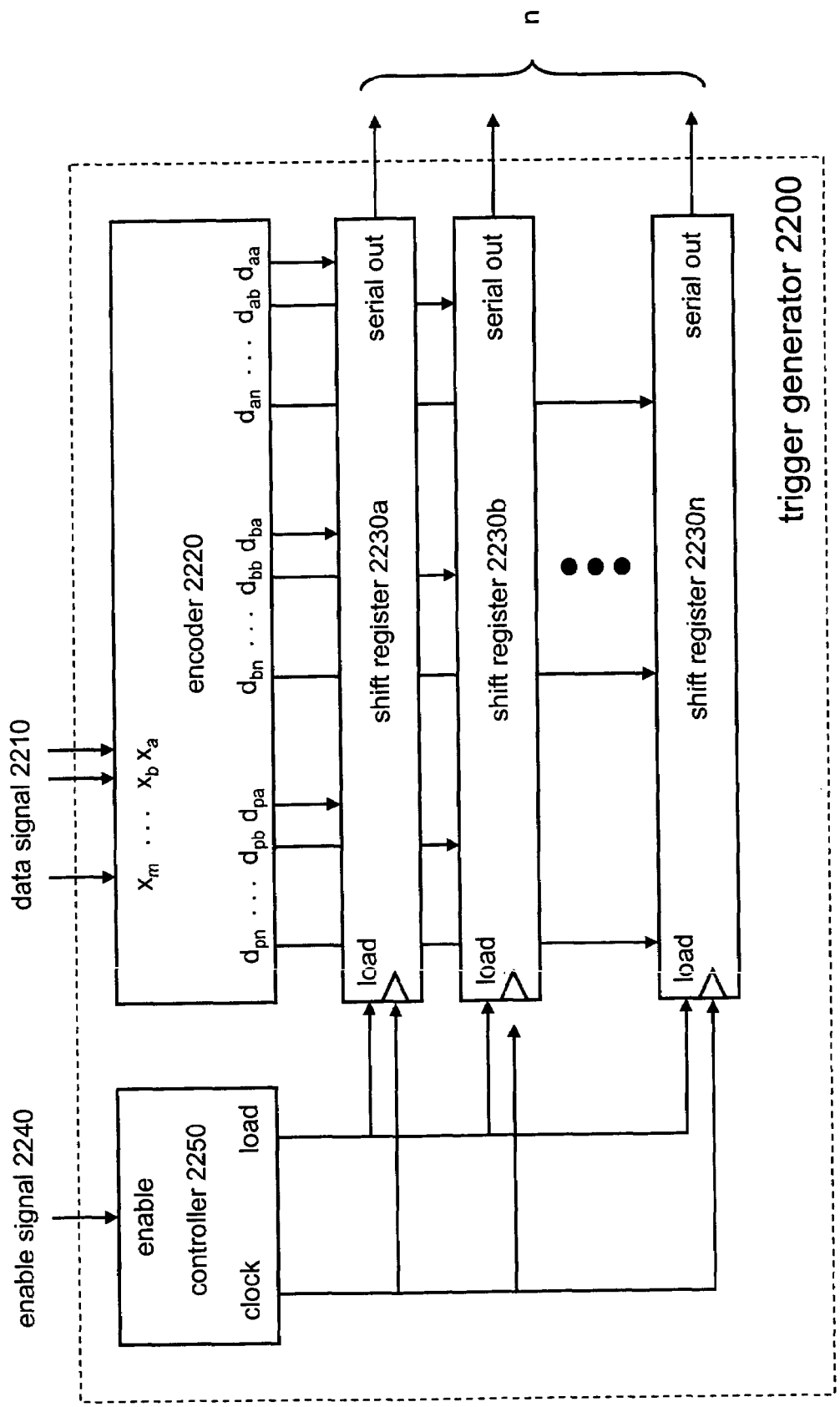
FIG. 65 shows an embodiment of a trigger generator using an encoder and shift registers to control burst generators.

Referring to FIG. 65, an embodiment of a trigger generator 2200 is illustrated, which consists of an encoder 2220, a shift register for each frequency band (2230a through 2230n), and a controller 2250. Encoder 2220 encodes input data 2210 into a set of control signals that control the operation of the n burst generators attached to the serial output of the shift registers 2230a through 2230n. Upon assertion of the load signal by controller 2250, the shift registers 2230a through 2230n are loaded with a set of control signals ($d_{ik}$). Then, by shifting the register contents during successive clock cycles, the serial outputs of the shift registers 2230a through 2230n control the burst generators during each time slot. The serial outputs of a shift register may comprise a single signal turning the attached burst generator on or off, or may comprise multiple signals that control the attached burst generator in further ways, such as determining its phase and/or amplitude, or other characteristics of the burst generator. After transmitting a cluster, the shift register outputs are configured such that they deactivate the attached burst generators until newly loaded with the next cluster. This can be achieved by shifting in a constant value, such as 0, which deactivates the burst generators, or by increasing the length of the shift register by one stage to load a terminal value that deactivates the burst generators. Controller 2250 controls the emission of a cluster by asserting and deasserting the load signal and providing clock pulses to the shift registers at the appropriate times.

To transmit data, data input signals 2210 are supplied to the inputs ($x_a \ldots x_m$) of encoder 2220 and the enable signal of the control block 2250 is asserted. Encoder 2220 then encodes the input into a set of burst generator control signals ($d_{aa} \ldots d_{pn}$). Control signal $d_{ik}$ will be loaded into shift register k and will control burst generator k during time slot i. Depending on the burst generators, $d_{ik}$ may comprise a single bit to activate and deactivate the burst generation, or may consist of multiple bits, e.g. to control the amplitude or the polarity of the generated frequency burst.

Referring to FIG. 65, controller 2250 generates the shift register load/shift signal as well as the time slot clock for the required number of cycles given by the number of time slots. By asserting the load signal attached to the shift registers 2230a through 2230n, and providing a clock pulse, controller 2250 causes the shift registers to load outputs $d_{aa}$ through $d_{pn}$ of encoder 2220. Control signals $d_{aa}$ through $d_{an}$ appear at the serial output of the shift registers 2230a through 2230n first and control the burst generators during the first time slot. After loading the shift registers, controller 2250 deasserts the load signal, causing the shift registers 2230a through 2230n to shift the loaded data upon receiving clock pulses from controller 2250. The controller then generates p−1 additional clock pulses to shift out the remaining control signals $d_{ba}$ through $d_{pn}$ stored in the shift registers. Each clock pulse marks the start of a new time slot.

It will be understood by persons skilled in the art that controlling the shifting of the shift register by means of providing clock pulses is but one embodiment. Other embodiments, such as embodiments using an explicit shift signal to control shifting while providing clock pulses continuously, are equally possible.

Encoder 2220 can be implemented using a Random Access Memory (RAM), a Read-Only Memory (ROM), or a programmable ROM such as an Electrically Erasable Programmable ROM (EEPROM) addressed by the data input ($x_a$ through $x_m$). Alternatively, the encoder can be implemented as a combination of logic gates (combinational logic) whose inputs are the data input ($x_a$ through $x_m$) or by any other method known in the art. The number of data input bits (m) varies with the chosen encoding, the number of time slots (p), and the number of frequency bands (n). The number of output bits ($d_{aa}$ through $d_{pn}$) in one embodiment is the product of p and n.

In the preferred embodiment, encoder 2220 is implemented such that it can be reconfigured during operation. For example, an embodiment using RAM allows the transmitter 2200 to be reconfigured to use a different cluster encoding, a reduced number of burst generators, and/or a reduced number of time slots. This enables transmitter 2200 to adapt to interference, for example, by avoiding the use of the frequency bands subject to interference, or to provide different data rates at different times or under different conditions.

Controller 2250 is preferably implemented as a finite state machine using combinational logic gates and state registers, but other means known in the art, such as a processor and memory, are equally applicable.

Figure 66:
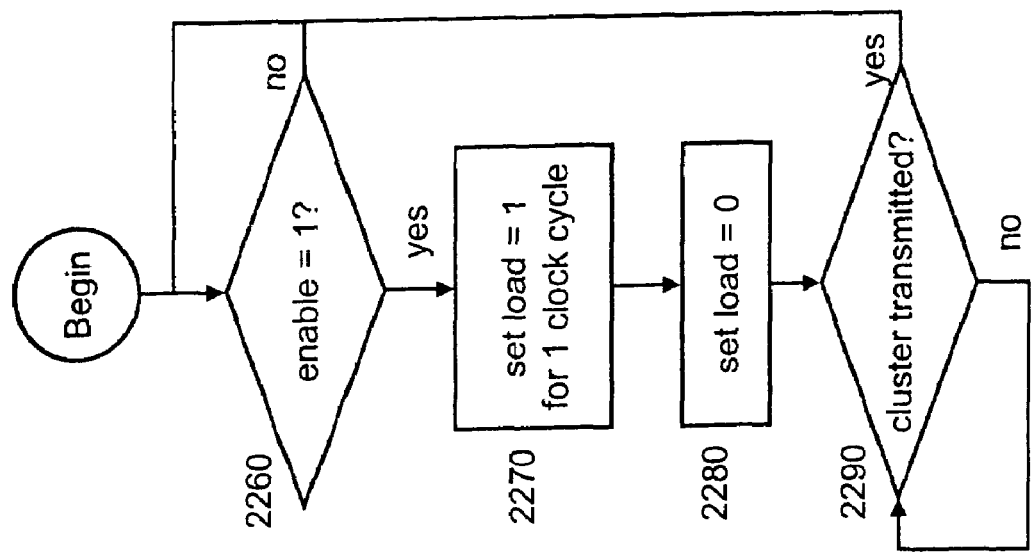
FIG. 66 shows a flow diagram for controlling trigger generator 2200 shown in FIG. 65.

FIG. 66 shows a control flow diagram for controller 2250 in FIG. 65. At block 2260, controller 2250 waits until the enable input is asserted, indicating that a data value is present on the data signal input 2210 in FIG. 65. When enable is asserted, the controller advances to block 2270, where it asserts the load output, causing the shift registers 2230a through 2230n to be loaded with the output of the encoder 2220. After one clock cycle, the load flag is deasserted at block 2280, causing the shift registers to switch from loading mode to shift mode, and the controller advances to block 2290 where the controller issues p−1 additional clock cycles. After the cluster is transmitted (p clock cycles later), the controller returns to block 2260, awaiting the next data value to be transmitted.

Figure 67:
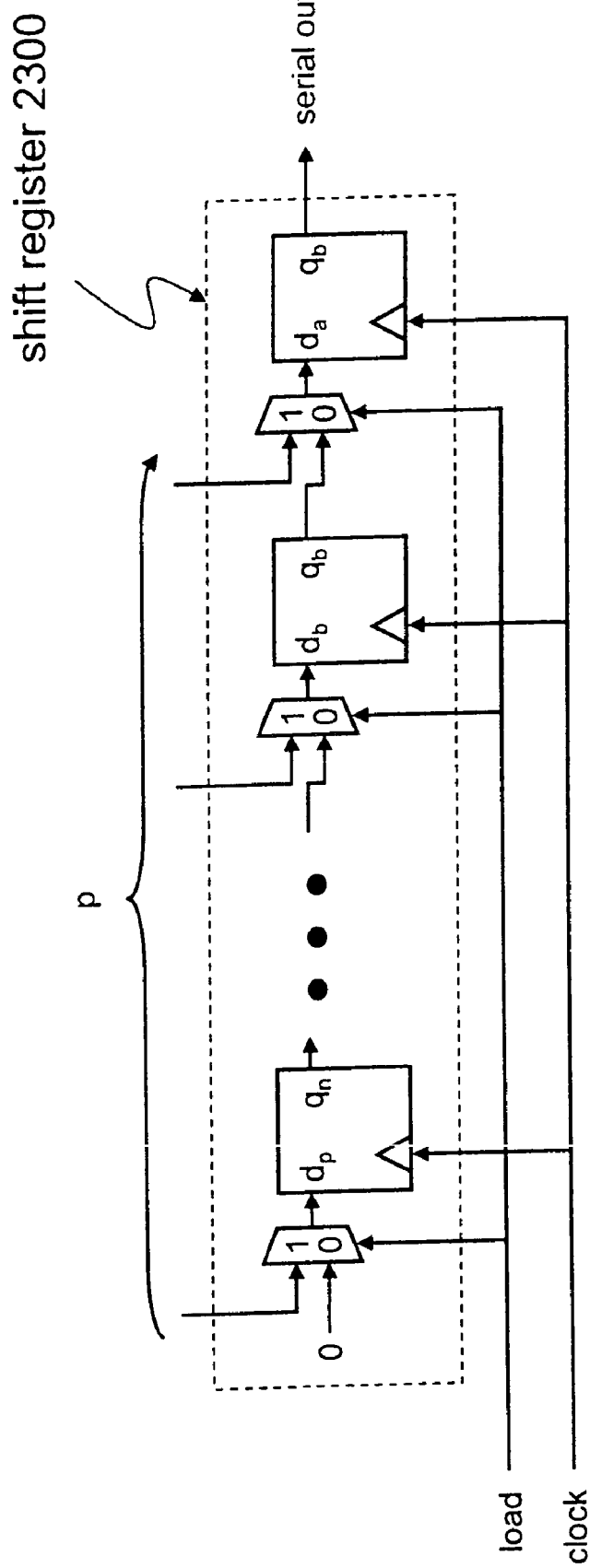
FIG. 67 shows one embodiment of a parallel-to-serial shift register.

The loadable shift registers 2230a through 2230n in FIG. 65 are implemented as known in the art. FIG. 67 shows one possible implementation of a parallel-to-serial shift register 2300. It consists of p pairs of a D flip-flop and a preceding multiplexer. The shift register 2300 is loaded by asserting the load signal and providing a clock pulse, whereupon each D flip-flop is loaded with one of the p inputs. Deasserting the load signal and providing subsequent clock pulses causes the loaded values to be shifted to the right while a 0 value into the left-most D flip-flop.

TABLE 1 shows an example of an encoding table according to one embodiment. For this example, it is assumed that a control bit with value 1 causes the corresponding burst generator to emit a frequency burst and that a control bit with value 0 causes it not to emit a burst. It is assumed that during each time slot exactly one burst generator emits a frequency burst and that a burst generator emits only one frequency burst during a cluster (such as in cluster 94 of FIG. 11). It should be understood that this is only one possible method to encode data values and that both the encoding table may vary as well as the way in which the burst generators are controlled.

TABLE 1

| Data | $x_2 \ldots x_0$ | Time Slot 0 $d_{02} \ldots d_{00}$ | Time Slot 1 $d_{12} \ldots d_{10}$ | Time Slot 2 $d_{22} \ldots d_{20}$ |
|---|---|---|---|---|
| 0 | 000 | 100 | 010 | 001 |
| 1 | 001 | 010 | 100 | 001 |
| 2 | 010 | 100 | 001 | 010 |
| 3 | 011 | 001 | 100 | 010 |
| 4 | 100 | 010 | 001 | 100 |
| 5 | 101 | 001 | 010 | 100 |

As a result of these assumptions, there are n! possible data values with n burst generators, or 6 distinct clusters using n=3 burst generators as shown in TABLE 1. Each of the 6 data values is presented to the encoder as a binary number of m=3 bits ($x_2 \ldots x_0$). The encoder produces control signals for each burst generator k in time slot i. There are p=3 time slots. These control signals $d_{ik}$ are stored in the shift register. For example, to encode the data value 3, burst generator 0 emits a frequency burst during time slot 0, burst generator 2 emits a burst during time slot 1, and burst generator 1 emits a burst during time slot 2.

Figure 68:
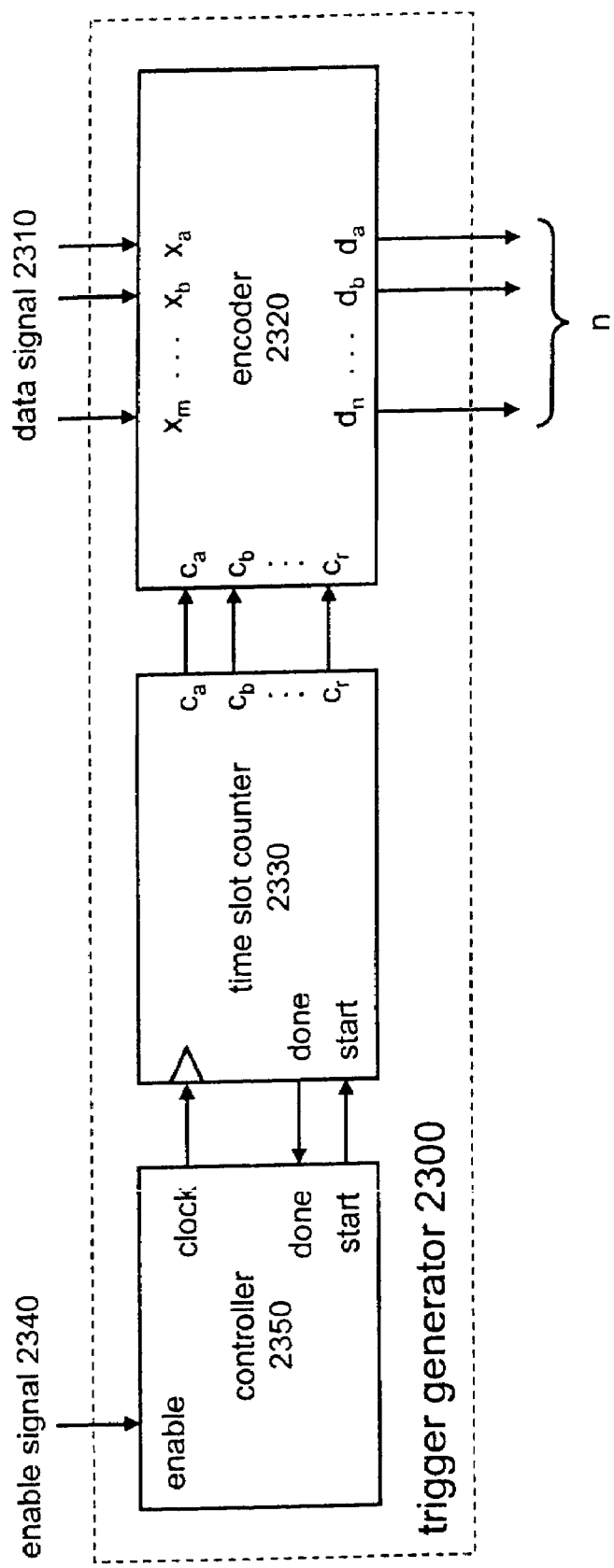
FIG. 68 shows an alternative embodiment of a trigger generator using an encoder and a time slot counter to control burst generators.

FIG. 68 shows an alternative embodiment of a trigger generator. Trigger generator 2300 comprises an encoder 2320 coupled to a time slot counter 2330, and a controller 2350 controlling time slot counter 2330. Encoder 2320 outputs $d_a$ through $d_n$ are coupled to the burst generators inputs and control the burst generators' operation.

To transmit a data value, the data value is provided to encoder 2320 through data signal 2310 and the enable signal 2340 is asserted. The data value is provided to the encoder for the duration of the cluster, generally p time slots. Upon assertion of the enable input, controller 2350 asserts the start signal for one clock cycle. Time slot counter 2330, upon determining its start input signal asserted, counts for p clock cycles. After counting for p cycles, time slot counter 2330 asserts the done signal, signaling to controller 2350 that counting has terminated. The values counter 2330 assumes, corresponding to the current time slot number, are provided to encoder 2320 as r bits.

Encoder 2320 uses data signal input 2310 and the current value of time slot counter 2330 to determine the control signals for the n burst generators attached to the encoder outputs $d_a$ through $d_n$ for the time slot defined by the value of the time slot counter 2330.

Encoder 2320 can be implemented using a Random Access Memory (RAM), a Read-Only Memory (ROM), or a programmable ROM such as an Electrically Erasable Programmable ROM (EEPROM) addressed by the data input ($x_a$ through $x_m$) and the time slot counter value ($c_a$ through $c_r$). Alternatively, the encoder can be implemented as a combination of logic gates (combinational logic) whose inputs are the data input ($x_a$ through $x_m$) and the time slot counter value ($c_a$ through $c_r$), or any other way known in the art. The number of data input bits (m+r) varies with the chosen symbol encoding, the number of time slots (p), and the number of frequency bands (n). The number of counter output bits r is given by the formula $|\log_2(p)|$. The number of output bits in one embodiment is the number of burst generators n. Depending on the burst generators, $d_{ik}$ may comprise a single bit to activate and deactivate the burst generation, or may consist of multiple bits, e.g. to control the amplitude or the phase of the generated frequency burst.

In the preferred embodiment, encoder 2320 is implemented such that it can be reconfigured during operation. For example, an embodiment using RAM allows transmitter 2300 to be reconfigured to use a different cluster encoding, a reduced number of burst generators, and/or a reduced number of time slots. This enables transmitter 2300 to adapt to interference, for example, by avoiding use of the frequency bands subject to interference, or to provide different data rates at different times or under different conditions.

Controller 2350 in FIG. 68 is preferably implemented as a finite state machine using combinational logic gates and state registers, but other means known in the art, such as a processor and memory, are equally applicable.

Figure 69:
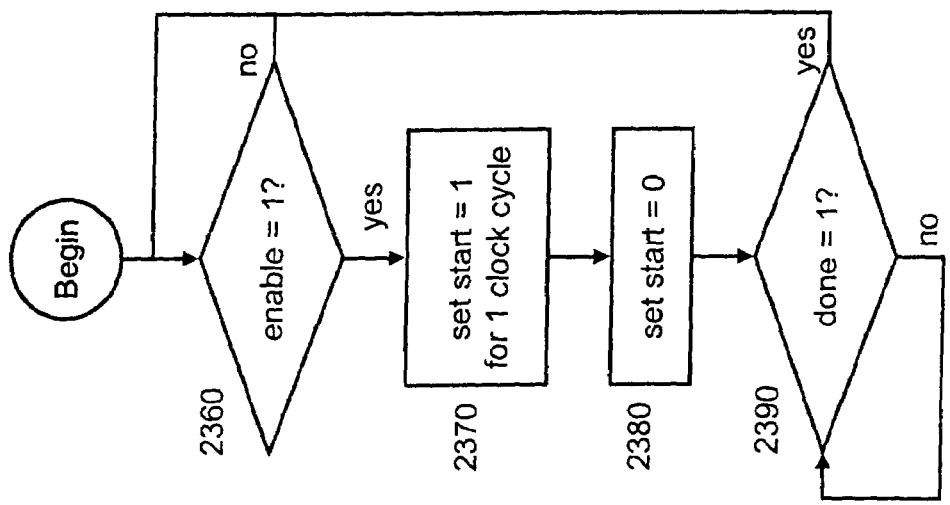
FIG. 69 shows a flow diagram for controlling trigger generator 2300 shown in FIG. 68.

FIG. 69 shows a control flow diagram for controller 2350 in FIG. 68. At block 2360, the controller waits for the enable input to be asserted. Once it is asserted, control advances to block 23700, where the controller asserts the start output. After one clock cycle, controller 2350 deasserts the start output at block 2380 and continues at block 2390. There, the controller waits until time slot counter 2330 asserts its done output, indicating the cluster has been transmitted. Once done is asserted, controller 2350 continues at block 2360 waiting for the next data item to transmit.

Referring to FIG. 11, signal decoder 1100 comprises detector capture registers 1110a through 1110n, a start of cluster detector 1120, a controller 1130, shift registers 1140a through 1140n, and a decoder 1150. The burst detectors 530a through 530n in FIG. 64 sense the communication channel and detect frequency bursts in their respective detector band. They present the state of the channels on their outputs, which are coupled to the detector capture registers 1110a through 1110n in FIG. 11. The detector capture registers are implemented as one shot registers and are set the first time the attached burst detectors sense a frequency burst. They are reset by controller 1130. When activated by the controller, the shift registers 1140a through 1140n capture the state of the detector capture registers 1110a through 1110n during each time slot. Simultaneously, they present the captured states ($d_{aa}$ through $d_{pn}$) to decoder 1150. The decoder determines the received symbol given the detector states $d_{aa}$ through $d_{pn}$ as inputs. Controller 1130 generates the time slot clock, signals the decoding of a data value to the consumer of the received data, and clears the detector capture registers prior to receiving the next symbol.

Reception begins when one of the burst detectors 2130a through 2130n senses a frequency burst in its respective band, causing the output of the detector capture register (one of 1110a through 1110n) connected to the burst detector to go high. This causes the output of the start of cluster detector 1120 to go high, enabling the shifting of serial input data into the shift registers 1140a through 1140n. It also triggers the controller 1130, which then provides the shift registers with a time slot clock for the duration of the cluster (p cycles). At the end of a cluster, controller 1130 resets the detector state registers, stopping further shifting of the detector state into the shift register and stops the time slot clock. The outputs of shift registers 1140a through 1140n are presented to decoder 1150, which, based on this input, determines the received symbol and presents it on the decoder outputs $x_a$ through $x_m$. Controller 1130 asserts the valid signal output in parallel with the decoder output to indicate that a new data value is available. Prior to the reception of the next cluster, controller 1130 resets the detector state registers to enable reception of another symbol.

The detector capture registers 1110a through 1110n are implemented in any way known in the art to be asynchronously set upon a signal by the pulse detectors and to be synchronously or asynchronously reset by controller 1130. Examples include RS flip-flops or D flip-flops whose clock inputs are connected to the pulse detector state output.

Decoder 1150 can be implemented using a RAM, a ROM, or a programmable ROM such as an EEPROM addressed by the shift register stage outputs. Alternatively, the decoder can be implemented as a combination of logic gates (combinational logic) whose inputs are the shift register stage outputs. The number of decoder inputs is generally the number of time slots p times the number of frequency bands n times the number of bits provided by the burst detectors. Preferably, the decoder is implemented such that it can be reconfigured at runtime. This enables the transmitter and receiver subsystems to adapt to interference by changing their data encoding, for example, by avoiding bands that contain interfering signals.

Controller 1130 is preferably implemented as a finite state machine using combinational logic gates and state registers, but other means known in the art, such as a processor and memory, are equally applicable.

Figure 71:
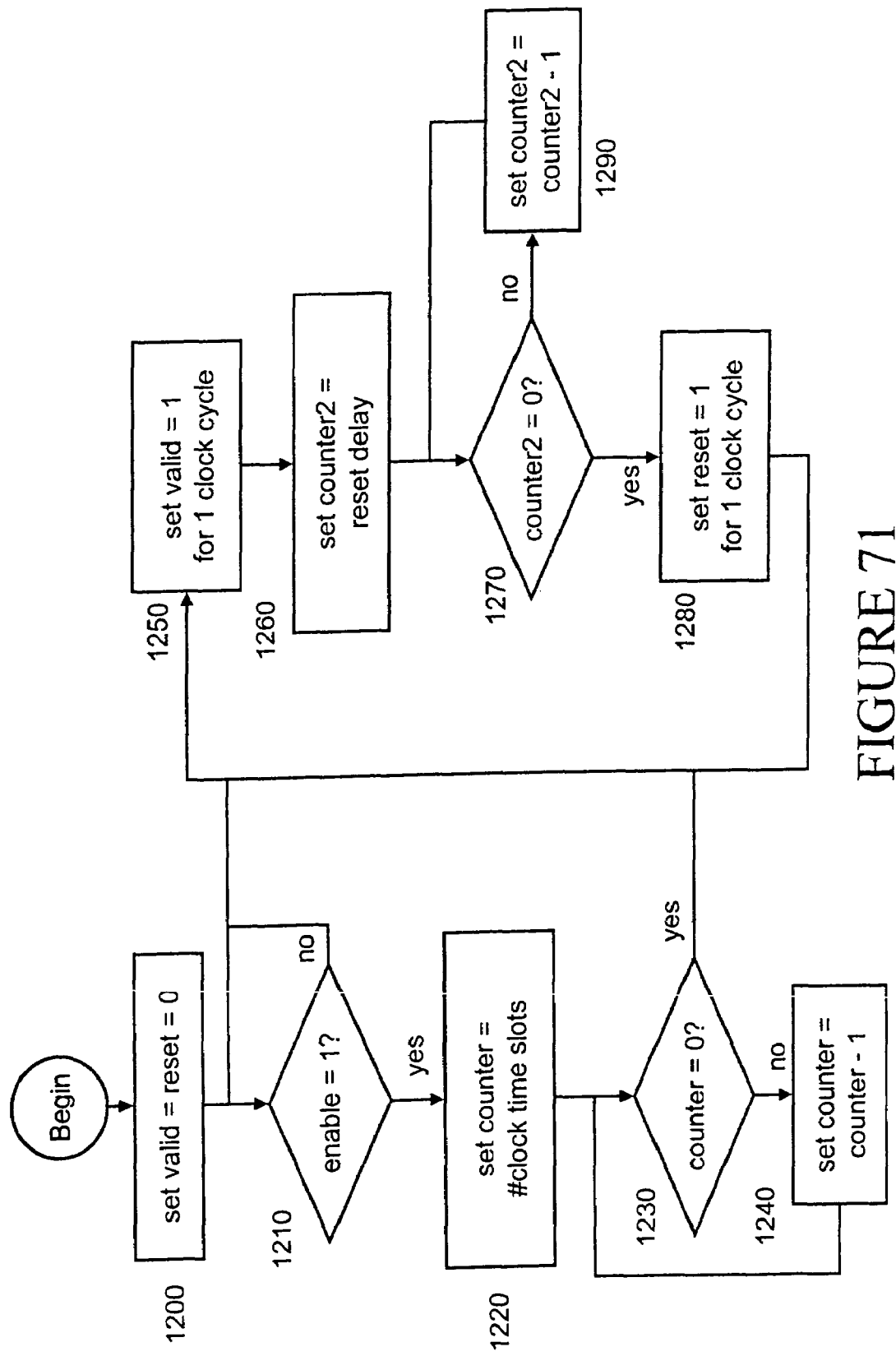
FIG. 71 shows a flow diagram for controlling signal decoders 1100 and 1400 shown in FIG. 70 and FIG. 73, respectively.

FIG. 71 shows a control flow diagram for controller 1130. At block 1200, the controller initializes itself and then advances to block 1210. There, it waits for the start of cluster detector to indicate an incoming cluster. When an incoming cluster is detected, the controller advances to block 1220. There, it initializes the time slot counter to the number of time slots p and then enters into block 1230. At block 1230, the controller tests if the time slot counter has completed counting the number of slots of one cluster, and, if so, advances to state 1250. Otherwise, the controller decrements the time slot counter in block 1240, provides a clock pulse to the shift registers and reenters block 1230. At block 1250, the controller asserts the valid signal 1170 for one clock cycle to indicate that a complete cluster has been received and its decoded data value is present on the output of decoder 1150. The controller then proceeds to block 1260, where it initializes a delay counter. In block 1470, the counter is compared to zero to determine if the delay time has been reached. The delay length corresponds to about the interval between successive clusters minus the length of a cluster and serves to prevent early triggering due to interference. If the counter has not yet reached zero, it is decremented in block 1290 before reentering block 1270. When the counter reaches zero, the controller resets the detector capture registers 1110a through 1110n in block 1280 to prepare for the arrival of the next cluster.

Figure 72:
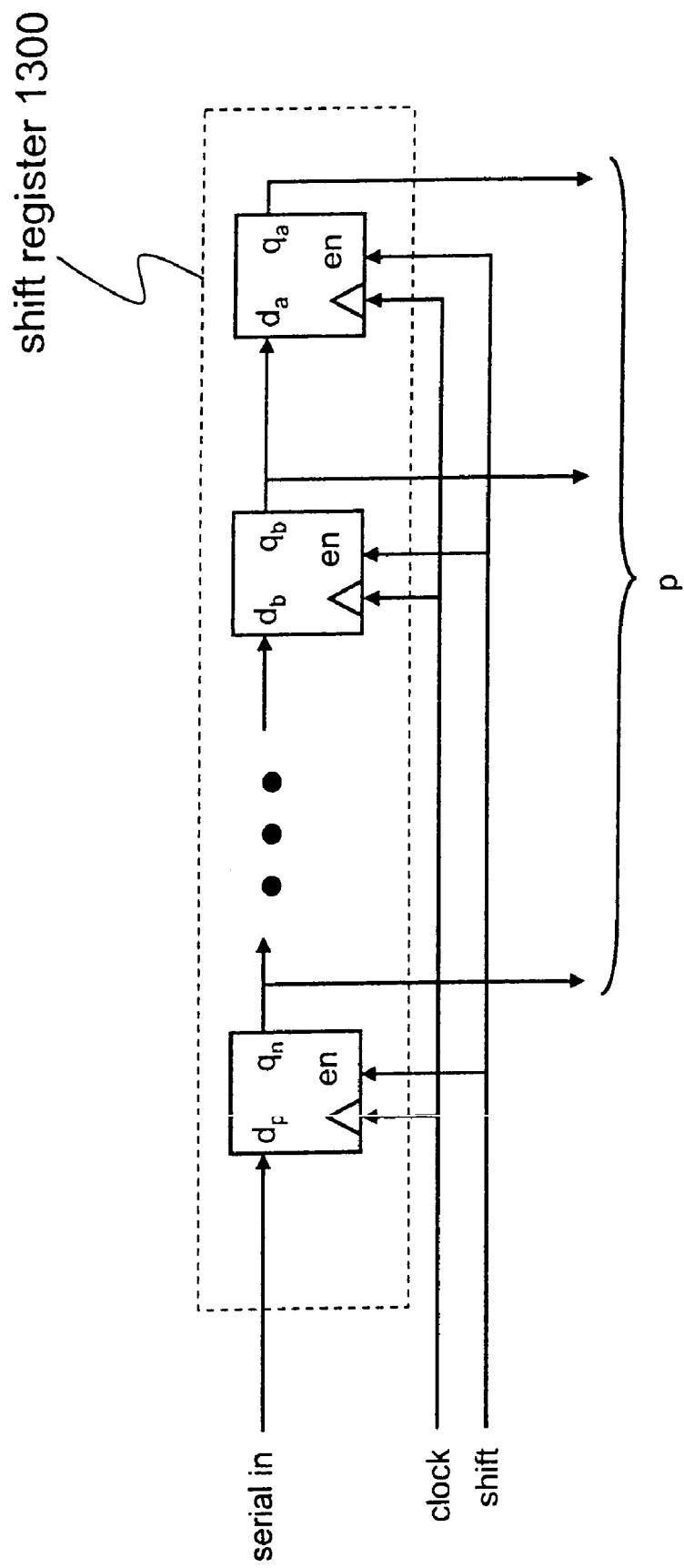
FIG. 72 shows an embodiment of a serial-to-parallel shift register.

The serial-to-parallel shift registers 1140a through 1140n are implemented as known in the art. FIG. 72 shows a common implementation. The shift register 1300 consists of p D flip-flops connected in series. The input of the leftmost flip-flop is connected to the output of the detector capture register. The shift input connected to the output of the start of cluster detector 1120 causes data to be shifted in when controller 1130 provides the time slot clock. The outputs of the shift register are connected to decoder 1150. The number of shift register stages and the number of bits vanes with the chosen symbol encoding and the number of pulse detectors as well as the number of outputs provided by the burst detectors. For example, the burst detectors may provide amplitude information stored in multiple bits instead of a single bit indicating presence or absence of a burst.

Controller 1130 is preferably implemented as a finite state machine using combinational logic gates and state registers, but other means known in the art, such as a processor and memory, are equally applicable.

Figure 70:
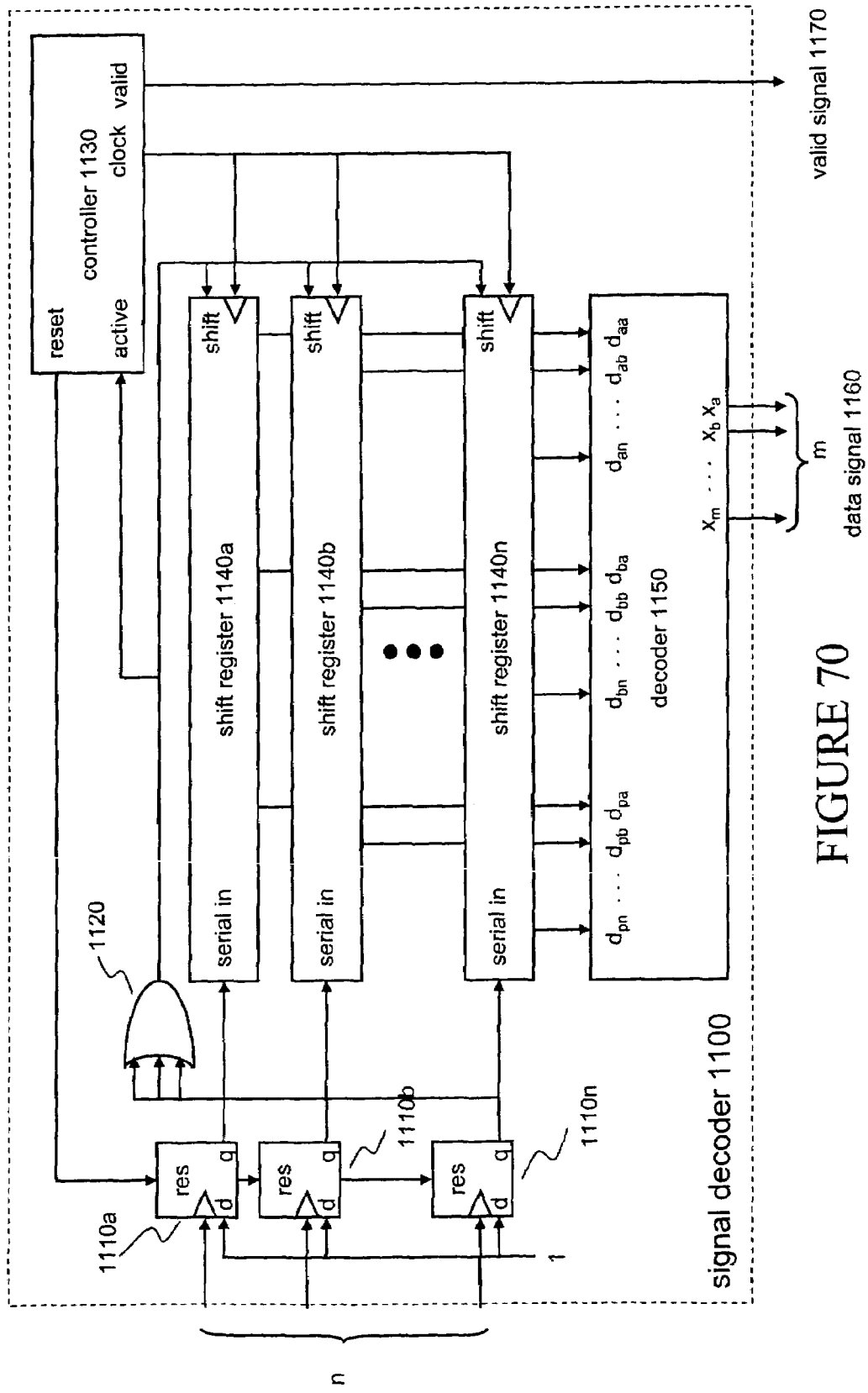
FIG. 70 shows an embodiment of a signal decoder using detector capture registers, serial-to-parallel shift registers and a decoder.
Figure 73:
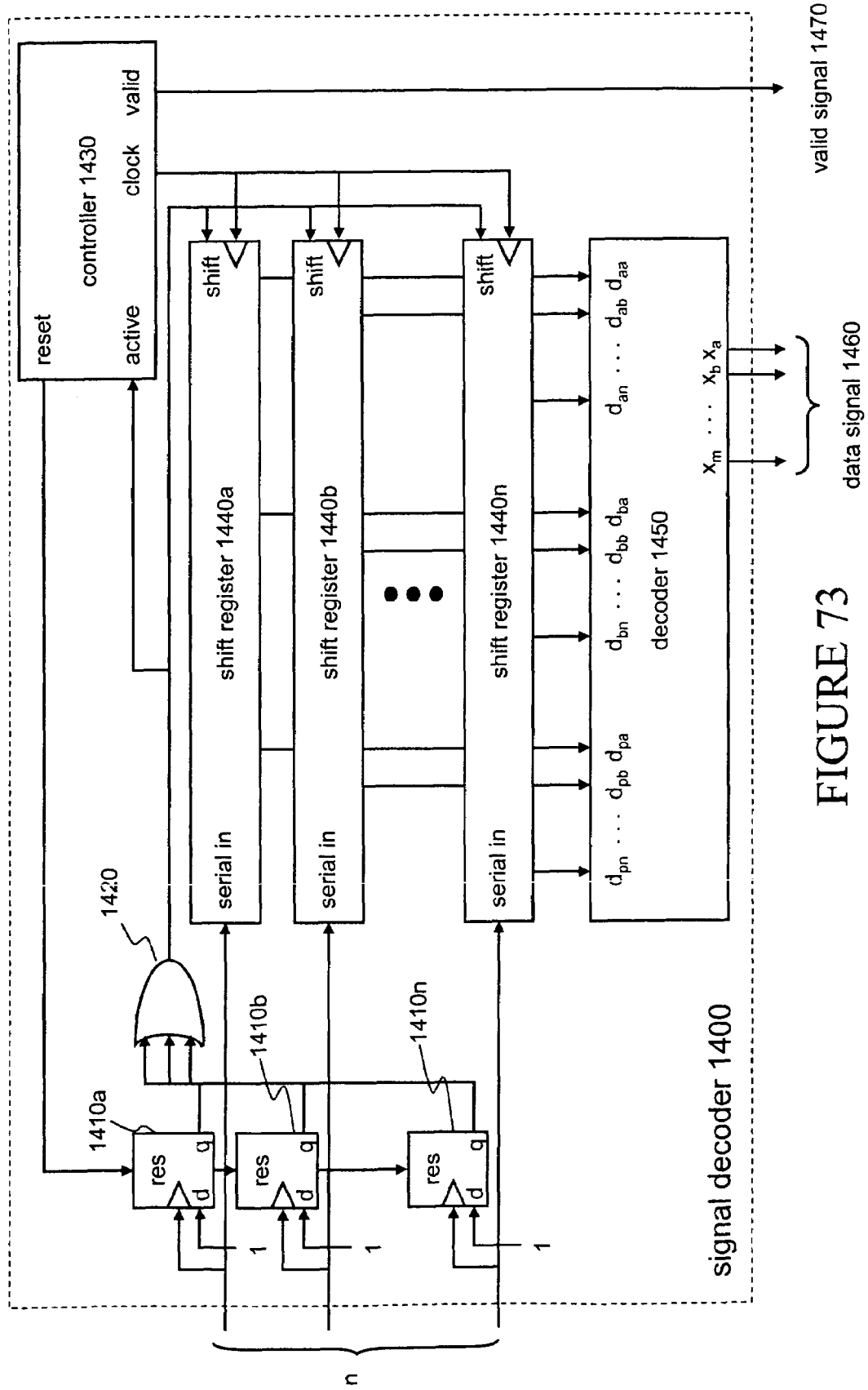
FIG. 73 shows an alternative embodiment of a signal decoder.

FIG. 73 shows an alternative embodiment of signal decoder 1100 shown in FIG. 70. Signal decoder 1400 comprises detector capture registers 1410a through 141 On, a start of cluster detector 1420, a controller 1430, shift registers 1440a through 1440n and a decoder 1450. Burst detectors 2130a through 2130n in FIG. 64 sense the communication channel and detect frequency bursts in their respective frequency bands. The burst detectors present the state of the channels on their outputs, which are coupled to the serial inputs of shift registers 1440a through 1440n and also to the inputs of detector capture registers 1410a through 1410n in FIG. 73. The detector capture registers are implemented as one shot registers and are set the first time the attached burst detectors sense a frequency burst. They are reset by controller 1430. When activated by the controller by providing clock pulses, the shift registers 1440a through 1440n capture the state of the burst detectors 2130a through 2130n shown in FIG. 64 during each time slot. Simultaneously, they present the captured states ($d_{aa}$ through $d_{pn}$) to decoder 1450 by means of the parallel outputs of the shift registers. The decoder determines the received symbol given the detector states $d_{aa}$ through $d_{pn}$ as inputs. Controller 1430 generates the time slot clock, signals the decoding of a data value to the consumer of the received data, and clears the detector capture registers prior to receiving the next symbol.

Reception begins when one of the burst detectors 2130a through 2130n senses a frequency burst in its respective band, causing the output of the detector capture register (one of 1410a through 1410n) connected to the burst detector to go high. This causes the output of the start of cluster detector 1420 to go high, enabling the shifting of serial input data into the shift registers 1440a through 1440n. It also triggers the controller 1430, which then provides the shift registers with a time slot clock for the duration of the cluster (p cycles). At the end of a cluster, controller 1430 resets the detector state registers, stopping further shifting of the detector state into the shift register and stops the time slot clock. The outputs of shift registers 1440a through 1440n are presented to decoder 1450, which, based on this input, determines the received symbol and presents it on the decoder outputs $x_a$ through $x_m$. Controller 1430 asserts the valid signal output in parallel with the decoder output to indicate that a new data value is available. Prior to the reception of the next cluster, controller 1430 resets the detector state registers to enable reception of another symbol.

Whereas the embodiment of signal detector 1100 shown in FIG. 70 only detects the first occurrence of a burst in frequency band, signal detector 1400 captures the state of the burst detector during each time slot, thus enabling a broader range of cluster encodings to be used, for example a cluster encoding scheme where more than 1 burst per/cluster is transmitted in a given frequency band.

The foregoing presentation of the described embodiments is provided to enable any person skilled in the art to make or use the invention as claimed. Various modifications to these embodiments are possible, and the generic principles presented herein may be applied to other embodiments as well. For example, implementations of a receiver as described herein may also be applied to receive signals transmitted using chirping techniques as described herein. Modulation techniques and implementation principles as described herein may be applied to communications over wired, wireless (e.g. guided and/or free space), and/or optical (e.g. guided (for example, in a fiber) and/or free space) transmission channels, at frequencies including but not limited to radio frequency, microwave, millimeter-wave, and optical.

It is further noted that although many of the embodiments described herein are in the context of a multi-band system transmitting and receiving wideband and/or ultra-wideband signaling in multiple wideband and/or ultra-wideband frequency bands, the methods and corresponding apparatus presented herein may be implemented in systems using narrowband signaling. For example, systems using signaling in which the bandwidth of the multiple frequency bands is less than 2%, typically significantly less than 2% of the center frequency of the respective frequency band.

The invention may be implemented in part or in whole as a hard-wired circuit and/or as a circuit configuration fabricated into an application-specific integrated circuit. The invention may also be implemented in part or in whole as a firmware program loaded into non-volatile storage (e.g. ROM or flash or battery-backup RAM) or a software program loaded from or into a data storage medium (for example, a read-only or rewritable medium such as a semiconductor or ferromagnetic memory (e.g. ROM, programmable ROM, dynamic RAM, static RAM, or flash RAM); or a magnetic, optical, or phase-change medium (e.g. a floppy, hard, or CD or DVD disk)) as machine-readable code, such code being instructions executable by an array of logic elements such as a microprocessor or other digital signal processing unit or an FPGA.

In some cases, for example, the design architecture for a time division multiple frequency (TDMF) modulation technique according to an embodiment of the invention may be realized in an integrated circuit device, such as an application-specific integrated circuit (ASIC). Such a design may be implemented as a stand-alone packaged device, or embedded as a core in a larger system ASIC. Features of an architecture according to certain such embodiments of the invention lend themselves well to an ASIC implementation that enables low cost, low power, and/or high volume production. Embodiments of the invention may include designs that are scalable with evolving semiconductor technologies, enabling increased performance objectives and expanded applications. In some cases an entire such architecture may be implemented in a single semiconductor process, although even in these cases it may be possible to transfer the design to multiple semiconductor technologies rather than to depend on a single semiconductor process.

Thus, the present invention is not intended to be limited to the embodiments shown above but rather is to be accorded the widest scope consistent with the principles and novel features disclosed in any fashion herein.

What is claimed is:

1. A method of data transmission, said method comprising:
   encoding an ordered set of m data values to produce a corresponding series of ordered n-tuples; and
   according to the series of ordered n-tuples, transmitting a plurality of bursts, each burst occupying at least one of a plurality n of frequency bands,
   wherein, for each of the plurality of bursts, a frequency band occupied by the burst is indicated by the order within its n-tuple of an element corresponding to the burst, and
   wherein a bandwidth of at least one of the plurality of bursts is at least two percent of the center frequency of the burst and
   wherein information is encoded into an additional modulation of at least one of the plurality of bursts;
   wherein, for each among at least some of the plurality of bursts, the burst corresponds to at least one element to the exclusion of other elements, and a value of at least one such corresponding elements indicates the additional modulation of the burst, and
   wherein, for each of the plurality of bursts, a time of transmission of the burst relative to the rest of the plurality of bursts is indicated by the order, within the series of ordered n-tuples, of the n-tuple that includes the element corresponding to the burst.

2. The method of data transmission according to claim 1, wherein, the information is encoded into an amplitude of at least one of the plurality of bursts.

3. The method of data transmission according to claim 1, wherein, the information is encoded into a width of at least one of the plurality of bursts.

4. The method of data transmission according to claim 1, wherein, the information is encoded into a polarization of at least one of the plurality of bursts.

5. The method of data transmission according to claim 1, wherein at least one of the plurality of bursts corresponds to a plurality of the m data values.

6. The method of data transmission according to claim 1, wherein said plurality of bursts includes a first burst occupying one of the plurality of frequency bands and a second burst occupying a different one of the plurality of frequency bands, and
   wherein at least one frequency point exists at which the amplitude of the first burst is within twenty decibels of the maximum amplitude of the first burst and at which the amplitude of the second burst is within twenty decibels of the maximum amplitude of the second burst.

7. A method of data transmission, said method comprising:
   encoding an ordered set of m data values to produce a corresponding series of ordered n-tuples; and
   according to the series of ordered n-tuples, transmitting a plurality of bursts, each burst occupying at least one of a plurality n of frequency bands,
   wherein, for each of the plurality of bursts, a frequency band occupied by the burst is indicated by the order within its n-tuple of an element corresponding to the burst, and
   wherein a bandwidth of at least one of the plurality of bursts is at least two percent of the center frequency of the burst and
   wherein information is encoded into an additional modulation of at least one of the plurality of bursts,
   wherein each among the series of ordered n-tuples corresponds to one among a series of time periods, and
   wherein each of the series of time periods has a different start time, and
   wherein, for each of the plurality of bursts, the time period during which the burst is launched is indicated by the location within the series of n-tuples of an n-tuple that includes an element corresponding to the burst,
   wherein during each time period, no more than one of the plurality of bursts is launched.

8. A transmitter comprising:
   an encoder configured to receive an ordered set of m data values and to produce a corresponding series of ordered n-tuples; and
   a signal generator configured to transmit, according to the series of ordered n-tuples, a plurality of bursts, each burst occupying at least one of a plurality n of frequency bands,
   wherein, for each of the plurality of bursts, a frequency band occupied by the burst is indicated by the order within its n-tuple of an element corresponding to the burst, and
   wherein a bandwidth of at least one of the plurality of bursts is at least two percent of the center frequency of the burst and
   wherein said transmitter is configured to encode information into an additional modulation of at least one of the plurality of bursts;
   wherein, for each of the plurality of bursts, a time of transmission of the burst relative to the rest of the plurality of bursts is indicated by the order, within the series of ordered n-tuples, of an n-tuple that includes an element corresponding to the burst.

9. The transmitter according to claim 8, wherein said transmitter is configured to encode information into an amplitude of at least one of the plurality of bursts.

10. The transmitter according to claim 8, wherein said transmitter is configured to encode information into a width of at least one of the plurality of bursts.

11. The transmitter according to claim 8, wherein said transmitter is configured to encode information into a polarization of at least one of the plurality of bursts.

12. The transmitter according to claim 8, wherein said signal generator includes a plurality of burst generators,
   wherein each of the plurality of burst generators is configured to receive a trigger event and to generate at least one of the plurality of bursts according to the trigger event, and
   wherein at least one of the burst generators is configured to encode information into the additional modulation of a burst.

13. The transmitter according to claim 8, said transmitter further comprising a signal launcher configured to receive the plurality of bursts and to transmit the plurality of bursts over a transmission medium.

14. The transmitter according to claim 8, wherein said signal generator includes an oscillator configured to output a signal over a selectable one of at least two of the plurality n of frequency bands, and
   wherein said signal generator is configured to encode information into the additional modulation of the burst.

15. A method of data reception, said method comprising:
   receiving a plurality of bursts, each burst occupying at least one of a plurality n of frequency bands, wherein information is encoded into an additional modulation of at least one of the plurality of bursts,
   obtaining a series of ordered n-tuples based on the plurality of bursts; and
   decoding the series of ordered n-tuples to produce an ordered set of m data values, wherein, for each of the plurality of bursts, the order within its n-tuple of an element corresponding to the burst is indicated by a frequency band occupied by the burst, and wherein a bandwidth of at least one of the plurality of bursts is at least two percent of the center frequency of the burst and wherein information is decoded from the additional modulation encoded into at least one of the plurality of bursts;

wherein, for each of the plurality of bursts, the order, within the series of ordered n-tuples, of an n-tuple that includes an element corresponding to the burst is indicated by a timing of the burst relative to the rest of the plurality of bursts.

16. The method of data reception according to claim 15, wherein information is encoded into an amplitude of at least one of the plurality of bursts, and the information is decoded from the amplitude encoded into at least one of the plurality of bursts.

17. The method of data reception according to claim 15, wherein information is encoded into a width of at least one of the plurality of bursts, and the information is decoded from the width encoded into at least one of the plurality of bursts.

18. The method of data reception according to claim 15, wherein information is encoded into a polarization of at least one of the plurality of bursts, and the information is decoded from the polarization encoded into at least one of the plurality of bursts.

19. The method of data reception according to claim 18, wherein at least one of the plurality of bursts corresponds to a plurality of the m data values.

20. A receiver comprising:

a signal detector configured to receive a signal including a plurality of bursts, wherein information is encoded into an additional modulation of at least one of the plurality of bursts, each burst occupying at least one of a plurality n of frequency bands, and to output a series of ordered n-tuples based on the plurality of bursts; and a decoder configured to produce an ordered set of m data values from the series of ordered n-tuples, wherein the signal detector is configured to output, for each of the plurality of bursts, an element corresponding to the burst such that an order of the element within its n-tuple corresponds to a frequency band occupied by the burst, and wherein a bandwidth of at least one of the plurality of bursts is at least two percent of the center frequency of the burst and wherein the signal detector is configured to output the information based upon the additional modulation of at least one of the plurality of bursts;

wherein, for each of the plurality of bursts, the order, within the series of ordered n-tuples, of an n-tuple that includes an element corresponding to the burst is indicated by a timing of the burst relative to the rest of the plurality of bursts.

21. The receiver according to claim 20, wherein information is encoded into an amplitude of at least one of the plurality of bursts, and the signal detector is configured to output the information based upon the amplitude of at least one of the plurality of bursts.

22. The receiver according to claim 20, wherein information is encoded into a width of at least one of the plurality of bursts, and the signal detector is configured to output the information based upon the width of at least one of the plurality of bursts.

23. The receiver according to claim 20, wherein information is encoded into a polarization of at least one of the plurality of bursts, and the signal detector is configured to output the information based upon the polarization of at least one of the plurality of bursts.

24. The receiver according to claim 20, wherein the signal detector includes at least one correlator configured to detect a received burst based on a correlation of a template with at least a portion of the received signal, and wherein the at least one correlator is configured to detect the additional modulation of the received burst.

25. The receiver according to claim 20, wherein the signal detector includes at least one filter configured to select at least a portion of a corresponding one of the plurality n of frequency bands.

26. The receiver according to claim 20, wherein at least one of the plurality of bursts corresponds to a plurality of the m data values.

* * * * *